United States Patent [19]

Dinwiddie, Jr. et al.

[11] Patent Number: 5,369,767
[45] Date of Patent: Nov. 29, 1994

[54] SERVICING INTERRUPT REQUESTS IN A DATA PROCESSING SYSTEM WITHOUT USING THE SERVICES OF AN OPERATING SYSTEM

[75] Inventors: John M. Dinwiddie, Jr., West Palm Beach; Lonnie E. Grice, Boca Raton; John M. Loffredo, Deerfield Beach; Kenneth R. Sanderson, West Palm Beach, all of Fla.

[73] Assignee: International Business Machines Corp., Armonk, N.Y.

[21] Appl. No.: 353,117

[22] Filed: May 17, 1989

[51] Int. Cl.$^5$ ............................................. G06F 9/00
[52] U.S. Cl. ................................. 395/725; 395/700
[58] Field of Search ................................. 395/700, 725

[56] References Cited

U.S. PATENT DOCUMENTS

| | | | |
|---|---|---|---|
| 4,004,277 | 1/1977 | Gayril | 340/172.5 |
| 4,099,234 | 7/1978 | Woods et al. | 364/200 |
| 4,214,305 | 7/1980 | Tokita et al. | 364/200 |
| 4,228,496 | 10/1980 | Katzman et al. | 364/200 |
| 4,244,019 | 1/1981 | Anderson et al. | 364/200 |
| 4,245,344 | 1/1981 | Richter | 371/68 |

(List continued on next page.)

OTHER PUBLICATIONS

IBM Systems Journal, vol. 27, No. 2, 1988 p. 93.
Weiser et al, Status and Performance of the Z mob Parallel Processing System, Feb. 25-28, Spring Comp Con 85 IEEE pp. 71-74.
Ramadrandran et al, Hardware Support for Interprocess Communication, Jun. 2-5, 1987, 14th International Symposium Computer Architecture, IEEE.
Peacock, Application dictates your choice of a multiprocessor model, EDN Jun. 25, 1987, pp. 241-246, 248.
Golkar et al, IBM-Compatible Mainframe in 20,000-Gate CMOS Arrays, VLSI Systems Design, May 20, 1987.
Inselberg, Multiprocessor architecture ensures fault-tolerant transaction processing, Mini-Micro Systems, Apr. 1983.

Primary Examiner—Allen R. MacDonald
Assistant Examiner—Glenn A. Auve
Attorney, Agent, or Firm—Robert S. Babayi

[57] ABSTRACT

The functions of two virtual operating systems (e.g., S/370 VM, VSE or IX370 and S/88 OS) are merged into one physical system. Partner pairs of S/88 processors run the S/88 OS and handle the fault tolerant and single system image aspects of the system. One or more partner pairs of S/370 processors are coupled to corresponding S/88 processors directly and through the S/88 bus. Each S/370 processor is allocated from 1 to 16 megabytes of contiguous storage from the S/88 main storage. Each S/370 virtual operating system thinks its memory allocation starts at address 0, and it manages its memory through normal S/370 dynamic memory allocation and paging techniques. The S/370 is limit checked to prevent the S/370 from accessing S/88 memory space. The S/88 Operating System is the master over all system hardware and I/O devices. The S/88 processors access the S/370 address space in direct response to a S/88 application program so that the S/88 may move I/O data into the S/370 I/O buffers and process the S/370 I/O operations. The S/88 and S/370 peer processor pairs execute their respective Operating Systems in a single system environment without significant rewriting of either operating system. Neither operating system is aware of the other operating system nor the other processor pairs.

12 Claims, 84 Drawing Sheets

U.S. PATENT DOCUMENTS

| | | | |
|---|---|---|---|
| 4,315,321 | 2/1982 | Parks et al. | 363/900 |
| 4,316,244 | 2/1982 | Grondalski | 364/200 |
| 4,325,116 | 4/1982 | Kranz et al. | 364/200 |
| 4,354,225 | 10/1982 | Frieder et al. | 364/200 |
| 4,356,550 | 10/1982 | Katzman et al. | 364/200 |
| 4,365,295 | 12/1982 | Katzman et al. | 364/200 |
| 4,368,514 | 1/1983 | Persaud | 364/200 |
| 4,400,775 | 8/1983 | Nozaki et al. | 364/200 |
| 4,412,281 | 10/1983 | Works | 364/200 |
| 4,414,620 | 11/1983 | Tsuchimoto et al. | 364/200 |
| 4,533,996 | 8/1985 | Hartung et al. | 364/200 |
| 4,563,737 | 1/1986 | Nakamura et al. | 364/200 |
| 4,564,903 | 1/1986 | Guyette et al. | 364/300 |
| 4,591,975 | 5/1986 | Wade et al. | 364/200 |
| 4,628,508 | 12/1986 | Sager et al. | 371/9 |
| 4,654,779 | 3/1987 | Kato et al. | 364/200 |
| 4,674,038 | 6/1987 | Brelsford et al. | 364/200 |
| 4,677,546 | 6/1987 | Freeman et al. | 364/200 |
| 4,679,166 | 7/1987 | Berger et al. | 364/900 |
| 4,722,048 | 1/1988 | Hirsch et al. | 364/200 |
| 4,727,480 | 2/1988 | Albright et al. | 364/200 |
| 4,747,040 | 5/1988 | Blanset et al. | 364/200 |
| 4,750,177 | 6/1988 | Hendrie et al. | 371/32 |
| 4,812,967 | 3/1989 | Hirosawa et al. | 364/200 |
| 4,837,674 | 6/1989 | Takane | 364/200 |

SYSTEM/88 MODULE

MODULES INTERCONNECTED VIA HSDI's

PHYSICAL PACKAGING

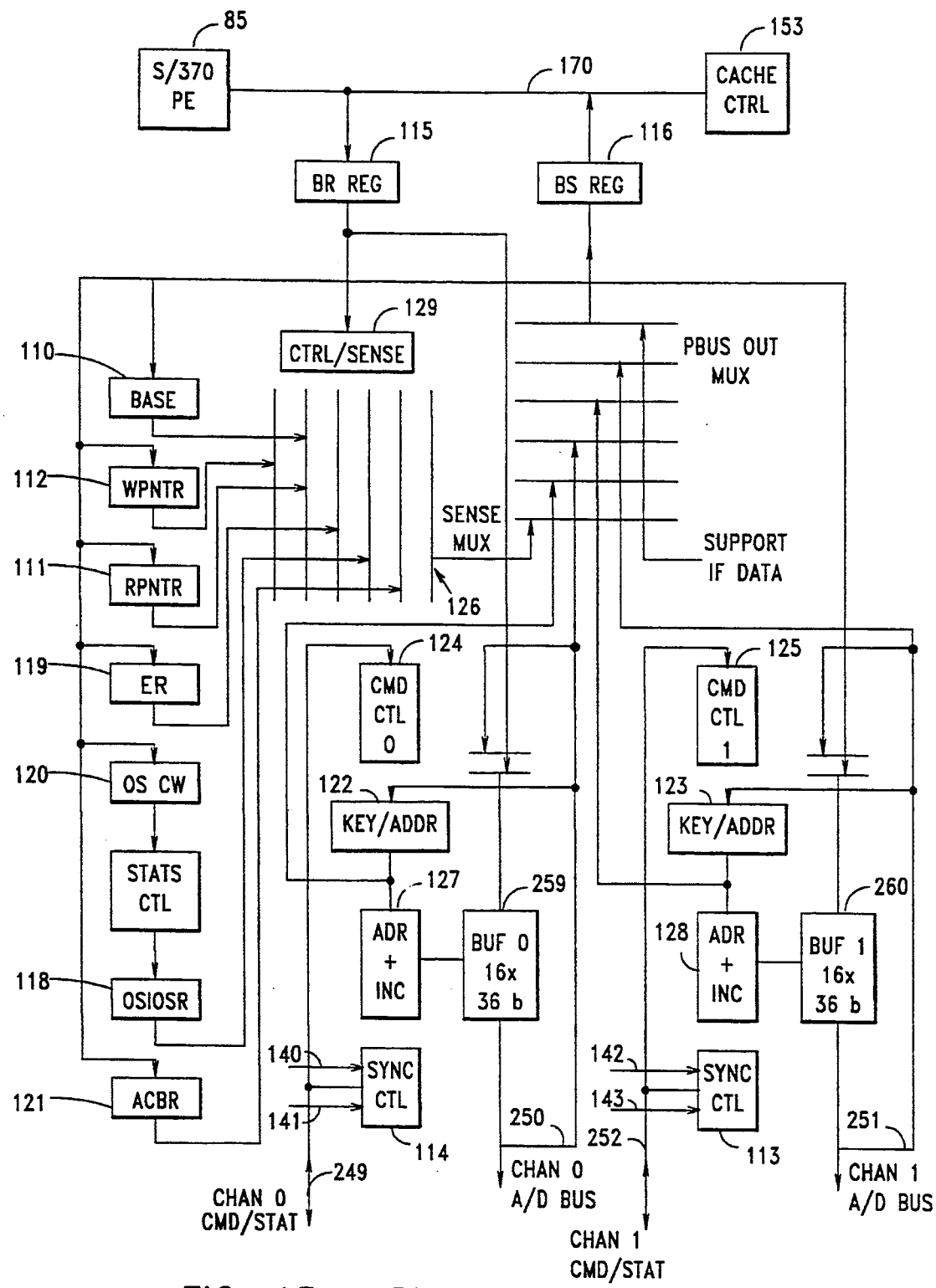
FIG. 13 — BUS ADAPTER 154

| CHANNEL SUBCYCLE | 1 | 2 |
|---|---|---|
| BIT | 0123 | 4567 |
| SELECT CYCLE: BSM select in | 11ff | ffff |
| Mailbox select in | 110f | ffff |
| DATA CYCLE: Data out | 0000 | 0000 |
| Data/Status out | KAB1 | KAB1 |

DATA ON BUS 249

| | 1 | | 2 | 2 | 3 |
|---|---|---|---|---|---|
| | | 1 1 | 1 | 2 | 3 |
| 0......7 | 8......5 | 6......3 | 4......1 |
| kkkk1ppc | aaaaaaaa | aaaaaaa | aaaaaaa |
| kkkk001c | ............ | ......ooooo | |
| dddddddd | dddddddd | dddddddd | dddddddd |
| dddddddd | dddddddd | dddddddd | dddddddd |

DATA ON BUS 250

FIG. 14A

| CHANNEL SUBCYCLE | 1 | 2 |
|---|---|---|
| BIT | 0123 | 4567 |
| SELECT CYCLE: | | |
| BSM select in | 01ff | ffff |
| Mailbox select in | 110f | ffff |
| Queue select in | 110f | ffff |
| DATA CYCLE: | | |
| Data in | //// | //// |
| Status out | KAB1 | KAB1 |

DATA ON BUS 252

| | 1 | | 2 | |
|---|---|---|---|---|
| | 0......7 | 8......15 | 16......23 | 24......31 |
| | kkkk1ppc | aaaaaaaa | aaaaaaaa | aaaaaaaa |
| | kkkk001c | ........ | ........ | ...ooooo |
| | kkkk001c | ........ | ........ | ...ooooo |
| | dddddddd | dddddddd | dddddddd | dddddddd |
| | //////// | //////// | //////// | //////// |

DATA ON BUS 251

FIG. 14B

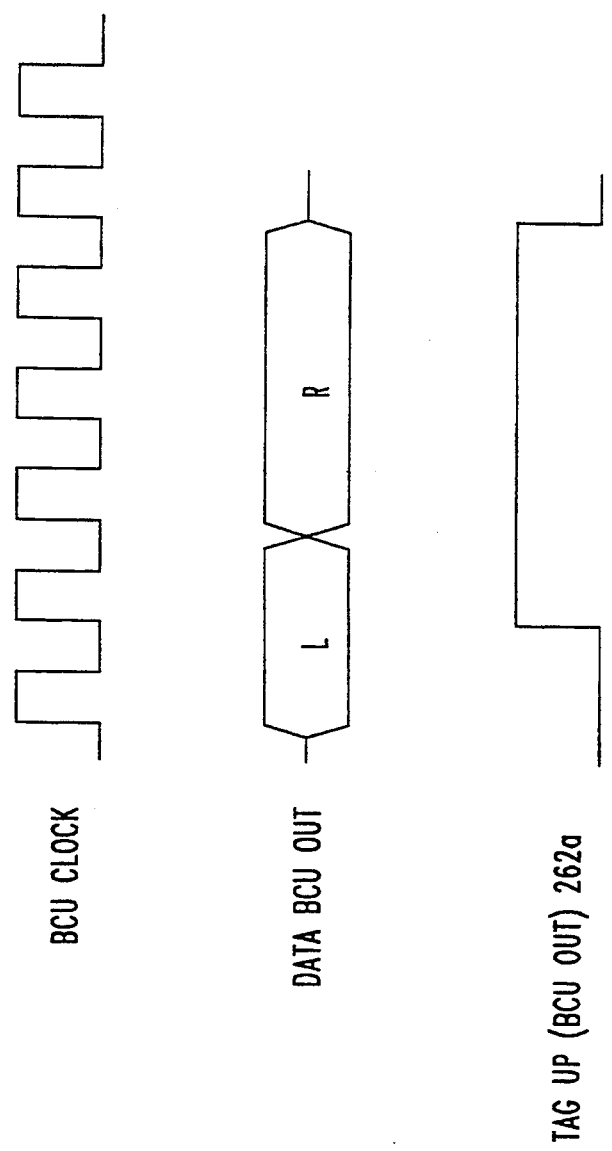
FIG. 15A – STORE

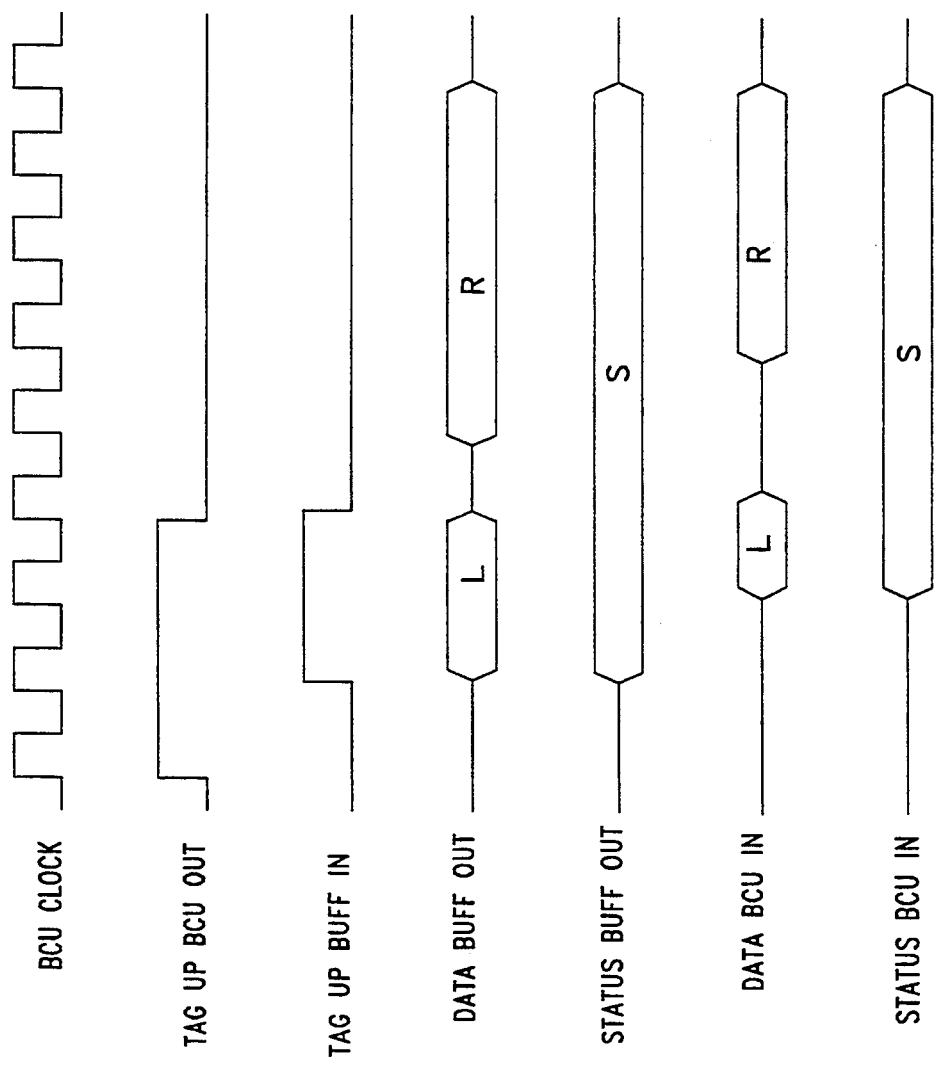
FIG. 15B – FETCH

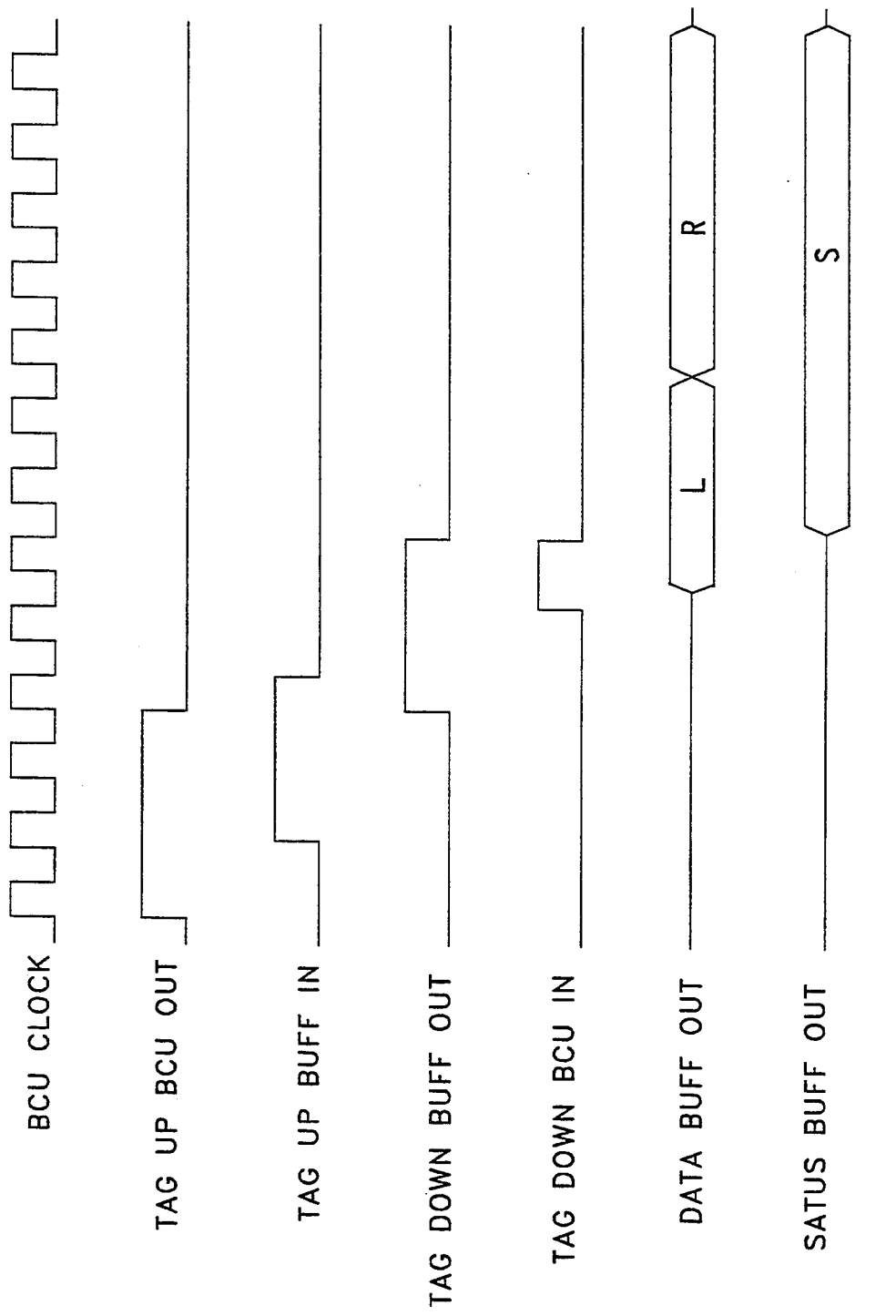

| | ADRS | | CH0 | CH1 | CH2 | CH3 |
|---|---|---|---|---|---|---|
| CSR | 00 | chanl status | | | | |
| CER | 01 | chanl error | | | | |
| DCR | 04 | device control | A9 | A8 | A8 | A8 |
| OCR | 05 | operation control | 9E | 92 | 12 | 12 |
| SCR | 06 | sequence control | 04 | 04 | 04 | 04 |
| CCR | 07 | chanl control | 08 | 08 | 08 | 08 |
| NIV | 25 | normal control | VV | VV | VV | VV |
| EIV | 27 | error vector | VV | VV | VV | VV |
| CPR | 2D | chanl priority | 00 | 02 | 02 | 01 |
| MFC | 29 | mem function codes | 04 | 04 | 04 | 04 |
| DFC | 31 | dev function codes | 00 | 00 | 00 | 00 |
| BFC | 39 | base function codes | 01 | 00 | 00 | 00 |
| MTC | 0A/B | memory xfer count | | | | |
| BTC | 1A/B | base xfer count | | | | |
| MAR | 0C-F | memory address | | | | |
| DAR | 14-7 | device address | | | | |
| BAR | 1C-F | base address | | | | |
| GCR | FF | general control | | | | |

FIG. 18 — DMAC REGISTERS

BYTE AND WORD READ CYCLE TIMING
(32-BIT DATA PORT)

BYTE AND WORD WRITE CYCLE TIMING
(32-BIT DATA PORT)

INTERRUPT ACKNOWLEDGE CYCLE TIMING

FIG. 25 – READ MBX/BSM READ CMD

FIG. 26 — Q SELECT UP/BSM WRITE CMD

FIG. 27 — S/370 PROCESSOR 85

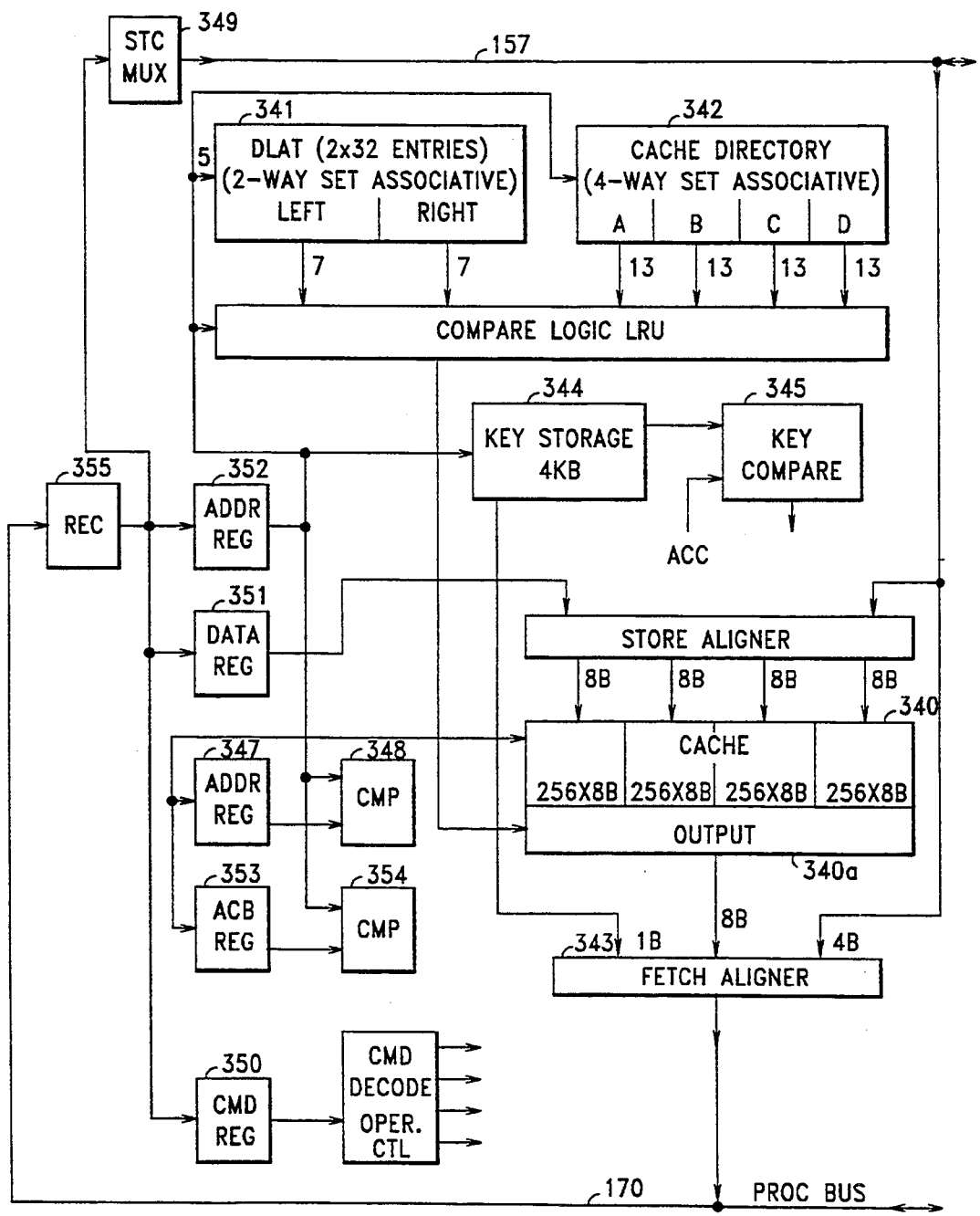
FIG. 31 — CACHE CONTROLLER 153

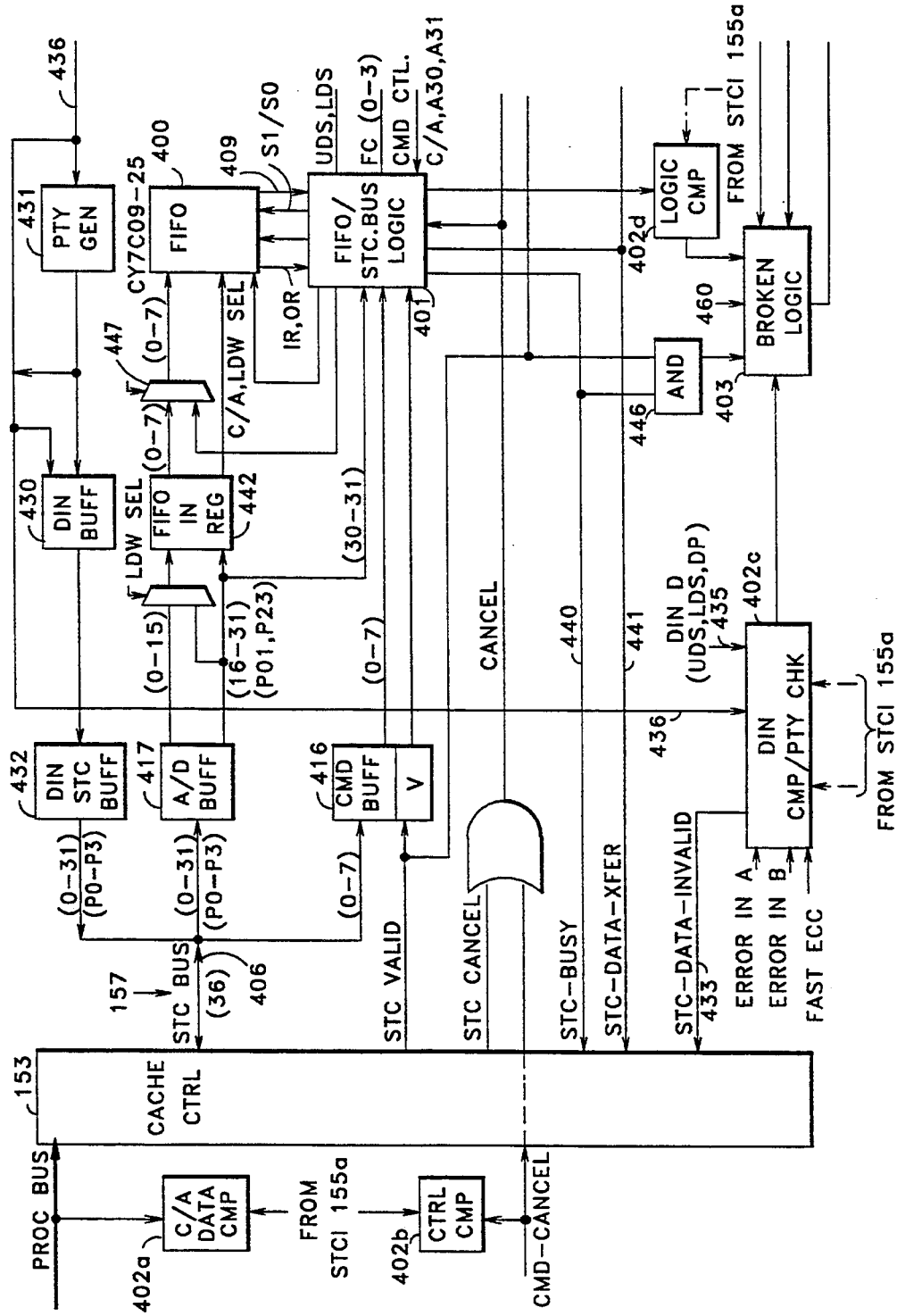
FIG. 32A – STCI 155

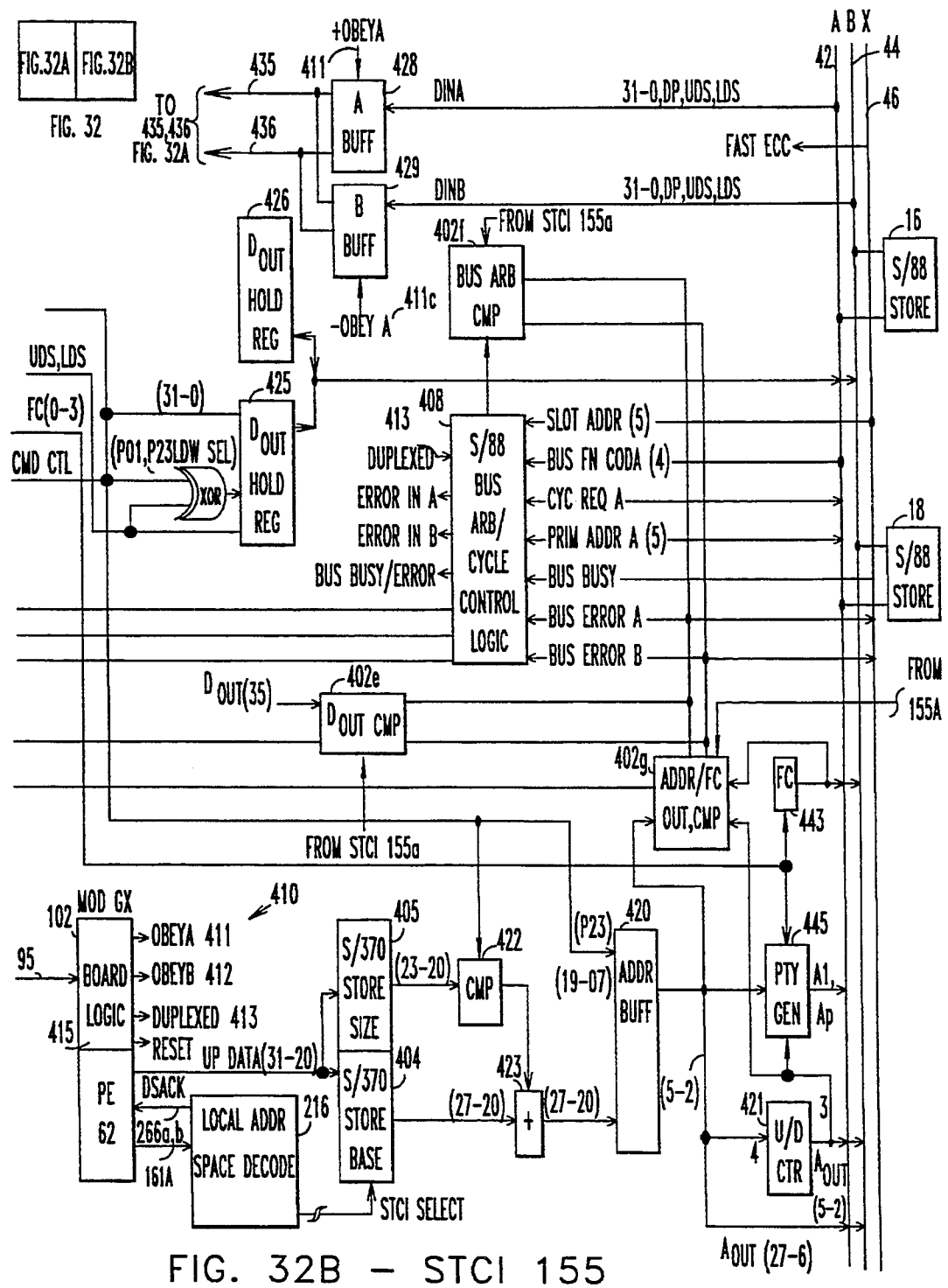
FIG. 32B — STCI 155

COMMAND ADDRESS WORD       STORE DATA WORD
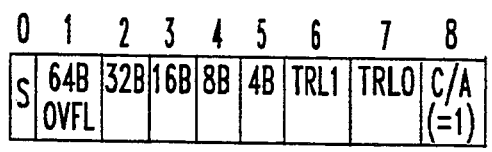 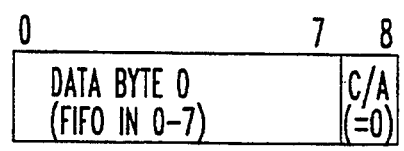
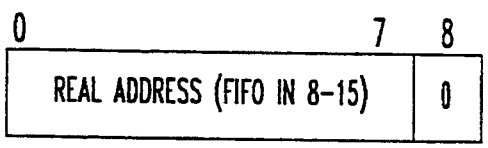 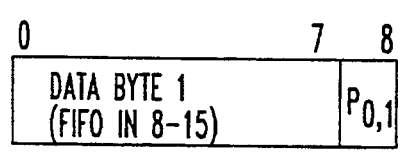
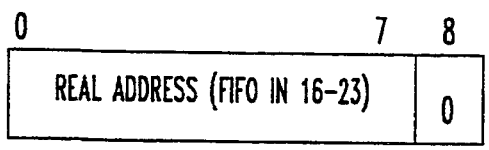 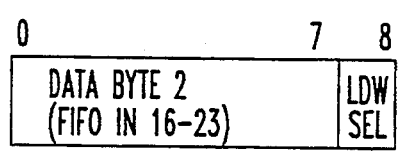
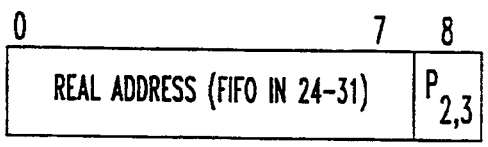 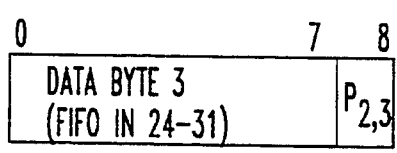
FIG. 35 — FIFO FORMATS

| COMMAND | STC BUS 0 - 7 | 28-31 | VALID BYTE(S) UU | UM | LM | LL | ACTUAL TRANSFER | ACTUAL S/88 CYCLE |
|---|---|---|---|---|---|---|---|---|
| PE85 FETCH | 1011 | 1nnn | | | | | | |
| 1 BYTE | 1011 1000 | xx00 | V | | | | BYTE | MEM32 |
| 1 BYTE | 1011 1000 | xx01 | | V | | | BYTE | MEM32 |
| 1 BYTE | 1011 1000 | xx10 | | | V | | BYTE | MEM32 |
| 1 BYTE | 1011 1000 | xx11 | | | | V | BYTE | MEM32 |
| 2 BYTE | 1011 1001 | xx00 | V | V | | | WORD | MEM32 |
| 2 BYTE | 1011 1001 | xx01 | | V | V | | 2-BYTE | MEM32 |
| 2 BYTE | 1011 1001 | xx10 | | | V | V | WORD | MEM32 |
| 3 BYTE | 1011 1010 | xx00 | V | V | V | | 3-BYTE | MEM32 |
| 3 BYTE | 1011 1010 | xx01 | | V | V | V | 3-BYTE | MEM32 |
| 4 BYTE | 1011 1011 | xx00 | V | V | V | V | LW | MEM32 |
| 8 BYTE | 1011 1100 | x000 | V | V | V | V | 2-LW | MEM64 |
| 64 BYTE | 1011 1101 | xx00 | V | V | V | V | (8)2-LW | MEM64 |
| 64 BYTE slow | 1011 1110 | xx00 | V | V | V | V | (16) LW | MEM32 |

FIG. 36A — STC INTERFACE (PE85 ORIGINATED FETCHES)

| COMMAND | STC BUS 0 - 7 | 28-31 | VALID BYTE(S) UU | UM | LM | LL | ACTUAL TRANSFER | ACTUAL S/88 CYCLE |
|---|---|---|---|---|---|---|---|---|
| I/O 1-64 BYTE FETCH | 01nn nnnn | | | | | | | |
| IN WORD BOUNDARY | | | | | | | | |
| 1 BYTE | 0100 0000 | xxxx | V | | | | BYTE | MEM32 |
| 1 BYTE | 0100 0000 | xxxx | | V | | | BYTE | MEM32 |
| 1 BYTE | 0100 0000 | xxxx | | | V | | BYTE | MEM32 |
| 1 BYTE | 0100 0000 | xxxx | | | | V | BYTE | MEM32 |
| 2 BYTE | 0100 0001 | xxxx | V | V | | | WORD | MEM32 |
| 2 BYTE | 0100 0001 | xxxx | | V | V | | 2-BYTE | MEM32 |
| 2 BYTE | 0100 0001 | xxxx | | | V | V | WORD | MEM32 |
| 3 BYTE | 0100 0010 | xxxx | V | V | V | | 3-BYTE | MEM32 |
| 3 BYTE | 0100 0010 | xxxx | | V | V | V | 3-BYTE | MEM32 |
| 4 BYTE | 0100 0011 | xxxx | V | V | V | V | LW | MEM32 |
| FOR WORD BOUNDARY CROSSING | | | | | | | | |
| Header | | | | | | | | |
| 3 BYTE | 01nn nnnn | xx01 | | V | V | V | 3-BYTE | MEM32 |
| 2 BYTE | 01nn nnnn | xx10 | | | V | V | WORD | MEM32 |
| 1 BYTE | 01nn nnnn | xx11 | | | | V | BYTE | MEM32 |
| Middle | | | | | | | | |
| 8 BYTE | 01nn nnnn | xxxx | V | V | V | V | 2-LW | MEM64 |
| Trailing | | | | | | | | |
| 1 BYTE | 01nn nnnn | xxxx | V | | | | BYTE | MEM32 |
| 1 BYTE | 01nn nnnn | xxxx | | V | | | BYTE | MEM32 |
| 1 BYTE | 01nn nnnn | xxxx | | | V | | BYTE | MEM32 |
| 1 BYTE | 01nn nnnn | xxxx | | | | V | BYTE | MEM32 |
| 2 BYTE | 01nn nnnn | xxxx | V | V | | | BYTE | MEM32 |
| 2 BYTE | 01nn nnnn | xxxx | | V | V | | BYTE | MEM32 |
| 2 BYTE | 01nn nnnn | xxxx | | | V | V | BYTE | MEM32 |
| 3 BYTE | 01nn nnnn | xxxx | V | V | V | | 3-BYTE | MEM32 |
| 3 BYTE | 01nn nnnn | xxxx | | V | V | V | 3-BYTE | MEM32 |
| 4 BYTE | 01nn nnnn | xxxx | V | V | V | V | LW | MEM32 |

FIG. 36B — STC INTERFACE (ADAPTER 154 ORIGINATED FETCHES)

|  |  | STC BUS |  | VALID BYTE(S) |  |  |  | ACTUAL | ACTUAL S/88 |  |  |
|---|---|---|---|---|---|---|---|---|---|---|---|
| COMMAND | 0 | - 7 | 28-31 | UU | UM | LM | LL | TRANSFER | CYCLE | UDS | LDS |
| PE85 STORE | 1001 | 1nnn |  |  |  |  |  |  |  |  |  |
| 1 BYTE | 1001 | 1000 | xx00 | V |  |  |  | BYTE | MEM16 | 1 | 0 |
| 1 BYTE | 1001 | 1000 | xx01 |  | V |  |  | BYTE | MEM16 | 0 | 1 |
| 1 BYTE | 1001 | 1000 | xx10 | LM |  | V |  | BYTE | MEM16 | 1 | 0 |
| 1 BYTE | 1001 | 1000 | xx11 |  | LL |  | V | BYTE | MEM16 | 0 | 1 |
| 2 BYTE | 1001 | 1001 | xx00 | V | V |  |  | WORD | MEM16 | 1 | 1 |
| 2 BYTE | 1001 | 1001 | xx01 |  | V | V |  | 2-BYTE | MEM32 | 0 | 0 |
| 2 BYTE | 1001 | 1001 | xx10 | LM | LL | V | V | WORD | MEM16 | 1 | 1 |
| 3 BYTE | 1001 | 1010 | xx00 | V | V | V |  | 3-BYTE | MEM32 | 1 | 0 |
| 3 BYTE | 1001 | 1010 | xx01 |  | V | V | V | 3-BYTE | MEM32 | 0 | 1 |
| 4 BYTE | 1001 | 1011 | xx00 | V | V | V | V | LW | MEM32 | 1 | 1 |
| 8 BYTE | 1001 | 1100 | x000 | V | V | V | V | 2-LW | MEM32 | 1 | 1 |
| 64 BYTE | 1001 | 1101 | xx00 | V | V | V | V | (16) LW | MEM32 | 1 | 1 |

Valid bytes multiplexed onto upper bytes are shown by 'LM' or 'LL'

FIG. 36C – STC INTERFACE (PE85 ORIGINATED STORES)

| COMMAND | STC BUS 0 - 7 | STC BUS 28-31 | VALID BYTE(S) UU | VALID BYTE(S) UM | VALID BYTE(S) LM | VALID BYTE(S) LL | ACTUAL TRANSFER | ACTUAL S/88 CYCLE | UDS | LDS |
|---|---|---|---|---|---|---|---|---|---|---|
| I/O 1-64 BYTE STORE | 00nn | nnnn | | | | | | | | |
| IN WORD BOUNDARY | | | | | | | | | | |
| 1 BYTE | 0000 0000 | xx00 | V | | | | BYTE | MEM16 | 1 | 0 |
| 1 BYTE | 0000 0000 | xx01 | | V | | | BYTE | MEM16 | 0 | 1 |
| 1 BYTE | 0000 0000 | xx10 | LM | | V | | BYTE | MEM16 | 1 | 0 |
| 1 BYTE | 0000 0000 | xx11 | | LL | | V | BYTE | MEM16 | 0 | 1 |
| 2 BYTE | 0000 0001 | xx00 | V | V | | | WORD | MEM16 | 1 | 1 |
| 2 BYTE | 0000 0001 | xx01 | | V | V | | 2-BYTE | MEM32 | 0 | 0 |
| 2 BYTE | 0000 0001 | xx10 | LM | LL | V | V | WORD | MEM16 | 1 | 1 |
| 3 BYTE | 0000 0010 | xx00 | V | V | V | | 3-BYTE | MEM32 | 1 | 0 |
| 3 BYTE | 0000 0010 | xx01 | | V | V | V | 3-BYTE | MEM32 | 0 | 1 |
| 4 BYTE | 0000 0011 | xx00 | V | V | V | V | LW | MEM32 | 1 | 1 |
| FOR WORD BOUNDARY CROSSING | | | | | | | | | | |
| Header | | | | | | | | | | |
| 3 BYTE | 00nn nnnn | xx01 | | V | V | V | 3-BYTE | MEM32 | 0 | 1 |
| 2 BYTE | 00nn nnnn | xx10 | LM | LL | V | V | WORD | MEM16 | 1 | 1 |
| 1 BYTE | 00nn nnnn | xx11 | | LL | | V | BYTE | MEM16 | 0 | 1 |
| Middle | | | | | | | | | | |
| 8 BYTE | 00nn nnnn | xxxx | V | V | V | V | 2-LW | MEM64 | 1 | 1 |
| Trailing STC (6,7) + (30,31) | | | | | | | | | | |
| =00 | 00nn nnnn | xxxx | V | | | | BYTE | MEM16 | 1 | 0 |
| =01 | 00nn nnnn | xxxx | V | V | | | WORD | MEM16 | 1 | 1 |
| =10 | 00nn nnnn | xxxx | V | V | V | | 3-BYTE | MEM32 | 1 | 0 |
| =11 | 00nn nnnn | xxxx | V | V | V | V | LW | MEM32 | 1 | 1 |

FIG. 36D — STC INTERFACE (ADAPTER 154 ORIGINATED STORES)

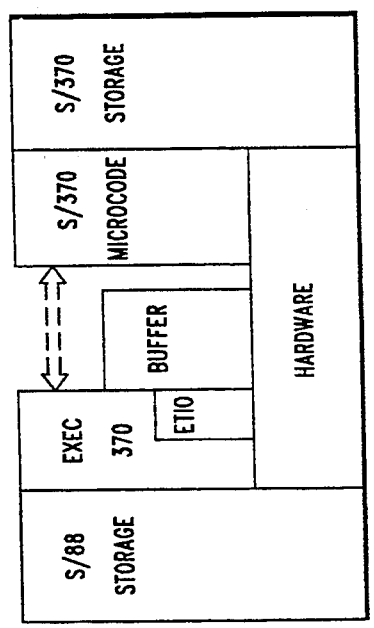
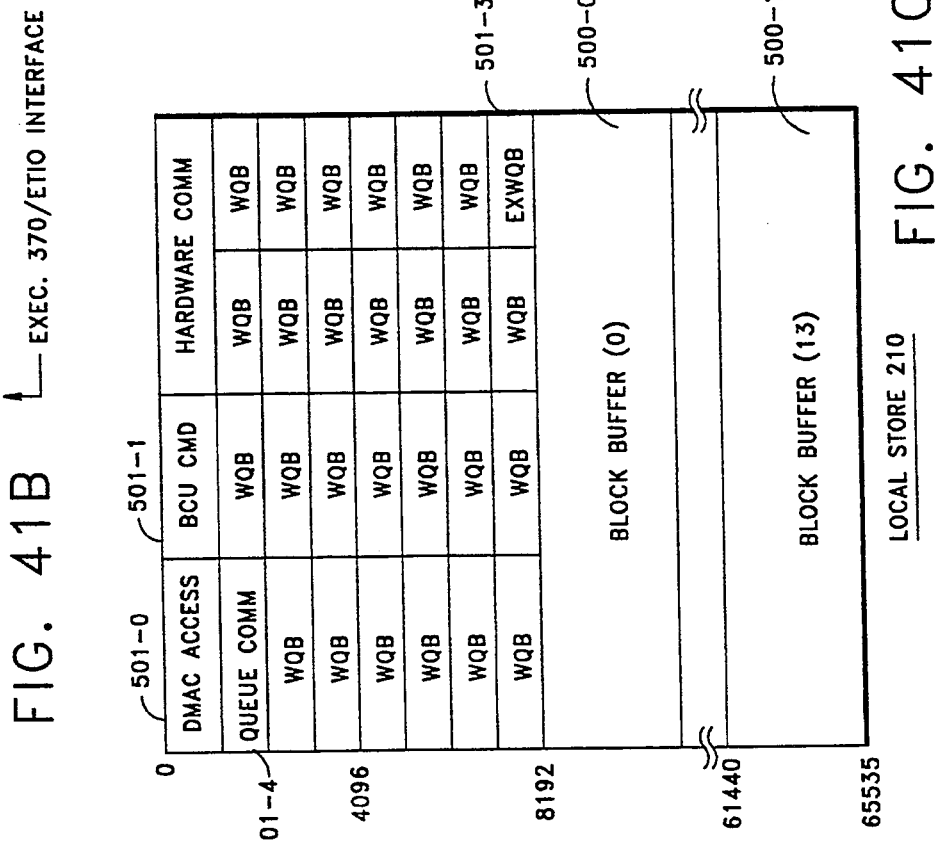
FIG. 41A
FIG. 41B
FIG. 41C

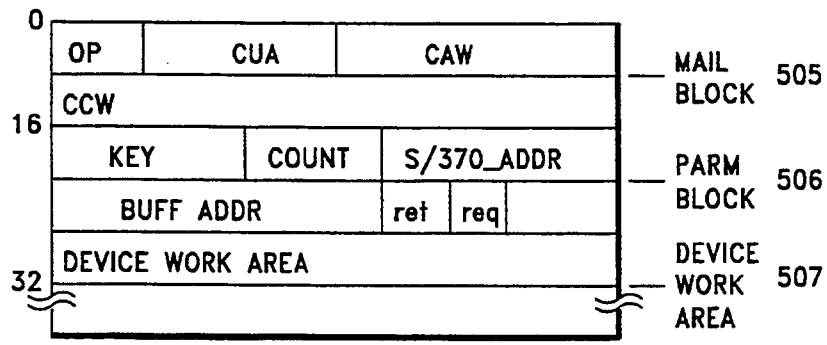
FIG. 41D — WQB
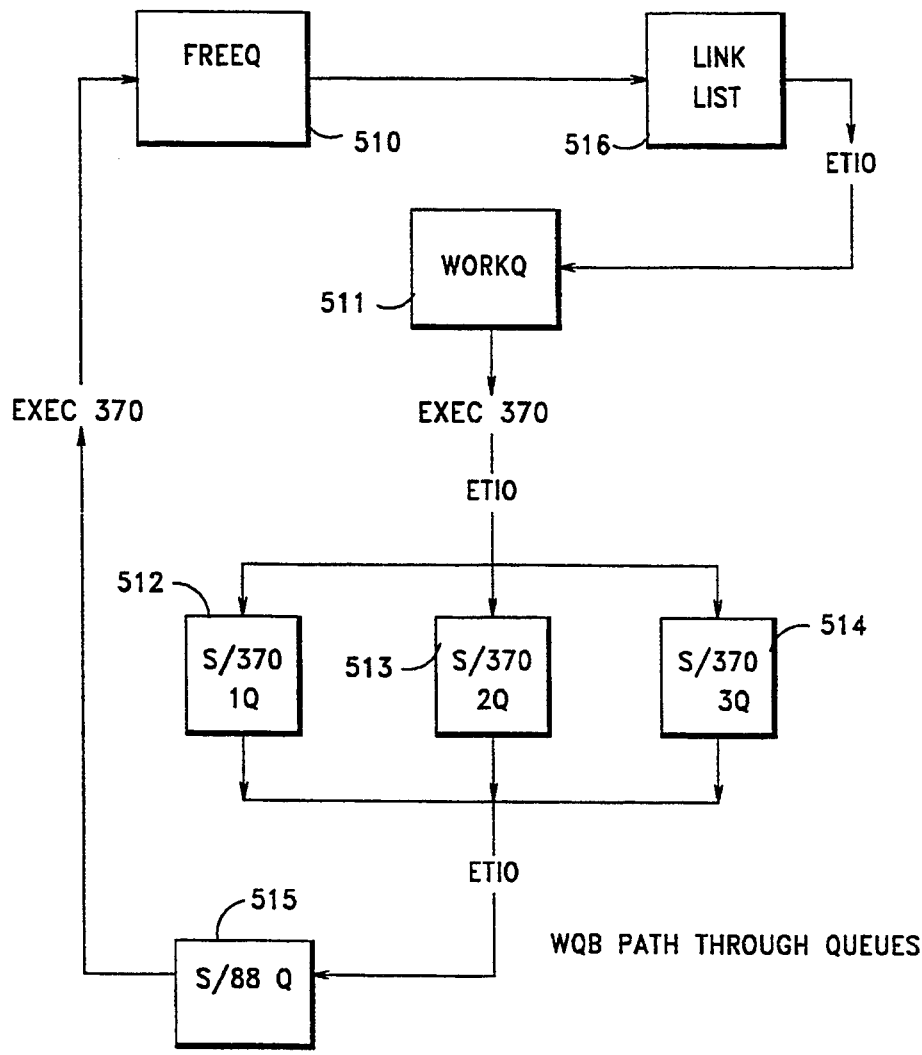
FIG. 41E — WQB PATH THROUGH QUEUES

| OFFSET | | | | |
|---|---|---|---|---|
| 0 | EXBUSY | | | 501-4 |
| 4 | EX S/370 EVENT ID | | | |
| 8 | FREE Q | 40b | (32 ENTRIES) | |
| 48 | WORK Q | 40b | (32 ENTRIES) | |
| 88 | CAP1Q | 40b | (32 ENTRIES) | |
| 128 | CAP2Q | 40b | (32 ENTRIES) | |
| 168 | CAP3Q | 40b | (32 ENTRIES) | |
| 208 | S/88 Q | 40b | (32 ENTRIES) | |
| 248 | RESERVED | 8b | 255 | |

| LINK LIST | | 516 |
|---|---|---|
| NEXT LINK | WQB ADDRESS | COUNT |
| | | |
| | | |

COMMAND/STATUS

ADDRESS/DATA BUS

ADDRESS BUS

DATA BUS

ADDRESS BUS

DATA BUS

COMMAND/STATUS

ADDRESS/DATA BUS

PROCESSOR BUS

KEY/STATUS BUS

ADDRESS BUS

DATA BUS

ADDRESS BUS

DATA BUS

COMMAND/STATUS

ADDRESS/DATA BUS

PROCESSOR BUS

KEY/STATUS BUS

ADDRESS BUS

DATA BUS

ADDRESS BUS

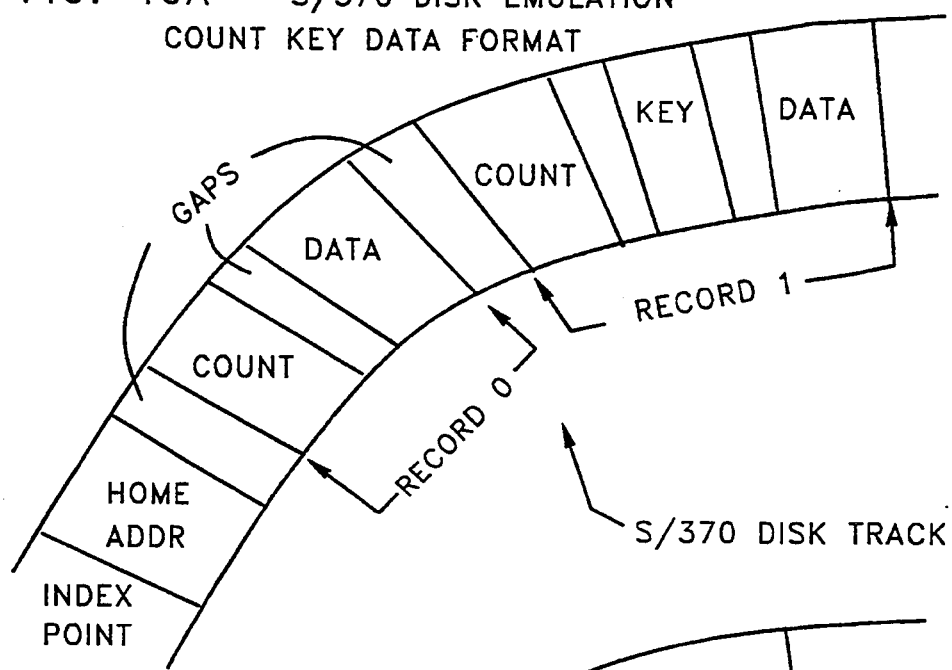
FIG. 46A — S/370 DISK EMULATION COUNT KEY DATA FORMAT
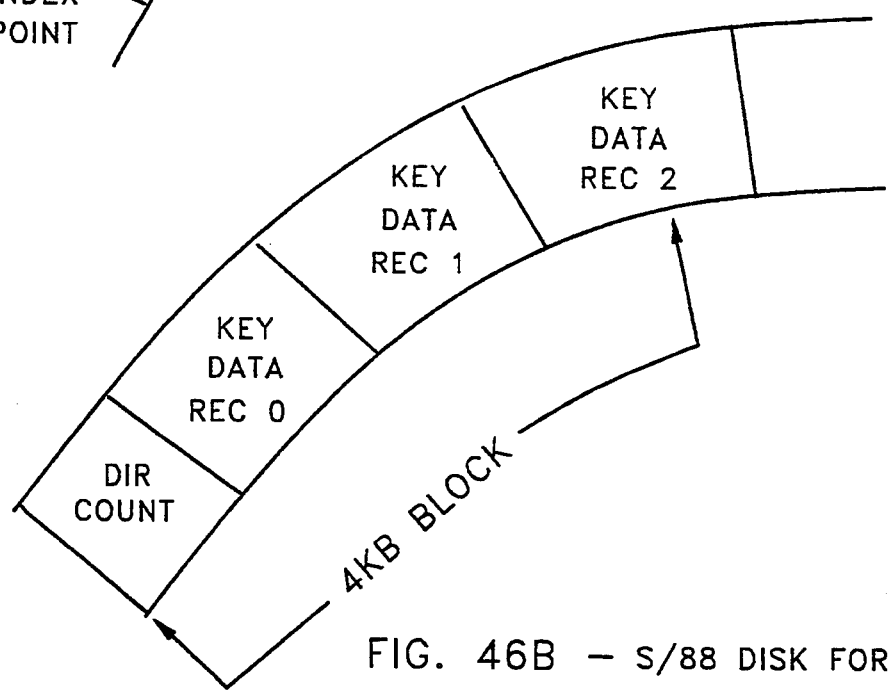
FIG. 46B — S/88 DISK FORMAT

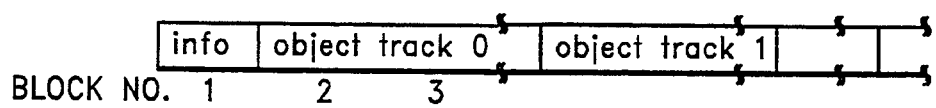
FIG. 46C – S/88 DISK BLOCKS
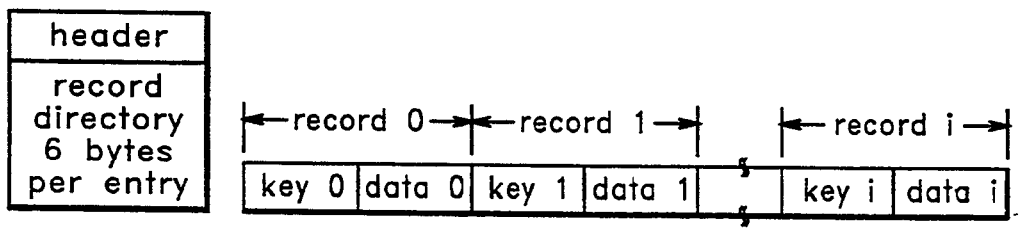
FIG. 46D
read/write
home address
| FCCHH |
FIG. 46F
record zero
| CCHHR KL DL | key | data |
first record in track
FIG. 46G

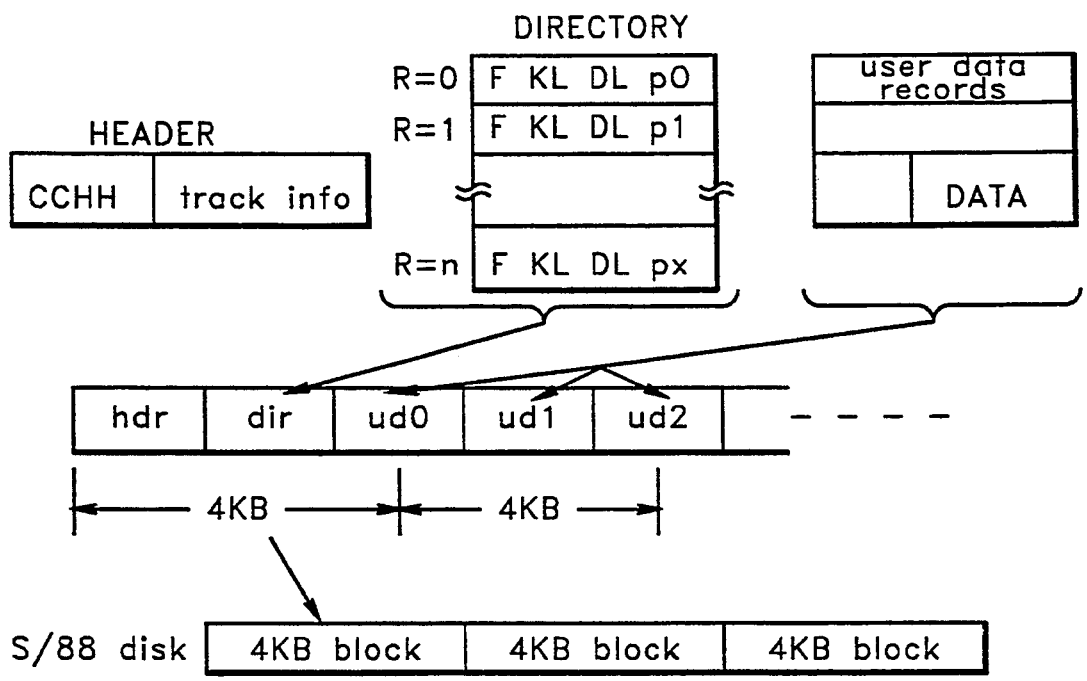
FIG. 46E — Count, Key, and Data Emulation format count
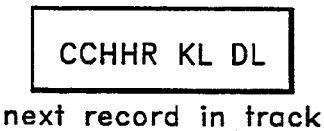
next record in track
FIG. 46H
key & data
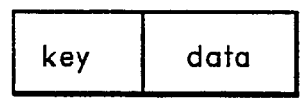
next record in track
FIG. 46I
count key & data
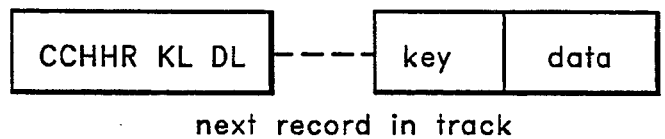
next record in track
FIG. 46J
multi count key & data
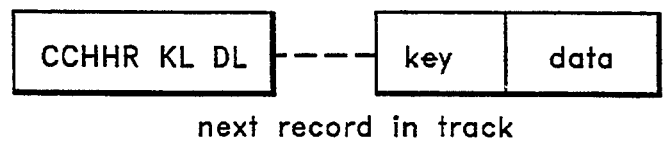
next record in track
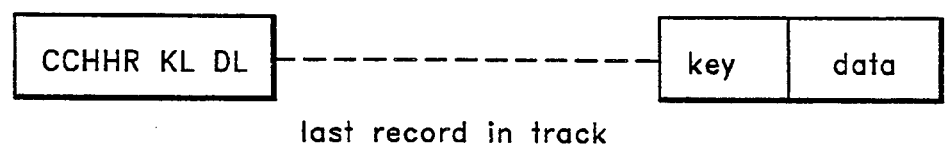
last record in track
FIG. 46K

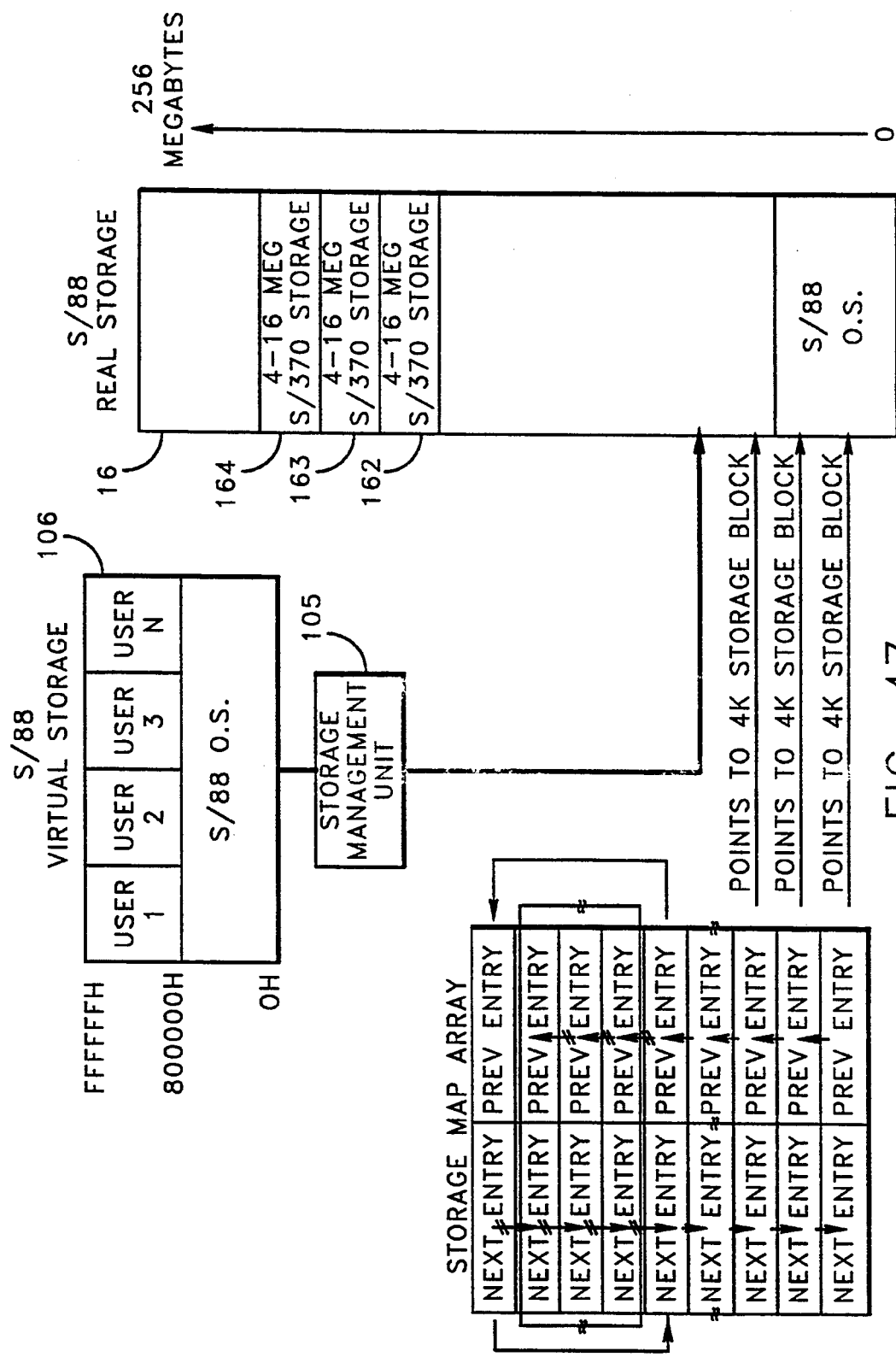

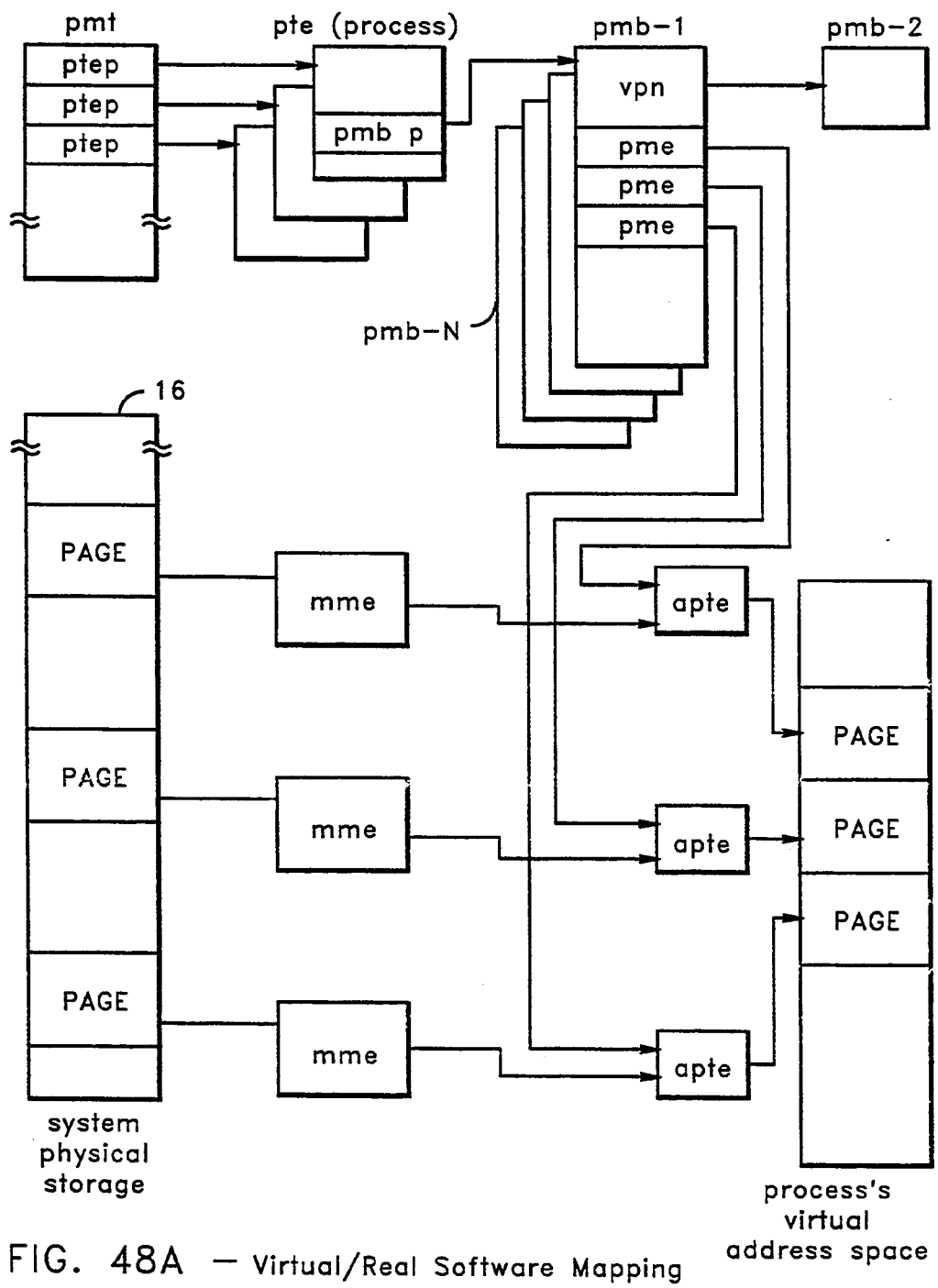
FIG. 48A — Virtual/Real Software Mapping mme

| flags | next mme | prev mme | address | aptep |

FIG. 48B — Memory Map Entry

FIG. 48E — Active Page Table Entry

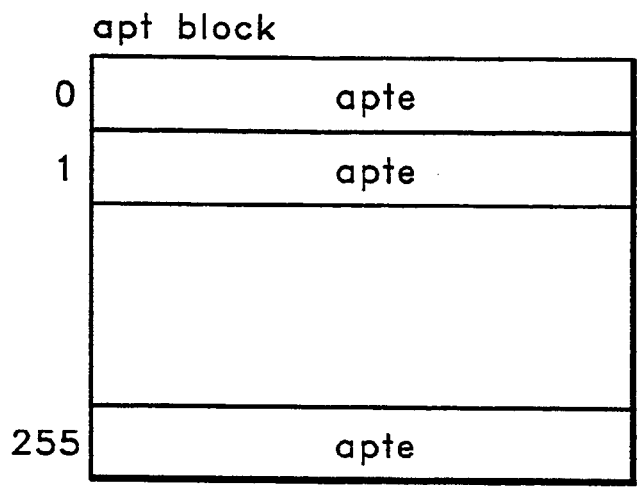
FIG. 48F — Active Page Table Block
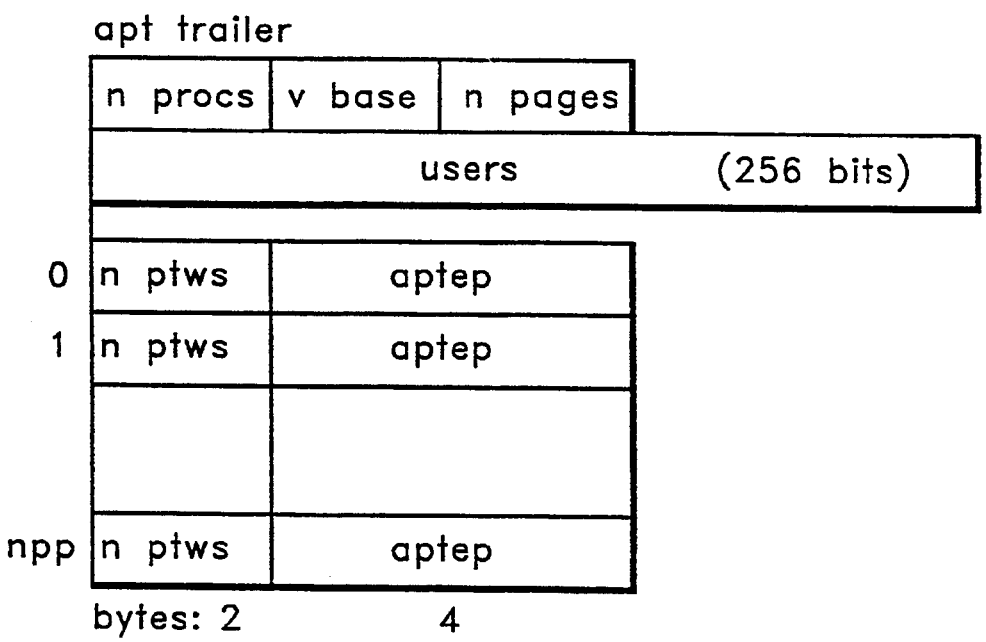
FIG. 48G — Active Page Table Trailer pte

```
Client info: process id, name, etc
process info: priority, type, number, etc.
flags: process scheduler, page control
sched info: etc
pc and mem mgmt, PMBp, map slot, user fence
        prepare mmes, pages used, vm file.
        ROOT table ptrs
other: meters, cpu profile, stack info.
        process interrupts, EITEp,
        sub process, cache mgr. request
        etc.
``` explicits:

| first pmb ptr |
| map root tbl phys addr |
| map root ptr phys |
| pdr ptr |

FIG. 48H — Process Table Entry pmb

| next p | base vpn | map addr |

|    | flags | aptep |
|----|-------|-------|
| 0  | flags | aptep |
|    |       |       |
| 63 | flags | aptep |

FIG. 48I — Process Map Block

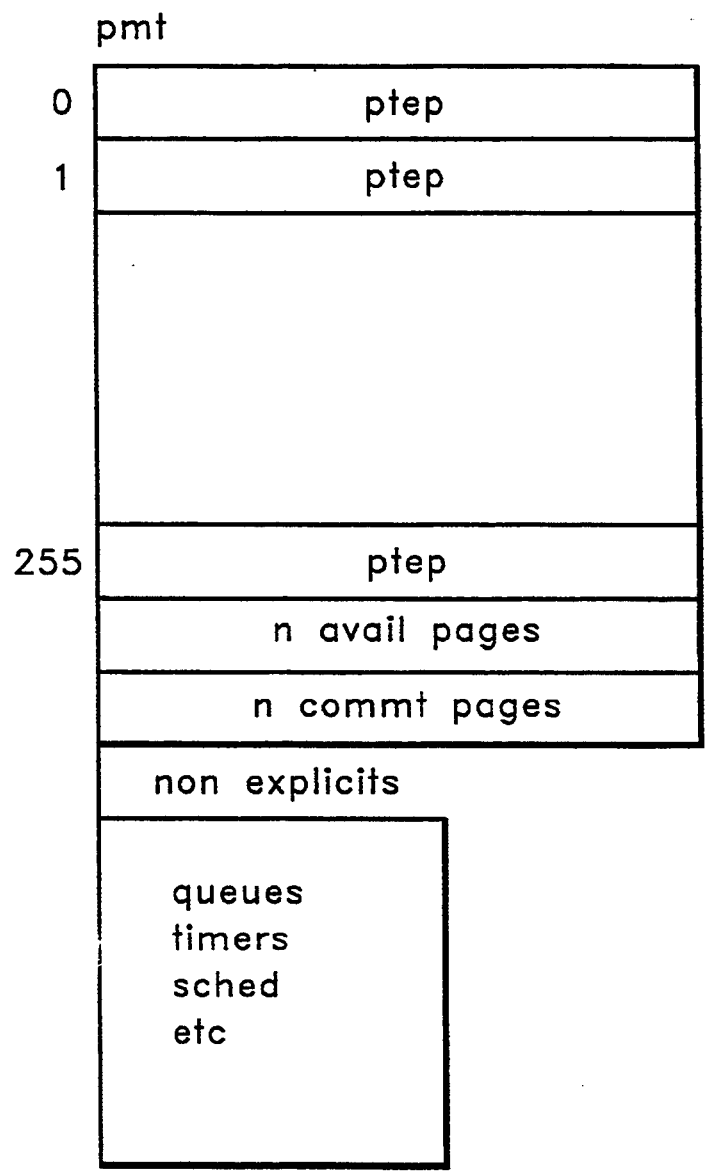
FIG. 48J — Process Management Table
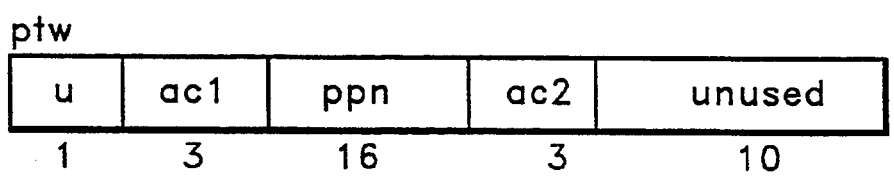
FIG. 48K — Physical Table Word

SERVICING INTERRUPT REQUESTS IN A DATA PROCESSING SYSTEM WITHOUT USING THE SERVICES OF AN OPERATING SYSTEM

The subject application is related to other applications having different joint inventorships filed on the same day and assigned to a common assignee. These other applications are:

| Ser. No. | Title | Inventors |
| --- | --- | --- |
| 07/353116 | Fault Tolerant Data Processor System | E. D. Baker<br>J. M. Dinwiddie<br>L. E. Grice<br>J. M. Joyce<br>J. M. Loffredo<br>K. R. Sanderson<br>G. A. Suarez |
| 07/353114 | Uncoupling A Central Processing Unit From Its Associated Hardware For Interaction With Data Handling Apparatus Alien To The Operating System Controlling Said Unit And Hardware | E. D. Baker<br>J. M. Dinwiddie<br>L. E. Grice<br>J. M. Joyce<br>J. M. Loffredo<br>K. R. Sanderson |
| 07/353113 | A Single Physical Main Storage Shared By Two Or More Processors Executing Respective Operating Systems | E. D. Baker<br>J. M. Dinwiddie<br>L. E. Grice<br>J. M. Loffredo<br>K. R. Sanderson<br>G. A. Suarez |
| 07/353111 | Providing Additional System Characteristics To A Data Processing System | E. D. Baker<br>J. M. Dinwiddie<br>L. E. Grice<br>J. M. Joyce<br>J. M. Loffredo<br>K. R. Sanderson |
| 07/353115 | Method And Apparatus For The Direct Transfer Of Information Between Application Programs Running On Distinct Processors Without Utilizing The Services Of One Or Both Operating Systems | E. D. Baker<br>J. M. Dinwiddie<br>L. E. Grice<br>J. M. Joyce<br>J. M. Loffredo<br>K. R. Sanderson |
| 07/353112 now U.S. Pat. No. 5,113,522 issued May 12, 1992 | Data Processing System With System Resource Management For Itself And For An Associated Alien Processor | J. M. Dinwiddie<br>B. J. Freeman<br>L. E. Grice<br>J. M. Loffredo<br>K. R. Sanderson<br>G. A. Suarez |

TABLE OF CONTENTS

Background of the Invention
    Field of the Invention
    Prior Art
Summary of the Invention
Brief Description of the Drawings
Description of the Preferred Embodiment
    Introduction
        1. Operating a Normally Non-Fault Tolerant Processor in a Fault Tolerant Environment
        2. Uncoupling a Processor from Its Associated Hardware to Present Commands and Data from Another Processor to Itself
        3. Presentation of Interrupts to a System Transparent to the Operating System
        4. Sharing a Real Storage Between Two or More Processors Executing Different Virtual Storage Operating Systems
        5. Single System Image
        6. Summary
    Prior Art System/88 Detail
    Fault Tolerant S/370 Module 9 Interconnected via Links, Networks
    General Description of Duplexed Processor Partner Units 21, 23
    Coupling of S/370 and S/88 Processor Elements 85, 62
    Processor to Processor Interface 89
        1. I/O Adapter 154 (Note: Uses FIG. 18 re IOA)
        2. I/O Adapter Channel 0 and Channel 1 Bus
        3. The Bus Control Unit 156—General Description
        4. Direct Memory Access Controller 209
        5. Bus Control Unit 156—Detailed Description
            (a) Interface Registers for High Speed Data Transfer
            (b) BCU Uncouple and Interrupt Logic 215, 216
            (c) BCU Address Mapping
            (d) Local Address and Data Bus Operations
            (e) S/88 Processor 62 and DMAC209 Addressing To/From Local Storage 210
            (f) BCU Basic Storage Module (BSM) RD/WR Byte Counter Operation
            (g) Handshake Sequences BCU 156/Adapter 154
    S/370 Processor Element 85
    Processor Bus 170 and Processor Bus Commands
    S/370 Storage Management Unit 81
        1. Cache Controller 153
        2. STCI 155
            (a) Introduction
            (b) System Bus Phases
            (c) STCI Features
            (d) Data Store Operations
            (e) Data Fetch Operations
    S/370 I/O Support
    S/370 I/O Operations, Firmware Overview
    System Microcode Design
        1. Introduction
        2. ETIO/EXEC370 Program Interface
        3. EXEC370, S/370 Microcode Protocol
        4. Instruction Flows Between S/370 Microcode and EXEC370
    Operation of the Bus Control Unit (BCU) 156
        1. Introduction
        2. S/370 Start I/O Sequence Flow, General and Detailed Description
        3. S/370 I/O Data Transfer Sequence Flow, General Description
            (a) I/O Write Operations:
            (b) I/O Read Operation:
            (c) S/370 High Priority Message Transfer Sequence Flow
            (d) BCU Status Command
            (e) Programmed BCU Reset
    Count, Key, and Data Track Format Emulation
        1. The Object System
        2. The Target System
        3. The Emulation Format
        4. Emulation Functions
    Sharing of Real Storage 16 by S/88 and S/370
        1. Introduction
        2. Mapping S/88 Storage 16
        3. Startup Procedure
        4. Start S/370 Service Routine
        5. Unthread Chosen String of MMC's From Free List
        6. Writing Storage Base and Size to STCI
    Initialization Functions for Uncoupling S/88 Interrupts Initiated by S/370

Gain Freedom Without Modifying the S/88 Operating System
Stealing Storage Without Modifying S/88 OS
Power on and Synchronization of Simplexed and Partner Units 21, 23
(S/88 Processing Unit as a Service Processor for S/370 Processing Unit)
1. Introduction
2. Fault Tolerant Hardware Synchronization
3. A Simplexed Processing Unit 21 is Powered On
   (a) Hardware Implementation
   (b) Microcode—Only Implementation
4. Duplexed Processing Units 21, 23 are Powered On
   (a) Hardware Implementation
   (b) Microcode—Only Implementation
5. A Partner 23 Is Inserted While The Other Unit 21 Processes Normally
   (a) Hardware Implementation
   (b) Microcode—Only Implementation
6. A Partner Detects A Compare Failure
   (a) Hardware Implementation
   (b) Microcode—Only Implementation
Alternative Embodiments
1. Use In Other (Non-S/88) Fault-Tolerant Systems
2. Direct Data Transfers Between S/88 I/O Controllers and S/370 Main Storage
3. Uncoupling Both Processors of a Directly Connected Pair

BACKGROUND OF THE INVENTION

1. Field of the Invention

The improvement of the present application relates to the servicing of interrupt requests to a processor unit, and more particularly to the servicing of interrupt requests from apparatus which is alien to the operating system under which the processor unit runs, i.e. the operating system has no routines provided for servicing a request from the apparatus.

2. Prior Art

Most current data processing programs execute in one of two (or more) states, a supervisor state or a user state. Application programs run in user state, and functions such as the servicing of interrupt requests are performed by operating system routines running in supervisor state.

An application program contains instructions to attach to an I/O port, then opens the port, issues an I/O request in the form of a read, write or control. At that time the processor will take a task switch. When the operating system receives an interrupt signifying an I/O completion, then the operating system will put this information into a ready queue and sort by priority for system resources.

The operating system reserves all interrupt vectors for its own use; none are available for new features such as an external interrupt signifying an I/O request from another machine, such as a processor alien to the operating system.

Often a majority of the available interrupt vectors are actually unused, and these are set up to cause vectoring to a common error handler for 'uninitialized' or 'spurious' interrupts, as is the common practice in operating systems.

It is therefore the primary object of the present improvement to provide an improved method and means for servicing interrupt requests to a processor from apparatus alien to the operating system under which the processor operates.

SUMMARY OF THE INVENTION

To achieve this object, special interrupt routines for handling interrupt requests from alien apparatus are provided in the form of application program routines adapted to run on the processor. When an interrupt request is received from the alien apparatus, logic means including the processor inhibit the selection of the normal operating system interrupt handler routines and alternatively select one of the special interrupt routines without the operating system being aware that an interrupt request was received. The alien interrupt request is then serviced by the selected special interrupt routine without the use of operating system services.

BRIEF DESCRIPTION OF THE DRAWINGS

FIG. 13 diagrammatically illustrates the S/370 bus adapter;

FIGS. 14A, 14B and 15A-C illustrate conceptually the timing and movement of data across the output channels of the S/370 bus adapter;

FIG. 18 shows DMAC registers for one of its four channels;

FIG. 31 is a block diagram of a preferred form of a S/370 cache controller;

FIGS. 32A and 32B (with layout FIG. 32) schematically illustrate a preferred form of the storage control interface in greater detail;

FIG. 35 shows formats of the command and store data words stored in the FIFO of FIG. 32B;

FIG. 36A-D illustrate store and fetch commands from the S/370 processor and adapter which are executed in the storage control interface;

FIGS. 41A and 41B illustrate conceptually interfaces and protocols between EXEC 370 software and S/370 microcode and between ETIO microcode and EXEC 370 software;

FIGS. 41C—H illustrate the contents of the BCU local store including data buffers, work queue buffers, queues, queue communication areas and hardware communication areas including a link list and the movement of work queue buffers through the queues, which elements comprise the protocol through which S/370 microcode and EXEC 370 software communicate with each other;

FIGS. 46A-K illustrate conceptually a preferred form of disk emulation process whereby the S/88 (via the BCU, ETIO and EXEC 370) stores and fetches information on a S/88 disk in S/370 format in response to S/370 I/O instructions;

FIG. 47 illustrates conceptually the memory mapping of FIG. 10 together with a view of the S/88 storage map entries, certain of which are removed to accommodate one S/370 storage area;

FIGS. 48A-K illustrate a preferred form of virtual/physical storage management for the S/88 which can interact with newly provided subroutines during system start-up and reconfiguration routines to create S/370 storage areas within the S/88 physical storage;

DESCRIPTION OF THE PREFERRED EMBODIMENT

INTRODUCTION

Figure 1:
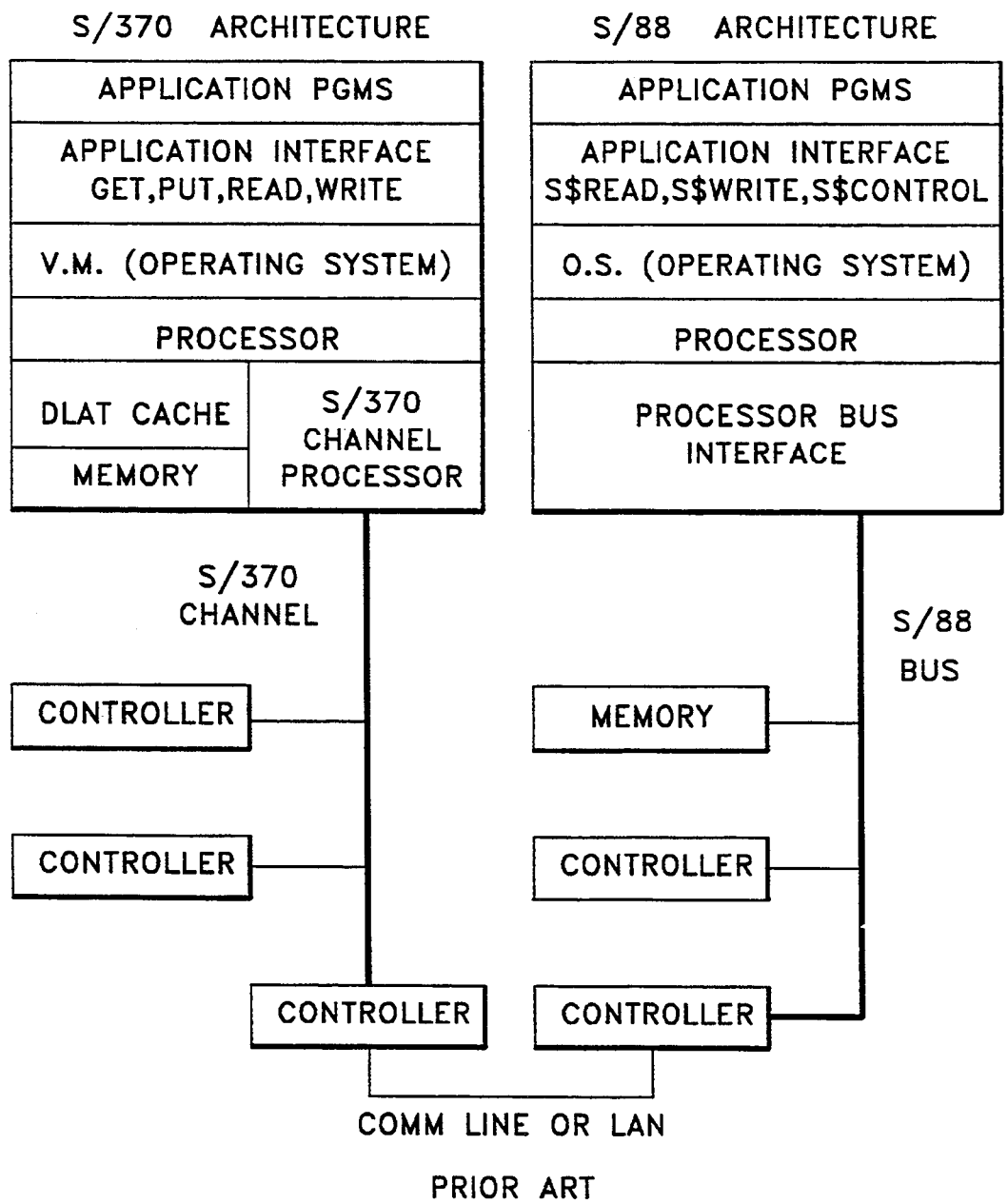
FIG. 1 diagrammatically illustrates the standard interconnection computer systems utilizing a communication line.

The preferred embodiment for implementing the present invention comprises a fault tolerant system. Fault tolerant systems have typically been designed from the bottom up for fault tolerant operation. The processors, storage, I/O apparatus and operating systems have been specifically tailored to provide a fault tolerant environment. However, the breadth of their customer base, the maturity of their operating systems, the number and extent of the available user programs are not as great as those of the significantly older mainframe systems of several manufacturers such as the System/370 (S/370) system marketed by International Business Machines Corporation.

Today's fault tolerant data processing systems offer many advanced features that are not normally available on the older non-fault tolerant mainframe systems or that are not supported by the mainframe operating systems. Some of these features include: a single system image presented across a distributed computing network; the capability to hot plug processors and I/O controllers (remove and install cards with power on); instantaneous error detection, fault isolation and electrical removal from service of failed components without interruption to the computer user; customer replaceable units identified by remote service support; and dynamic reconfiguration resulting from component failure or adding additional devices to the system while the system is continuously operating. One example of such fault tolerant systems is the System/88 (S/88) system marketed by International Business Machines Corporation.

Proposals for incorporating the above features into the S/370 environment and architecture might typically consist of a major rewrite of the operating system(s) and user application programs and/or new hardware developed from scratch. However, the major rewrite of an operating system such as VM, VSE, IX370, etc. is considered by many to be a monumental task, requiring a large number of programmers and a considerable period of time. It usually takes more than five years for a complex operating system such as IBM S/370 VM or MVS to mature. Up to this time most system crashes are a result of operating system errors. Also, many years are required for users to develop proficiency in the use of an operating system. Unfortunately, once an operating system has matured and has developed a large user base, it is not a simple effort to modify the code to introduce new functions such as fault tolerance, dynamic reconfiguration, single system image, and the like.

Because of the complexities and expense of migrating a mature operating system into a new machine architecture, the designers will usually decide to develop a new operating system which may not be readily accepted by the using community. It may prove impractical to modify the mature operating system to incorporate the new features exemplified by the newly developed operating system; however, the new operating system may never develop a substantial user base, and will take many years of field usage before most problems are resolved.

Accordingly, it is intended that the present improvement will provide a fault tolerant environment and architecture for a normally non-fault-tolerant processing system and operating system without major rewrite of the operating system. In the preferred embodiment a model of IBM System/88 is coupled to a model of an IBM S/370.

One current method of coupling distinct processors and operating systems is through some kind of communications controller added to each system, appending device drivers to the operating systems, and using some kind of communication code such as Systems Network Architecture (SNA) or OSI to transport data. Normally, to accomplish data communications between end-node computers in a network, it is necessary that the end nodes each understand and apply a consistent set of services to data that is to be exchanged.

To reduce their design complexity, most networks are organized as a series of layers or levels, each one built upon its predecessor. The number of layers, the name of each layer, and the function of each layer differ from network to network. However, in all networks, the purpose of each layer is to offer certain services to the higher layers, shielding those layers from the details of how the offered services are actually implemented. Layer n on one machine carries on a conversation with layer n on another machine. The rules and conventions used in this conversation are collectively known as the layer n protocol. The entities comprising the corresponding layers on different machines are called peer processes, and it is the peer processes that are said to communicate using the protocol.

In reality, no data are directly transferred from layer n on one machine to layer n on another machine (except in the lowest or physical layer). That is, there can be no direct coupling of application programs operating on distinct or alien systems. Instead, each layer passes data and control information to the layer immediately below it, until the lowest layer is reached. At the lowest layer there is physical communication with the other machine, as opposed to the virtual communication used by the higher layers.

Definitions of these sets of services have existed in a number of different networks as mentioned above and more recently, interest has centered on provision of protocols to ease interconnection of systems from different vendors. A structure for development of these protocols is the framework defined by the International Standards Organization (ISO) seven layer OSI (Open Systems Interconnect) model. Each of the layers in this model is responsible for providing networking services to the layer above it while requesting services from the layer below it. The services provided at each layer are well defined so that they can be applied consistently by each station in the network. This is said to allow for the interconnection of different vendors' equipment. Implementation of layer to layer services within a node is implementation-specific and allows vendor differentiation on the basis of services provided within a station.

It is important to note that the entire purpose of implementing such a structured set of protocols is to perform end-to-end transfer of data. The major divisions within the OSI model can be better understood if one realizes that the user node is concerned with the delivery of data from the source application program to the recipient application program. To deliver this data, the OSI protocols act upon the data at each level to furnish frames to the network. The frames are built up as the data coupled with corresponding headers applied at each OSI level. These frames are then provided to the physical medium as a set of bits which are transmitted through the medium. They then undergo a reverse set of procedures to provide the data to the application program at the receiving station.

As stated earlier, one current method of coupling distinct processors and operating systems is through some kind of communications controller added to each system, appending device drivers to the operating systems, and using some kind of communication code such as Systems Network Architecture (SNA) or OSI to transport data. FIG. 1 shows a standard interconnection of two computer systems by means of a Local Area Network (LAN). In particular an IBM S/370 architecture system is shown connected to an IBM System/88 architecture. It will be observed that in each architecture an application program operates through an interface with the operating system to control a processor and access an I/O channel or bus. Each architecture device has a communications controller to exchange data. In order to communicate, a multi-layered protocol must be utilized to allow data to be exchanged between the corresponding application programs.

An alternative method to exchange data would be a coprocessor method in which the coprocessor resides on the system bus, arbitrates for the system bus, and uses the same I/O as the host processor. The disadvantage of the coprocessor method is the amount of code rewrite required to support non-native (alien) host I/O. Another disadvantage is that the user must be familiar with both systems architectures to switch back and forth from coprocessor to host operating systems—an unfriendly user environment.

A prior art fault tolerant computer system has a processor module containing a processing unit, a random access memory unit, peripheral control units, and a single bus structure which provides all information transfers between the several units of the module. The system bus structure within each processor module includes duplicate partner buses, and each functional unit within a processor module also has a duplicate partner unit. The bus structure provides operating power to units of a module and system timing signals from a main clock.

Figure 2:
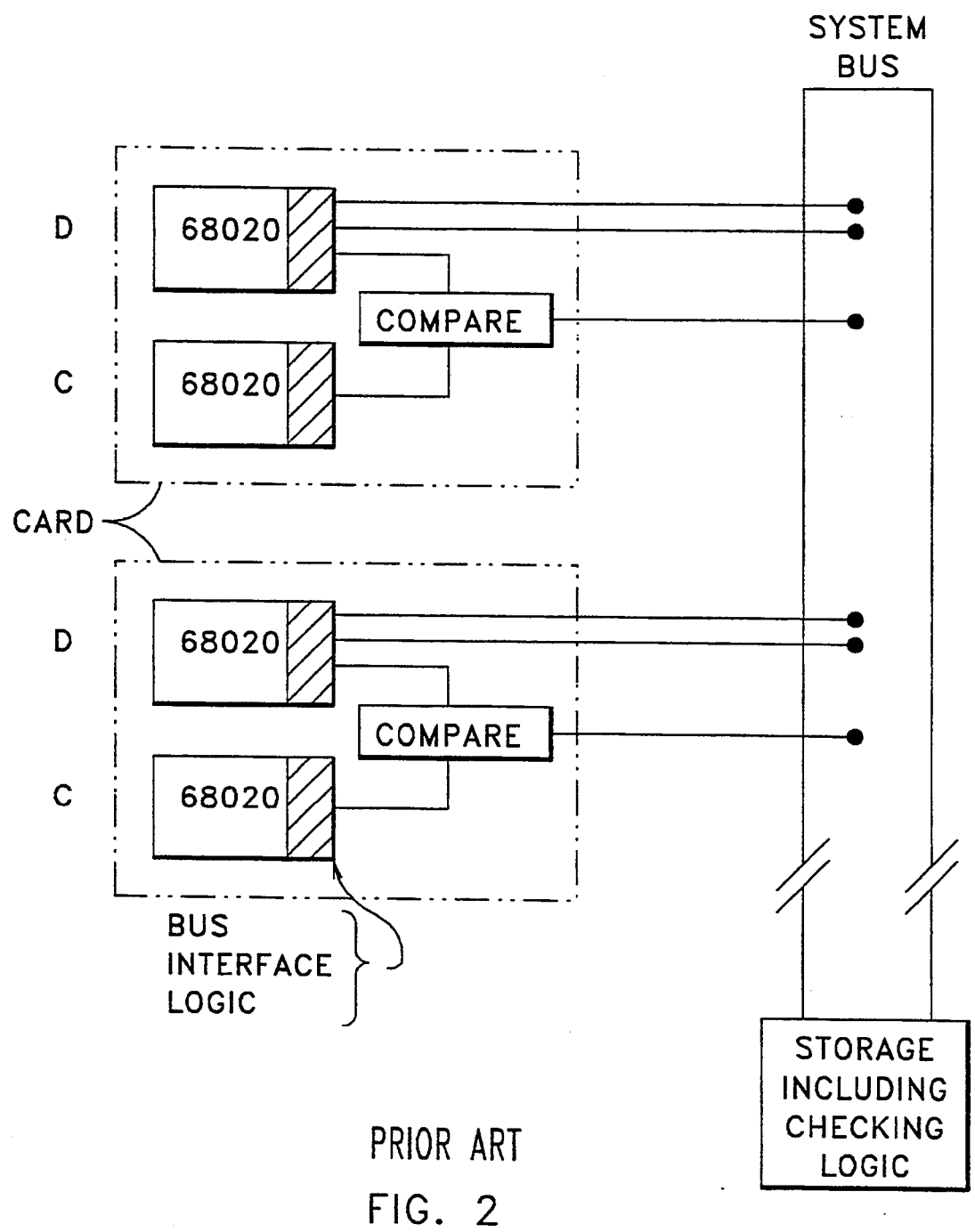
FIG. 2 shows diagrammatically the interconnection of S/88 processors in a fault tolerant environment.

FIG. 2 shows in the form of a functional diagram the structure of the processor unit portion of a processor module. By using identical paired processors mounted on a common replacement card and executing identical operations in synchronization, comparisons can be made to detect processing errors. Each card normally has a redundant partnered unit of identical structure.

The computer system provides fault detection at the level of each functional unit within the entire processor module. Error detectors monitor hardware operations within each unit and check information transfers between units. The detection of an error causes the processor module to isolate the unit which caused the error and to prohibit it from transferring information to other units, and the module continues operation by employing the partner of the faulty unit.

Upon detection of a fault in any unit, that unit is isolated and placed off-line so that it cannot transfer incorrect information to other units. The partner of the now off-line unit continues operating and thereby enables the entire module to continue operating. A user is seldom aware of such a fault detection and transition to off-line status, except for the display or other presentation of a maintenance request to service the off-line unit. The card arrangement allows easy removal and replacement.

The memory unit is also assigned the task of checking the system bus. For this purpose, the unit has parity checkers that test the address signals and that test the data signals on the bus structure. Upon determining that either bus is faulty, the memory unit signals other units of the module to obey only the non-faulty bus. The power supply unit for the processor module employs two power sources, each of which provides operating power to only one unit in each pair of partner units. Upon detecting a failing supply voltage, all output lines from the affected unit to the bus structure are clamped to ground potential to prevent a power failure from causing the transmission of faulty information to the bus structure.

Figure 3:
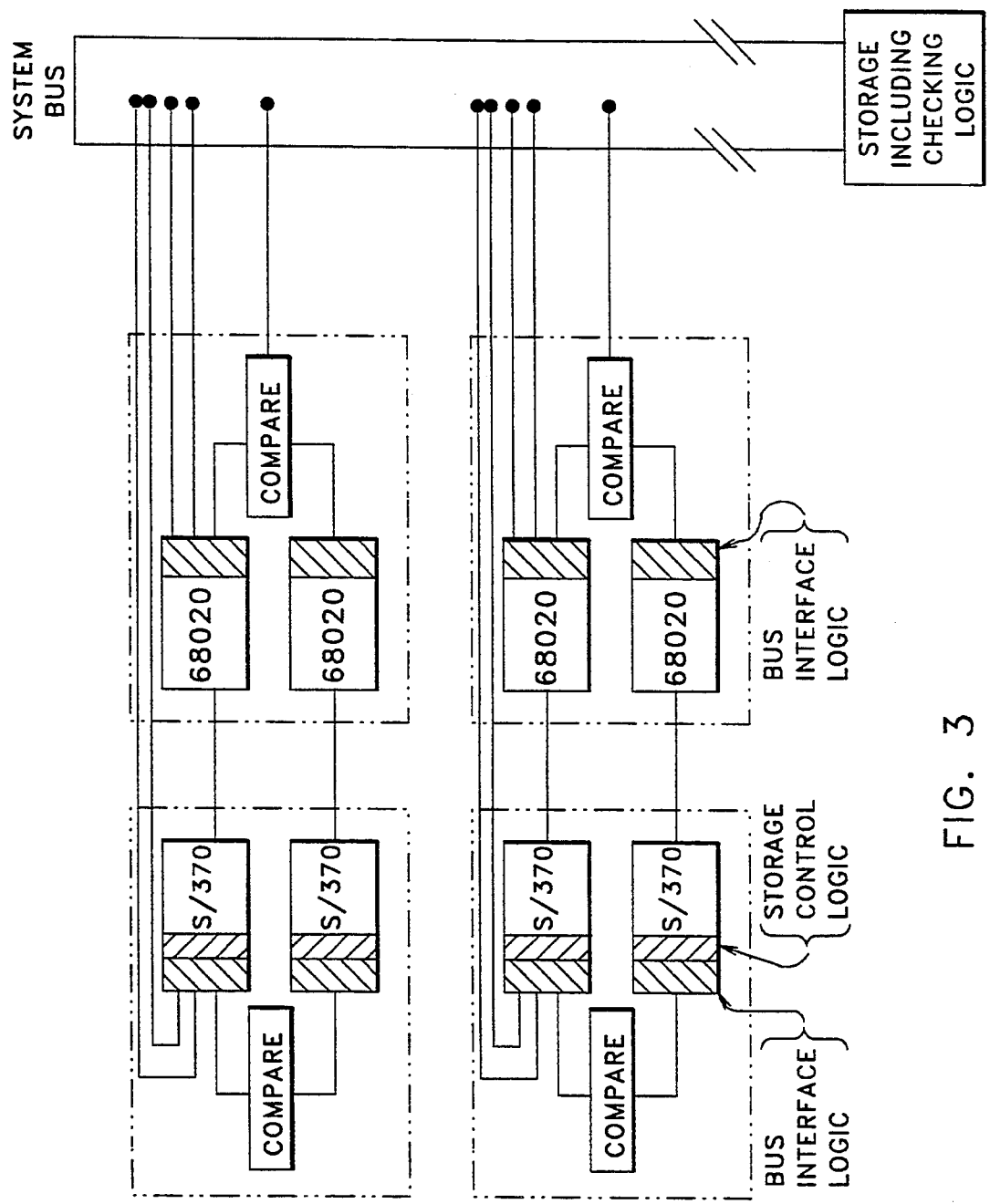
FIG. 3 shows diagrammatically the interconnection of S/370 processors with S/88 processors in the preferred embodiment.

FIG. 3 shows in the form of a functional diagram, the interconnection of paired S/370 processors with paired S/88 processors in the manner of a fault tolerant structure to enable the direct exchange of data. The similarity to the prior S/88 structure (FIG. 2) is intentional but it is the unique interconnection by means of both hardware and software that establishes the operation of the preferred embodiment. It will be observed that the S/370 processors are coupled to storage control logic and bus interface logic in addition to the S/88 type compare logic. As will be described the compare logic will function in the same manner as the compare logic for the S/88 processors. Moreover the S/370 processors are directly coupled and coupled through the system bus to corresponding S/88 processors. As with the S/88 processor the S/370 processors are coupled in pairs and the pairs are intended to be mounted on field replaceable, hot-pluggable, circuit cards. The detailed interconnections of the several drivers will be described in greater detail later.

The preferred embodiment interconnects plural S/370 processors for executing the same S/370 instructions concurrently under control of a S/370 operating system. These are coupled to corresponding plural S/88 processors, I/O apparatus and main storage, all executing the same S/88 instructions concurrently under control of a S/88 operating system. As will be described later means are included to asynchronously uncouple the S/88 processors from their I/O apparatus and storage, to pass S/370 I/O commands and data from the S/370 processors to the S/88 processors while the latter are uncoupled, and to convert the commands and data to a form useable by the S/88 for later processing by the S/88 processors when they are recoupled to their I/O apparatus and main storage.

1. Operating a Normally Non-Fault Tolerant Processor in a Fault Tolerant Environment The previously listed fault tolerant features are achieved in a preferred embodiment by coupling normally non-fault-tolerant processors such as S/370 processors in a first pair which execute the same S/370 instructions simultaneously under control of one of the S/370 operating systems. Means are provided to compare the states of various signals in one processor with those in the other processor for instantaneously detecting errors in one or both processors.

A second partner pair of S/370 processors with compare means are provided for executing the same S/370 instructions concurrent with the first pair and for detecting errors in the second pair. Each S/370 processor is coupled to a respective S/88 processor of a fault-tolerant system such as the S/88 data processing system having first and partner second pairs of processors, S/88 I/O apparatus and S/88 main storage. Each S/88 processor has associated therewith hardware coupling it to the I/O apparatus and main storage.

The respective S/370 and S/88 processors each have their processor buses coupled to each other by means including a bus control unit. Each bus control unit includes means which interacts with an application program running on the respective S/88 processor to asynchronously uncouple the respective S/88 processor from its associated hardware and to couple it to the bus control unit (1) for the transfer of S/370 commands and data from the S/370 processor to the S/88 processor and (2) for conversion of the S/370 commands and data to commands executable by and data useable by the S/88.

The S/88 data processing system subsequently processes the commands and data under control of the S/88 operating system. The S/88 data processing system also responds to error signals in either one of the S/370 processor pairs or in their respectively coupled S/88 processor pair to remove the coupled pairs from service and permit continued fault tolerant operation with the other coupled S/370 , S/88 pairs. With this arrangement, S/370 programs are executed by the S/370 processors (with the assistance of the S/88 system for I/O operations) in a fault tolerant (FT) environment with the advantageous features of the S/88, all without significant changes to the S/370 and S/88 operating systems.

In addition, the storage management unit of the S/88 is controlled so as to assign dedicated areas in the S/88 main storage to each of the duplexed S/370 processor pairs and their operating system without knowledge by the S/88 operating system. The processors of the duplexed S/370 processor pairs are coupled individually to the common bus structure of the S/88 via a storage manager apparatus and S/88 bus interface for fetching and storing S/370 instructions and data from their respective dedicated storage area.

The preferred embodiment provides a method and means of implementing fault tolerance in the S/370 hardware without rewriting the S/370 operating system or S/370 applications. Full S/370 CPU hardware redundancy and synchronization is provided without custom designing a processor to support fault tolerance. A S/370 operating system and a fault tolerant operating system, (both virtual memory systems) are run concurrently without a major rewrite of either operating system. A hardware/microcode interface is provided in the preferred embodiment between peer processor pairs, each processor executing a different operating system. One processor is a microcode controlled IBM S/370 engine executing an IBM Operating System (e.g., VM, VSE, IX370, etc.). The second processor of the preferred embodiment is a hardware fault tolerant engine executing an operating system capable of controlling a hardware fault tolerant environment (e.g., IBM System/88), executing S/88 VOS (virtual operating system).

The hardware/microcode interface between the processor pairs allows the two operating systems to coexist in an environment perceived by the user as a single system environment. The hardware/microcode resources (memory, system buses, disk I/O, tape, communications I/O terminals, power and enclosures) act independently of each other while each operating system handles its part of the system function. The words memory, storage and store are used interchangeably herein. The FT processor(s) and operating system manage error detection/isolation and recovery, dynamic reconfiguration, and I/O operations. The NFT processor(s) execute native instructions without any awareness of the FT processor. The FT processor appears to the NFT processor as multiple I/O channels.

The hardware/microcode interface allows both virtual memory processors to share a common fault tolerant memory. A continuous block of storage from the memory allocation table of the FT processor is assigned to each NFT processor. The NFT processor's dynamic address translation feature controls the block of storage that was allocated to it by the FT processor. The NFT processor perceives that its memory starts at address zero through the use of an offset register. Limit checking is performed to keep the NFT processor in its own storage boundaries. The FT processor can access the NFT storage and DMA I/O blocks of data in or out of the NFT address space, whereas the NFT processor is prevented from accessing storage outside its assigned address space. The NFT storage size can be altered by changing the configuration table.

2. Uncoupling a Processor from Its Associated Hardware to Present Commands and Data from Another Processor to Itself Adding a new device to an existing processor and operating system generally requires hardware attachment via a bus or channel, and the writing of new device driver software for the operating system. The improved "uncoupling" feature allows two distinct processors to communicate with each other without attaching one of the processors to a bus or channel and without arbitrating for bus mastership. The processors communicate without significant operating system modification or the requirements of a traditional device driver. It can give to a user the image of a single system when two distinct and dissimilar processors are merged, even though each processor is executing its own native operating system.

This feature provides a method and means of combining the special features exhibited by a more recently developed operating system, with the users view and reliability of a mature operating system. It couples the two systems (hardware and software) together to form a new third system. It will be clear to those skilled in the art that while the preferred embodiment shows a S/370 system coupled to a S/88 system any two distinct systems could be coupled. The design criteria of this concept are: little or no change to the mature operating system so that it maintains its reliability, and minimal impact to the more recently developed operating system because of the development time for code.

This feature involves a method of combining two dissimilar systems each with its own characteristics into a third system having characteristics of both. A preferred form of the method requires coupling logic between the systems that functions predominantly as a direct memory access controller (DMAC). The main objective of this feature is to give an application program running in a fault tolerant processor (e.g., S/88 in the preferred embodiment) and layered on the fault tolerant operating system, a method of obtaining data and commands from an alien processor (e.g., S/370 in the preferred embodiment) and its operating system. Both hardware and software defense mechanisms exist on any processor to prevent intrusion (i.e. supervisor versus user state, memory map checking, etc.). Typically, operating systems tend to control all system resources such as interrupts, DMA Channels, and I/O devices and controllers. Therefore, to couple two different architectures and transfer commands and data between these machines without having designed this function from the ground up is considered by many a monumental task and/or impractical.

Figure 4:
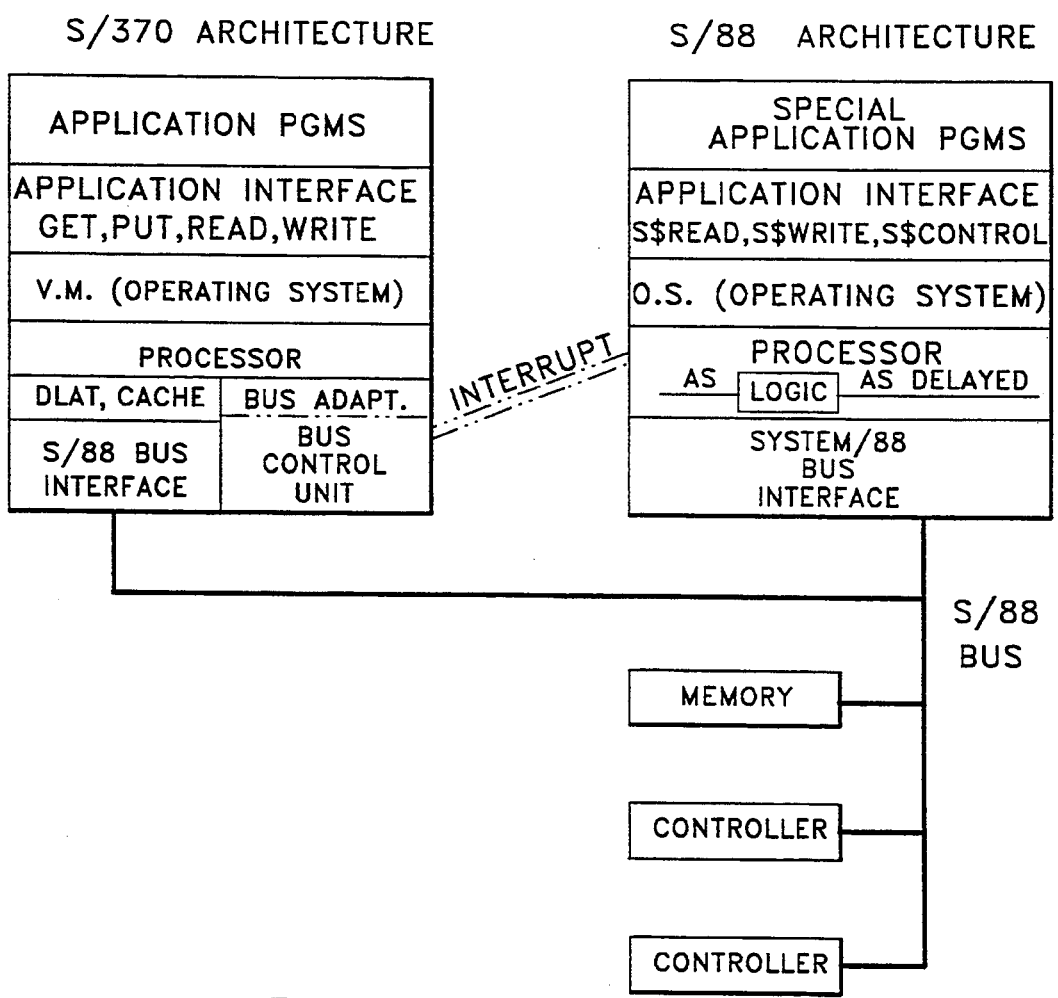
FIG. 4 shows diagrammatically a S/370 system coupled to a S/88 system in the manner of the preferred embodiment.

FIG. 4 shows diagrammatically a S/370 processor coupled to a S/88 processor in the environment of the preferred embodiment. By contrast with the S/370 processor shown in FIG. 1, the memory has been replaced by S/88 bus interface logic and the S/370 channel processor has been replaced by a bus adapter and bus control unit. Particular attention is directed to the interconnection between the S/370 bus control unit and the S/88 processor which is shown by a double broken line.

This feature involves attaching the processor coupling logic to the S/88 fault tolerant processor's virtual address bus, data bus, control bus and interrupt bus structure, and not to the system bus or channel as most devices are attached. The strobe line indicating that a valid address is on the fault tolerant processor's virtual address bus is activated a few nanoseconds after the address signals are activated. The coupling logic comprising the bus adapter and the bus control unit determines whether a preselected address range is presented by a S/88 application program before the strobe signal appears. If this address range is detected, the address strobe signal is blocked from going to the S/88 fault tolerant processor hardware. This missing signal will prevent the fault tolerant hardware and operating system from knowing a machine cycle took place. The fault tolerant checking logic in the hardware is isolated during this cycle and will completely miss any activity that occurs during this time. All cache, virtual address mapping logic and floating point processors on the processor bus will fail to recognize that a machine cycle has occurred. That is, all S/88 CPU functions are 'frozen,' awaiting the assertion of the Address Strobe signal by the S/88 processor.

Figure 5:
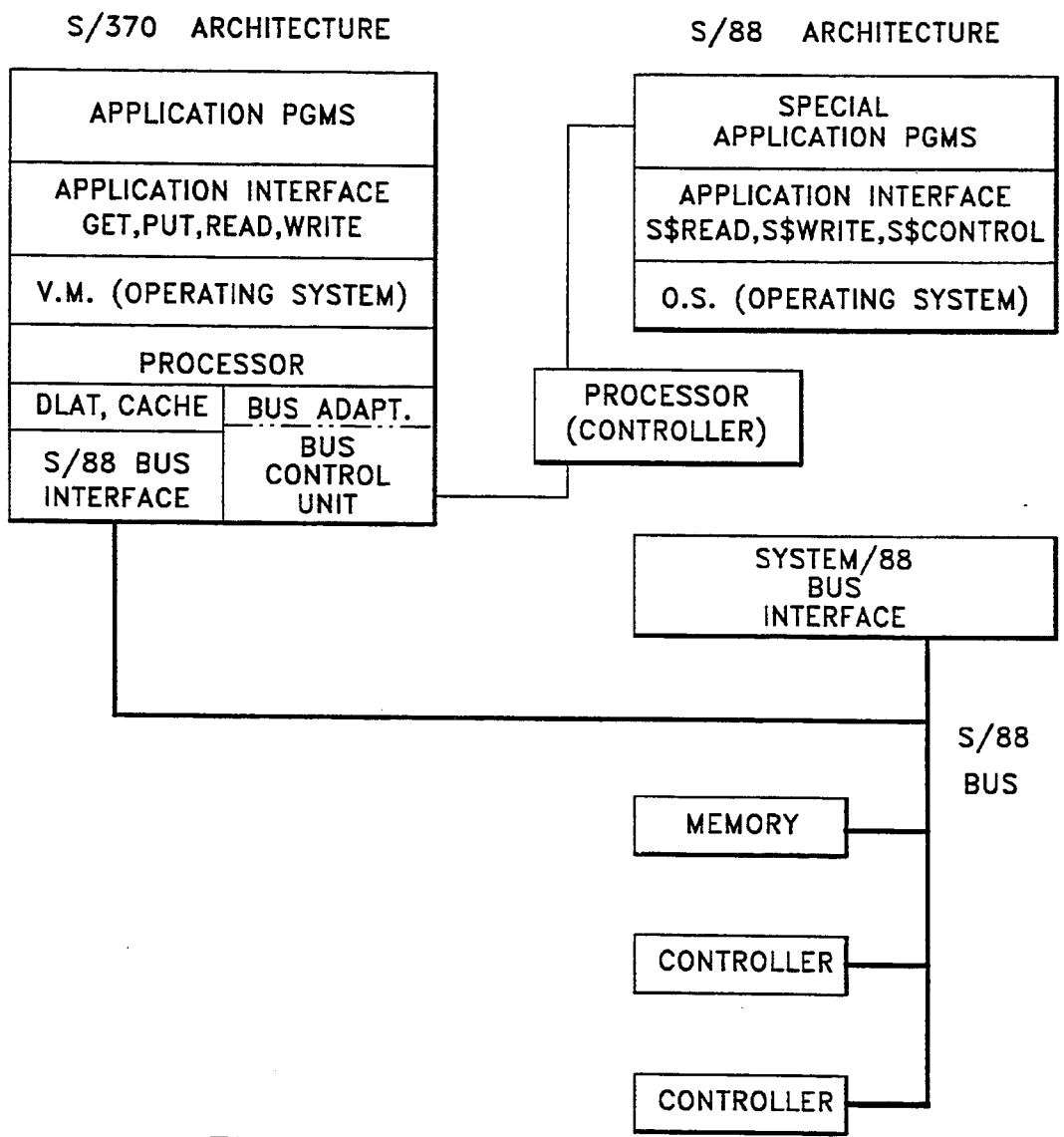
FIG. 5 shows diagrammatically the uncoupling of a S/88 processor to provide data exchange between the S/370 and the S/88 of the preferred embodiment.

The address strobe signal that was blocked from the fault tolerant processor logic is sent to the coupling logic. This gives the S/88 fault tolerant processor complete control over the coupling logic which is the interface between the fault tolerant special application program and the attached S/370 processor. The address strobe signal and the virtual address are used to select local storage, registers and the DMAC which are components of the coupling logic. FIG. 5 shows diagrammatically the result of the detection of an interrupt from the S/370 bus control logic which is determined to be at the appropriate level and corresponding to an appropriate address. In its broadest aspect therefore, the uncoupling mechanism disconnects a processor from its associated hardware and connects the processor to an alien entity for the efficient transfer of data with said entity.

The coupling logic has a local store which is used to queue incoming S/370 commands and store data going to and from the S/370. The data and commands are moved into the local store by multiple DMA channels in the coupling logic. The fault tolerant application program initializes the DMAC and services interrupts from the DMAC, which serves to notify the application program when a command has arrived or when a block of data has been received or sent. To complete an operation, the coupling logic must return data strobe acknowledge lines, prior to the clocking edge of the processor to insure that both sides of the fault tolerant processor stay in sync.

The application program receives S/370 channel type commands such as Start I/O, Test I/O, etc. The application program then converts each S/370 I/O command into a fault tolerant I/O command and initiates a normal fault tolerant I/O command sequence.

This is believed to be a new method of getting a block of data around an operating system and to an application. It is also a way of allowing an application to handle an interrupt which is a function usually done by an operating system. The application program can switch the fault tolerant processor from its normal processor function to the I/O controller function at will, and on a per cycle basis, just by the virtual address it selects.

Thus, two data processing systems having dissimilar instruction and memory addressing architectures are tightly coupled so as to permit one system to effectively access any part of the virtual memory space of the other system without the other system being aware of the one system's existence. Special application code in the other system communicates with the one system via hardware by placing special addresses on the bus. Hardware determines if the address is a special one. If it is, the strobe is blocked from being sensed by the other system's circuits, and redirected such that the other system's CPU can control special hardware, and a memory space, accessible to both systems.

The other system can completely control the one system when necessary, as for initialization and configuration tasks. The one system cannot in any way control the other system, but may present requests for service to the other system in the following manner:

The one system stages I/O commands and/or data in one system format in the commonly accessible memory space and, by use of special hardware, presents an interrupt to the other system at a special level calling the special application program into action.

The latter is directed to the memory space containing the staged information and processes same to convert its format to the other system's native form. Then the application program directs the native operating system of the other system to perform native I/O operations on the converted commands and data. Thus, all of the foregoing occurs completely transparent to and with no significant change in the native operating systems of both systems.

3. Presentation of Interrupts to a System Transparent to the Operating System Most current programs execute in one of two (or more) states, a supervisor state or a user state. Application programs run in user state, and functions such as interrupts run in supervisor state.

An application attaches an I/O port then opens the port, issues an I/O request in the form of a read, write or control. At that time the processor will take a task switch. When the operating system receives an interrupt signifying an I/O completion, then the operating system will put this information into a ready queue and sort by priority for system resources.

The operating system reserves all interrupt vectors for its own use; none are available for new features such as an external interrupt signifying an I/O request from another machine.

In the S/88 of the preferred embodiment, a majority of the available interrupt vectors are actually unused, and these are set up to cause vectoring to a common error handler for 'uninitialized' or 'spurious' interrupts, as is the common practice in operating systems. The preferred embodiment of this improvement replaces a subset of these otherwise unused vectors with appropriate vectors to special interrupt handlers for the S/370 coupling logic interrupts. The modified S/88 Operating System is then rebound for use with the newly-integrated vectors in place.

The System/88 of the preferred embodiment has eight interrupt levels and uses autovectors on all levels except level 4. The improvement of the present application uses one of these autovector levels, level 6, which has the next to highest priority. This level 6 is normally used by the System/88 for A/C power disturbance interrupts.

The logic which couples the System/370 to the System/88 presents interrupts to level 6 by ORing its interrupt requests with those of the A/C power disturbance. During system initialization, appropriate vector numbers to the special interrupt handlers for the coupling logic interrupts are loaded into the coupling logic (some, for example, into DMAC registers) by an application program, transparent to the S/88 operating system.

When any interrupt is received by the System/88, it initiates an interrupt acknowledge (IACK) cycle using only hardware and internal operations of the S/88 processor to process the interrupt and fetch the first interrupt handler instruction. No program instruction execution is required. However, the vector number must also be obtained and presented in a transparent fashion. This is achieved in the preferred embodiment by uncoupling the S/88 processor from its associated hardware (including the interrupt presenting mechanism for A/C power disturbances) and coupling the S/88 processor to the S/370-S/88 coupling logic when a level 6 interrupt is presented by the coupling logic.

More specifically, the S/88 processor sets the function code and the interrupt level at its outputs and also asserts Address Strobe (AS) and Data Strobe (DS) at the beginning of the IACK cycle. The Address Strobe is blocked from the S/88 hardware, including the A/C power disturbance interrupt mechanism, if the coupling logic interrupt presenting signal is active; and AS is sent to the coupling logic to read out the appropriate vector number, which is gated into the S/88 processor by the Data Strobe. Because the Data Strobe is blocked from the S/88 hardware, the machine cycle (IACK) is transparent to the S/88 Operating System relative to obtaining the coupling logic interrupt vector number.

If the coupling logic interrupt signal had not been active at the beginning of the IACK cycle a normal S/88 level 6 interrupt would have been taken.

4. Sharing a Real Storage Between Two or More Processors Executing Different Virtual Storage Operating Systems This feature couples a fault tolerant system to an alien processor and operating system that does not have code to support a fault tolerant storage, i.e. code to support removal and insertion of storage boards via hot plugging, instantaneous detection of corrupted data and its recovery if appropriate, etc.

This feature provides a method and means whereby two or more processors each executing different virtual operating systems can be made to share a single real storage in a manner transparent to both operating systems, and wherein one processor can access the storage space of the other processor so that data transfers between these multiple processors can occur.

This feature combines two user-apparent operating systems environments to give the appearance to the user of a single operating system. Each operating system is a virtual operating system that normally controls its own complete real storage space. This invention has only one real storage space that is shared by both processors via a common system bus. Neither operating system is substantially rewritten and neither operating system knows the other exists, or that the real storage is shared. This feature uses an application program running on a first processor to search through the first operating system's storage allocation queue. When a contiguous storage space is found, large enough to satisfy the requirements of the second operating system, then this storage space is removed, by manipulating pointers, from the first operating system's storage allocation table. The first operating system no longer has use (e.g., the ability to reallocate) of this removed storage unless the application returns the storage back to the first operating system.

The first operating system is subservient to the second operating system from an I/O perspective and responds to the second operating system as an I/O controller. The first operating system is the master of all system resources, and in the preferred embodiment is a hardware fault tolerant operating system. The first operating system initially allocates and de-allocates storage (except for the storage which is "stolen" for the second operating system), and handles all associated hardware failures and recovery. The objective is to combine the two operating systems without altering the operating system code to any major degree. Each operating system must believe it is controlling all of system storage, since it is a single resource being used by both processors.

When the system is powered up, the first operating system and its processor assume control of the system, and hardware holds the second processor in a reset condition. The first operating system boots the system and determines how much real storage exists. The operating system eventually organizes all storage into 4KB (4096 bytes) blocks and lists each available block in a storage allocation queue. Each 4KB block listed in the queue points to the next available 4KB block. Any storage used by the first system is either removed or added in 4KB blocks from the top of the queue; and the block pointers are appropriately adjusted. As users request memory space from the operating system the requests are satisfied by assigning from the queue a required number of 4KB blocks of real storage. When the storage is no longer needed, the blocks will be returned to the queue.

Next the first operating system executes a list of functions called module-start-up that configures the system. One application that is executed by the module-start-up is a new application used to capture storage from the first operating system and allocate the storage to the second operating system. This program scans the complete storage allocation list and finds a contiguous string of 4KB blocks of storage. The application program then alters the pointers in the portion of the queue corresponding to the contiguous string of blocks, thereby removing a contiguous block of storage from the first operating system's memory allocation list. In the preferred embodiment, the pointer of the 4KB block preceding the first 4KB block removed is changed to point to the 4KB block immediately following the removed contiguous string of blocks.

The first operating system at this point has no control or knowledge of this real memory space unless the system is rebooted or the application returns the storage pointers. It is as if the first operating system considers a segment of real storage allocated to a process running on itself and not reallocable because the blocks are removed from the table, not merely assigned to a user.

The removed address space is then turned over to the second operating system. There is hardware offset logic that makes the address block, stolen from the first operating system and given to the second operating system, appear to start at address zero to the second operating system. The second operating system then controls the storage stolen from the first operating system as if it is its own real storage, and controls the storage through its own virtual storage manager, i.e. it translates virtual addresses issued by the second system into real addresses within the assigned real storage address space.

An application program running on the first operating system can move I/O data into and out of the second processor's storage space, however, the second processor cannot read or write outside of its allocated space because the second operating system does not know of the additional storage. If an operating system malfunction occurs, in the second operating system, a hardware trap will prevent the second operating system from inadvertently writing in the first operating system space.

The amount of storage space allocated to the second operating system is defined in a table in the module-start-up program by the user. If the user wants the second processor to have 16 megabytes then he will define that in the module start up table and the application will acquire that much space from the first operating system. A special SVC (service call) allows the application program to gain access to the supervisor region of the first operating system so that the pointers can be modified.

An important reason why it is desirable for both operating systems to share the same storage is that the storage is fault tolerant on the first processor; and the second processor is allowed to use fault tolerant storage and I/O from the first processor. The second processor is made to be fault tolerant by replicating certain of the hardware and comparing certain of the address, data, and control lines. Using these techniques the second processor is, in fact, a fault tolerant machine even though the second operating system has no fault tolerant capabilities. More than one alien processor and operating system of the second type can be coupled to the first operating system with a separate real storage area provided for each alien processor.

In the preferred embodiment, the first operating system is that of the fault tolerant S/88 and the second operating system is one of the S/370 operating systems and the first and second processors are S/88 and S/370 processors respectively. This feature not only enables a normally non-fault-tolerant system to use a fault tolerant storage which is maintained by a fault tolerant system but also enables the non-fault-tolerant system (1) to share access to fault tolerant I/O apparatus maintained by the fault tolerant system and (2) to exchange data between the systems in a more efficient manner without the significant delays of a channel-to-channel coupling.

5. Single System Image

The term single system image is used to characterize computer networks in which user access to remote data and resources (e.g., printer, hard file, etc.) appears to the user to be the same as access to data and resources at the local terminal to which the user's keyboard is attached. Thus, the user may access a data file or resource simply by name and without having to know the object's location in the network.

The concept of "derived single system image" is introduced here as a new term, and is intended to apply to computer elements of a network which lack facilities to attach directly to a network having a single system image, but utilize hardware and software resources of that network to attach directly to same with an effective single system image.

For purposes of this discussion, direct attachment of a computer system, for developing effects of "derived single system image," can be effectuated with various degrees of coupling between that system and elements of the network. The term "loose coupling" as used here means a coupling effectuated through I/O channels of the deriving computer and the "native" computer which is part of the network. "Tight coupling" is a term presently used to describe a relationship between the deriving and native computers which is established through special hardware allowing each to communicate with the other on a direct basis (i.e., without using existing I/O channels of either).

A special type of tight coupling presently contemplated, termed "transparent tight coupling," involves the adaptation of the coupling hardware to enable each computer (the deriving and native computers) to utilize resources of the other computer in a manner such that the operating system of each computer is unaware of such utilization. Transparent tight coupling, as just defined, forms a basis for achieving cost and performance advantages in the coupled network. The cost of the coupling hardware, notwithstanding complexity of design, should be more than offset by the savings realized by avoiding the extensive modifications of operating system software which otherwise would be needed. Performance advantages flow from faster connections due to the direct coupling and reduced bandwidth interference at the coupling interface.

The term "network" as used in this section is more restricted than the currently prevalent concept of a network which is a larger international teleprocessing-/satellite connection scheme to which many dissimilar machine types may connect if in conformance to some specific protocol. Rather "network" is used in this section to apply to a connected complex of System/88 processors or alternatively to a connected complex of other processors having the characteristics of a single system image.

Several carefully defined terms will be used to further explain the concept of a single system image as contemplated herein; and it will be assumed that the specific preferred embodiment of the improvement will be used as the basis for the clarification:

a. High Speed Data Interconnection (HSDI) refers to a hardware subsystem (and cable) for data transfer between separate hardware units.

b. Link refers to a software construct or object which consists entirely of a multi-part pointer to some other software object and which has much of the character of an alias name.

c. MODULE refers to a free-standing processing unit consisting of at least one each of: enclosure, power supply, CPU, memory, and I/O device. A MODULE can be expanded by bolting together multiple enclosures to house additional peripheral devices creating a larger single module. Some I/O units (terminals, printers) may be external and connected to the enclosure by cables; they are considered part of the single MODULE. A MODULE may have only one CPU complex.

d. CPU COMPLEX refers to one or more single or dual processor boards within the same enclosure, managed and controlled by Operating System software to operate as a single CPU. Regardless of the actual number of processor boards installed, any user program or application is written, and executed, as if only one CPU were present. The processing workload is roughly shared among the available CPU boards, and multiple tasks may execute concurrently, but each application program is presented with a 'SINGLE-CPU IMAGE.' e. OBJECT refers to a collection of data (including executable programs) stored in the system (disk, tape) which can be uniquely identified by a hierarchical name. A LINK is a uniquely-named pointer to some other OBJECT, and so is considered an OBJECT itself. An I/O PORT is a uniquely-named software construct which points to a specific I/O device (a data source or target), and thus is also an OBJECT. The Operating System effectively prevents duplication of OBJECT NAMES.

Because the term 'single system image' is not used consistently in the literature, it will be described in greater detail for clarification of the present improvement of a "derived single system image." In defining and describing the term SINGLE-SYSTEM IMAGE, the 'image' refers to the application program's view of the system and environment. 'System,' in this context, means the combined hardware (CPU complex) and software (Operating System and its utilities) to which the application programmer directs his instructions. 'Environment' means all I/O devices and other connected facilities which are addressable by the Operating System and thus accessible indirectly by the programmer, through service requests to the Operating System.

A truly single, free-standing computer with its Operating System, then, must provide a SINGLE-SYSTEM IMAGE to the programmer. It is only when we want to connect multiple systems together in order to share I/O devices and distribute processing that this 'image' seen by the programmer begins to change; the ordinary interconnection of two machines via teleprocessing lines (or even cables) forces the programmer to understand— —and learn to handle—the dual environment, in order to take advantage of the expanded facilities.

Generally, in order to access facilities in the other environment, he must request his local Operating System to communicate his requirements to the 'other' Operating System, and specify those requirements in detail. He must then be able to accept the results of his request asynchronously (and in proper sequence) after an arbitrarily long delay. The handling and control of the multiple messages and data transfers between machines constitute significant processing overhead in both machines; it can be unwieldy, inefficient, and difficult for the programmer in such a DUAL-SYSTEM environment. And when the number of conventionally-connected machines goes up, the complexity for the programmer can increase rapidly.

The System/88 original design included the means to simplify this situation and provide the SINGLE-SYSTEM IMAGE to the programmer, i.e., the HSDI connection between MODULEs, and HSDI drive software within the Operating System in each MODULE. Here, in a two-MODULE system for example, each of the two Operating Systems 'know about' the entire environment, and can access facilities across the HSDI without the active intervention of the 'other' Operating System. The reduction in communications overhead is considerable.

A large number of MODULEs of various sizes and model types can be interconnected via HSDI to create a system complex that appears to the programmer as one (expandable) environment. His product, an application program, can be stored on one disk in this system complex, executed in any of the CPUs in the complex, controlled or monitored from essentially any of the terminals of the complex, and can transfer data to and from any of the I/O devices of the complex, all without any special programming considerations and with improved execution efficiency over the older methods.

The operating system and its various features and facilities are written in such a way as to natively assume the distributed environment and operate within that environment with the user having no need to be concerned with or have control over where the various entities (utilities, applications, data, language processors, etc.) reside. The key to making all of this possible is the enforced rule that each OBJECT must have a unique name; and this rule easily extends to the entire system complex since the most basic name-qualifier is the MODULE name, which itself must be unique within the complex. Therefore, locating any OBJECT in the entire complex is as simple as correctly naming it. Naming an OBJECT is in turn simplified for the programmer by the provision of LINKs, which allow the use of very short alias pointers to (substitute names for) OBJECTS with very long and complicated names.

To achieve the concept of a "derived single system image" within this complex of interconnected S/88 modules, a plurality of S/370 processors are coupled to S/88 processors in such a manner as to provide for the S/370 processor users at least some aspects of the S/88 single system image features. This, even though the S/370 processors and operating systems do not provide these features.

One or more S/370 processors are provided within the S/88 MODULE. A S/88 processor is uniquely coupled to each S/370 processor. As will be seen, each S/370 processor is replicated and controlled by S/88 software for fault-tolerant operation. The unique direct coupling of the S/88 and S/370 processors, preferably by the uncoupling and interrupt function mechanisms described above, render data transfers between the processors transparent to both the S/370 and S/88 operating systems. Neither operating system is aware of the existence of the other processor or operating system.

Each S/370 processor uses the fault-tolerant S/88 system complex to completely provide the S/370 main storage, and emulated S/370 I/O Channel(s) and I/O device(s). The S/370s have no main memory, channels, or I/O devices which are not part of the S/88, and all of these facilities are fault-tolerant by design.

At system configuration time, each S/370 processor is assigned a dedicated contiguous block of 1 to 16 megabytes of main storage from the S/88 pool; this block is removed from the configuration tables of the S/88 so that the S/88 Operating System cannot access it, even inadvertently. Fault-tolerant hardware registers hold the storage block pointer for each S/370, so that the S/370 has no means to access any main storage other than that assigned to it. The result is an entirely conventional, single-system view of its main memory by the S/370; the fault-tolerant aspect of the memory is completely transparent. An application program (EXEC370) in the S/88 emulates S/370 Channel(s) and I/O device(s) using actual S/88 devices and S/88 Operating System calls. It has the SINGLE-SYSTEM IMAGE view of the S/88 complex, since it is an application program; thus this view is extended to the entire S/370 'pseudo-channel.'

From the opposite point of view, that of the S/370 Operating System (and application programs by extension), it may help to visualize a 'window' (the channel) through which all I/O operations take place. The window is not altered in character—no S/370 programs need be changed—but the 'view' through the window is broadened to include the SINGLE-SYSTEM IMAGE attributes. A small conceptual step then pictures a large number of S/370 efficiently sharing a single database, that managed by the S/88.

A consequence of this connection technique is relatively simple and quick dynamic reconfigurability of each S/370. The channel 'window' is two-way, and the S/88 control program EXEC370 is on the other side of it; EXEC370 has full capability to stop, reset, reinitialize, reconfigure, and restart the S/370 CPU. Thus, by transparent emulation of S/370 I/O facilities using other facilities which possess the SINGLE-SYSTEM IMAGE attribute (S/88 I/O and Operating System), this attribute is extended and afforded to the S/370.

The S/370 therefore has been provided with object location independence. Its users may access a data file or other resource by name, a name assigned to it in the S/88 operating system directory. The user need not know the location of the data file in the complex of S/370-S/88 modules.

S/370 I/O commands issued by one S/370 processing unit in one module 9 are processed by an associated S/88 processing unit tightly coupled to the S/370 processing unit in the same module (or by other S/88 processing units interconnected in the module 9 and controlled by the same copy of the S/88 virtual operating system which supports multiprocessing) to access data files and the like resident in the same or other connected modules. It may return the accessed files to the requesting S/370 processing unit or send them to other modules, for example, to merge with other files.

6. Summary

Thus, the functions of two virtual operating systems (e.g., S/370 VM, VSE or IX370 and S/88 OS) are merged into one physical system. The S/88 processor runs the S/88 OS and handles the fault tolerant aspects of the system. At the same time, one or more S/370 processors are plugged into the S/88 rack and are allocated by the S/88 OS anywhere from 1 to 16 megabytes of contiguous memory per S/370 processor. Each S/370 virtual operating system thinks its memory allocation starts at address 0 and it manages its memory through normal S/370 dynamic memory allocation and paging techniques. The S/370 is limit checked to prevent the S/370 from accessing S/88 memory space. The S/88 must access the S/370 address space since the S/88 must move I/O data into the S/370 I/O buffers. The S/88 Operating System is the master over all system hardware and I/O devices. The peer processor pairs execute their respective Operating Systems in a single system environment without significant rewriting of either operating system.

Introduction—Prior Art System/88

The improvements of the present application will be described with respect to a preferred form in which IBM System/370 (S/370) processing units (executing S/370 instructions under the control of any one of the S/370 operating systems such as VM, VSE, IX370, etc.) are tightly coupled to IBM System/88 (S/88 ) processing units (executing S/88 instructions in a fault tolerant manner under control of a S/88 operating system in a fault tolerant environment) in a manner which permits fault tolerant operation of the S/370 processing units with the System/88 features of single system image, hot pluggability, instantaneous error detection, I/O load distribution and fault isolation and dynamic reconfigurability.

Figure 6A:
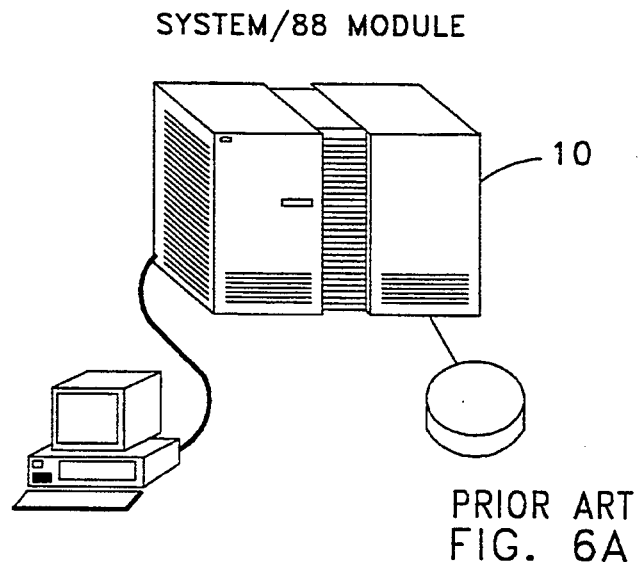
FIGS. 6A, 6B and 6C diagrammatically illustrate the prior art IBM System/88 module, plural modules interconnected by high speed data interconnections (HSDIs) and plural modules interconnected via a network in a fault tolerant environment with a single system image.

The IBM System/88 marketed by International Business Machines Corp. is described generally in the IBM System/88 Digest, Second Edition, published in 1986 and other available S/88 customer publications. The System/88 computer system including module 10, FIG. 6A, is a high availability system designed to meet the needs of customers who require highly reliable online processing. System/88 combines a duplexed hardware architecture with sophisticated operating system software to provide a fault tolerant system. The System/88 also provides horizontal growth through the attachment of multiple System/88 modules 10a, 10b, 10c, through the System/88 high speed data interconnections (HSDIs), FIG. 6B, and modules 10d–g through the System/88 Network, FIG. 6C.

The System/88 is designed to detect a component failure when and where it occurs, and to prevent errors and interruptions caused by such failures from being introduced into the system. Since fault tolerance is a part of the System/88 hardware design, it does not require programming by the application developer. Fault tolerance is accomplished with no software overhead or performance degradation. The System/88 achieves fault tolerance through the duplication of major components, including processors, direct access storage devices (DASDs) or disks, memory, and controllers. If a duplexed component fails, its duplexed partner automatically continues processing and the system remains available to the end users. Duplicate power supplies with battery backup for memory retention during a short-term power failure are also provided. System/88 and its software products offer ease of expansion, the sharing of resources among users, and solutions to complex requirements while maintaining a single system image to the end user.

A single system image is a distributed processing environment consisting of many processors, each with its own files and I/O, interconnected via a network or LAN, that presents to the user the impression he is logged on to a single machine. The operating system allows the user to converse from one machine to another just by changing a directory.

With proper planning, the System/88 processing capacity can be expanded while the System/88 is running and while maintaining a single-system image to the end user. Horizontal growth is accomplished by combining multiple processing modules into systems using the System/88 HSDI, and combining multiple systems into a network using the System/88 Network.

Figure 6B:
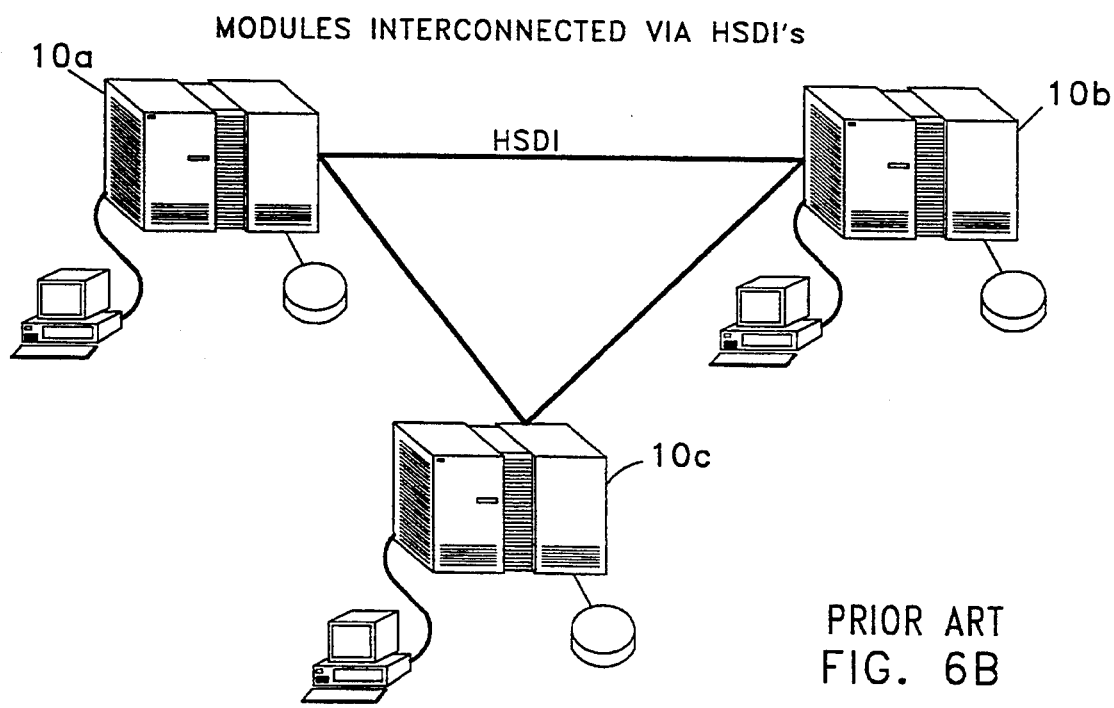
Figure 6C:
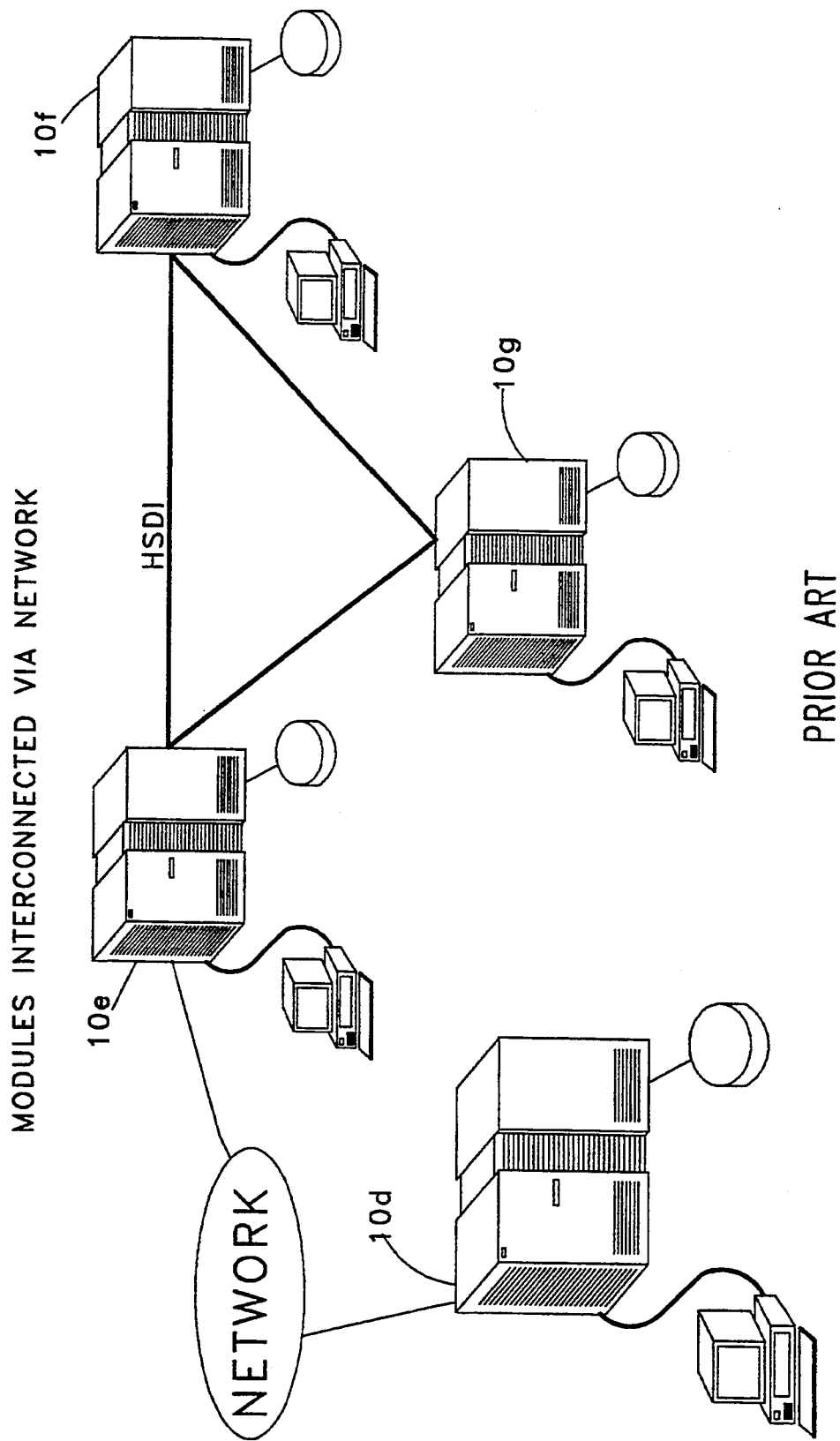

A System/88 processing module is a complete, stand-alone computer as seen in FIG. 6A of the drawings. A System/88 system is either a single module or a group of modules connected in a local network with the IBM HSDI as seen in FIG. 6B. The System/88 Network, using remote transmission facilities, is the facility used to interconnect multiple systems to form a single-system image to the end user. Two or more systems can be interconnected by communications lines to form a long haul network. This connection may be through a direct cable, a leased telephone line, or an X.25 network. The System/88 Network detects references to remote resources and routes messages between modules and systems completely transparent to the user.

Hot pluggability allows many hardware replacements to be done without interrupting system operation. The System/88 takes a failing component out of service, continuing service with its duplexed partner, and lights an indicator on the failing component—all without operator intervention. The customer or service personnel can remove and replace a failed duplexed board while processing continues. The benefits to a customer include timely repair and reduced maintenance costs.

Although the System/88 is a fault-tolerant, continuous operation machine, there are times when machine operation will need to be stopped. Some examples of this are to upgrade the System/88 Operating System, to change the hardware configuration (add main storage), or to perform certain service procedures.

The duplexed System/88 components and the System/88 software help maintain data integrity. The System/88 detects a failure or transient error at the point of failure and does not propagate it throughout the application or data. Data is protected from corruption and system integrity is maintained. Each component contains its own error-detection logic and diagnostics. The error-detection logic compares the results of parallel operations at every machine cycle.

If the system detects a component malfunction, that component is automatically removed from service. Processing continues on the duplexed partner while the failed component is checked by internal diagnostics. The error-detection functions will automatically run diagnostics on a failing component removed from service while processing continues on its duplexed partner. If the diagnostics determine that certain components need to be replaced, the System/88 can automatically call a support center to report the problem. The customer benefits from quick repairs and low maintenance costs.

The System/88 is based generally upon processor systems of the type described in detail in U.S. Pat. No. 4,453,215, entitled "Central Processing Apparatus for Fault Tolerant Computing", issued Jun. 5, 1984 to Robert Reid and related U.S. Pat. Nos. 4,486,826, 4,597,084, 4,654,857, 4,750,177 and 4,816,990; and said patents are hereby incorporated herein by reference in their entirety as if they were set forth fully herein. Portions of the '215 Reid patent are shown diagrammatically in FIGS. 7 and 8 of the present application.

Figure 7:
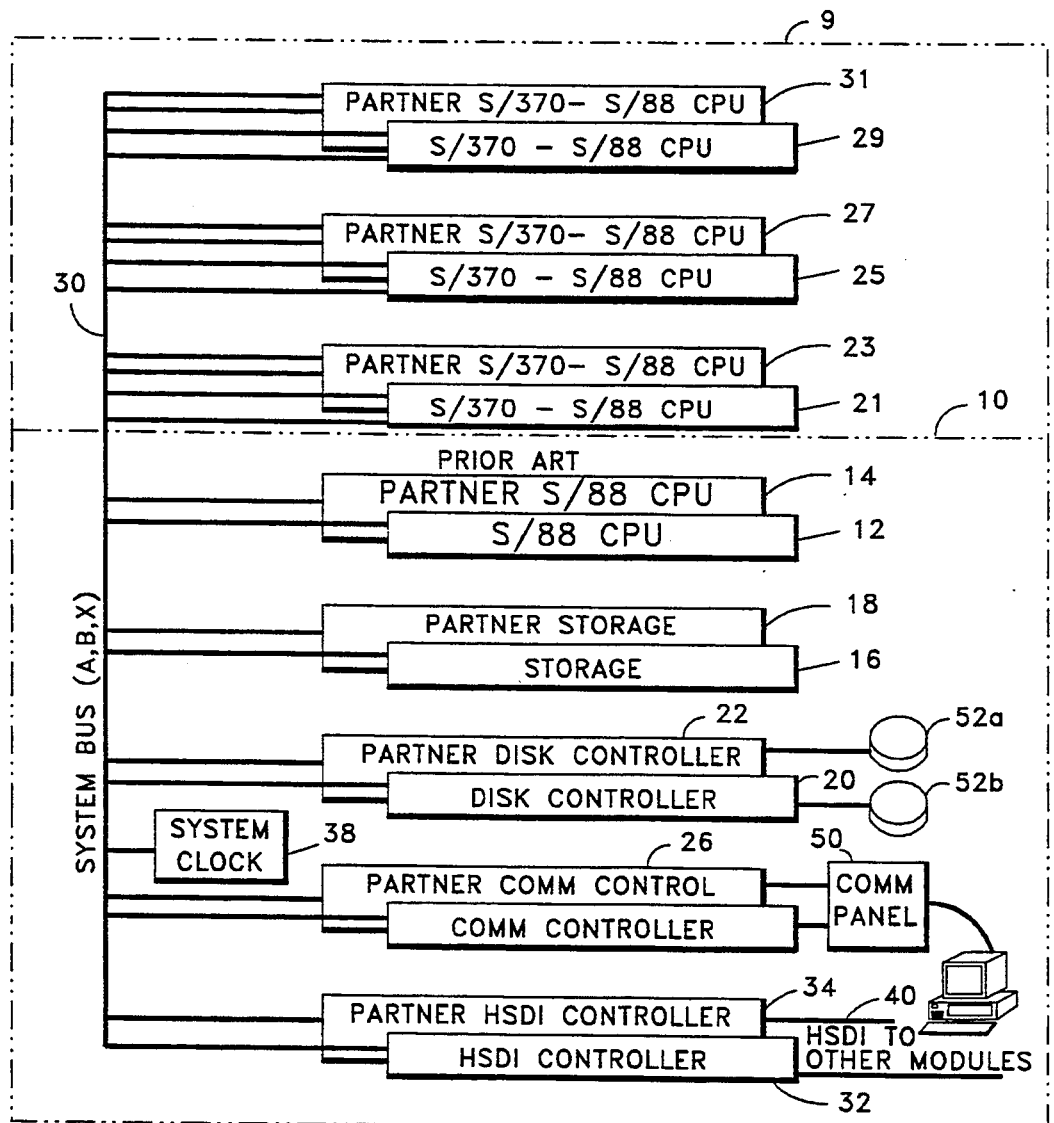
FIG. 7 diagrammatically illustrates one form of the improved module of the present invention which provides S/370 processors executing S/370 application programs under control of a S/370 operating system which are rendered fault tolerant by virtue of the manner in which the processors are connected to each other and to S/88 processors, I/O and main storage.
Figure 8:
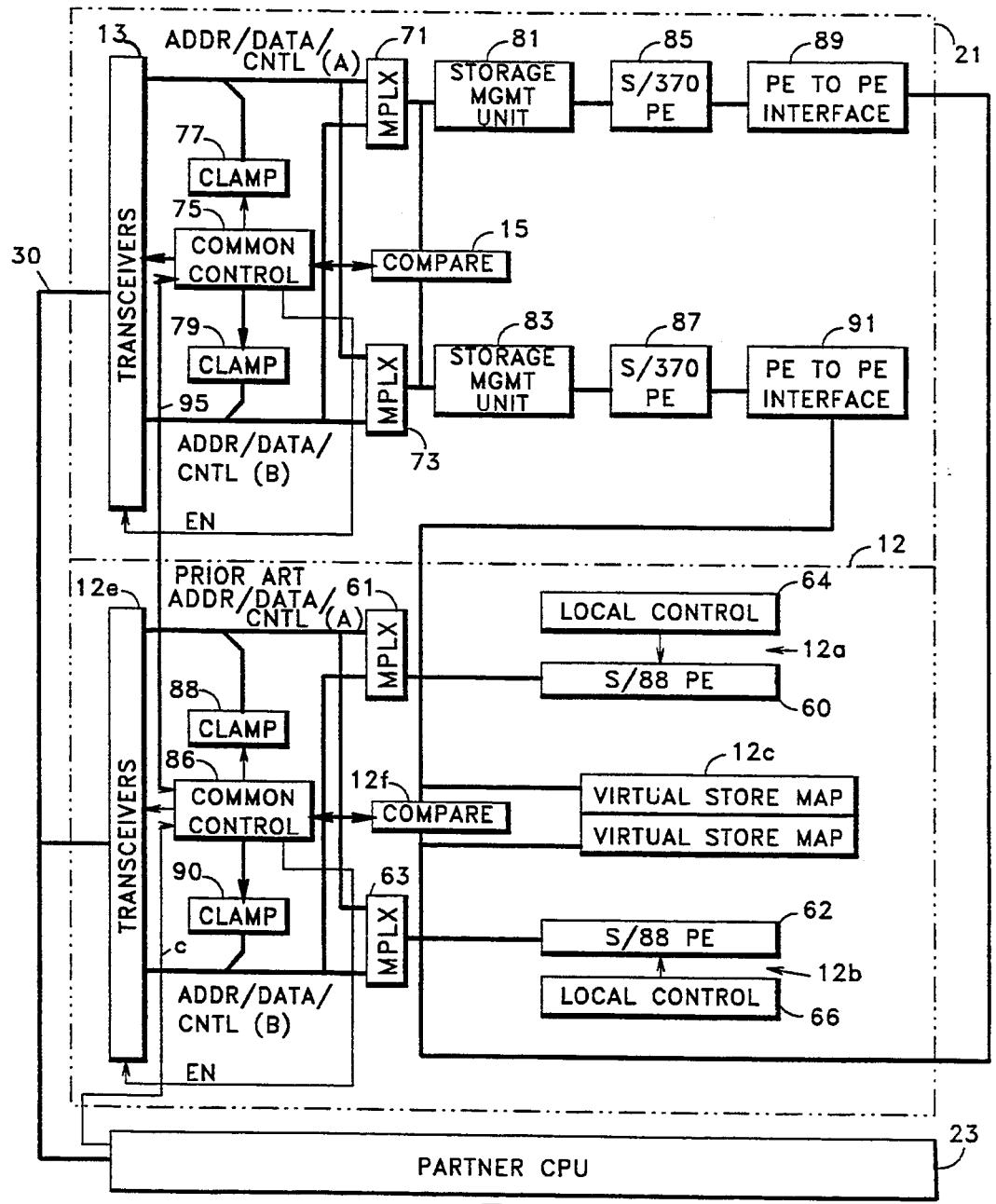
FIG. 8 diagrammatically illustrates in more detail the interconnection of paired S/370 units and S/88 units with each other to form a processor unit and their connection to an identical partner processor unit for fault tolerant operation.

This computer system of FIGS. 7 and 8 of the present application has a processor module 10 with a processing unit 12, a random access storage unit 16, peripheral control units 20, 24, 32, and a single bus structure 30 which provides all information transfers between the several units of the module. The bus structure within each processor module includes duplicate partner buses A, B, and each functional unit 12, 16, 20, 24, 32 has an identical partner unit. Each unit, other than control units which operate with asynchronous peripheral devices, normally operates in lock-step synchronism with its partner unit. For example, the two partner memory units 16, 18 of a processor module normally both drive the two partner buses A, B, and are both driven by the bus structure 30, in full synchronism.

The computer system provides fault detection at the level of each functional unit within a processor module. To attain this feature, error detectors monitor hardware operations within each unit and check information transfers between the units. The detection of an error causes the processor module to isolate the bus or unit which caused the error from transferring information to other units, and the module continues operation. The continued operation employs the partner of the faulty bus or unit. Where the error detection precedes an information transfer, the continued operation can execute the transfer at the same time it would have occurred in the absence of the fault. Where the error detection coincides with an information transfer, the continued operation can repeat the transfer.

The computer system can effect the foregoing fault detection and remedial action rapidly, i.e. within a fraction of an operating cycle. The computer system has at most only a single information transfer that is of questionable validity and which requires repeating to ensure total data validity.

Although a processor module has significant hardware redundancy to provide fault-tolerant operation, a module that has no duplicate units is nevertheless fully operational.

The functional unit redundancy enables the module to continue operating in the event of a fault in any unit. In general, all units of a processor module operate continuously, and with selected synchronism, in the absence of any detected fault. Upon detection of an error-manifesting fault in any unit, that unit is isolated and placed off-line so that it cannot transfer information to other units of the module. The partner of the off-line unit continues operating, normally with essentially no interruption.

In addition to the partnered duplication of functional units within a module to provide fault-tolerant operation, each unit within a processor module generally has a duplicate of hardware which is involved in a data transfer. The purpose of this duplication, within a functional unit, is to test, independently of the other units, for faults within each unit. Other structure within each unit of a module, including the error detection structure, is in general not duplicated.

The common bus structure which serves all units of a processor module preferably employs a combination of the foregoing two levels of duplication and has three sets of conductors that form an A bus, a B bus that duplicates the A bus, and an X bus. The A and B buses each carry an identical set of cycle-definition, address, data, parity and other signals that can be compared to warn of erroneous information transfer between units. The conductors of the X bus, which are not duplicated, in general carry module-wide and other operating signals such as timing, error conditions, and electrical power. An additional C bus is provided for local communication between partnered units.

A processor module detects and locates a fault by a combination of techniques within each functional unit including comparing the operation of duplicated sections of the unit, the use of parity and further error checking and correcting codes, and by monitoring operating parameters such as supply voltages. Each central processing unit has two redundant processing sections and, if the comparison is invalid, isolates the processing unit from transferring information to the bus structure. This isolates other functional units of the processor module from any faulty information which may stem from the processing unit in question. Each processing unit also has a stage for providing virtual memory operation which is not duplicated. Rather, the processing unit employs parity techniques to detect a fault in this stage.

The random access memory unit 16 is arranged with two non-redundant memory sections, each of which is arranged for the storage of different bytes of a memory word. The unit detects a fault both in each memory section and in the composite of the two sections, with an error-correcting code. Again, the error detector disables the memory unit from transferring potentially erroneous information onto the bus structure and hence to other units.

The memory unit 16 is also assigned the task of checking the duplicated bus conductors, i.e. the A bus and the B bus. For this purpose, the unit has parity checkers that test the address signals and that test the data signals on the bus structure. In addition, a comparator compares all signals on the A bus with all signals on the B bus. Upon determining in this manner that either bus is faulty, the memory unit signals other units of the module, by way of the X bus, to obey only the non-faulty bus.

Peripheral control units for a processor module employ a bus interface section for connection with the common bus structure, duplicate control sections termed "drive" and "check", and a peripheral interface section that communicates between the control sections and the peripheral input/output devices which the unit serves. There are disk control units 20, 22 for operation with disk memories 52a, 52b, a communication control unit 24, 26 for operation, through communication panels 50, with communication devices including terminals, printers and modems, and HSDI control units 32, 34 for interconnecting one processor module with another in a multiprocessor system. In each instance the bus interface section feeds input signals to the drive and check control sections from the A bus and/or the B bus, tests for logical errors in certain input signals from the bus structure, and tests the identity of signals output from the drive and check channels. The drive control section in each peripheral control unit provides control, address, status, and data manipulating functions appropriate for the I/O device which the unit serves. The check control section of the unit is essentially identical for the purpose of checking the drive control section. The peripheral interface section of each control unit includes a combination of parity and comparator devices for testing signals which pass between the control unit and the peripheral devices for errors.

A peripheral control unit which operates with a synchronous I/O device, such as a communication control unit 24, operates in lock-step synchronism with its partner unit. However, the partnered disk control units 20,22 operate with different non-synchronized disk memories and accordingly operate with limited synchronism. The partner disk control units 20, 22 perform write operations concurrently but not in precise synchronism inasmuch as the disk memories operate asynchronously of one another. The control unit 32 and its partner also typically operate with this limited degree of synchronism.

The power supply unit for a module employs two bulk power supplies, each of which provides operating power to only one unit in each pair of partner units. Thus, one bulk supply feeds one duplicated portion of the bus structure, one of two partner central processing units, one of two partner memory units, and one unit in each pair of peripheral control units. The bulk supplies also provide electrical power for non-duplicated units of the processor module. Each unit of the module has a power supply stage which receives operating power from one bulk supply and in turn develops the operating voltages which that unit requires. This power stage in addition monitors the supply voltages. Upon detecting a failing supply voltage, the power stage produces a signal that clamps to ground potential all output lines from that unit to the bus structure. This action precludes a power failure at any unit from causing the transmission of faulty information to the bus structure.

Some units of the processor module execute each information transfer with an operating cycle that includes an error-detecting timing phase prior to the actual information transfer. A unit which provides this operation, e.g. a control unit for a peripheral device, thus tests for a fault condition prior to effecting an information transfer. The unit inhibits the information transfer in the event a fault is detected. The module, however, can continue operation—without interruption or delay—and effect the information transfer from the non-inhibited partner unit.

Other units of the processor module, generally including at least the central processing unit and the memory unit, for which operating time is of more importance, execute each information transfer concurrently with the error detection pertinent to that transfer. In the event a fault is detected, the unit immediately produces a signal which alerts other processing units to disregard the immediately preceding information transfer. The processor module can repeat the information transfer from the partner of the unit which reported a fault condition. This manner of operation produces optimum operating speed in that each information transfer is executed without delay for the purpose of error detection. A delay only arises in the relatively few instances where a fault is detected. A bus arbitration means is provided to determine which unit gains access to the system bus when multiple units are requesting access.

The Fault Tolerant S/370 Module 9 Interconnected via HSDIs, Networks

FIG. 7 illustrates in the portion above prior art module 10, the interconnection of S/370 and S/88 duplexed processor pairs (partner units) 21, 23 which, when substituted for duplexed S/88 units 12, 14 in module 10, creates a new and unique S/370 module 9. When such unique modules 9 are interconnected by S/88 HSDIs and networks in a manner similar to that shown in FIGS. 6B, 6C for modules 10, they create a S/370 complex (rather than a S/88 complex) with the S/88 features of fault tolerance, single system image, hot pluggability, I/O load sharing among multiple S/88 processing units within the same module, etc.

Specifically, S/370 processors in partner units 21, 23 of the unique modules 9 execute S/370 instructions under control of their respective S/370 operating system; the interconnected S/88 processors perform all of the S/370 I/O operations in conjunction with their respective S/88 storage and S/88 peripheral units under control of the S/88 operating system in conjunction with a S/88 application program.

In addition, further S/370-S/88 processor partner units 25, 27 and 29, 31 can be incorporated within the new module 9 to permit a S/370 plural processor environment within the unique module 9. In addition, the S/370 processors within the partner units 21, 23 and 25, 27 and 29, 31 may each operate under a different S/370 operating system per partner-pair.

General Description of Duplexed Processor Partner Units 21,23

FIG. 8 illustrates a preferred form of interconnecting S/370 and S/88 processors within the unit 21. The lower portion of unit 21 comprises a central processor 12 essentially identical to processor 12 of the above-mentioned Reid patent except for the use of a single processor element in each of the pair of processor elements 60, 62. In the Reid patent, dual processors were provided at 60 and at 62 to execute respectively user code and operating system code.

In the present application, both functions are performed by a single microprocessor, preferably a Motorola MC68020 Microprocessor described in the MC68020 Users Manual, Third Edition (ISBN-0-13-

567017-9) published by Motorola, copyright 1989, 1988. Said publication is hereby incorporated by reference as if it were set forth herein in its entirety.

Thus, each processor element (PE)60 and 62 preferably comprises a Motorola 68020 microprocessor. Multiplexors 61, 63 connect processor elements 60, 62 to the bus structure 30 by way of address/data control A and B buses and transceivers 12e in a manner described in detail in the Reid patent. Local control 64, 66 and a virtual storage map 12c are provided for elements 60, 62. A comparator 12f checks for error-producing faults by comparing signals on control, data and address lines to and from the bus 30 and the processor elements 60, 62. Signal mismatches cause an error signal from comparator 12f to common control circuitry 86 which sends out error signals on the X bus of bus structure 30 and disables drivers (not shown) in the transceivers 12e to take the processing unit 12 off line. Clamp circuits 88, 90 respond to a power failure at the unit 12 to clamp to ground all output lines from unit 12 to bus structure 30. These components are described in greater detail in the Reid patent.

The upper portion of FIG. 8 illustrates a preferred form of connecting a pair of S/370 processing elements 85, 87 to the S/88 bus structure 30 and to the S/88 processing elements 60, 62. The processing elements 85, 87 are connected to the bus structure 30 via multiplexors 71, 73 and transceivers 13 in a manner logically similar to that in which elements 60, 62 are coupled to the bus structure 30.

A compare circuit 15 (described more fully in FIGS. 32A, B), clamp circuits 77 and 79 and common controls 75 are provided and operate in a manner similar to corresponding components in unit 12. The control circuit 86 is coupled to the S/88 interrupt mechanism of processing elements 60, 62. The S/370 processors 85, 87 and their related hardware use the S/88 to process error handling and recovery. Thus the common control circuit 75 is coupled to the common control circuit 86 via line 95 to permit the latter to handle errors detected by compare circuit 15. This coupling line 95 also permits common controls 75 and 86 to take both of their respective processor pairs 85, 87 and 60, 62 off line in the event of an error in either processor pair.

A preferred form of the S/370 processing units in unit 21 include the central processing elements 85, 87 storage management units 81, 83 and processor-to-processor (e.g. S/370 to S/88) interfaces 89, 91. The storage management units 81, 83 couple processing elements 85, 87 to S/88 main storage 16 via multiplexors 71, 73 transceivers 13 and bus structure 30.

Interfaces 89, 91 couple the processor buses of the S/370 processing elements 85, 87 respectively to the processor buses of the S/88 processing elements 62, 60.

The partner processor unit 23 is identical to processor unit 21. It will be remembered relative to the above description that the two processing elements 60, 62 in unit 21 and the corresponding two elements (not shown) in unit 23 all normally operate in lock-step with each other to simultaneously execute identical instructions under control of the same S/88 operating system.

Similarly the processing elements 85, 87 in unit 21 and their corresponding elements (not shown) in unit 23 operate in lock-step with each other to simultaneously execute identical instructions under control of the same S/370 operating system.

In the event of an error in unit 21 or 23, that unit is removed from service to permit continued fault tolerant operation by the other unit.

Although some details of one specific implementation of a S/370 processing unit will be described below, it will be appreciated that the other known implementations may be used which are compatible with the requirements described in IBM System/370 Principles of Operation (publication number GA22-7000-10, Eleventh Edition, September 1987) published by and available from International Business Machines Corporation. Said publication is hereby incorporated herein by reference as if it were set forth herein in its entirety.

Figure 9A:
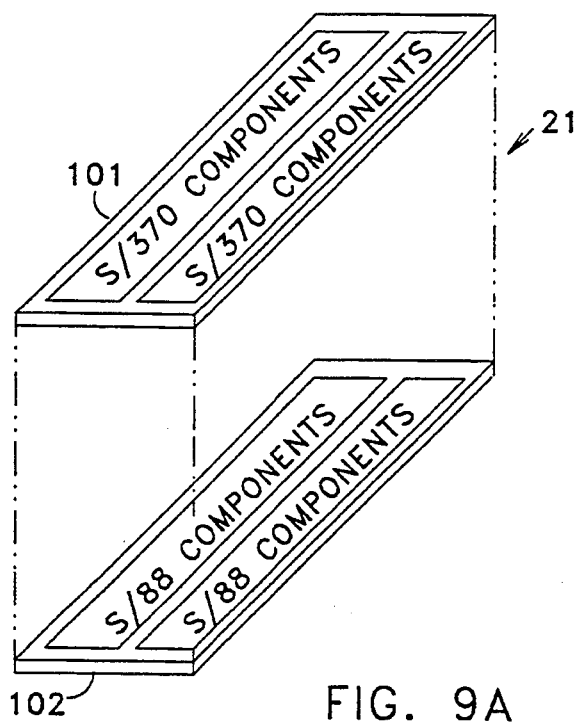
FIGS. 9A and 9B illustrate one form of physical packaging of paired S/370 and S/88 units on two boards for insertion into the back panel of a processing system enclosure.
Figure 9B:
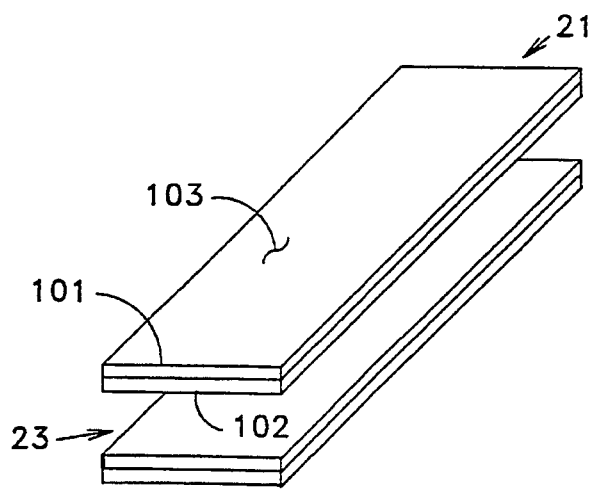

FIGS. 9A and 9B show one form of physical packaging for the S/370 and S/88 components for the processor unit 21 of FIG. 8. The S/370 components including the paired processing elements 85, 87 are mounted on one board 101 and the S/88 components including the paired processing elements 60, 62 are mounted on another board 102. The two boards 101 and 102 are rigidly affixed to each other to form a sandwich pair 103 and are adapted for insertion into two slots of the back panel (not shown) of the module 9, conventional back panel wiring couples the components on the boards 101 and 102 to each other and to the bus structure 30 as illustrated in FIG. 8 and as described in the Reid patent.

Before describing the details of the direct coupling of a S/370 processor to a S/88 processor, it will be helpful to provide a brief reference to the mechanisms permitting the S/370 to (1) use a portion of the S/88 main storage and (2) exchange commands and data with the S/88 utilizng certain of the S/88 virtual storage space. These mechanisms will be described in more detail later.

Figure 10:
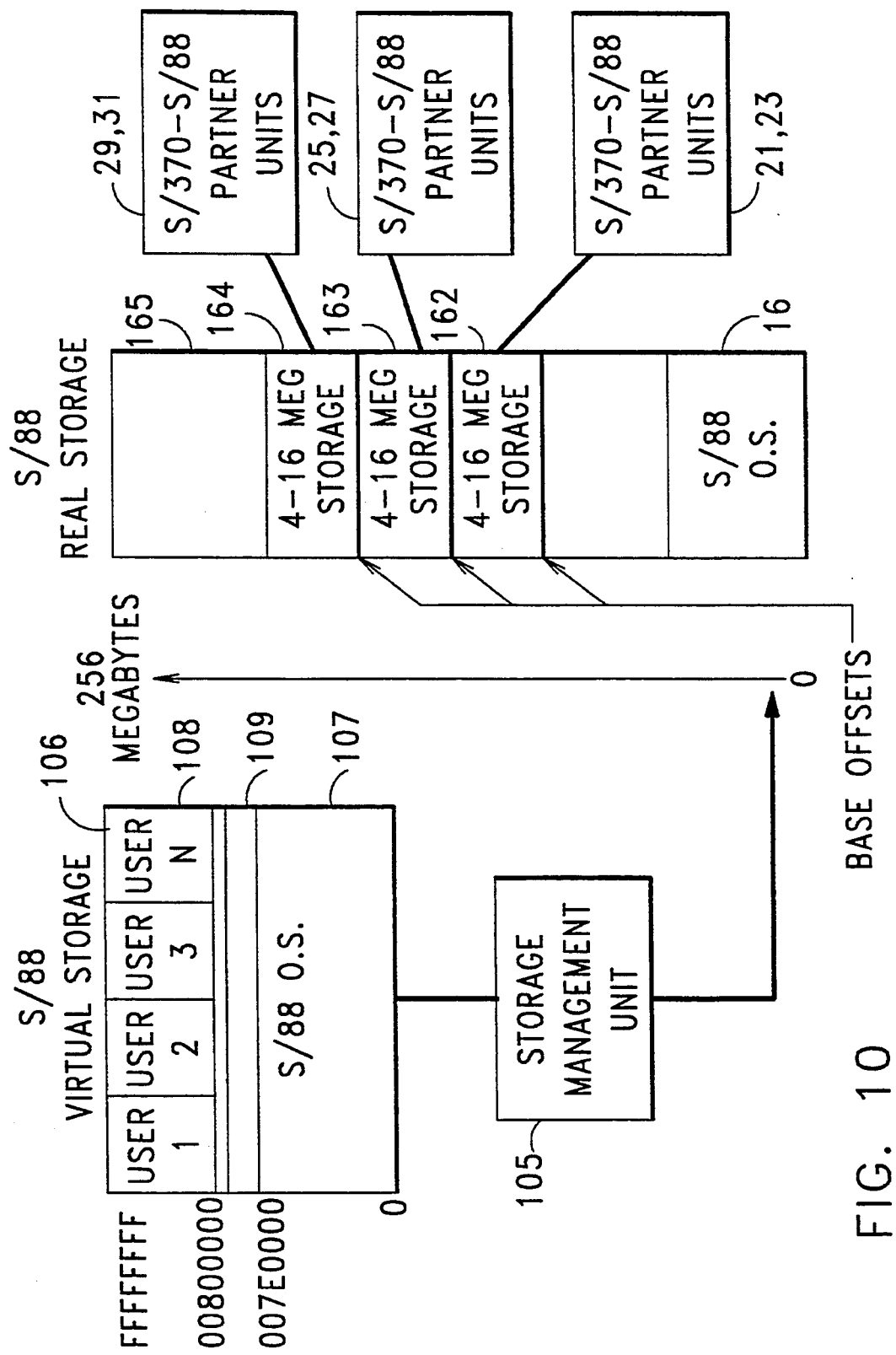
FIG. 10 conceptually illustrates S/88 main storage and sections of that storage dedicated to S/370 processor units without knowledge by the S/88 operating system.

Thus FIG. 10 is used to illustrate a preferred form of the mapping of the S/88 virtual storage to real storage 16 by a storage management unit 105 for one module 9. The virtual address space 106 is divided into S/88 operating system space 107 and user application space 108. Within the space 107 is an area 109 (addresses 007E0000 to 007EFFFF) reserved for hardware and code used to couple each S/370 processor element to a respective S/88 processor element in a processor unit such as 21. The address space 109 is made transparent to the S/88 operating system during normal system processing. The use of this space 109 will be described in detail below.

During system initialization, the storage management unit 105 assigns within the S/88 main storage unit 16 a S/370 main storage area for each set of four S/370 processor elements in partnered units such as 21 and 23. Thus three S/370 main storage areas 162, 163 and 164 are provided for partner units 21, 23 and 25, 27 and 29, 31 respectively. The S/88 processor elements within the partner units access the remaining parts of the storage unit 16 in the manner described in the Reid patent.

The S/370 storage areas 162–164 are assigned, as will be described later, in a manner such that the S/88 operating system does not know that these areas have been "stolen" and are not reassignable to S/88 users by the storage management unit unless returned to the S/88 space. Since the S/370 systems are virtual systems, they access their respective main storage area via address translation. The partner S/88 main storage unit 18 requires identical S/370 main storage areas (not shown). Each S/370 processor element can access only its respective S/370 main storage area and produces an error signal if it attempts to access the S/88 main storage space. Each S/88 processor element, however, can access (or direct the access to) the S/370 main storage area of its respective S/370 processor element during S/370 I/O operations when the S/88 processor element acts as an I/O controller for its S/370 processor element.

Figure 11:
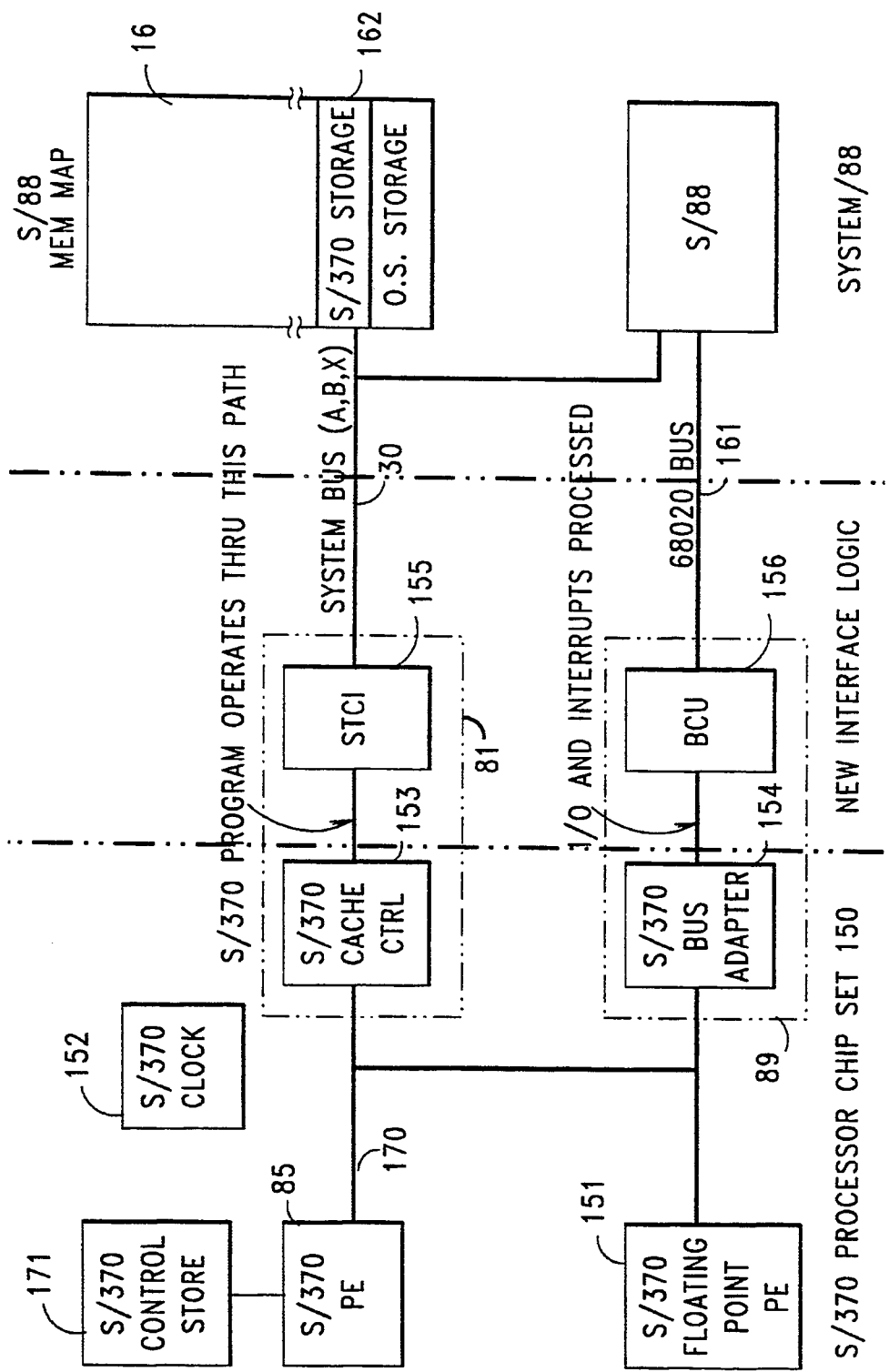
FIG. 11 shows diagrammatically certain components of the preferred form of a S/370 processor and means connecting it to a S/88 processor and storage.
Figure 12:
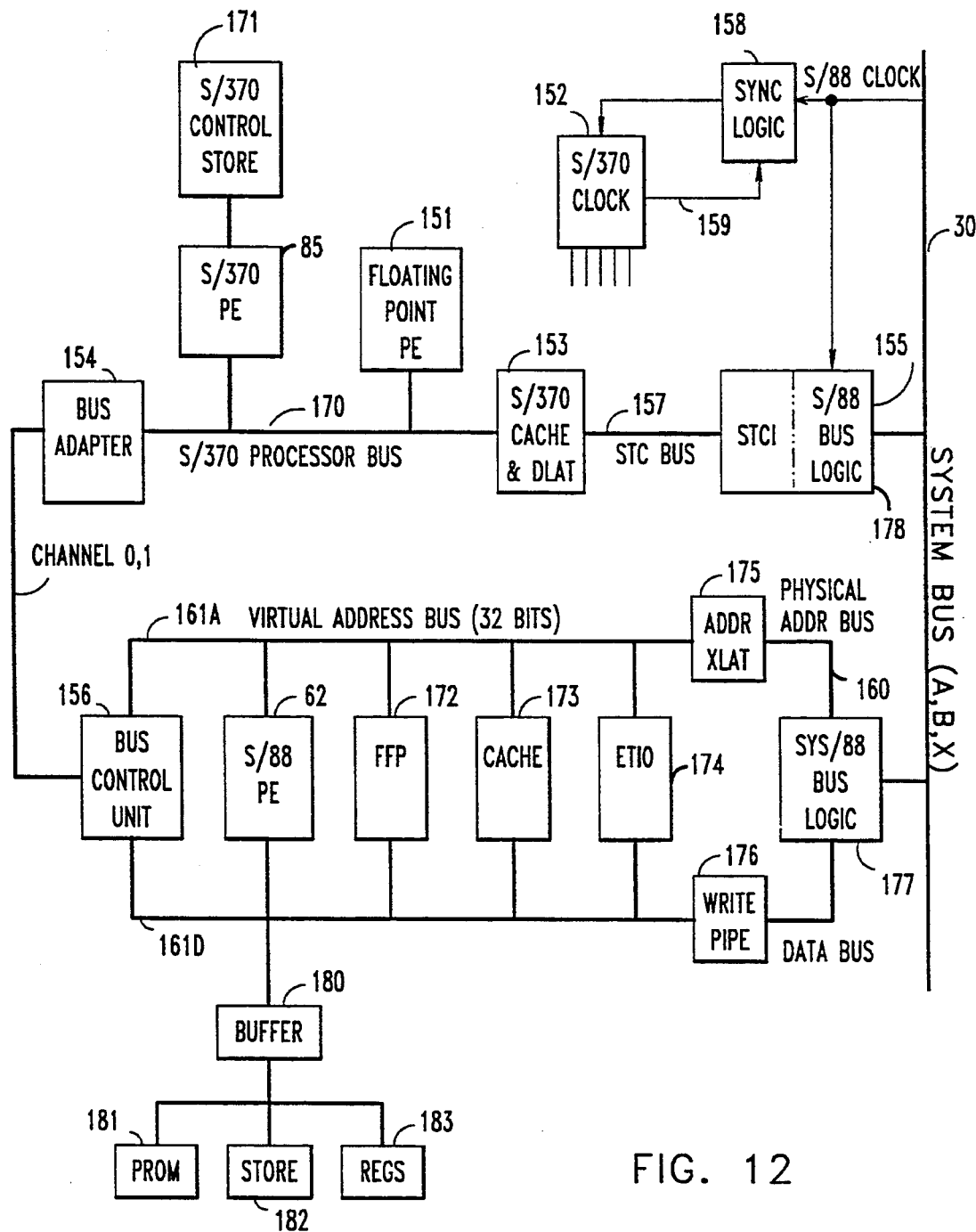
FIG. 12 shows the components of FIG. 11 in more detail and various components of a preferred form of a S/88 processor.

Coupling of S/370 and S/88 Processor Elements 85, 62 (FIGS. 11, 12

FIG. 8 illustrates diagrammatically the provision of four S/370 processor elements such as 85, two in each of the partner units 21, 23 and four S/88 processor elements such as 62, two in each unit 21, 23 coupled such that all S/370 processor elements concurrently execute identical S/370 instructions and all S/88 processor elements concurrently execute identical S/88 instructions. Thus all four S/370 processor elements act as one S/370 processing unit insofar as program execution is concerned. Similarly all four S/88 processor elements act as one S/88 processing unit.

Therefore, for ease of illustration and explanation, the following portions of the drawings and specification will primarily address one S/370 processor element 85 and one S/88 processor element 62 and their associated hardware and program code except where component replication requires further explanation.

Similarly, the coupling of processor elements to the bus structure 30, e.g., by way of multiplexors 61, 63, 71, 73 and transceivers 12e, 11, will be substantially omitted from the following description for ease of illustration and explanation. Brief reference to this coupling will be made with respect to FIG. 32.

Therefore, FIG. 11 shows the processor element 85 coupled to the system bus 30 and S/88 storage 16 by way of a first path including its processor bus 170, and a S/370 storage management unit 81. PE85 is shown coupled to the processor bus 161 of PE62 by way of a second path including processor element to processor element interface 89. PE85 uses the first path during S/370 program execution to fetch (and store) data and instructions from its assigned S/370 main storage area 162 in store 16. PE62 performs S/370 I/O operations for PE85 over the second path including interface 89.

In a preferred embodiment, a S/370 chip set 150 (FIG. 11) includes individual functional chips for the processor element 85, a clock 152, a cache controller 153 with a directory look aside table (DLAT) 341, a bus adapter 154, an optional floating point coprocessor element 151 and a control store 171 for storing a set of microcode which supports the S/370 architecture. This S/370 chip set may be adapted to be operated by any of the existing S/370 operating systems (such as VSE/SP, VM/SP, IX/370 etc.) marketed by International Business Machines Corporation.

The cache controller 153 together with a storage control interface (STCI) 155 form the S/370 storage management unit 81. The bus adapter 154 and a bus control unit (BCU) 156 comprise the PE to PE interface 89.

In the preferred embodiment, each of the S/370 CPU's such as PE85 is a 32 bit microprocessor having 32 bit data flow, a 32 bit arithmetic/logic unit (ALU), 32 bit registers in a three port data local store, and an 8 byte S/370 instruction buffer. S/370 instructions are executed either in hardware or are interpreted by micro instructions. The chip 153 provides cache storage for S/370 program instructions and data together with associated storage control functions. The chip 153 handles all storage requests that are issued from the PE85 as it executes its program instructions. The chip 153 also handles requests from the bus adapter 154 when transferring I/O data.

The bus adapter 154 and BCU 156 provide logic and control to directly (or tightly) interconnect the internal S/370 processor bus 170 to the S/88 processor bus 161 during input/output operations. The BCU 156 is the primary mechanism for directly coupling the processor buses of PE85 and PE62 to each other. It is the hardware mechanism which interacts with the S/88 processor element 62 when PE62 is "uncoupled" from its associated system hardware for the transfer of data and commands between PE62 and PE85 as will be described later.

The clock chip 152 (FIG. 12) uses centralized logic for clock signal generation and applies appropriate clock signals individually to each of the other chips 85, 151, 153 and 154. The clock 152 is in turn controlled by clock signals from the System/88 bus 30 to synchronize both the S/370 PE85 and the S/88 PE62.

An integral part of merging the two distinct S/370 and S/88 hardware architectures, aside from the processor coupling/uncoupling hardware, is a means of synchronously attaching the previously non-fault-tolerant hardware to the fault-tolerant bus structure 30. In the preferred embodiment this interface is handled by the STCI logic 155 which must communicate between the S/370 cache controller 153 and the S/88 system bus 30. Furthermore, the non-fault-tolerant hardware must be replicated on the board as shown in FIG. 8 to produce a 'check' and 'drive' logic which are capable of running in lock-step with each other and with a partner unit. Thus the 'single' CPU consisting of system components on boards 101 and 102, must run in lock-step with its respective duplexed partner unit. The task of implementing the above requirements while maintaining optimal performance and functionality involves the synchronization of separate clock sources.

In the preferred embodiment, the S/88 system clock 38 (FIG. 7) is received by all devices attached to the common bus structure 30, and two S/88 clock cycles are defined per bus 30 cycle. This system clock 38 ensures synchronous communication on the bus and may be used by individual processors/controllers to develop internal clock frequency sources based on the system clock. The S/370 hardware utilizes an oscillator input into the S/370 clock chip 152, which then generates a set of unique clocks to each of the other S/370 chips 85, 151, 153, 154, 155. This clock chip 152 has inherent delay which can vary based on various parameters such as operating temperature, manufacturing variations, etc. This delay variation may be unacceptable in both maintaining lock-step synchronization between redundant check and drive logic, as well as in maintaining full pipelining capability between the STCI 155 and the bus structure 30.

Figure 19A:
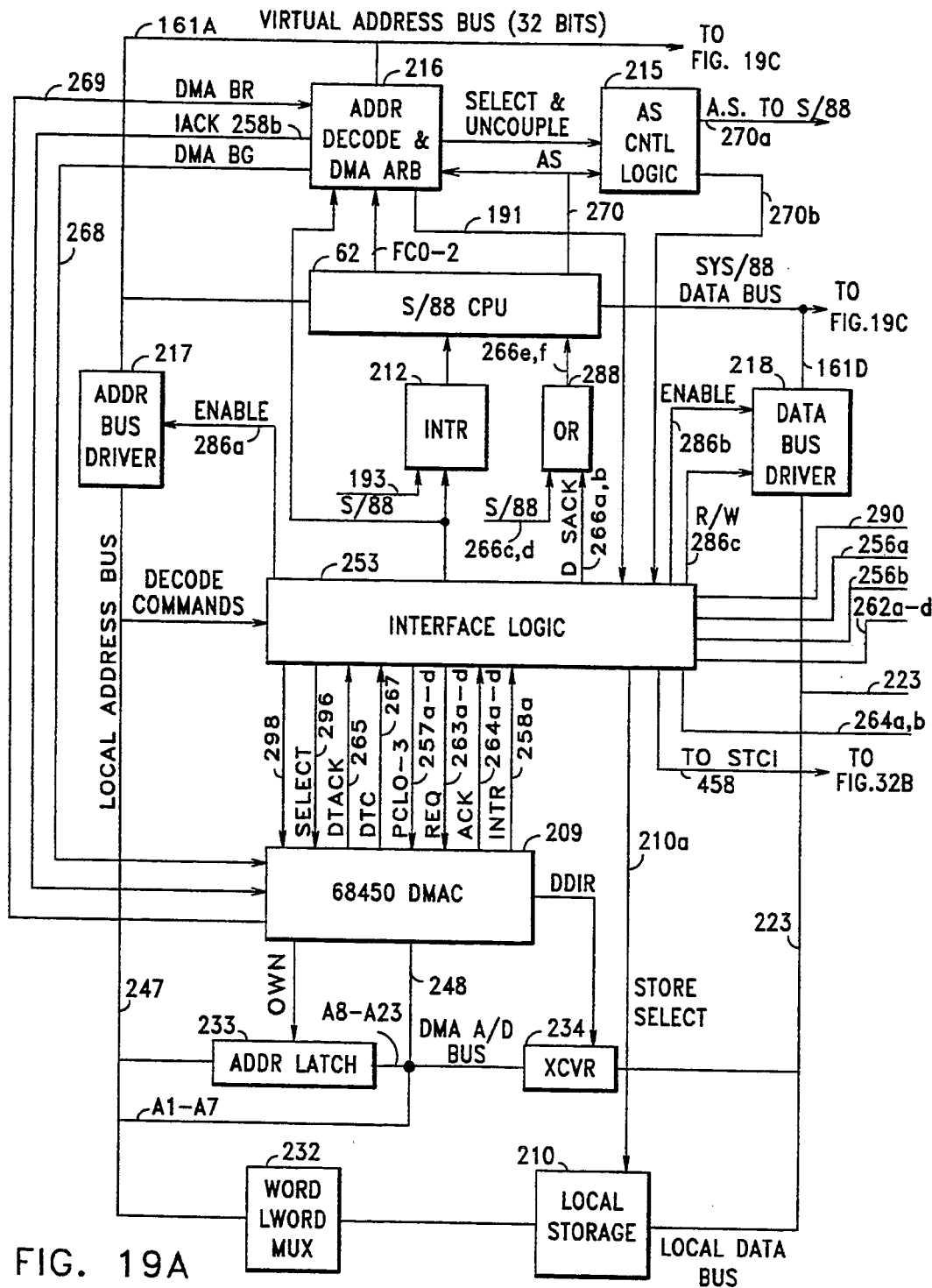
FIGS. 19A, 19B and 19C (with layout FIG. 19) are a schematic/diagrammatic illustration showing in more detail than FIG. 16 a preferred form of the bus control unit interconnecting a S/370 processor with a S/88 processor and main storage.
Figure 19B:
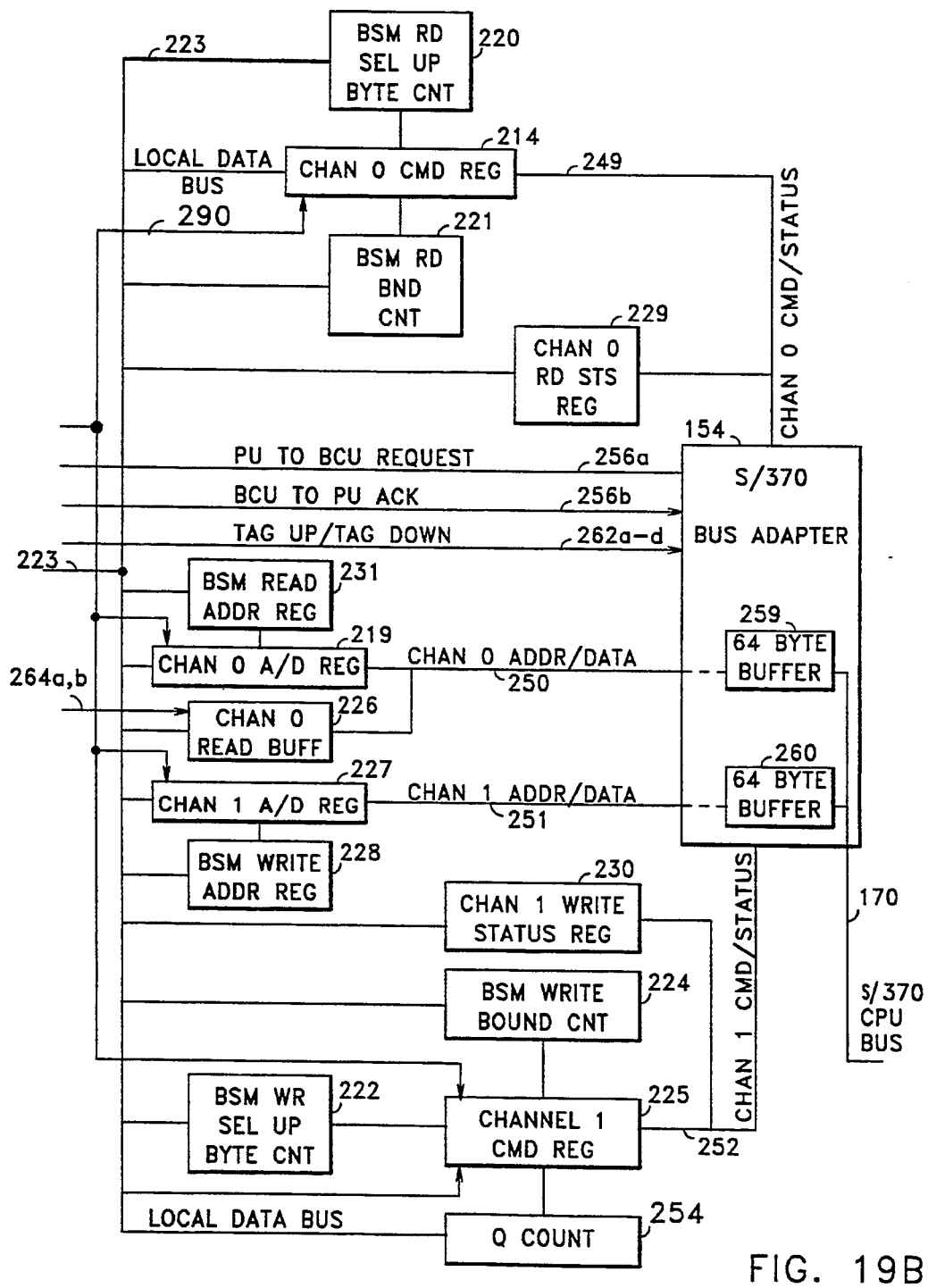
Figure 19C:
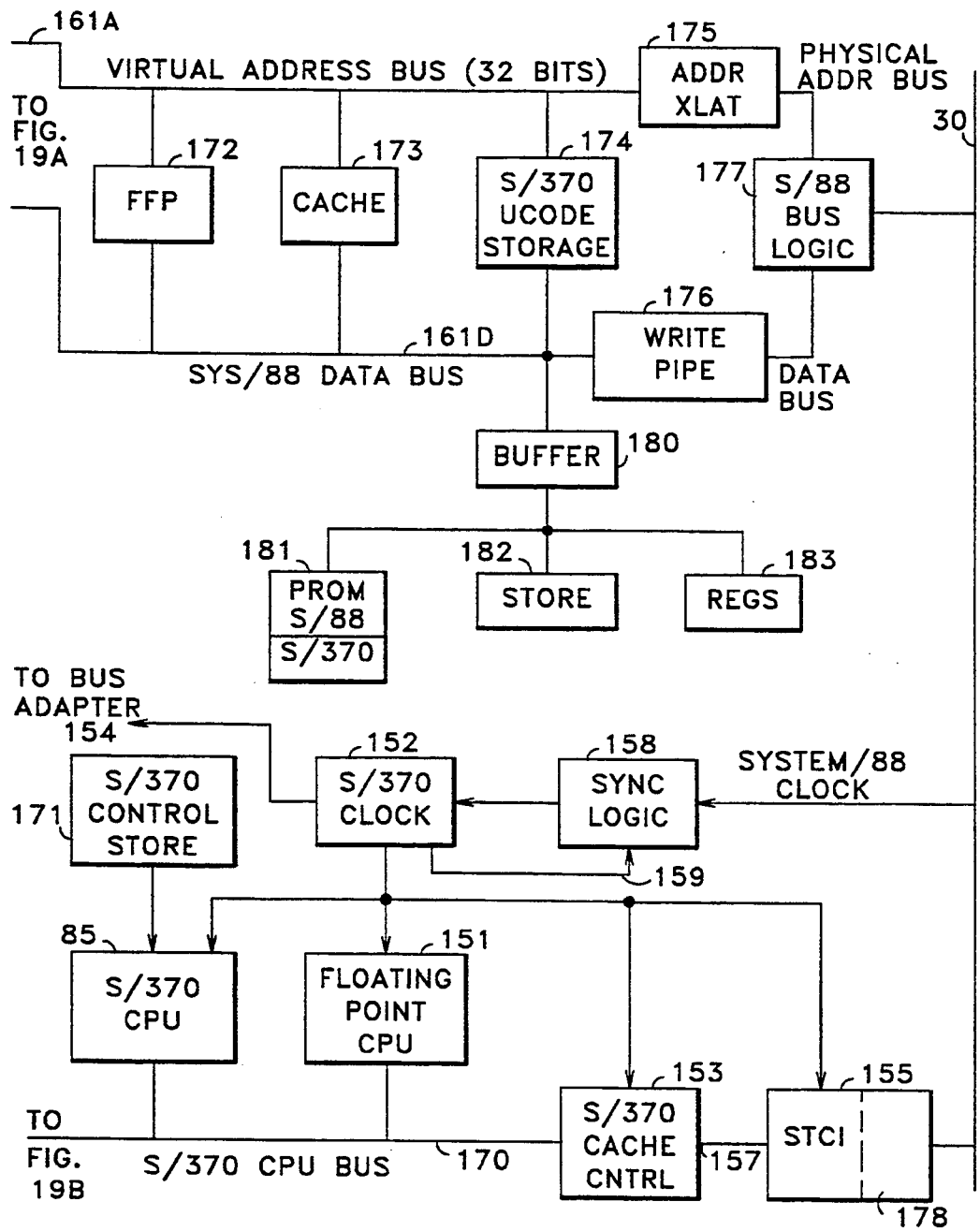

As illustrated in FIGS. 12 and 19c, the preferred embodiment utilizes redundant clock synchronization (sync) logic 158 (and 158a not shown, for the paired S/370 processor unit) to allow both processor check and drive sides of a board 101 to run in lock-step after a reset (i.e., power-on-reset or other), while synchronizing the S/370 processor cycle with the S/88 bus 30 cycle. Clock signals from the S/88 clock 38 are applied via bus structure 30 to the sync logic 158 and to the STCI 155, for S/88-S/370 synchronization and for accessing the main storage via system bus 30.

This synchronization is accomplished in the clock sync logic 158 by first multiplying the S/88 clock to achieve the desired S/370 oscillator input frequency into the S/370 clock chip 152. In this case it is twice the frequency of the S/88 and S/370 clock cycles. Secondly, a feedback pulse on line 159 representing the beginning of the S/370 cycle, is sampled with S/88 clocks representing the leading and trailing edges of a period one register latch delay greater than the S/370 oscillator input clock period, which itself is equal to a S/88 half-cycle period. In the event of a reset in which the sampled S/370 clock feedback pulse on line 159 falls outside of the sampled window, or which overlaps the beginning of the S/88 clock, then the S/370 oscillator input is negated for one S/370 cycle. This serves to 'extend' the current S/370 cycle so that, in the preferred embodiment, the next S/370 clock feedback pulse (on line 159) sampling will ensure falling within the desired window. All comparator logic 15 (FIG. 8), shown in greater detail in FIG. 32 (e.g., 402a-g), is ignored during this time to allow both check and drive hardware to synchronize.

Hence the S/370 processor cycle is assured to start within a S/88 half-cycle period of the start of the S/88 clock period. All transfer timings between the bus structure 30 and S/370 cache controller 153 thus assume the worst case delay for this half-cycle. In addition the comparator logic 15 is only fed by lines sampled with S/88 clocks, ensuring synchronization of "broken" logic 403 (FIG. 32) with the accompanying S/88 processor board 102. Therefore, although the check and drive S/370 hardware may actually be slightly out of sync due to delay variations in their respective clock generation logic, both sides will run in lock-step relative to the current S/88 clock 38 common to bus structure 30, and never more than a half-cycle after the start of the S/88 clock cycle. The sync logic 158 continually monitors the S/370 clock feedback on line 159 to ensure no drifting beyond the half-cycle period. A maximum of one bus 30 cycle is required in the preferred embodiment to bring both sides into sync during any system reset; however, any drift in total delay outside of reset, which causes one side to 'extend' its S/370 clocks, will result in a board "broken" condition, i.e., a fault.

FIG. 12 shows the arrangement of FIG. 11 in greater detail. The S/370 control store 171 is shown connected to PE85. The control store 171 in the preferred embodiment consists of 16 KB of random access storage for storing micro instructions which control the execution of program instructions and I/O operations within PE85. The control store 171 also includes therein a 64 B block 186 (FIG. 29) which is used as a buffer to hold transient micro code loaded on a demand basis from an internal object area (IOA) 187 (FIG. 28) which is part of the S/370 dedicated storage 162 within the main storage unit 16. In this figure the bus structure 161 of the PE62 is shown broken into its virtual address bus 161A and the data bus 161D. PE62 has associated therewith hardware including a floating point processor 172, a cache 173, a microcode storage unit 174 which is used to store coupling microcode referred to as ETIO herein. Both the microcode and an application program stored in cache 173, as will be seen below, are used for controlling PE62 and the BCU logic 156 to perform I/O operations for PE85.

The PE62 hardware also includes an address translation mechanism 175. A write pipe 176 temporarily stores data during one write cycle for application of that data to the system bus 30 during the next cycle to speed up operation of the System/88 . System/88 bus logic 177 of the type described in the Reid patent couples the translation unit 175 and the write pipe 176 to the system bus 30 in a manner described generally in the above mentioned Reid patent. A similar System/88 bus logic unit 178 couples the storage control interface 155 to the system bus 30.

A buffer 180, a programmable read only memory 181, a store 182 and a register set 183 are coupled to the PE62 for use during initialization of the System/88 and the System 370. PROM 181 has system test code and IDCODE required to boot the system from a power on sequence. PROM 181 has the synchronization code for S/88 . Register 183 has the system status and control register.

Two of the S/370 chip sets are mounted on the same physical board, brought into synchronization, and execute programs in lock-step, to provide board self checking. The STC Bus 157 and a channel 0, 1 bus will be monitored for potential failures so the S/370 processor cannot propagate an error to another field replaceable unit.

The BCU 156 and adapter 154 of interface 89 allow each processor (PE62, PE85) to have appropriate control over the other processor so that neither operating system is in full control of the system. Each processor's functions are in part controlled by the interface 89 and microcode running in each processor.

Processor to Processor Interface 89

1. I/O Adapter 154

The adapter 154 (FIG. 13) interfaces the S/370 processor 85 to the BCU 156 via its output Channels 0, 1. The Channels include a pair of asynchronous two-byte-wide data buses 250, 251. The buses 250, 251 are coupled to the synchronous four-byte-wide data path in processor bus 170 via a pair of 64 byte buffers 259, 260. Data is transferred from the BCU 156 to adapter 154 (and S/370 main storage 162) via bus 251 and from the adapter 154 to the BCU 156 via bus 250.

The adapter 154 includes the following registers:
1. The base register 110 contains the base-address and queue length used for queue and mailbox-addressing.
2. The readpointer (RPNTR) and the writepointer (WPNTR) registers 111 and 112 contain the offset from the base address to the next queue entry to be accessed for a read or write respectively. Their value will be loaded along with the command into the bus send register (BSR) 116 when the command/address are to be transferred to cache controller 153 via the bus 170.
3. The status register (IOSR) 118 contains all PU-BCU and BCU-PU requests, the status of the inbound message queue, and status of the BCU-interface.
4. If a bit in the exception enable register (ER) 119 is 1 and the corresponding IOSR-bit is 1, an exception in the PE85 is raised.
5. The control word register (CW) 120 controls setting/resetting of some IOSR bits.
6. The address check boundary register (ACBR) 121 holds the starting page address of the internal object area (IOA) 187.
7. The address key registers (ADDR/KEY) 122, 123 are normally loaded by the BCU 156 via the address/data buses 250 and 251 to access a location in the storage 162. These registers can be loaded by the PE85 for testing purposes.

8. The command-registers (CMDO,1) 124, 125 are normally loaded with a command and byte count by the BCU 156. The registers can be loaded by PE85 for testing purposes.

The adapter 154 is the interface between PE85 and the BCU 156. Logically, adapter 154 provides the following services to the BCU 156:

access to the S/370 main storage 162 access to a mailbox and a message queue in S/370 storage 162 a request/response mechanism between PE85 and BCU 156.

Figure 28:
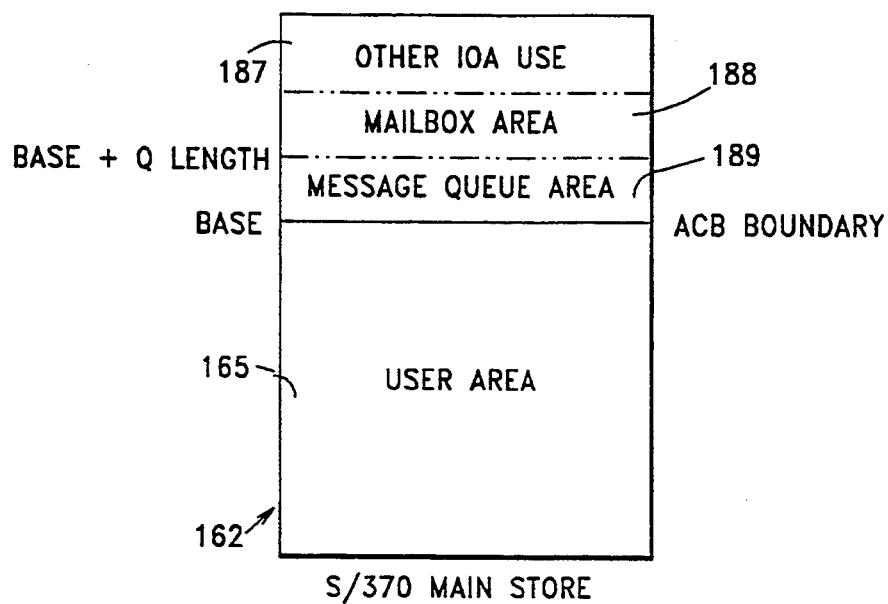
FIGS. 28 and 29 illustrate certain areas of the S/370 main storage and control storage.

The BCU 156 has access to the complete storage 162, including its IOA area 187 (FIG. 28). Adapter 154 performs address boundary checking (ACB check) between the IOA area 187 and the user area 165 while key checking is done by cache controller 153 after receiving key, command and storage 162 address data via the processor bus 170 from adapter 154. If the addressed line of data to be stored is held in the cache, then data is stored in the cache. Otherwise controller 153 transfers the data to main store 162. For data fetches the same mechanism applies in cache controller 153.

I/O command and message transfers between PE85 and BCU 156 are done through predefined storage 162 locations (mailbox area 188 and inbound message queue 189) shown in FIG. 28.

The BCU 156 fetches I/O commands from the mailbox area 188 of 16 bytes. The address for accesses to the mailbox area is computed as follows:

base address + message queue
length + offset-in-mailbox.

The first two terms are supplied by base register 110 of adapter 154, the last by the BCU 156. The queue length is set by two bits in the base register 110 to 1, 2, 4 or 8 kB (i.e. 64 to 512 entries). Its base is set in the base register 110 to a boundary of two times the buffer size (i.e. 2–16 kB respectively).

The inbound message queue 189 stores all messages received via the BCU 154 in chronological order. Each entry is 16 bytes long.

The read pointer (RPNTR) and write pointer (WPNTR) in registers 111, 112 are used by the BCU 156 for reading entries from and writing entries into the queue 189. The PE85 accesses the readpointer by a sense-operation. The base address in register 110 plus WPNTR points to the next queue-entry to be written and base address plus RPNTR points to the next queue-entry to be read.

These pointers are updated after each queue-operation:

WPNTR + 16 = WPNTR after a write
RPNTR + 16 = RPNTR after a read

The following conditions result from comparing the pointers:

RPNTR = WPNTR Queue is empty

RPNTR = WPNTR + 16 Queue is full; if BCU 156 requests write to queue; buffer not available (BNA) sent to BCU via status bus.

The validity of data stored in the mailbox area 188 is signaled from the PE 85 to the BCU 156 and vice versa by the following mechanisms:

PU to BCU request on line 256a (FIG. 16) is set by the PE 85 with a control microinstruction. It advises BCU 156 to fetch an order from the mailbox 188 and to execute it. The request is reset by the BCU after execution of the order. The state of the request can be sensed by the PE 85.

The BCU 156 makes a request when a problem occurs either during execution of an order initiated by the PE 85 or at any other time. It causes an exception in the PE 85, if not selectively masked.

Adapter 154 matches the transfer speed of the asynchronous adapter channels 0,1 to the synchronous processor bus 170. Therefore the BCU 156 is supported by 64 byte data buffers 259, 260 in adapter 154 for data transfer to and from BCU 156 respectively. The array has a 4-byte port to the channel 0,1 bus and to the processor bus 170.

Synchronous registers 113, 114 buffer data transferred between BCU 156 and the buffer arrays 260, 259. Bus receive and send registers 115 and 116 store data received from and transferred to processor bus 170 respectively.

A store operation (I/O Data Store, Queue op) is started by the BCU 156 sending to the adapter 154 the command/byte count, protection key and storage address via the channel 1 bus. The command/byte count is received on the command-bus 252 (FIG. 13) and stored into the command register 125. Key and address data are received from BCU 156 via the address/data-bus 251 (FIG. 13) and stored into the key/addr-register 123. The array write and read address pointers are set to their starting values in register 128. The number of data transfers (2 bytes at a time) on the bus 251 are determined by the byte count. With one store operation, up to 64 bytes of data can be transferred. The storage address of any byte within a store operation may not cross a 64 byte address boundary.

The command/address is followed by data cycles on the bus 251. All data is collected in the 64 byte buffer 260. After the last data is received from the BCU 156, the adapter 154 performs first an internal priority check (not shown) for the two data buffers 259, 260 and then requests mastership (not shown) on the processor bus 170, where adapter 154 has the highest request priority.

In case both buffers 259, 260 request a transfer at the same time the internal priority control grants the bus 170 first to buffer 259 and then without an arbitration cycle to buffer 260, i.e.: reads have priority over writes.

When bus mastership is granted, command/byte count, protection key and the starting address are transferred to cache controller 153. The command transfer cycle is followed by data transfer cycles.

Cache controller 153 performs the protection key checking. A key violation will be reported to adapter 154 in the bus 170 status. Other check conditions detected by cache controller 153 and main store 162 are reported as ANY-CHECK status. A key violation and status conditions detected by adapter 154 will be sent to the BCU 156 in a status transfer cycle.

There are two possible adapter 154 detected status conditions which can be reported to the BCU 156. For both check conditions the access to storage 162 is suppressed.

Each main store address received from the BCU 156 is compared with the address kept in the ACB register to determine whether the access is to the IOA 187 or customer area 165 of storage 162. A "customer" bit received along with each command from the BCU 156 determines whether the main storage access is intended for the IOA area 187 or customer area 165 and checks for improper accesses.

A Buffer Not Available (BNA) condition, described below, is reported only for Queue operations.

Read operations (I/O Read, Mailbox Read) are started by the BCU 156 in a manner essentially the same as store operations. As soon as the command/byte count, protection key and address are received from BCU 156, the adapter 154 internal priority check is performed and processor bus 170 mastership is requested. If bus mastership is granted, command/byte count, protection key and the main store starting address is transferred to cache controller 153 to initiate the read cycle. Adapter 154 loads the requested data first in its buffer 259 and then, on BCU request via the bus 250, to the BCU 156. Status is reported with each data transfer.

The status conditions and reporting mechanism for store operations apply to read operations.

PE85 can access most of the registers in adapter 154 with both sense (read) and control (write) operations via the bus 170.

For sense operations, the command is transferred to adapter 154 and latched into the register 129. Next cycle the sense multiplexor 126 is selected according to the command; and the command is loaded into the BSR 116 to have the expected data valid in the following bus 170 cycle.

If an internal parity error on the register to be sensed is detected, adapter 154 sends data with good parity back to the PE85, but raises a check condition on the Key/Status bus. This function can be tested with a specific sense codepoint.

For control operations, the BUS 170 command will be followed by data, which is loaded into the target register in the next cycle.

If a parity error is detected on the bus 170 in the command cycle for sense or control operations or in the data cycle for control operations, adapter 154 forces a clock stop.

The base register 110 contains the base-address used for queue and mailbox addressing and the queue length code. The queue starts at the base address, the mailbox-area at base+queue length.

The RPNTR and WPNTR registers 111 and 112 registers contain the offset from the base address to the next queue entry to be accessed for a read or write respectively.

When sensed, the read pointer and write pointer are concatenated with the base-address by sense multiplexer 126 in adapter 154. Therefore the word returned by the sensed operation is the complete address of the next queue-entry to be accessed.

The I/O Status Register contains the following bits (in addition to others, not described herein):
  Any Check (Bit 0)—Set to 1, if any check condition in CHSR<0..24> and corresponding CHER-bit is 1. Any Check causes ATTN-REQ. If MODE-REQ<1>=1, then the signal Clock_Stop_Diana becomes active.
  BNA sent (bit 6)—Buffer not available (BNA) bit is 1, when BCU 156 tries to store an inbound message into the queue and the queue is full, i.e. RPNTR equals WPNTR+16. This bit can only be reset by writing a 1 to CW register 120, bit 6.
  Queue not empty (bit 7). This bit is 1 if RPNTR not equal WPNTR. It is 0 if RPNTR=WPNTR. This is the means used to notify the processor 85 that a new message has been received.
  BCU to PU Request (bits 10 and 14)—Set by the BCU 156 via the signal on 'BCU to PU Request' line 256c for channel 0 and 1. Resetting of bits 10 and 14 by PE85 produce a BCU to PU acknowledge on line 256d for channels 0 and 1.
  PU to BCU Req. (bit 11)—Set on line 256a by PE85 by setting bit 11 of CW register 120 for channel 0 and bit 15 CW register 120 for channel 1. Reset by the PU to BCU acknowledge signal on line 256b.
  BCU powerloss (bit 13)—This bit is set to 1 by the BCU 156 when it loses its power or when a 'power on reset' occurs. It is reset to 0 if a 1 is written to the 'Reset BCU powerloss' bit of the CW register 120 and the BCU is no longer in the powerloss state.
  Allow Arbitration (bit 29)—This bit activates the Channel bus signal 'Allow Arbitration' if bit 3 of the adapter mode register is inactive.

The customer access bit, which is part of the command/address received from the BCU 156, determines if the storage access will be in the IOA or customer storage area. If the customer access bit is '0', the page address for the storage access must be within the IOA area 187. No Key checking will be done for these accesses, hence the adapter hardware forces the Key to zero (matches with all key entries).

If the customer access bit is '1', the page address for the storage access must be within the customer storage area 165. Otherwise an ACB check condition is raised for the access.

The PE85 uses Message Commands to read (sense) or write (control) the adapter 154 registers.

The format for these commands is as follows:

| bits | | |
|---|---|---|
| 0–7 CMD = | command type | |
| 8–11 SRC = | requesting Bus Unit Address | |
| 12–15 DST = | receiving Bus Unit Address | |
| 16–23 MSG = | data to be transmitted in cmd cycle | |
| 24–27 REG1 = | register number for CONTROL | |
| 28–31 REG2 = | register number for SENSE | |

The DST field for the PU-BCU Interface is X'8'. Adapter 154 will not decode the SRC and MSG field since there is no information contained for command execution. During control and sense operations, the Reg1 and Reg2 bits will define respectively the register in adapter 154 to be written into and read from.

Figure 16:
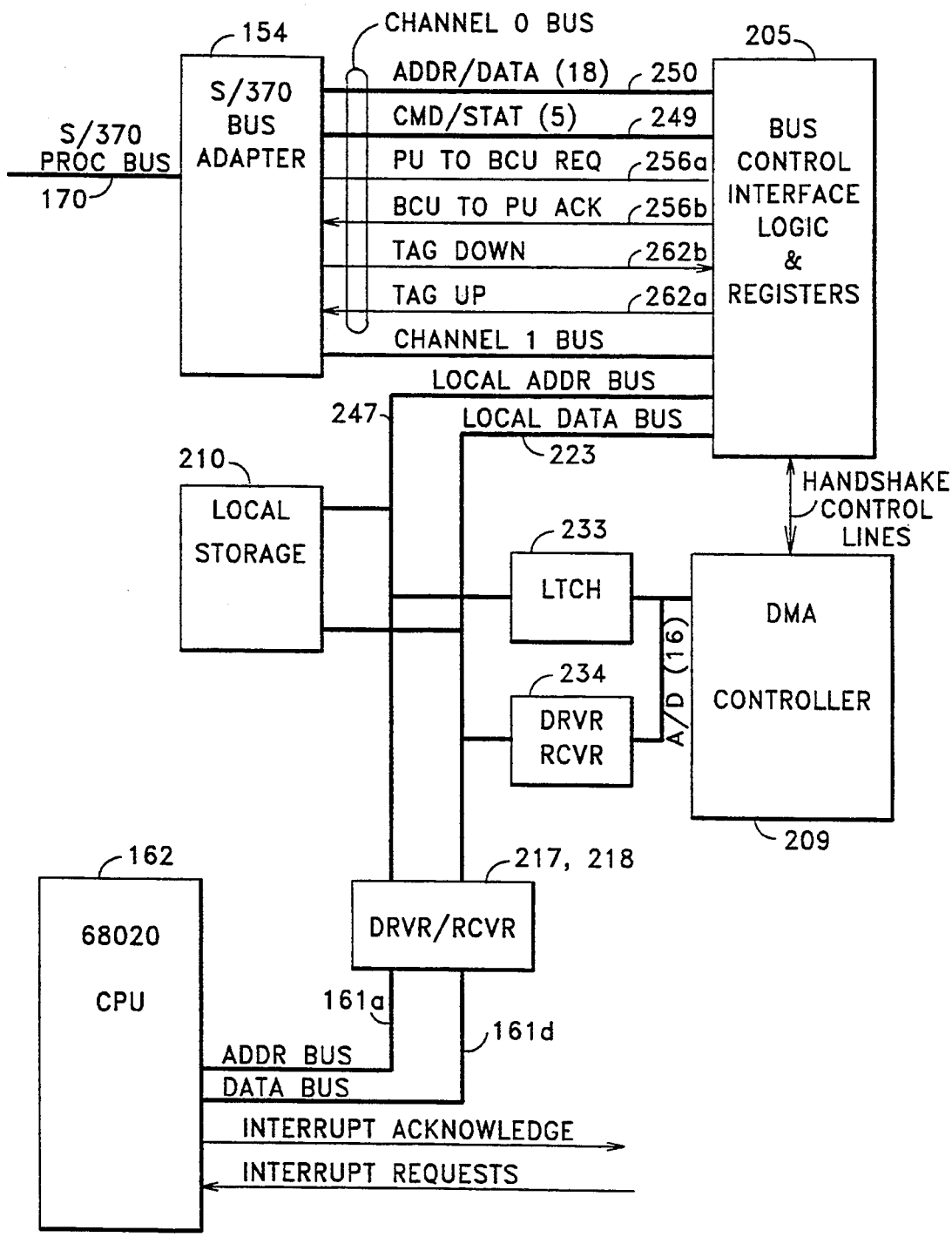
FIG. 16 diagrammatically illustrates the direct interconnection between a S/370 and a S/88 processor in more detail.

2. I/O Adapter Channel 0 and Channel 1 Bus (FIG. 16)

The adapter channel 0 and adapter channel 1 are high speed interconnections from the I/O adapter 154 to the bus control unit 156.

Channel 0 includes:
Address/Data Bus 250 (Bits 0–16, P0, P1)
Command/Status Bus 249 (Bits 0–3, P)
Tag Up (BCU to Buffer) line 262a
Tag Down (Buffer to BCU) line 262b
PU to BCU request line 256a
BCU to PU Acknowledge line 256b Channel 1 includes an address/data bus 251, a command/status bus 252 and tag up and tag down lines 262c and 262d.

Channel 0 is used for data transfers from S/370 storage 162 (and PE 85) to BCU 156 and Channel 1 is used for data transfers from BCU 156 to storage 162 (and PE 85).

The channel buses 249, 250, 251 and 252 originate in the I/O adapter 154 which is essentially a pair of data buffers with control logic capable of storing up to 64 bytes of data each. The buses terminate in the BCU 156. The I/O adapter 154 serves as speed match between the S/370 internal processor bus 170 with its full-word format (32 bits) and the slower buses 249-252 with their half word format (16 bits).

Each channel is organized in two portions, the two-byte wide (half-word) data bus (250, 251) and the half-byte wide (4-bit) command/status bus (249, 252). Tag signals provide the means to control the operations via request/response, and special signals.

The data transfer over each channel occurs always in two cycles (to transfer four bytes over the two-byte bus). Logically, all data transfer is between S/370 main storage 162 and the I/O subsystem including BCU 156. The BCU 156 is the master, that is, it initiates all transfer operations once the PE 85 has signaled the need for it.

The command/status bus (249, 252) is used during a select cycle to define the transfer direction (fetch/store), and the amount of data to be transferred. The address/data bus (250, 251) serves to transfer the main storage address during the select cycle and delivers data during the actual transfer cycle. It is also used to indicate specific areas 188, 189 in storage 162 known as "mailbox" and "message queue". These areas allow the PE 85 to exchange certain information with the BCU 156.

During a fetch operation (from storage 162), the status is transferred over the command/status bus 249 together with the first two bytes of data on bus 250. This status indicates any address check, key check, etc, or is zero to indicate a successful operation.

If a store operation (into storage 162) is performed, a status cycle follows after all data has been delivered to main storage 162.

FIGS. 14A and 14B show the logical usage of the bus portions during subcycle 1 and subcycle 2 of fetch and store operations respectively, wherein:

| | |
|---|---|
| aaa... | address of first (left-most) byte in data field |
| A: | 1 = address check |
| B: | 1 = buffer not available |
| c: | 1 for customer storage (165) access, 0 for microcode area access (IOA 187) |
| ddd.. | 4 bytes data to/from storage |
| fff.. | field length minus 1 in bytes (0..63 decimal) |
| kkkk | storage key (0..15 decimal) |
| K | 1 = keycheck |
| ooooo: | offset within 32 byte mailbox area |
| pp | priority (0..3, 3 is highest) |
| .... | don't care |
| ///: | bus is floating (undefined) |
| in | inbound (BCU to Buffer) |
| out | outbound (Buffer to BCU) |

The following tag lines are used for data transfer operations:

1. PU to BCU Request line 256a from bus adapter 154 to BCU 156 is used by PE 85 to indicate the need for an I/O operation. Once set, the signal remains active until it is reset by the BCU 156.
2. Tag Up line 262a from the BCU 156 to the adapter 154 is used to request outbound data from the adapter 154 or to indicate that input data is available on the bus. Tag Up line 262c functions in the same manner.
3. Tag Down line 262b from the adapter 154 to the BCU 156 is used to indicate a temporary lack of data to the BCU 156, if this situation exists. The falling edge of Tag Down will then indicate the availability of outbound data on the bus. Tag Down line 262d functions in the same manner.
4. BCU to PU Acknowledge line 256b from the BCU 156 to the adapter 154 is used to reset the PU to BCU request signal. This reset is performed when an I/O mailbox operation has been completed.

When the PE 85 detects a Start I/O instruction (SIO) in the instruction stream, it alerts the I/O subsystem, i.e. BCU 156, about the need for an I/O operation by activating the "PU to BCU Request" line 256a. This tag causes the BCU 156 to look into the "mailbox" 188 within store 162 to find out whether this operation is a fetch or a store, how many bytes are to be transferred, etc. The mailbox actually contains the channel SIO, CUA, CAW and command word (CCW) of the pertinent I/O operation.

Store operations are generally those where the BCU 156 sends data to the PE 85. This "data" is either the command/key/address which is sent in the select cycle or the "real" I/O data to be stored in main storage 162. In both cases, the sequence of events is the same.

FIGS. 15A-C diagrammatically illustrate in a generalized form, for the following description, the manner in which data and status information are gated in and out of thirty-two bit buffers/registers in adapter 154 and BCU 156 and in which the higher order (left) and lower order (right) bits of the information are placed on the eighteen bit channel 0, 1 buses of the adapter 154.

Figure 25:
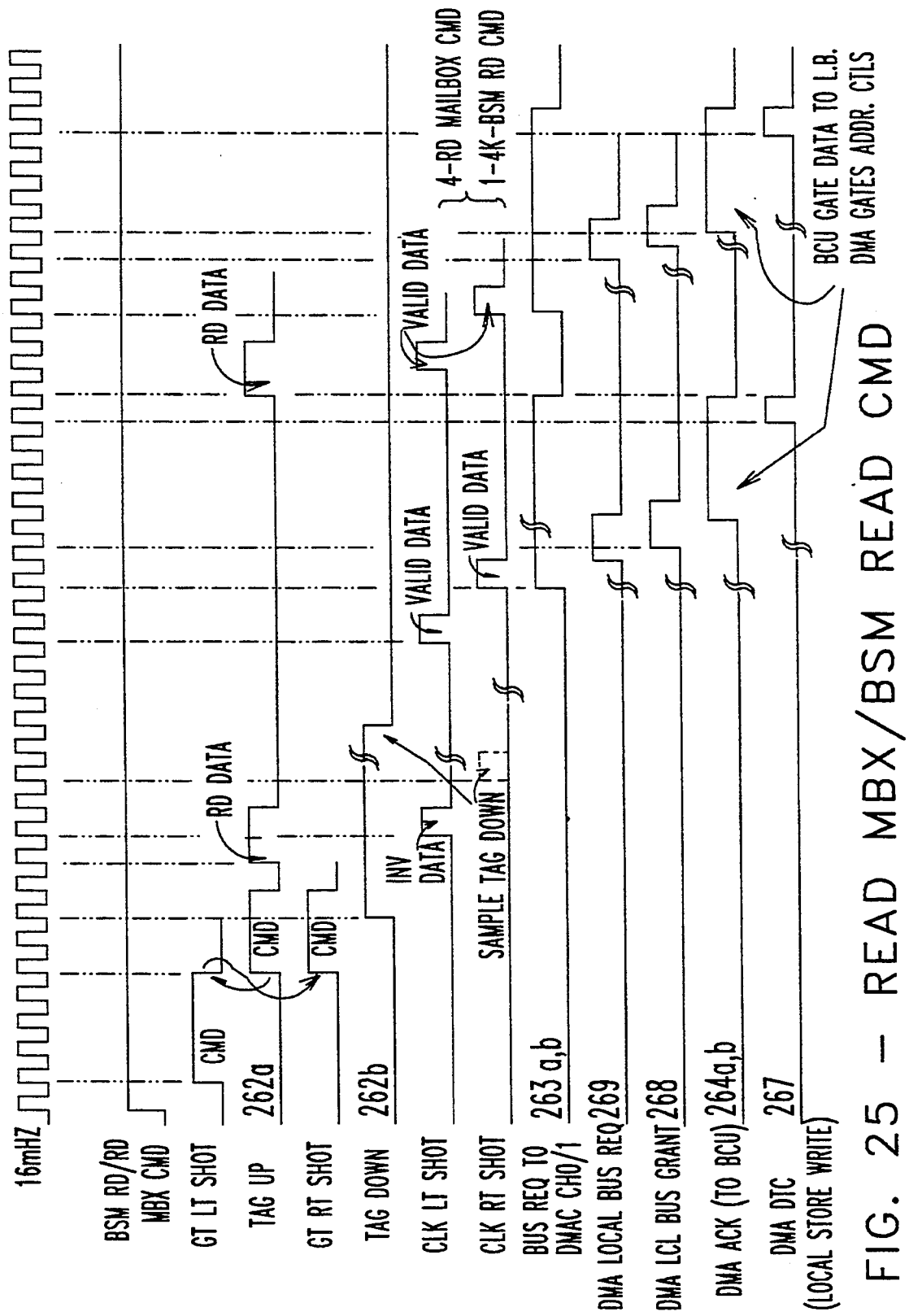
FIGS. 25 and 26 show handshake timing diagrams for adapter bus channels 0, 1 during mailbox read commands, Q select up commands, BSM read commands and BSM write commands.
Figure 26:
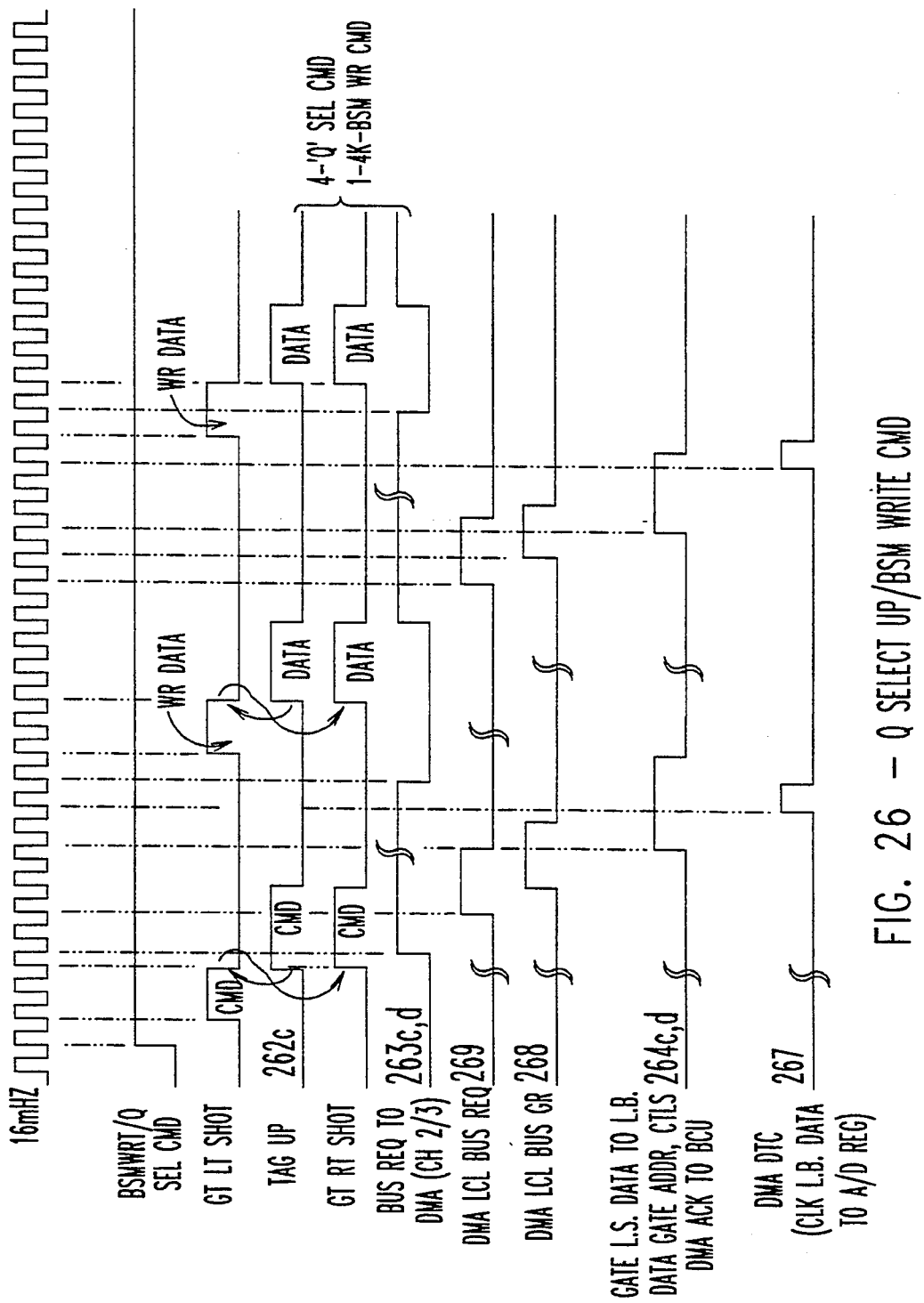

FIGS. 25 and 26 provide a specific set of signals for data transfers between BCU 156 and adapter 154.

With the beginning of a BCU clock cycle during a store operation, FIG. 15A, the BCU 156 places the data for the first cycle onto the bus 251. If this is a select cycle for a main storage data operation, a command, a byte count, an access key and the first byte of the main storage address is placed on the command/status bus 252 and the address/data bus 251, respectively. If this is the select cycle for a mailbox lookup, no main storage address is placed since the command indicates the mailbox which is in a fixed location. The first subcycle is maintained valid on the bus for two subcycle times.

One BCU-clock cycle after the placing of data on the bus 251 during a select cycle, the BCU 156 raises the "Tag Up" signal line. The Tag Up line 262a causes the adapter 154 to store the first two bytes in the left half of register 113. With the beginning of the next clock cycle, the BCU 156 places the data (second two bytes) for the next subcycle on the address/data bus 251 for storage in the other half of the register 113 adapter 154. This data is either the remainder of a main storage address, or an offset (if the shot belongs to a mailbox lookup select cycle). The BCU 156 holds the second two bytes for three BCU clock cycles, then drops the "Tag Up" signal.

Fetch operations are generally those where the BCU 156 demands data from the main storage data space 162, from the microcode area in main storage 162, or from the mailbox or the message queue. In any case, a select cycle must precede such a fetch operation to instruct the logic of adapter 154 about the operation it must execute. The select cycle is performed by placing command/key/address on the bus 249 in a manner similar to the store operation using bus 252, except that the command on the command/status bus 249 is a "fetch" command.

With the beginning of the next clock cycle (after completion of the select cycle) the BCU 156 raises the "Tag Up" signal and maintains it for three BCU clock cycles (FIG. 15B). Tag up demands data from the buffer. Data will be available one cycle later if the buffer can deliver data. Since the operation is semi-synchronous, the BCU 156 assumes that the first two bytes of data are maintained valid on the bus for two cycles, then there is a switch-over time of one cycle, and thereafter the second two bytes of data can be gated to the BCU 156.

However, there are situations in which the adapter 154 has no data available at the instant when "Tag Up" rises. This occurs typically on an "initial" data fetch, that is, when data is fetched from a new address where it takes some time until the fetch request is processed via cache controller 153 and storage controller 155, then back down to the adapter 154. A retry in main storage 162 may likewise cause a temporary delay.

Whenever the adapter 154 cannot deliver data (FIG. 15C), it raises the "Tag Down" line as soon as "Tag Up" is detected. The BCU 156 should sample the "Tag Down" line not later than five cycles after having raised "Tag Up".

The adapter 154 maintains "Tag Down" until the first data word (four bytes) is available. At that instant, the adapter 154 places the first two bytes onto the bus 250 and drops "Tag Down". The falling edge of the "Tag Down" signal triggers the BCU's logic 253.

The BCU 156 assumes that the first bytes are valid for two cycles following the dropping of "Tag Down," and thereafter the second two bytes are available. Depending on the count that is set up during the select cycle up to 60 bytes can follow, two bytes at a time.

When all mailbox data which was ordered in a select cycle has been received, the BCU 156 raises the "BCU to PU Acknowledge" signal on line 256b to the adapter 154 to reset the PU to BCU request on line 256a that started the operation.

Most information transfer between PE 85 and BCU 156 is done through predefined storage locations 188, 189 using the base address and the queue length stored in base register 110 in the adapter 154. The inbound message queue 189 stores all messages sent by the BCU in chronological order.

Figure 17:
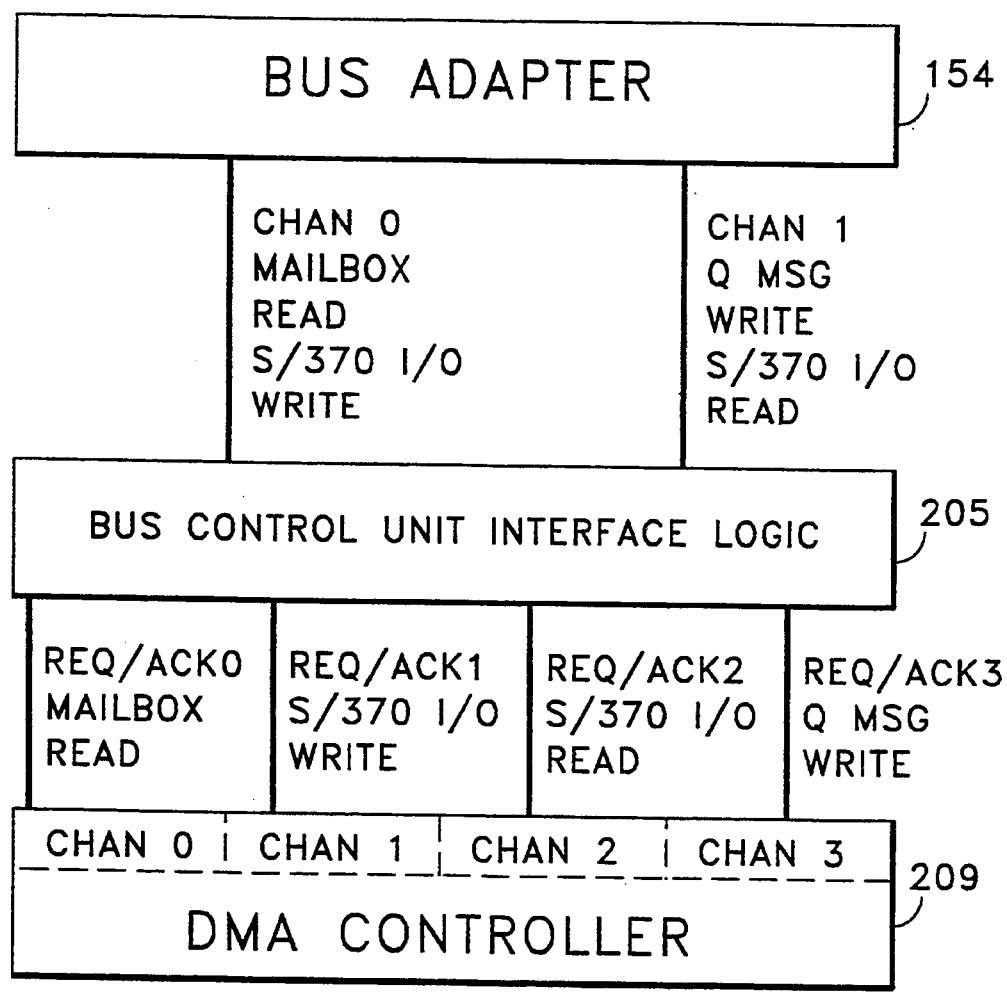
FIG. 17 conceptually illustrates data flow between a S/370 bus adapter and a DMA controller of the interconnection of FIG. 16.

3. The Bus Control Unit 156—General Description (FIGS. 16, 17)

The Bus Control Unit (BCU) 156 is the primary coupling hardware between the S/370 processor 85 and its associated S/88 processor 62 which is utilized to perform the S/370 I/O operations.

The BCU 156 includes means which interacts with an application program (EXEC370) and microcode (ETIO) running on the S/88 processor 62 to present interrupts to the processor 62 and to asynchronously uncouple the processor 62 from its associated hardware and to couple the processor 62 to the BCU 156, all transparent to the S/88 operating system. The transparent interrupt and uncoupling functions are utilized to permit the direct coupling of the S/370 and S/88 processors for the efficient transfer of S/370 I/O commands and data from the S/370 processor 85 to the S/88 processor 62 for the conversion of the commands and data to a form usable by the S/88 processor 62 to perform the desired S/370 I/O operations.

It will be appreciated that EXEC370 and ETIO may both be either microcode or application program and stored in either store 174 or cache 173.

The BCU 156, FIG. 16, includes bus control unit interface logic and registers 205, a direct memory access controller (DMAC) 209 and a local store 210. Local address and data buses 247, 223 couple store 210 to the PE 62 address, data buses 161A, 161D via driver/receiver circuits 217, 218 and to the interface logic 205. DMAC 209 is coupled to address bus 247 via latches 233 and to data bus 223 via driver/receivers 234.

DMAC 209 in the preferred embodiment is a 68450 DMA controller described in greater detail below.

DMAC 209 has four channels 0-3 which are coupled to the interface logic 205 (FIG. 17) by respective Request and Acknowledge paths, each dedicated to a specific function; Channel 0 transfers S/370 I/O commands from a mail box area 188 (FIG. 28) in S/370 storage 162 to local store 210 (MAILBOX READ). Channel 1 transfers S/370 data from storage 162 to store 210 (S370 I/O WRITE). Channel 2 transfers data from store 210 to storage 162 (S/370 I/O Read). Channel 3 transfers high priority S/88 messages from Store 210 to a message queue area 189 (FIG. 28) in Storage 162 (Q Message WRITE).

The bus adapter 154 has two channels 0 and 1. Adapter channel 0 handles the MAILBOX READ and S/370 I/O WRITE functions of DMAC channels 0, 1 (i.e., data flow from S/370 to BCU 156). Adapter channel 1 handles the S/370 I/O READ and Q MESSAGE WRITE functions of DMAC channels 2, 3 (i.e., data flow from BCU 156 to S/370).

4. Direct Memory Access Controller 209

The DMAC 209 is preferably of the type described (MC68450) in the M68000 Family Reference Manual, FR68K/D, Copyright Motorola, Inc., 1988. Said manual is hereby incorporated by reference as if it were set forth herein in its entirety. The DMAC 209 is designed to complement the performance and architectural capabilities of Motorola M68000 Family microprocessors (such as the M68020 processor element 62 of the present application) by moving blocks of data in a quick, efficient manner with minimum intervention from a processor. The DMAC 209 performs memory-to-memory, memory-to-device, and device-to-memory data transfers.

It includes four independent DMA channels with programmable priority and uses the asynchronous M68000 bus structure with a 24-Bit address and a 16-bit data bus. It can be addressed explicitly or implicitly.

The main purpose of a DMAC such as 209 in any system is to transfer data at very high rates, usually much faster than a microprocessor under software control can handle. The term direct memory access (DMA) is used to refer to the ability of a peripheral device to access memory in a system in the same manner as a microprocessor does. The memory in the present application is local store 210. DMA operation can occur concurrently with other operations that the system processor needs to perform, thus greatly boosting overall system performance.

The DMAC 209 moves blocks of data at rates approaching the limits of the local bus 223. A block of data consists of a sequence of byte, word, or long-word operands starting at a specific address in storage with the length of the block determined by a transfer count. A single channel operation may involve the transfer of several blocks of data to or from the store 210.

Any operation involving the DMAC 209 will follow the same basic steps: channel initialization by PE62, data transfer, and block termination. In the initialization phase, the processor PE62 loads the registers of the DMAC with control information, address pointers, and transfer counts and then starts the channel. During the transfer phase, the DMAC 209 accepts requests for operand transfers and provides addressing and bus control for the transfers. The termination phase occurs after the operation is complete, when the DMAC indicates the status of the operation in the status register CSR. During all phases of a data transfer operation, the DMAC 209 will be in one of three operating modes:

1. IDLE—This is the state that the DMAC 209 assumes when it is reset by an external device and waiting for initialization by the system processor 62 or an operand transfer request from a peripheral.
2. MPU—This is the state that the DMAC 209 enters when it is chip selected by another bus master in the system (usually the main system processor 62). In this mode, the DMAC internal registers are written or read, to control channel operation or check the status of a block transfer.
3. DMA—This is the state that the DMAC 209 enters when it is acting as a bus master to perform an operand transfer.

The DMAC can perform implicit address or explicit address data transfers. For explicit transfers, data is transferred from a source to an internal DMAC holding register, and then on the next bus cycle it is moved from the holding register to the destination. Implicit transfers require only one bus cycle because data is transferred directly from the source to the destination without internal DMAC buffering.

There are three types of channel operations: 1) single block transfers, 2) continued operation, and 3) chained operations. When transferring single blocks of data, the memory address and device address registers MAR and DAR are initialized by the user to specify the source and destination of the transfer. Also initialized is the memory transfer count register to count the number of operands transferred in a block.

The two chaining modes are array chaining and linked array chaining. The array chaining mode operates from a contiguous array in store 210 consisting of memory addresses and transfer counts. The base address register BAR and base transfer count register BTC are initialized to point to the beginning address of the array and the number of array entries, respectively. As each block transfer is completed, the next entry is fetched from the array, the base transfer count is decremented and the base address is incremented to point to the next array entry. When the base transfer count reaches zero, the entry just fetched is the last block transfer defined in the array.

The linked array chaining mode is similar to the array chaining mode, except that each entry in the memory array also contains a link address which points to the next entry in the array. This allows a non-contiguous memory array. The last entry contains a link address set to zero. The base transfer count register BTC is not needed in this mode. The base address register BAR is initialized to the address of the first entry in the array. The link address is used to update the base address register at the beginning of each block transfer. This chaining mode allows array entries to be easily moved or inserted without having to reorganize the array into sequential order. Also, the number of entries in the array need not be specified to the DMAC 209. This mode of addressing is used by DMAC 209 in the present application for accessing free work queue blocks (WQB) from a link list in a manner described in detail below.

The DMAC 209 will interrupt the PE62 for a number of event occurrences such as the completion of a DMA operation, or at the request of a device using a PCL line 57a–d. The DMAC 209 holds interrupt vectors in eight on-chip vector registers for use in the PE62 vectored interrupt structure. Two vector registers, normal interrupt vector (NIV) and error interrupt vector (EIV), are available for each channel.

Each channel is given a priority level of 0, 1, 2, or 3, i.e., channel 0, 1, 2, 3 are assigned priority levels 0, 2, 2, 1 respectively (priority level 0 is highest).

Requests are externally generated by a device or internally generated by the auto-request mechanism of the DMAC 209. Auto-requests may be generated either at the maximum rate, where the channel always has a request pending, or at a limited rate determined by selecting a portion of the bus bandwidth to be available for DMA activity. External requests can be either burst requests or cycle steal requests that are generated by the request signal associated with each channel.

The DMAC 209 contains 17 registers (FIG. 18) for each of the four channels plus one general control register GCR, all of which are under software control.

The DMAC 209 registers contain information about the data transfers such as the source and destination address and function codes, transfer count, operand size, device port size, channel priority, continuation address and transfer count, and the function of the peripheral control line. One register CSR also provides status and error information on channel activity, peripheral inputs, and various events which may have occurred during a DMA transfer. The general control register GCR selects the bus utilization factor to be used in limited rate auto-request DMA operations.

The input and output signals are functionally organized into the groups as described below (Ref. FIG. 19A).

The address/data bus (A8–A23, DO–D15) 248 a 16-bit bus, is time multiplexed to provide address outputs during the DMA mode of operation and is used as a bidirectional data bus to input data from an external device (during a PE62 write or DMAC read) or to output data to an external device (during an PE62 read or a DMAC write). This is a three-state bus and is demultiplexed using external latches and buffers 233, 234 controlled by the multiplex control lines OWN and DDIR.

Lower address bus lines A1 through A7 of bus 247 are bidirectional three-state lines and are used to address the DMAC internal registers in the MPU mode and to provide the lower seven address outputs in the DMA mode.

Function code lines FC0 through FC2 are three-state output lines and are used in the DMA mode to further qualify the value on the address bus 247 to provide separate address spaces that may be defined by the user. The value placed on these lines is taken from one of the internal function code registers MFC, DFC, BFC, depending on the register that provides the address used during a DMA bus cycle.

Asynchronous bus control lines control asynchronous data transfers using the following control signals: select address strobe, read/write, upper and lower data strobes, and data transfer acknowledge. These signals are described in the following paragraphs.

SELECT input line 296 is used to select the DMAC 209 for an MPU bus cycle. When it is asserted, the address on A1–A7 and the data strobes (or AO when using an 8-bit bus) select the internal DMAC register that will be involved in the transfer. SELECT should be generated by qualifying an address decode signal with the address and data strobes.

ADDRESS STROBE (AS) on line 270b is a bidirectional signal used as an output in the DMA mode to indicate that a valid address is present on the address bus 161. In the MPU or IDLE modes, it is used as an input to determine when the DMAC can take control of the bus (if the DMAC has requested and been granted use of the bus).

READ/WRITE is a bidirectional signal (not shown) used to indicate the direction of a data transfer during a bus cycle. In the MPU mode, a high level indicates that a transfer is from the DMAC 209 to the data bus 223 and a low level indicates a transfer from the data bus to the DMAC 209. In the DMA mode, a high Level indicates a transfer from the addressed memory 210 to the data bus 223 and a low level indicates a transfer from the data bus 223 to the addressed memory 210.

UPPER AND LOWER DATA STROBE bidirectional lines (not shown) indicate when data is valid on the bus and what portions of the bus should be involved in a transfer D8–15 or DO–7.

DATA TRANSFER ACKNOWLEDGE (DTACK) bidirectional line 265 is used to signal that an asynchronous bus cycle may be terminated. In the MPU mode, this output indicates that the DMAC 209 has accepted data from the PE62 or placed data on the bus for PE62. In the DMA mode, this input 265 is monitored by the DMAC to determine when to terminate a bus cycle. As long as DTACK 265 remains negated, the DMAC will insert wait cycles into a bus cycle and when DTACK 265 is asserted, the bus cycle will be terminated (except when PCL 257 is used as a ready signal, in which case both signals must be asserted before the cycle is terminated).

Multiplex control signals on lines OWN and DDIR are used to control external multiplex/demultiplex devices 233, 234 to separate the address and data information on bus 248 and to transfer data between the upper and lower halves of the data bus 223 during certain DMAC bus cycles. OWN line is an output which indicates that the DMAC 209 is controlling the bus. It is used as the enable signal to turn on the external address drivers and control signal buffers.

BUS REQUEST (BR) line 269 is an output asserted by the DMAC to request control of the local bus 223, 247.

BUS GRANT (BG) line 268 is an input asserted by an external bus arbiter 16 to inform the DMAC 209 that it may assume bus mastership as soon as the current bus cycle is completed.

The two interrupt control signals IRQ and IACK on lines 258a and 258b form an interrupt request/acknowledge handshake sequence with PE62 via interrupt logic 212. INTERRUPT REQUEST (IRQ) on line 258a is an output is asserted by the DMAC 209 to request service from PE62. INTERRUPT ACKNOWLEDGE (IACK) on line 258b is asserted by PE62 via logic 216 to acknowledge that it has received an interrupt from the DMAC 209. In response to the assertion of IACK, the DMAC 209 will place a vector on DO–D7 of bus 223 that will be used by the PE 62 to fetch the address of the proper DMAC interrupt handler routine.

The device control lines perform the interface between the DMAC 209 and devices coupled to the four DMAC channels. Four sets of three lines are dedicated to a single DMAC channel and its associated peripheral; the remaining lines are global signals shared by all channels.

REQUEST (REQ0 THROUGH REQ3) inputs on lines 263a–d are asserted by logic 253 to request an operand transfer between main store 162 and store 210.

ACKNOWLEDGE (ACK0 THROUGH ACK3) outputs on lines 264a–d are asserted by the DMAC 209 to signal that an operand is being transferred in response to a previous transfer request.

PERIPHERAL CONTROL LINES (PCL0 THROUGH PCL3) 257a–d inclusive are bidirectional lines between interface logic 253 and DMAC 209 which are set to function as ready, abort, reload, status, interrupt, or enable clock inputs or as start pulse outputs.

DATA TRANSFER COMPLETE (DTC) line 267 is an output asserted by the DMAC 209 during any DMAC bus cycle to indicate that data has been successfully transferred.

DONE (DONE). This bidirectional signal is asserted by the DMAC 209 or a peripheral device during DMA bus cycle to indicate that the data being transferred is the last item in a block. The DMAC will assert this signal during a bus cycle when the memory transfer count register is decremented to zero.

5. Bus Control Unit 156—Detailed Description (FIGS. 19A–C, 20)

(a) Interface Registers for High Speed Data Transfer

The BCU interface logic 205 (FIG. 16) has been separated into various functional units for ease of illustration and description in FIGS. 19A–C. Thus, the logic 205 includes a plurality of interface registers interposed between the local data bus 223 and the adapter channels 0, 1 for increasing the speed and performance of data transfers between the adapter 154 and the BCU 156. The hardware logic 253 of interface 205 together with DMAC 209, the address decode and arbitration logic 216 and address strobe logic 215 control the operations of the BCU 156.

The interface registers include a channel 0 read status register 229 and a channel 1 write status register 230 coupled to the channel 0 and 1 command status buses 249, 252 for holding the status of data transfers between adapter 154 and BCU 156.

Channel 0 and 1 command 214, 225 registers temporarily store the data transfer commands from BCU 156 to the adapter 154, S/370.

Channel 0, 1 address/data registers 219,227 hold the S/370 address for transfer to adapter 154 during S/370 I/O data transfers. Register 227 also holds succeeding I/O data words (up to 4 bytes) of data transfers (up to 64 bytes per address transfer) to adapter 154 after each address transfer.

Channel 0 read buffer receives I/O data transferred from adapter 154 during BCU mailbox read and S/370 I/O write operations.

Channel 0, 1BSM read/write select up byte counters 220, 222 and BSM read/write boundary counters 221, 224 hold byte counts for transfer of data from the BCU 156 to adapter 154. Both counters are required for each channel to avoid the crossing of S/370 sixty-four byte address boundaries by data transfers. As will be described in greater detail later, counters 220, 222 initially store the total byte count to be transferred for an I/O operation (up to 4KB) and are used to transfer count values to registers 214, 225 to partially form a S/370 starting address only for the last block (64 bytes) transfer, i.e. the last command/data transfer operation. The boundary counters 221, 224 are used to present (in part) a starting S/370 address whenever a boundary crossing is detected by the BCU 156 for any single command data transfer operation or when the byte count is greater than 64 bytes.

The counters 220, 221, 222 and 224 are appropriately decremented after each data transfer over channel 0 or 1.

A queue counter 254 provides a similar function for message transfers (up to sixteen bytes) to S/370 storage via adapter 154.

The addresses for selecting the above interface registers are in the store 210 address space, FIG. 23C, and are selected by decoding the address on bus 247 in a well known manner.

A signal on PU to BCU request line 256a from the adapter 154 to logic 253 notifies BCU 156 that a S/370 mailbox read request is ready. This signal is not reset by a BCU PU acknowledge signal on line 256b until the mailbox information has been stored into local store 210.

Tag up and tag down lines 262a-d are used for strobing data between the BCU 156 and adapter 154 over adapter channels 0, 1.

Handshake signals are provided between the BCU logic 253 and DMAC 209. BCU logic makes service requests on lines 263a-d, one for each DMAC channel. DMAC responds with acknowledge signals on lines 264a-d. Other lines such as select 270, data transfer acknowledge 265, peripheral control lines 257a-d, data transfer complete 267 have been described above with respect to DMAC 209.

Figure 20:
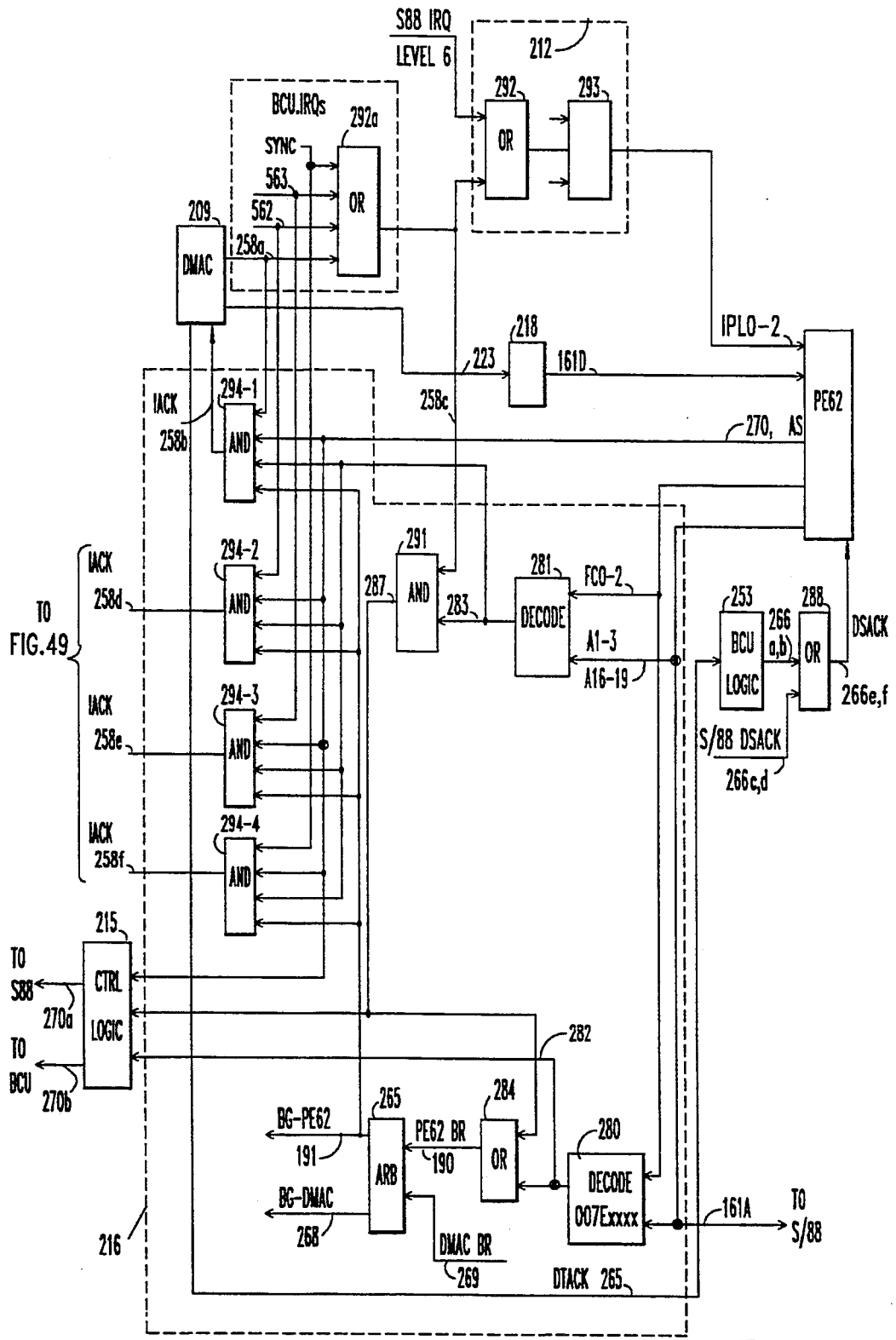
FIG. 20 is a schematic diagram of a preferred form of the logic uncoupling the S/88 processor from its associated system hardware and of the logic for handling interrupt requests from the alien S/370 processor to the S/88 processor.
Figure 21:
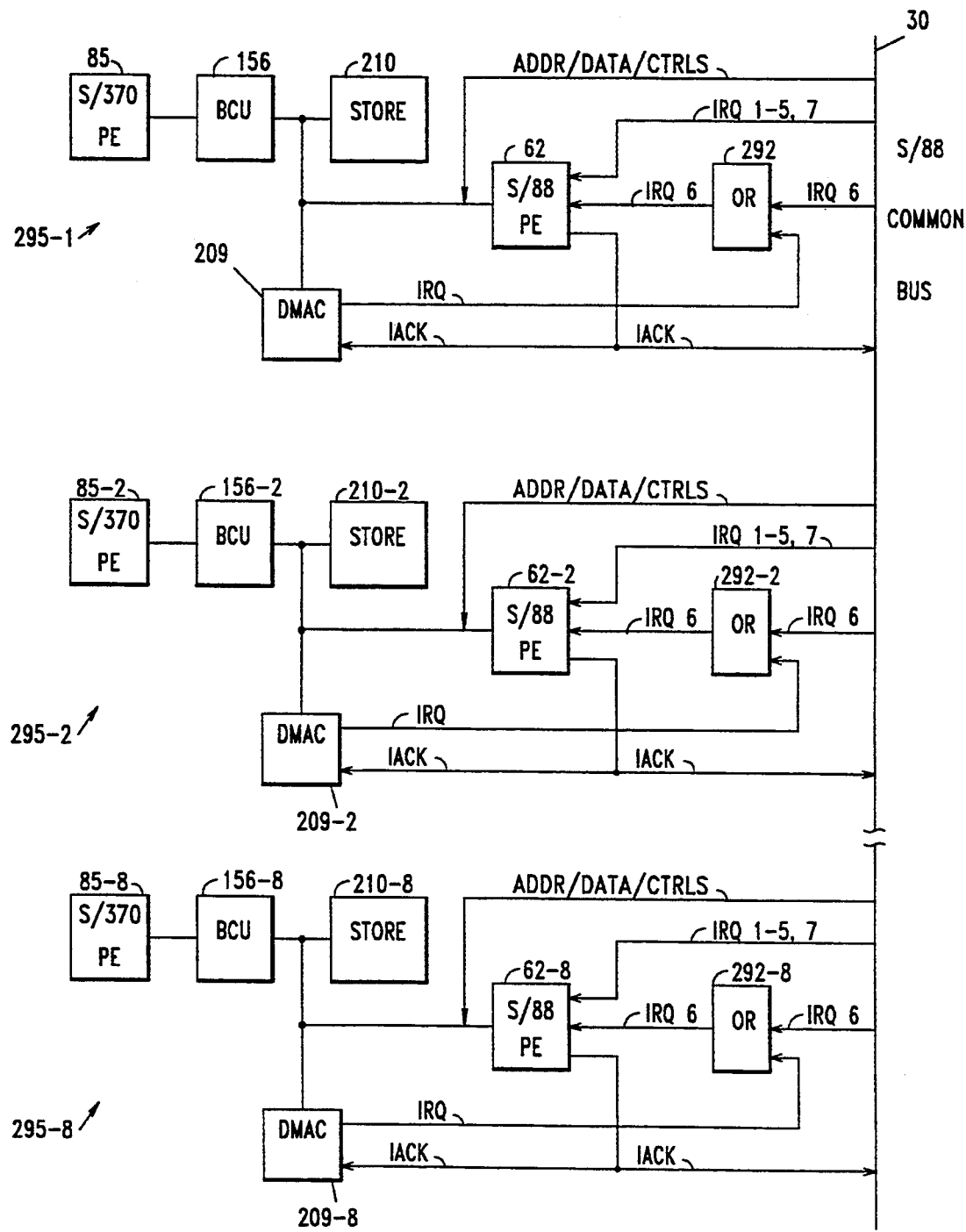
FIG. 21 conceptually illustrates the modification of the existing S/88 interrupt structure for a module having a plurality of interconnected S/370-S/88 processors according the teachings of the present application.

(b) BCU Uncouple and Interrupt Logic 215, 216 (FIGS. 20, 21)

It has been mentioned earlier that two features are critical to achieving the tight coupling of the S/370 and S/88 processors in such a way as to provide for the S/370 system many of the unique characteristics of the S/88 system such as fault-tolerant operation and a single system image environment. Those features are referred to herein as "uncoupling" of the S/88 processor from its associated hardware and a "unique interrupt" mechanism. Both features operate in a fashion which is transparent to the S/88 Operating System. The uncoupling and interrupt logic 215, 216 are provided in the BCU 156.

The "uncoupling" logic decodes the virtual address applied to the S/88 processor address bus 161A during each instruction execution cycle. If one of the block of preselected S/88 virtual addresses assigned to the BCU 156 and its store 210 are detected, the address strobe (AS) signal from the S/88 processor 62 is gated to the BCU 156 rather than to the associated S/88 hardware. This action prevents the S/88 Operating System and hardware from knowing a machine cycle has taken place, that is the action is transparent to the S/88.

However, the S/88 processor 62 is coupled to control the BCU 156 during this machine cycle, the AS signal and the preselected address being used to select and control various components in the BCU 156 to perform a function, related to S/370 I/O operations.

Special application code (EXEC370) running on the S/88 processor 62 initiates communication with the S/370 processor 85 by placing these preselected virtual addresses on the S/88 bus 161A to direct the BCU 156 to perform operations to effectuate said communication.

The DMAC 209 and other logic in the BCU 156 present interrupts to the S/88 at a specified level (6) calling this special application code into action as required. The presentation of each interrupt is transparent to the S/88 Operating System.

A brief description of the type of functions performed by a few of the interrupt handler routines in response to these interrupts will be described later with respect to one example in a firmware overview of S/370 I/O operations.

The mechanism and S/88 operating system modifications for handling the S/370 interrupts to S/88 via DMACs such as 209, both on a partnered unit basis and in a module having multiple partnered units will now be described.

It will be recalled that one partner unit is a connected sandwich of a modified dual S/88 processor board with a dual S/370 processor board containing dual local stores, DMACs, and custom logic. The like elements of this dual sandwiched board operate in parallel, in full synchronism (lock-step) for fault-detection reasons.

This entire sandwich normally has an identical partner sandwich, and the partners run in lock-step, thus appearing as a single fault-tolerant entity. It is sufficient to the following discussion to consider this doubly-replicated hardware as a single operational unit as shown in FIG. 21.

In a preferred embodiment, up to eight of these operational units 295 to 295-8 may reside within a single module enclosure, sharing main memory, I/O facilities, and power supplies, under the control of a single copy of the S/88 Operating System. The unit 295 (and each other unit 295-2 and 295-8) corresponds to a pair of partner boards such as boards 21, 23 of FIG. 7. Importantly, in this multiple-CPU configuration, the S/88 processor units 62 to 62-8 operate as multi-processors sharing the S/88 workload, but the S/370 units 85 to 85-8 operate separately and independently and do not intercommunicate. Each S/370 unit runs under control of its own Operating System, and has no 'knowledge' of any other CPU in the enclosure (either S/370 or S/88 ).

Due to the multi-processing environment and the S/88 architecture, the handling of interrupts in the normal S/88 system is shared among the CPU units 62 to 62-8. In a simplified view, each interrupt (from I/O, timers, program traps, etc.) is presented on the common bus 30 to all S/88 processor units in parallel; one unit accepts the responsibility for servicing it, and causes the other units to ignore it. Regardless of which is the servicing CPU unit, there is a single vector table, a single entry point (per vector) within the Operating System for the handler code, and disposition of the interrupt is decided and handled by the (single) Operating System.

In a multiple-S/370 configuration, all of the normal S/88 interrupts operate as described above; no S/88 interrupt handler code is changed. Minor hardware changes to allow DMAC 209 to 209-8 interrupt presentation are entirely transparent to the normal S/88 interrupt mechanism and software.

A requirement is that a DMAC interrupt must be handled only by the S/88 processor 62 to which that DMAC, BCU, and S/370 is attached, so that the multiple S/370 units 85 to 85-8 cannot interfere with each other. To this end, the DMAC IRQ line 258a is wired directly to the S/88 processor 62 to which the DMAC 209 is attached and does not appear on the common S/88 bus 30, as do all of the normal S/88 interrupt request lines. During the time-slices usurped from S/88 for S/370 support, a given S/88 processor 62 is dedicated to the S/370 to which it is directly attached.

Eight user vector locations within the main S/88 vector table are reserved for use by the DMACs, and these vectors are hard-coded addresses of eight DMAC interrupt handlers which are added to the S/88 Operating System. These eight interrupt handlers are used by all S/88 processors to process interrupts presented by all DMACs for the associated S/370 processors.

Each DMAC such as 209 has a single interrupt request (IRQ) output signal and eight internal vector registers (two per channel, one each for normal operations and DMAC-detected errors). At initialization time (described later), these DMAC vector register values are programmed to correspond to the eight reserved main vector-table locations mentioned above. Thus a DMAC may request one of eight handler routines when it presents IRQ. These handlers access the DMAC, BCU hardware, queues, linked lists, and all control parameters by presenting virtual addresses that lie within the address range of the 'hidden' local store 210. The hardware design ensures that each S/88 processor such as 62 can access its own store such as 210 and no others, even though a common virtual-address uncoupling 'window' is shared among multiple S/370 units. That is, the S/88 virtual address space 007EXXXX is used by all S/88 -S/370 multiprocessors in a module even though each partnered unit such as 21, 23 has its dedicated S/88 physical storage as shown in FIG. 10.

In the multiple-S/370 configurations, all of the DMACs 209 to 209-8 are programmed identically as regards these eight vector registers, and all share the eight reserved vectors in the main vector table, as well as the handler routines. Differentiation, as well as uncoupling, occur at each access to the store such as 210.

The hard-wired presentation of the DMAC IRQ to its own S/88 processor 62, together with the uncoupling, assures separation and integrity of the S/370 processor units and noninterference with the S/88 normal operation. Except for the 'lost' S/88 CPU time, the servicing of these interrupts is transparent to the S/88 Operating System.

The complete interrupt design thus accomplishes intermittent 'dedicated upon demand' servicing of the S/370 DMAC interrupts, with isolation and protection for multiple S/370 units, by usurping individual processor facilities from a multiprocessing system environment which uses a different interrupt servicing philosophy, with essentially no impact upon the multiprocessing system operation and no significant changes to the multiprocessing Operating System.

For a more detailed operation of each DMAC interrupt mechanism, attention is directed to FIGS. 19A and 20. When a peripheral device such as DMAC 209 having selection vectors presents an interrupt request (IRQ) to the S/88 processor 62, a single IRQ line 258a is made active by the device. This IRQ line is wired to an encoding circuit 293 in a manner specified by the S/88 processor architecture, so as to present an encoded interrupt request to the S/88 processor 62 via input pins IPL0-IPL2 at a specific priority level 6.

The processor 62 effectively decides when it can service the interrupt, using priority masking bits kept in the internal status register. When ready, the processor 62 begins a special 'Interrupt Acknowledge' (IACK) cycle.

In the IACK cycle, which is internally controlled by the processor 62, a unique address configuration is presented on the address bus 161A in order to identify the type of cycle and priority level being serviced. This is also effectively a demand for a vector number from the interrupting device. All requesting devices compare the priority level being serviced with their own, and the device with a matching priority gates a one-byte vector number to the data bus 161D for the processor 62 to read.

Once the vector number is obtained, the processor 62 saves basic internal status on a supervisor stack and then generates the address of the exception vector to be used. This is done by internally multiplying the device's vector number by four, and adding this result to the contents of the internal Vector Base Register, giving the memory address of the exception vector. This vector is the new program counter value for the interrupt handler code.

The first instruction is fetched using this new program counter value, and normal instruction decoding and execution is resumed, in supervisor state, with the processor 62 status register set to the now-current priority level.

The above steps, from the start of the IACK cycle through the fetching of the first interrupt handler instruction, are done by a combination of hardware and processor 62 internal operations and do not require program instruction execution. The net effect is transparent pre-emption of the previously running (lower priority) program in order to execute the higher priority interrupt handler.

The DMAC 209 interrupts in the preferred embodiment are wired to priority level six, and conform entirely to the processor 62 architecture. The DMAC 209 has eight vector numbers programmed internally, and eight separate handler routines are used.

The decode and arbitration logic 216 (FIG. 19A) and AS control logic 215 control this interrupt function during the IACK cycle in addition to providing the S/88 processor 62 uncoupling function.

Both of these detailed hardware functions will now be described with attention being directed to FIG. 20 which shows details of logic 215 and 216 of FIG. 19A. The address strobe line 270 from PE62 is coupled to one input of control logic 215. Logic 216 has a pair of decode circuits 280, 281. The output 282 of circuit 280 is coupled to logic 215; the output 283 of circuit 281 is also coupled to logic 215 via AND gate 291 and line 287. Normally during instruction execution, decode circuits 280, 281 permit the address strobe signal (AS) on line 270 to pass through logic 215 to line 270a which is the normal address strobe to S/88 hardware associated with PE62.

Figure 22:
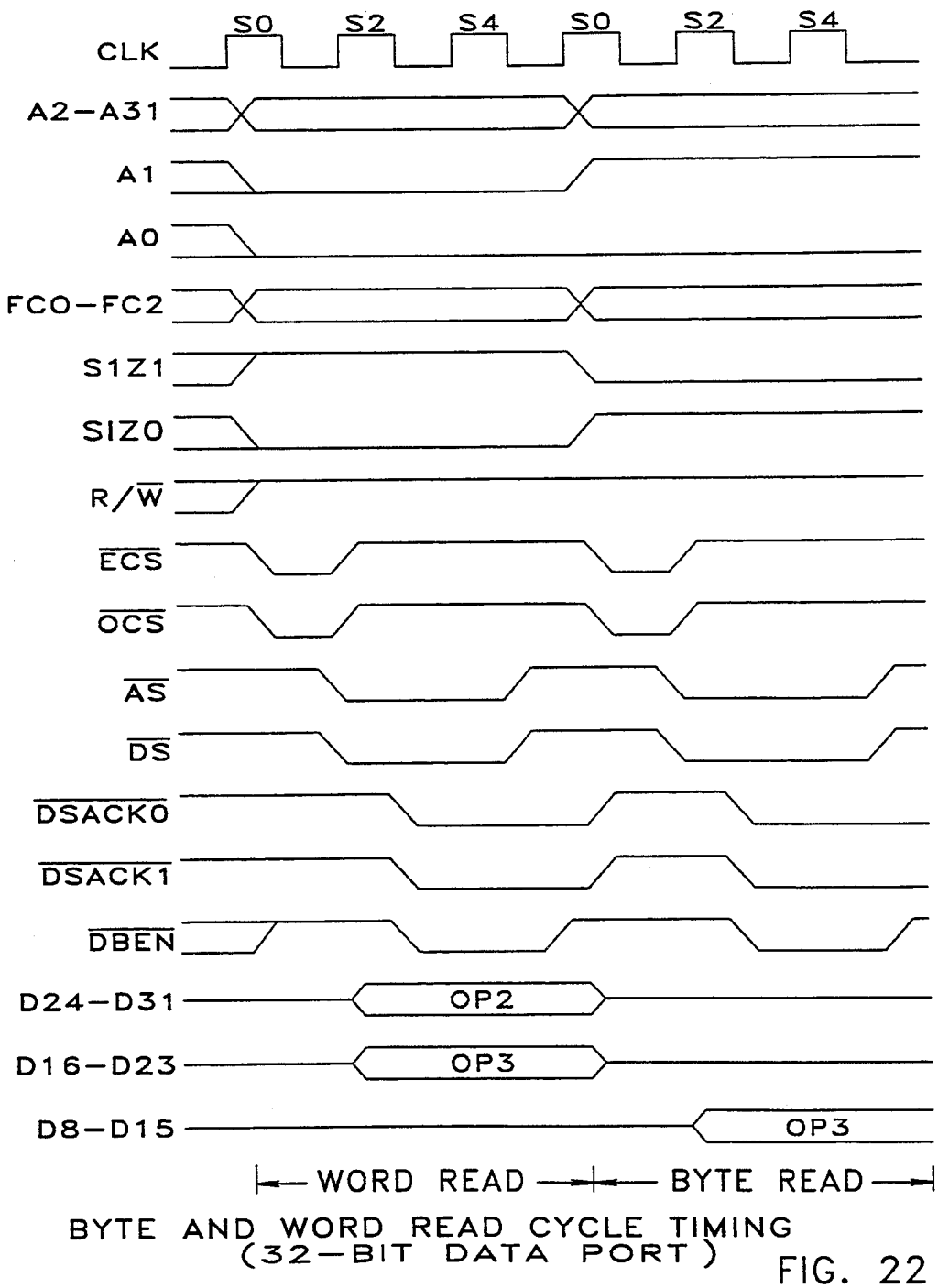
FIGS. 22, 23 and 24 are timing diagrams for Read, Write and Interrupt Acknowledge cycles of the preferred form of the S/88 processors.
Figure 23:
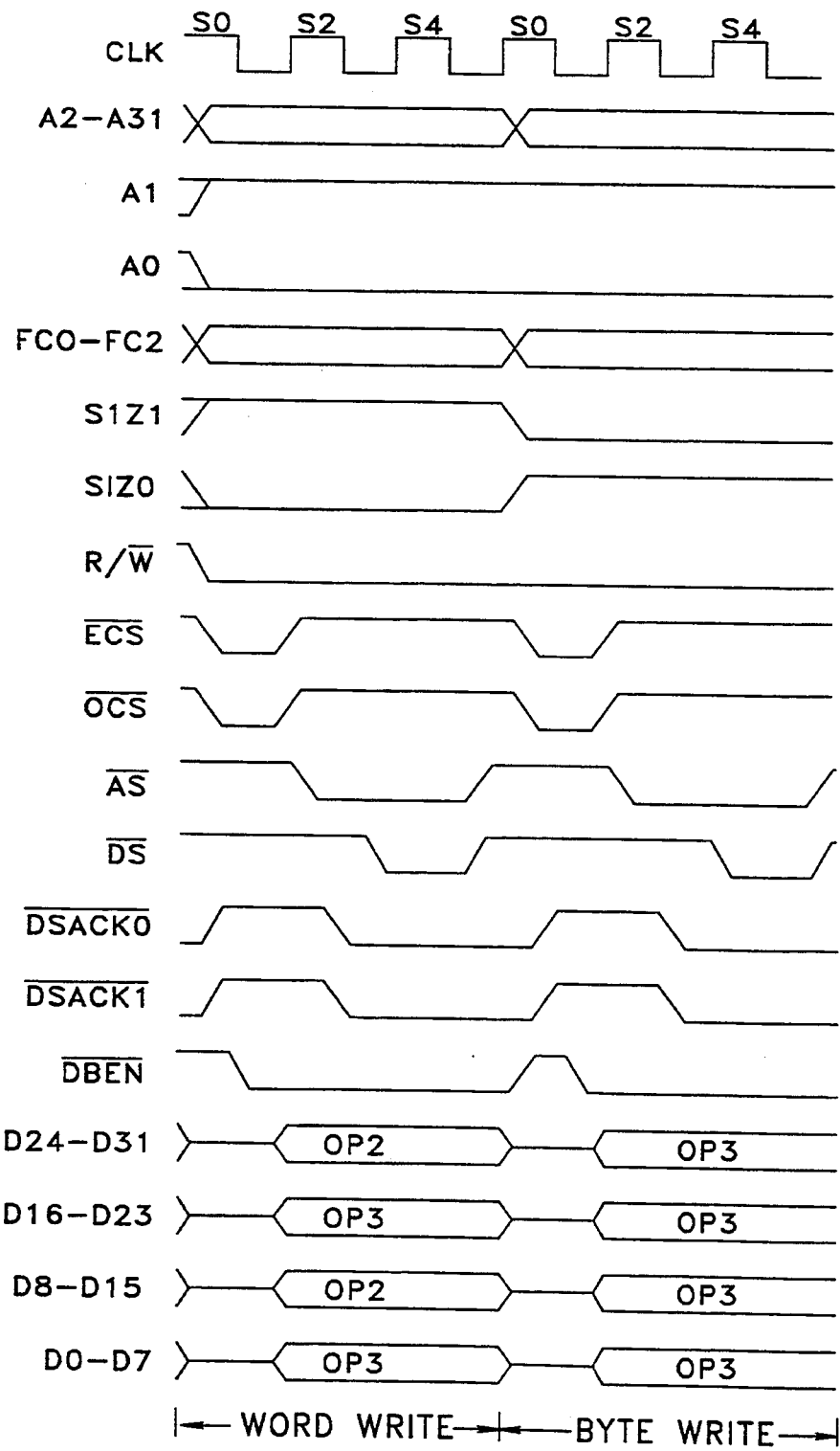
Figure 24:
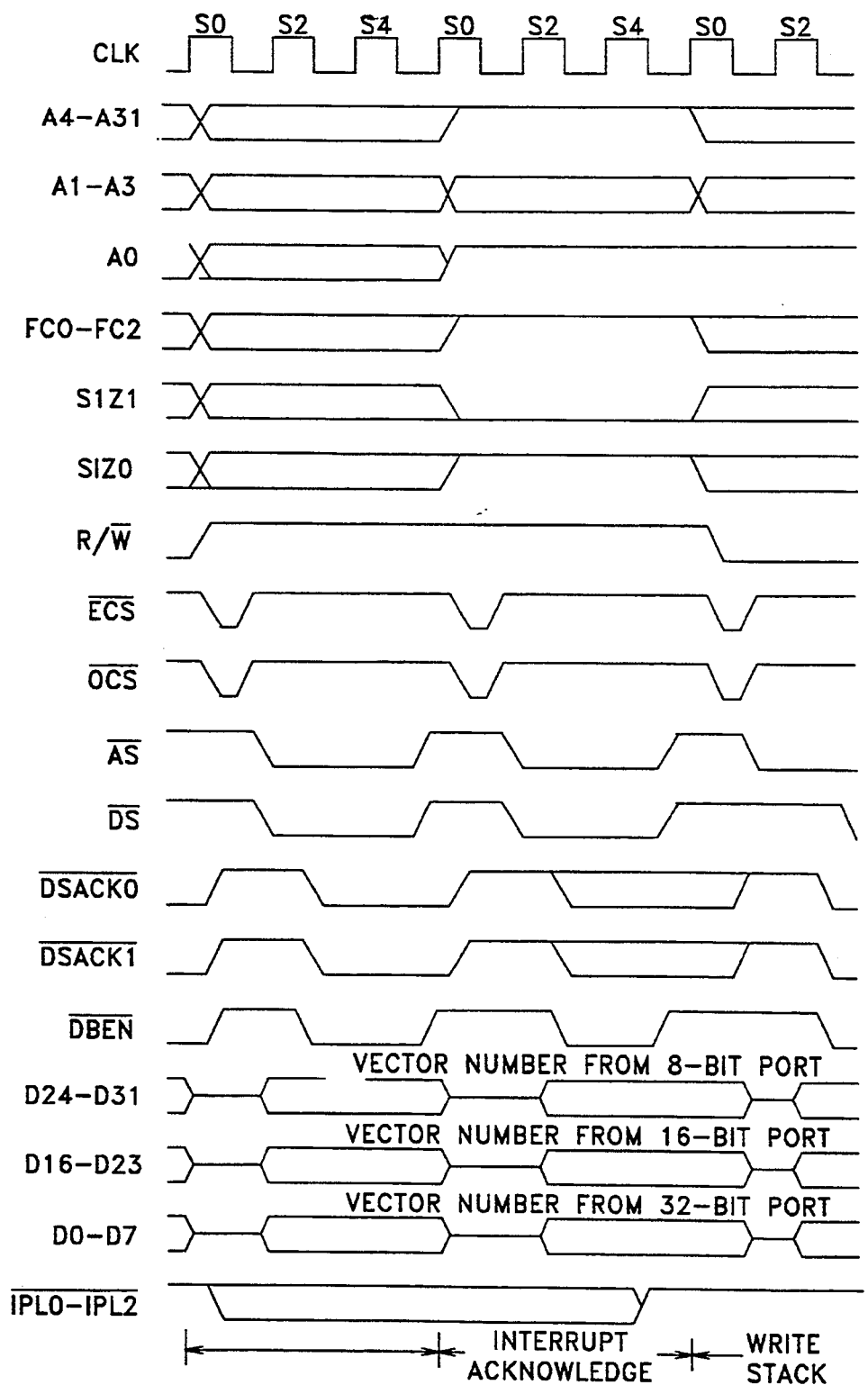

However, if an instruction executed by the S/88 processor 62 applies a virtual address on address bus 161A, with the four high order hex digits equal to "007E" (implying decoupling of PE62 from its S/88 hardware and coupling PE62 to BCU 156 for a function related to a S/370 I/O operation), the decode logic 280 puts a signal on line 282 to block the AS signal on line 270a and sends AS to the BCU 156 via line 270b. The decode logic 280 may also be designed to detect an appropriate function code on lines FC0-2; however this is merely a design choice. FIGS. 22, 23 and 24 show the delay between the address signals on bus 161A and address strobe on line 270 which permits blocking of the AS on line 270a prior to the time at which the AS signal is raised. It will be appreciated that means other than a special group of S/88 virtual addresses applied to the address bus may be used for decoding a condition indicating decoupling PE62 from its associated S/88 hardware and coupling PE62 to BCU 156.

The blocking signal on line 282 is applied to OR circuit 284 to produce a PE62 local bus request signal on line 190 to the arbitration logic 285. Logic 285 will grant the request to PE62 only if DMAC 209 has not already placed a request on line 269. The PE62 bus grant line 191 is activated if there is no DMAC request. The PE62 bus grant signal on line 191 raises ENABLE lines 286a, b (FIG. 19A) via logic 253 to couple PE62 buses 161A, D to local buses 247, 223 via drivers 217 and driver/receivers 218 in preparation for a PE62 operation with BCU 156. Data and Commands may be transferred between the PE62 and elements of the BCU while the processor buses 161A, D are coupled to the local buses 247, 223 under control of the instruction being executed by PE62. The application program EXEC370 and the VETIO firmware contain such instructions.

If a DMAC request is on line 269, logic 285 gives the DMAC 209 priority over the PE62 request on line 190; the DMAC bus grant signal on line 268 is returned to DMAC 209; and the local bus 247, 223 is connected between either the local store 210 and adapter channels 0, 1 via the high speed interface registers or between the DMAC 209 and the local store 210 in preparation for a DMAC operation with BCU 156.

It can be seen therefore that logic 215, 216 uncouples the S/88 processor 62 from the associated hardware (e.g., 175, 176, 177) and couples it to the BCU 156 when an address 007EXXXX is decoded by logic 280. This uncoupling is transparent to the S/88 operating system.

Similarly, the decode logic 281 (and associated hardware) blocks address strobe AS from line 270a and initiates a local bus request to the arbitration logic 285 during a DMAC 209 interrupt sequence to PE62.

More specifically, when DMAC 209 places an interrupt signal on line 258a, it is applied to PE62 via OR circuits 292a and 292, level 6 input of the S/88 interrupt priority logic 293 and lines IPLO-2. PE62 responds with an interrupt acknowledge cycle. Predetermined logical bits (which include the value of the interrupt level) are placed on output FCO-2 and address bus 161A (bits A1-3, A16-19), which bits are decoded by logic 281 to produce an output on line 283. This output and the interrupt signal on line 258c cause AND gate 291 to apply a signal to line 287 causing logic 215 to apply AS to the BCU logic 253 via line 270b.

The signal on line 287 blocks AS from line 270a and places a PE62 bus request on line 190 via OR circuit 284 to arbitration logic 285. Because the address strobe (AS) signal is blocked from going to the S/88 hardware, this interrupt is transparent to the S/88 Operating System.

When the special IACK bits are received on bus 161A and FCO-2 as described above, decode logic 281 produces an output signal on line 283 to block an address strobe signal on line 270a and to place a PE62 request on arbitration logic 285 via OR circuit 284 and line 190. If there is no DMAC request on line 269, the PE62 bus grant signal is raised on line 191 to AND gate 294-1. The AND gate 294 produces an IACK signal on line 258b to DMAC 209. This alerts the DMAC 209 to present its interrupt vector. The DMAC then places the vector on the local bus and raises 'DTACK' on line 265 to logic 253. Logic 253, in response to the AS signal on line 270b, raises ENABLE signals on lines 286a, 286b to couple the processor buses 161A and D to local buses 248 and 223 via circuits 217, 218 to read the appropriate vector from DMAC 209 into PE62. The DMAC 209 presents interrupt vectors from the least significant byte of its data bus 248 (FIG. 19A) to the S/88 processor data bus 161D, bits 23-16, via driver receiver 234 and bits 23-16 of the local data bus 223.

The vector number issued by DMAC 209 is used by the S/88 processor 62 to jump to one of eight interrupt handlers in the S/88 interface microcode ETIO.

DTACK on line 265, and logic 253 activates DSACK 0, 1 on lines 266a, b to terminate the PE62 cycle via a pair of OR circuits 288. Lines 266a, b are ORed with standard S/88 DSACK lines 266c, d to form the ultimate DSACK inputs 266e, f to PE62.

Interrupt requests applied to OR circuit 292a via lines 562, 563 from the Integrated Service Facility (FIG. 49) cause a sequence of operations similar to those described above with respect to a DMAC interrupt request. A pair of AND gates 294-2 and 294-3 (FIG. 20) raise IACK signals on lines 258d, e to initiate the transfer of appropriate vector numbers from the BCU156 to the S/88 processing unit 62 via logic 564, 565 of FIG. 49 and local data bus 223.

It will be appreciated that the S/88 level 6 interrupt request could be given priority over a DMAC or BCU interrupt request (when they are concurrent) by a minor change in the logic. However, currently, the time to recognize Power Faults as secondary interrupt sources is more than adequate.

(c) BCU Address Mapping

The local storage 210 (FIG. 41C) is of fixed size and is mapped into the S/88 PE 62 virtual-address space. The local storage 210 is divided into three address ranges to differentiate three purposes:
1. S/88 PE 62 read/write directly from/to local data buffers and control structures including link-lists;
2. S/88 PE 62 read/write commands, read status to/from BCU 156; commands are decoded from specific addresses; and
3. S/88 PE 62 read/write DMAC registers (both for initialization and normal operations); register numbers are decoded from specific addresses.

The local storage address space includes:

| | | |
|---|---|---|
| 1. | DATA BUFFERS and CONTROL STRUCTURES | (64K bytes less 512 includes link-lists in physical storage 210); |
| 2. | BCU COMMAND AREA | (256 bytes command decoded from specific address); and |
| 3. | DMAC ACCESSING AREA | (256 bytes register number decoded from specific address). |

The local address decode and bus arbitration unit 216 detects all addresses within this local storage space. The DMAC 209 may, at the same time, be presenting an address within the area 1 above. The DMAC may NOT address areas 2 or 3 above; this is guaranteed by initialization microcode.

The BCU 156 monitors all addresses on the local bus and redirects, via control tags, operations having addresses within ranges 2 and 3 to the proper unit (BCU or DMAC) instead of to the local storage 210. Thus the address area of local storage 210 represented by the ranges 2 and 3 above, while present, is never used for storage therein.

In the preferred embodiment, a fourth operation type is also handled by the local address decode and bus arbitration unit 215:

S/88 processor 62 acknowledges DMAC 209 interrupts to S/88 PE 62 and completes each interrupt according to the MC 68020 architecture as described above.

This special operation is detected by address and function code bits that the S/88 PE 62 presents, with the difference that the (architected special) decode is not an address in the range of the local storage 210.

The local bus arbitration unit 216 therefore has a special decoder for this case, and assist logic to signal the DMAC to present its pre-programmed interrupt vector. The operation is otherwise similar to the S/88 processor 62 reading a DMAC register.

The address bus 247 is selected by PE 62 when the high order digits decode to hexadecimal (H) 007E.

The remaining four hex digits provide the local storage address range of 64KB which are assigned as follows:

| I/O Device (or command) | Address Decode |
| --- | --- |
| DMAC register select | 007E0000–007E00FF (area 3 above) |
| BCU Reset | 007E0100 (area 2 above) |
| BSM Wr Sel Up | 007E0104 (area 2 above) |
| BSM Rd Sel Up | 007E0108 (area 2 above) |
| Read BCU Status | 007E010C (area 2 above) |
| local storage select | 007E0200–007EFFFF (area 1 above) |

The following data is placed on the local data bus 223 by the S/88 processor 62 for a selected DMAC memory transfer count register, and for the BCU 156 to be used in a subsequent BSM Read/Write Select Command:

```
31          23        15    7    0
OOOO  Oqbb  bbbb  bbbb  rspp  kkkk  CLXX  XXXX.
```

Bits 31–16 (0000 0qbb bbbb bbbb) the byte transfer count are set into the DMAC memory transfer counter:
- 26=High order byte count bit (=1 for max byte count (4096 only) ).
- 25–16=Lower order byte count bits. Bits 26–16 represent $\frac{1}{4}$ of actual byte count (dbl word transfers). The BCU 156 captures the data as follows for a subsequent BSM Read/Write Select Up command;
- 31–27=Ignored by the BCU
- 26=High order byte count bit. This bit will equal 1 only when the maximum byte count is being transferred.
- 26–14=Transfer byte count bits (4096 max) to register 220 or 222 adapter requires a count of 1111 1111 1111 in order to transfer 4096 bytes (byte count 1). Therefore, the BCU 156 will decrement the doubleword boundary bits 26–16 once before presenting it along with byte-offset bits 15–14 (in 64 byte blocks) to bus adapter 154.
- 15–14=Low order byte count bits. These bits represent the byte offset minus 1 (for bus adapter requirements) from a doubleword boundary. These bits are not used by the DMAC 209 or the BCU 156, since they transfer doublewords only. They are latched in the BCU 156 until passed to bus adapter 154 for presentation to the S/370 BSM 162.
- 13–12=Adapter bus channel priority to register 219 or 227.
- 11–08=Storage key to register 219 or 227.
- 07=Customer/IOA space bit to register 219 to 227.
- 06=The S/88 processor will activate this bit for BSM Write Select Up to indicate that one additional local storage access is required. This will occur when a starting local storage address is not on a doubleword boundary. Since all BCU accesses must start at a doubleword boundary, the first access will contain the byte(s) at the designated starting address, as well as the preceding byte(s) contained at that doubleword address. The preceding byte(s) are discarded.
- 05–00=Reserved The following will be placed on the local data bus 223 by the S/88 processor 62 for the DMAC memory transfer count register, and by the BCU 156 for a subsequent Q select Up command:

```
OOOO OOOO OOOO bbbb OOOO kkkk cxxx xxxx
```

The byte transfer count, (bits 31–16) are set into the DMAC channel 3 memory transfer count register MTC.

The BCU 156 captures the data for a subsequent Q Select Up command as follows:
- 31–20=Ignored by the BCU.
- 19–16=Byte count (64 bytes max) to register 220 or 222.
- 15–12=Ignored by the BCU.
- 11–08=Storage Key to register 227.
- 07=Customer/IOA space bit to register 227.
- 06–00=Ignored by the BCU.

(d) Local Address and Data Bus Operation

All local bus operations are initiated via Bus Requests from the S/88 processor 62 or the DMAC 209. S/88 processor 62 local bus operations include:
- Read/Write local storage (32 bits)
- Read/Write DMAC Registers (8,16,32 bits)
- Interrupt acknowledge cycle to DMAC (8 bit interrupt vector read)
- Read BCU status (32 bit BCU read)
- Programmed BCU reset DMAC 209 local bus operations include:
- Link-list load (16 bits)
- DMAC operations (32 bits )
  - Provides local storage address only
  - Provides local bus request
- Interrupts
  - Provides normal interrupt vector to PE 62 for 4 channels (8 bits)
  - Provides error interrupt vector to PE 62 for illegal DMAC operations and other DMAC detected errors (8 bits)

BCU 156 local bus operations include:
  Provides Read/Write data (32 bits) during DMA operations
  Initiates Data Request to DMAC 209
  Initiates Read Mailbox Interrupt Request via DMAC line PCL0 257a Whenever the S/88 processor 62 activates its address bus with a valid local bus decode (007EXXXX) or with a DMAC directed Interrupt Acknowledge Cycle, the BCU 156 logic performs the following:
  Blocks ADDRESS STROBE line to S/88
  Activates a Bus Request to the contention logic 216.
  If the local bus is not in use, the S/88 processor address bus 161A and data bus 161D are coupled to the local bus 247, 223 via driver receivers 217, 218. The Read, Write or IACK operation is performed.
The DSACK lines 266a, b are activated by the BCU logic to close out the cycle:
  32 bit DSACK for all local storage and BCU directed commands.
  16 bit DSACK for all DMAC register directed commands.
  16 bit DSACK for IACK cycles The DMAC Bus Request (BR) line 269 from the DMAC 209 is activated for a DMAC or a Link-List load sequence. When this occurs, the BCU 156 performs the following:
  If the local bus is not in use, the DMAC address (during DMAC Read/Write or Link-List load) is gated to the local address bus 247. The BCU 156 logic gates the data (DMAC write to local storage 210) from a DMAC register to the local data bus 223. The local storage 210 gates its data (DMAC Read or Link-List load) to local bus 223. The Read/Write operation is performed. The DTACK line is activated by the BCU logic 253 to the DMAC 209 to close out the cycle.

(e) S/88 Processor 62 and DMAC 209 Addressing To/From Local Storage 210

The address bit assignments from the S/88 processor 62 to the local storage 210 are as follows: low order bits 0,1 (and SIZO, 1 of PE 62, not shown) determine the number and bus alignment of bytes (1-4) to be transferred. Bits 2-15 inclusive are the address bits for storage space 210.

In the link list mode, the DMAC address bit A2 is used as the low order address bit (double word boundary) to the local storage 210. Since the DMAC 209 is a word oriented (16 bit) device (A1 is its low order address bit) and since the local storage 210 is accessed by doubleword (32 bits), some means must be provided in the hardware to allow the DMAC 209 to read data into its internal link-list from contiguous local storage locations. This is accomplished by reading the same doubleword location in store 210 twice, using A2 as the low order address bit. Bit A1 is then used to select the high-/low word from the local bus. The address bit shift to the local storage 210 is accomplished in the hardware via the DMAC function code bits. Any function code except "7" from the DMAC 209 will cause address bits A15–A02 to be presented to the local storage 210. This scheme allows the local storage link list data for the DMAC 209 to be stored in contiguous locations in store 210.

In the local store read/write mode, the DMAC bit A1 is used as the low order address bit to the local storage 210. The read data is supplied to storage 210 from the adapter bus Channel 0 read buffer 226. Data is written from storage 210 to the adapter bus Channel 1 write buffer 228. Since the DMAC is a 16 bit device, the low order address bit is intended to represent a word boundary. However, each DMAC operation accesses a doubleword. To allow for doubleword accesses with a word access addressing mechanism, an address shift is required.

The address bit shift to the local storage 210 is accomplished in the hardware via the DMAC function code bits. A function code of 7 from the DMAC 209 will cause address bits A14–A01 to be presented to the local storage 210. In order to allow for correct operation, the DMAC is loaded with ¼ of the actual byte count (½ the actual word count). For a DMAC write operation, there is a provision to allow word writes by controlling the UDS and LDS lines (not shown) from the DMAC 209, although all DMAC operations are normally doubleword accesses. The UDS and LDS signals cause accessing of high (D31–D16) and low order portions (D15–DO) local store 210.

In the PE 62 to DMAC 209 mode, the S/88 processor PE 62 will write the DMAC registers in each of the four DMAC channels 0-3 in order to set up the internal controls for a DMAC operation. PE 62 also has the capability of reading all of the DMAC registers. The DMAC 209 returns a word (16 bit) DSACK on a bus 266 which has two lines DSACK 0, DSACK 1 permitting port sizes of 8, 16 or 32 bits. This allows the DMAC 209 to take as many cycles as necessary in order to perform the DMAC load properly.

The S/88 processor SIZ0, SIZ1 (not shown) and A0 lines are used to generate I/DS (Upper Data Strobe) and LDS (Lower Data Strobe) inputs (not shown) to the DMAC 209. This is required in order to access byte wide registers in the DMAC 209 as described more fully in the above described DMAC publication. The LDS line is generated from the logical OR of NOT SIZ0 or SIZ1 or AO of address bus 161D. The UDS line is generated from the logical NOT of A0. The SIZO line is used to access the low order byte when a word wide register is being accessed (NOT SIZO). The SIZ1 line is used to access the low-order byte when a word wide register is being accessed via a "three byte remaining" S/88 processor operation. This will only occur when the S/88 processor is performing a doubleword (32 bit) read/write operation to the DMAC on an odd-byte boundary. Bit AO is used to select the high or low byte in a two-byte register. Bits AO, A1 are used to select bytes in a four-byte DMAC register. Bits A6, A7 of the PE62 address bus 161D select one of the four DMAC channels.

(f) BCU BSM RD/WR Byte Counter Operation

The BCU 156 is capable of accepting a single command from the DMAC 209 which will transfer up to 4KB of data across each adapter BUS 250, 251. However, each bus can only handle 64 byte blocks for one data transfer operation. There are other adapter bus restrictions that must be obeyed by the hardware in order to meet the protocol requirements. The following is a detailed description of the BCU 156 hardware that accomplishes this.

The BCU 156 contains two fullword (11 bit) counters 220, 222 and two boundary (4 bit) counters 221, 224 that are used for adapter bus BSM read and BSM write operations. The boundary counters 221, 224 are used to represent a starting address to bus adapter when a 64 byte boundary crossing is detected by the BCU 156 for any single command/data transfer operation, or when the byte count is greater than 64 bytes. The boundary counter contents are presented to bus adapter 154 for all but the last block transfer. The fullword counter contents are presented for the last block transfer only (last command/data transfer operation).

The S/88 processor 62 places byte count, key, and priority bits on the local bus 223 (FIG. 45F) for transfer to register 222 or 220. The r bit (count bit 1) represents word (2 bytes) boundaries and the s bit (count bit 0) represents byte boundaries. Fullword counter bits represent a 2KB−1 doubleword transfer capability. Since all transfers are done on a doubleword basis, bit 2 is the low order decrement bit. The r and s bits are latched by the BCU and presented to bus adapter 154 on the final 64B transfer.

Due to the following bus adapter restrictions, and the fact that only doubleword transfers occur on the local bus 223, it becomes necessary to manipulate the byte and word count bits. This will allow odd bytes/words to be transferred to the S/370 PE85, and will also allow for a starting address that is not on a doubleword boundary. The byte count that is presented to bus adapter 154 cannot be greater than 64 bytes. The count must be represented in bytes−1. No block transfer may cross a 64 byte boundary. When byte count is equal to or less than 64 bytes and there is no boundary crossing and the starting address is not on a double-word boundary, an extra adjustment to the double-word count may be required.

When there is a 64 byte boundary crossing, at least two adapter bus command/data transfer operations are required regardless of the count value. The S/88 processor will pre-calculate the double-word count and the r, s and i bits, based upon an examination of the factors described above, and the total byte transfer count. The r and s bits will not be presented to bus adapter 154 until the last command/data transfer operation.

When the S/88 PE62 places the count on the local bus 223 (FIG. 45F), the DMAC 209 captures bits 31–16, and BCU 156 captures bits 26–6. BCU 156 stores bits 26–14 in register 220 or 222. The bits 26–16 represent the doubleword count field. Counter 220 or 222 is decremented on a doubleword boundary (Bit 2). S/88 processor PE62 places a BSM Read/Write Select Up Command on the local address bus 247 and the BSM starting address on the local data bus 223.

The DMAC 209 is a 16 bit device which is connected to a 32 bit bus. It is programmed to transfer words (2 bytes) during DMA operations in all channels, and each internal memory address register MAR increments by one word (2 bytes) per transfer. However, a doubleword (4 byte) increment is required, since each transfer is actually 32 bits. To accomplish this, the S/88 processor PE62 always initializes the MAR to one-half the desired starting address (in store 210). The BCU 156 then compensates for this by doubling the address from the MAR before presenting it to the local bus 223, resulting in the correct address sequencing as seen at the store 210.

The BCU 156 performs the following:
1. Boundary counter 221 or 224 is loaded from inverted bits 2–5 of the local data bus 223 at the same time that the BSM address register 228 or 231 is loaded;
2. Decrement the fullword counter 220 or 222 on a doubleword boundary (bit 2); and
3. Increment the BSM address register 228 or 231 on a doubleword boundary (bit 2).

When more than 64 bytes remain or a boundary crossing occurs during a block transfer of data, the BCU 156 loads the BSM Read/Write command byte count to the command/status bus 249 or 252 from the boundary counter 221 or 224 and BSM address register 231 or 228 bits 1,0 (inverted). Then a Read/Write operation is performed. The BCU 156 will decrement the boundary count registers 221 or 224 and the fullword count register 220 or 222 on a doubleword boundaries; in addition, it will increment BSM address register 231 or 22B on a doubleword boundary. The BCU 156 will stop when BSM address register 231 or 228, bits 5−2=0000, a 64-byte boundary. Boundary counter bits should=1111 at this time.

When 64 bytes or less remain and there is no boundary crossing during a block transfer of data, the BCU 156 will load BSM Read/Write command byte count to adapter bus command/status bus 249 or 252 from bits 5–2 of counter 220 or 222 and the r, s bits. The BCU 156 then performs a Read/Write operation during which it decrements register 220 or 222 on a doubleword boundary, increments BSM address register 231 or 228 on a doubleword boundary, and stops when the register 220 or 222 bits 12–2 are all ones. A boundary crossing is detected by comparing bits 2–5 of count register 220 or 222 with its boundary register 221 or 224. If the count register 220, 222 value is greater than that of the boundary register 221, 224, then a boundary crossing has been detected.

(g) Handshake Sequences BCU 156/Adapter 154

The timing chart of FIG. 25 shows the handshaking sequences between the BCU 156 and the adapter 154 for Read Mailbox commands and storage Read commands including the transfer of two thirty-two bit words to a work queue buffer in local store 210.

When a Mailbox Read or Storage Read command is issued on bus 290 (FIG. 19A), a pair of signals Gate Left and Gate Right sequentially gate the left and right portions of the command and address in registers 214 and 219 (FIG. 19B) to adapter 154 to fetch the appropriate data from S/370 storage 162. The Tag Up command is raised on line 262a followed by periodic Read Data signals. Tag Down is raised on line 262b until the fetched data is stored in buffer 259. When the next of the periodic Clock Left and Clock Right signals are raised, the left and right portions of the first fetched word are gated into buffer 226 via bus 250.

Bus Request is raised on line 263a or b for DMAC channel 0 or 1. DMAC arbitrates for control of the local bus via line 269. When this request is granted by logic 216, Bus Grant is raised on line 268. DMAC 209 raises the Acknowledge signal on line 264a or 264b which causes the BCU to gate the data in buffer 226 to the local data bus 223 while DMAC 209 places the selected local store address on the local address bus 247. The DMAC 209 then issues DTC on line 267 to cause logic 253 to raise the Store Select on line 210a; and the data on bus 223 is placed in the appropriate buffer in local store 210.

Succeeding periodic Tag Up, Clock Left and Right, DMAC Request gate succeeding data words to buffer 226; and these words are transferred to the appropriate buffer in store 210 as DMAC 209 gains access to the local buses 247, 223 via arbitration logic 216 and issues Acknowledge and DTC signals.

FIG. 26 similarly shows the handshaking sequences for Queue Select Up and Storage Write Commands. When either command is issued on bus 290, the Gate Left and Right signals transfer the command and address (previously stored in registers 225 and 227) to the adapter 154. A Tag Up Command followed by periodic Data signals are raised on line 262a. DMAC Request is raised on line 263c or d. The DMAC 209 arbitrates for the local bus 247, 223 via line 269 and logic 216. When the request is granted via line 268, the DMAC 209 raises Acknowledge on line 264c or d followed by DTC on line 267 to transfer the first data word from store 210 to register 227. The next periodic Gate Left and Right signals transfer the first data word from register 227 to the buffer 260 of adapter 154.

Succeeding DMAC Request signals on line 263c or d and DMAC Acknowledge and DTC signals transfer succeeding data words to register 227 as the DMAC 209 arbitrates for control of the local buses 247, 223. Succeeding periodic Gate Left and Right signals transfer each data word from the register 227 to buffer 260.

S/370 PROCESSOR.ELEMENT PE85

Each processing ELEMENT such as PE85 of the preferred embodiment contains the basic facilities for the processing of S/370 instructions and contains the following facilities:

Basic 32 bit data flow;
32-bit arithmetic/logic unit (ALU) 306;
32-bit shift unit 307;
48 register (32 bits each) data local store;
303 with 3-port addressability;
8 byte S/370 instruction buffer 309; and
timer facilities (CPU timer, comparator etc.) 315.

Figure 27:
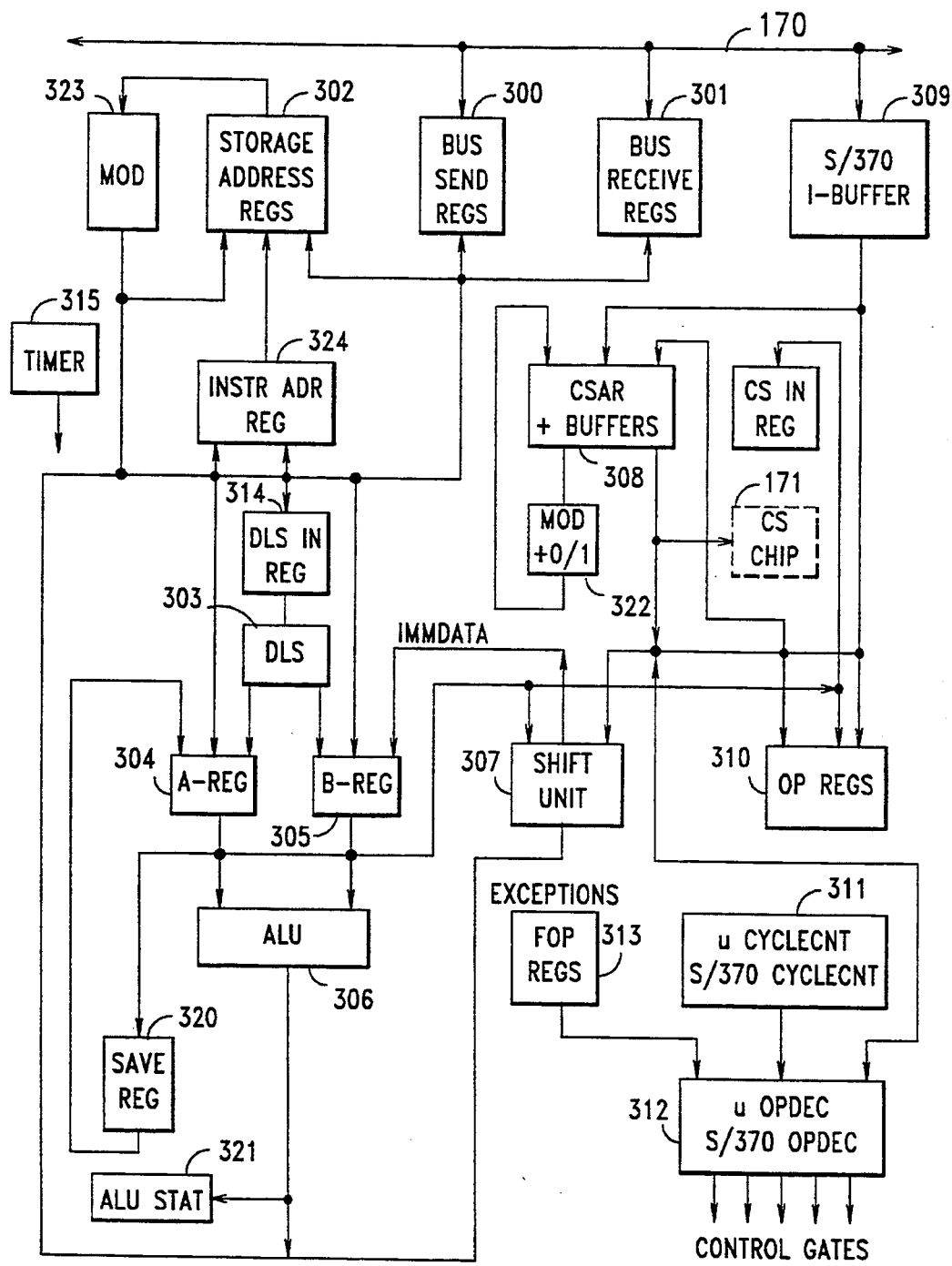
FIG. 27 is a block diagram of a preferred form of a S/370 central processing element.

The simplified data flow of one preferred form of PE 85 is shown in FIG. 27; it being understood that many S/370 processor implementations exist which are well known in the art. The preferred form of each processor element 85 of the preferred embodiment is a processor capable of executing the instructions of the System/370 architecture. The processor fetches instructions and data from a real storage area 162 of the storage 16 over the processor bus 170. This bi-directional bus 170 is the universal connection between PE85 and the other units of the S/370 chip set 150. PE85 acts as master but has the lowest priority in the system. The instructions are executed by hardware and by micro instructions which the processor executes when it is in micro mode.

PE85 has four major function groups:
The "bus group" consisting of the send and receive registers 300, 301, and the address registers 302 for storage operands and instructions.
The "arithmetic/logic group" consisting of the data local store (DLS) 303, the A and B operand registers 304, 305, the ALU 306 and the shift unit 307.
The "operation decoder" group consisting of the control store address register (CSAR) 308, the /370 instruction buffer (I-buffer) 309, the op registers 310, and cycle counters 311 with trap and exception control.
The "timer group" which is a small, relatively independent unit 315 consisting of an interval timer 315, time-of-day clock, clock comparator, and CPU timer.

The following brief description will outline the use of these logical units.

The I-buffer 309 makes the S/370 instructions available to the decoder as fast as possible. The first half word containing the op code is fed via operation register 310 to the decoder 312 to start the S/370 I-phase. The second and third half words (if any) are fed to the ALU for address calculation. The I-buffer 309 is a double word register which is loaded by operations such as IPL, LOAD PSW, or PSW swap via a forced operation (FOP) in register 313 prior to the start of a /370 instruction sequence. The I-buffer 309 is refilled word-by-word as the instructions are fed to operation register 310 (and ALU 306, for address calculation), and it is refilled completely during each successful branch. The operation decoder 312 selects which operation to perform. The decoder is fed from the operation and the micro code operation registers 310. Mode bits decide which one (or none in case of a forced operation) gets control to decode.

The I-buffer 309 contents are fed into the operation register 310 and in parallel into the CSAR 308 to address an opcode table in the control store 171. Each entry in this table serves two purposes: it indicates whether a microcode routine exists and it addresses the first instruction of that routine. Microcode routines exist for the execution of the more complex instructions, such as variable field length instructions and all others that are not directly executed by hardware. Special function codes in the micro instructions activate the supporting hardware so that it is possible to control the 32-bit data flow using mostly 16-bit micro instructions.

All processing occurs in a three-stage pipeline, as follows:
The first stage reads the instruction into the op register 310.
The second stage reads the data and/or addresses into the A/B registers 304, 305 and the bus send register 300. The op register 310 is freed for another first stage by passing its contents to the op decoder 312 which controls the third stage.
The third stage performs the ALU, shift or bus operation, as the case may require. DLS write operations are also performed in the third stage.

Effective processing is additionally enhanced by implementing the decoder in several groups (not shown), one specifically dedicated to the ALU, another to the bus group, and so forth. Byte-selectable multiplexers (not shown) at the A/B register input and the ALU output further enhance the operations. Thus there are S/370 RR instructions which occupy each of the pipelining stages for only one cycle.

The forced operation registers (FOPs) 313 are used for internal control. They get input from traps and exceptional conditions, and force another mode into the decoder 312. Typical operations are I-buffer loading, transition to trap level, and the start of exception routines.

Each operation register 310 has a cycle counter 311 of its own. The micro code cycle counters are shared by some forced operations (FOPs). The arithmetic operations and most of the other micro instructions require only one cycle. Most of the micro instructions which perform processor bus operations require two cycles.

The data local store 303 contains 48 full-word (4-byte) registers which are accessible via three ports, two being output ports, one being the input port. Any register can be addressed via register 314 for input, and the same register or two different registers can simultaneously be addressed for output. This three-fold addressing allows operand fetching to overlap with processing. Due to a comparator logic and data gating (not shown), a register just addressed for a write operation may also be used as input in the same cycle. This facilitates the pipelining actions.

The ALU 306 is preferably a full-word logic unit capable of executing AND, OR, XOR, and ADD operations in true and inverted form on two full word operands. Decimal addition is also supported. Parity prediction and generation as well as fast carry propagation is included. The save register 320 supports divide operations. Status logic 321 generates and stores various conditions for branch decisions, sign evaluation, etc.

Figure 29:
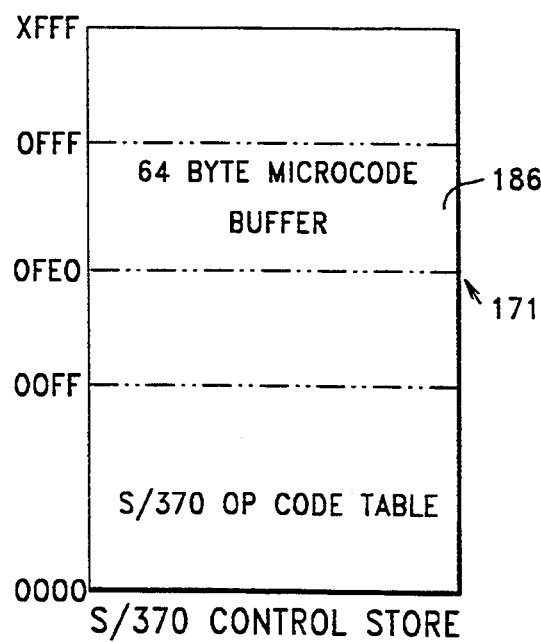

The control store address register (CSAR) 308 addresses micro instructions and tables in the control store 171. The input to the CSAR 308 is either an updated address from the associated modifier 322 or a branch target address from a successful branch, or a forced address for a table look up. A table look up is mandatory at the beginning of each S/370 instruction, and for some forced operations (FOPs). The CSAR 308 gets the op code pattern as an address to access the op code table (FIG. 29). The output of this op code table defines the form of execution which may be direct decoding out of the operation register 310. If indirect execution is required, the op code table output is fed back into CSAR to address the appropriate micro routine.

The storage address register 302 is designed for 24-bit addresses. An associated modifier 323 updates the address according to the size of the data block fetched. Instructions are fetched in advance in increments of one word (4 bytes) as the I-buffer 309 is being emptied. The input to the storage address register 302 comes from the instruction operand address register 324. It is furthermore set in parallel with the instruction address register 324 for speed up reasons.

The CPU data flow allows the overlapped processing of up to three S/370 instructions at a time. S/370 instructions are executed either in hardware or interpreted by microinstructions. The basic cycle time of the preferred embodiment is 80 ns. Instruction processing is performed in one or more 80 ns steps. A high speed multiply facility PE151 speeds up binary and floating point multiply operations. Microinstructions from control store 171 are employed only for the execution of those S/370 instructions which are too complex and thus too expensive to be implemented entirely in hardware. The microinstructions, if needed, are supplied at a rate of 60 ns per instruction. The microinstruction set is optimized for the interpretation of S/370 instructions. Microinstructions have half word format and can address two operands.

Microcode not contained in the control store 171 is held in the IOA area 187 which is a reserved area in S/370 memory 162 (see FIGS. 28, 29). This microcode includes the less performance sensitive code for exceptions, infrequently executed S/370 instructions, etc. These microroutines are fetched on a demand basis into a 64 B buffer 186 in the RAM part of control store 171. Whenever the PE85 encounters an address larger than implemented in the control store 171, it initiates a 64 B block fetch operation to cache controller 153 and storage controller interface 155. The units 153, 155 fetch the 64 B block from the IOA 187 and send it to the PE85 which stores it into the buffer 186. The microinstructions are fetched by PE85 from buffer 186 for execution. All microcode is loaded into memory at initial microcode load (IML) time. The system provides an IML support to facilitate the microcode loading from the S/88 into the memory.

S/370 instructions and user data are fetched from an 8 KB high speed cache storage 340 (FIG. 31). Data is read/written from/into the cache 340 on a full word basis. The time needed to read/write a full word from/into the cache is 120 nanoseconds. The cache 340 is automatically replenished with 64 byte blocks from the memory 162 when the need arises. The PE85 communicates with the cache 340 via processor bus commands. The virtual addresses provided by the PE85 are used to look up the corresponding pre-translated page addresses in directory look aside table (DLAT) 341.

The data local store 303 in PE85 includes 16 general registers, 4 floating point registers and 24 work registers. All registers can be addressed individually via three separately addressable ports. Thus the store 303 can feed two operands in parallel into the ALU 306 and simultaneously accept a full word from the ALU 306 or cache 340 within the same 80 ns cycle. Since there is no serialization as on conventional data local stores, arithmetic and logic operations can be executed in an overlapped manner with preparation for the next instructions.

The CPU maintains an 8-byte instruction buffer (I-Buffer) 309 for S/370 instructions. This buffer is initialized by a successful S/370 branch instruction. The PE85 fetches a double-word of data from the S/370 instruction stream from cache 340 and loads it into the I-Buffer 309. When the first full-word is loaded in the I-Buffer 309, the PE85 starts instruction execution again. I-Buffer data is fetched from cache 340 simultaneously with the execution of S/370 instructions. Since the first cycle in each S/370 instruction execution is a non-cache cycle, the CPU utilizes this cycle for pre-fetching a full-word from cache 340 into the I-Buffer 309.

A second non-cache cycle is available with S/370 instructions which require indexing during the effective address calculation or which are executed by microroutines. In these cases S/370 instruction fetching can be completely overlapped with the execution of S/370 instructions.

In the preferred embodiment, the S/370 chip set 150 communicates via an interrupt mechanism which requires the chip receiving an interrupt to acknowledge it by resetting the interrupt latch of the sending chip.

Whenever the system (e.g., via BCU 156) sets (activates) one or more bits in a status register (STR) (described below) of the adapter 154, the system must also activate an N_ATTN_REQ control line. This causes an exception in the processor element 85 when the current S/370 instruction has been executed, thus forcing the processor element 85 to "look" at the status register. An exception handler will then sense the STR contents, interrogate the 'interrupt type(s)' and dispatch the appropriate system microroutine(s). Whenever the processor element 85 activates a bit in the STR, the system must react to it accordingly. Basically there are two types of interrupt requests:

1. System requests (SYSREQs) are demands (via BCU 156) to the S/370 processor element 85. The system sets the interrupt type(s) into STR to specify its demand. This causes an exception in the processor element 85 which transfers control to the exception handler. The exception handler dispatches the appropriate microroutine which will issue a PROC-Bus command to the adapter 154 to reset the appropriate interrupt type in the STR, execute the function defined by the interrupt type, and start execution of next S/370 instruction.

2. Transfer requests may be invoked either by the system or PE 85 and involve additional data transfer on the system interface. For this purpose two interrupt latches are assumed in the STR: one is the Processor Communication Request (PCR), the other is the System Communication Request (SCR). The PCR is set by PE 85 and reset by the system; the SCR is set by the system, reset by PE 85.

For fast data transfer operations, the existence of two additional registers is assumed, the BR register 115 (FIG. 13) which is set by PE 85 and read by the system and the BS register 116 which is set by the system and read by PE 85.

The following is an example of a PE 85 to system transfer request. The PE 85 sets data to be transmitted to the system into the register 115 and sets the PCR1 latch on. The system reads the data from the register 115 and resets the PCR latch.

The processor 85 may sense the PCR latch to find out whether or not it has been reset. The PE 85 may transfer further data to the system by repeating above sequence.

The system may transfer data to the PE 85 in a similar way as follows. The system sets data to be transmitted to the PE 85 into the register 116 and sets the SCR latch on. The PE 85 is interrupted, senses the STR, finds the SCR latch on, reads the data from the register 116, and resets the SCR latch. The system may interrogate the SCR latch to find out whether or not it has been reset.

3. The system may transfer further data to the PE 85 by repeating above sequence.

Data can also be exchanged via the IOA storage area 187. There are PROCBUS commands for the PE 85 and the adapter 154 that allow both to store/fetch data into/from the IOA area 187.

The PE 85 has one set of buffers assigned in the IOA area 187 into which it sets data to be fetched by the system. Correspondingly, the system has another set of buffers assigned in the IOA area 187 into which it sets data to be fetched by the PE 85. The interrupt types IOASYS/IOAPU may be used in SYSREQs to indicate to each other that data was set into IOA buffers.

Certain machine check and external interruption conditions are raised by the using system. The system communicates an interruption condition to the PE by issuing a SYSREQ or XFERREQ communication request. PE 85 executes the following functions:

a. Senses the register STR and interrogates its contents.
b. Calls the system-provided microroutine. The system interrupt request handler performs the specific interrupt processing. At an appropriate point in time, the microroutine issues a PROCBUS command to the adapter 154 to reset the corresponding SYSREQ or XFERREQ. Finally, it returns control to the S/370 microcode.
c. PE 85 performs the PSW swap for the appropriate S/370 interrupt class and executes the NSI function.

I/O interruption requests are generated by the system by setting the I/O bit in the STR. Each time when the current S/370 instruction is completed, the exception handler is invoked. In this routine, the PE 85 reads the STR to recognize the I/O interrupt request. The PE 85 resets the STR bit and sets the interrupt request latch internal to the PE 85. This latch is masked with the I/O mask of the current PSW. If the mask is 1 and no higher priority interrupt requests are pending, the exception handler passes control to a system-provided I/O interrupt request handler which processes the I/O interrupt request.

Figure 30:
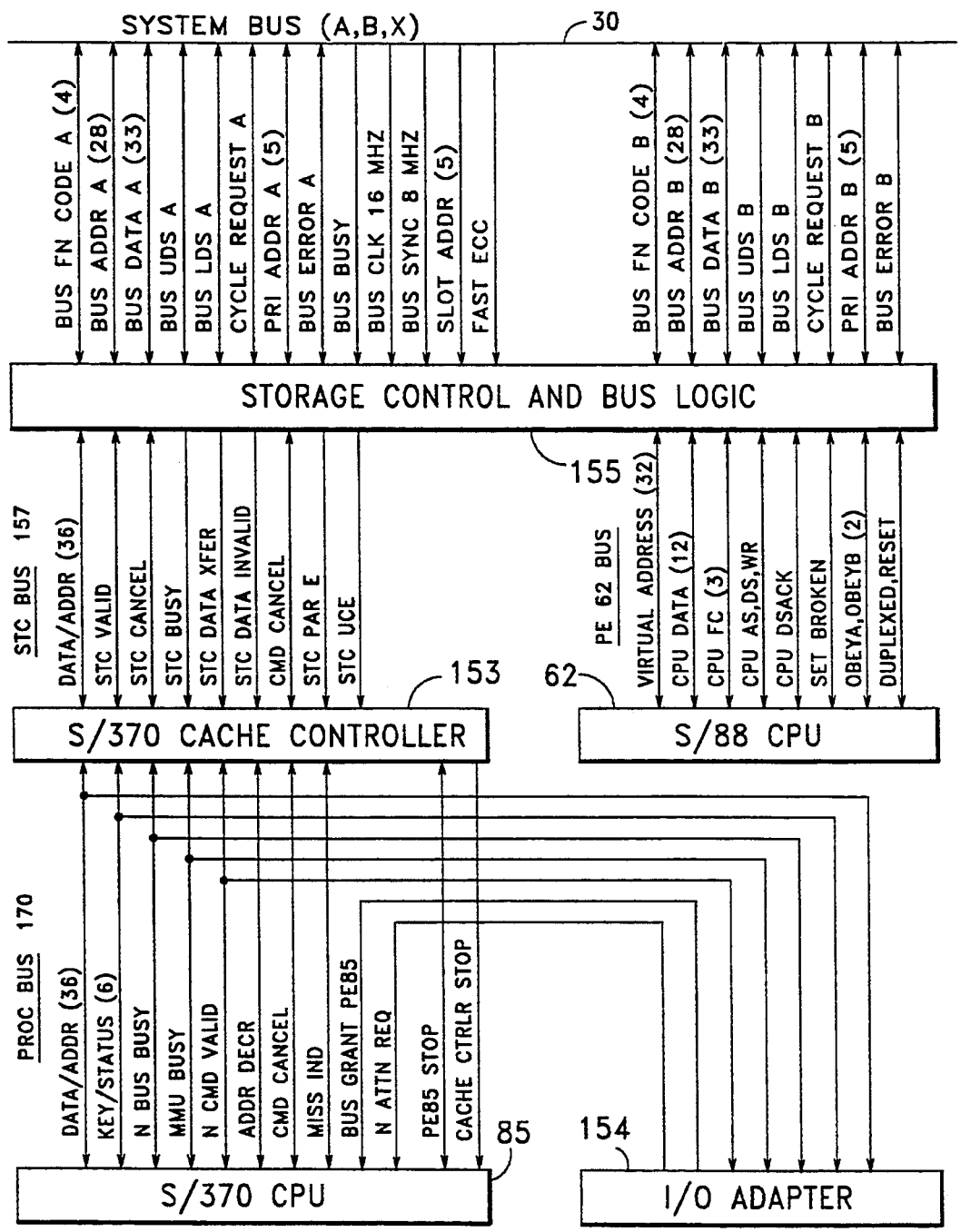
FIG. 30 shows a preferred form of the interface buses between the S/370 central processing element, I/O adapter, cache controller, storage control interface and S/88 system bus, and processor.

Processor Bus 170 (FIGS. 11 and 30) and Processor Bus Commands

The processor bus 170 is the common connection between all S/370 chip set components. Logically, all lines listed below belong to this bus:

1. Processor bus lines (0–31+4 parity) are generally used to transfer a command together with an address in one cycle, then transfer the associated data in the next cycle. Permission to use the bus is given by an arbiter preferably located in bus adapter 154. PE85 has the lowest priority. When permission is given via Bus Grant PE85, PE85 places four items on the appropriate bus lines in the next cycle. For a storage access operation, the command is put on PROC BUS lines 0–7, the address is put on PROC BUS lines 8–31, an access key is put on the Key Status bus, and simultaneously an 'N-Command-Valid' signal is raised.

2. The Key/Status Bus (0–4+parity) is used for two purposes: to send an access key to storage, and to get a status report back. Four bits of the S/370 PSW access key plus a fifth bit representing the AND-result of the PSW control mode bit (BC or EC) and the dynamic address translation bit, are transferred.

The returned status should be zero for a good operation. A non-zero status causes a trap in PE85 in most cases. No status is expected for commands of the type "message" which set control latches in the addressed bus unit.

3. The N-BUS Busy line provides a busy indication whenever an operation cannot be completed in the same cycle in which it was started. N-Bus-Busy is activated by the PE85 simultaneously with N-CND-Valid for all commands which require more than 1 cycle to complete.

It is the responsibility of the addressed bus unit to pull N-Bus-Busy to the active level if the execution of the command takes two cycles or more. N-Bus-Busy is also pulled to the active level when the addressed bus unit cannot accept the next command for a couple of cycles. There is an exception to the rule: PE85 will activate N-BUS-BUSY for three cycles if it issues store operation commands to the BSM array main storage 162. In general, N-Bus-Busy will be at the active level at least one cycle less than the execution of a command lasts.

4. The memory management unit (MMU) BUSY signal originates at the cache controller 153. It is used to indicate to PE85 the arrival of status and data for all storage access operations that take more than one cycle to execute.

Fetch operations principally deliver data in the next cycle (after having been started) or later. If data and status are delivered in the next cycle, the MMU-Busy signal remains inactive at down level (0). If data and status cannot be delivered in the next cycle, MMU-Busy is raised to 1 and returns to 0 in the cycle in which data and status are actually placed on the bus.

During store operations, PE85 expects status on the Key Status Bus in the next cycle (after having started the store operation). If status can be delivered in the next cycle, MMU-Busy remains inactive (0); else it is raised to 1 and returns to 0 in the cycle in which status is actually delivered.

5. The cache miss indicator on line MISS IND is used by the cache controller 153 to indicate a DLAT-miss, a key-miss, or an addressing violation to PE85. The indication is a duplication of information that is also available in the status. The line is valid in the same cycle in which status is presented on the Key Status Bus, but the miss indication line is activated a few nanoseconds earlier. The miss indication forces a trap via PE85 in the next cycle.

6. The signal on line Bus-Grant PE85 gives permission to use the bus to PE85. The signal originates at the arbiter. PE85 subsequently places command and address for the desired operation onto the bus in the cycle that follows the one in which the grant signal turned active and N-Bus-Busy is not active.

7. Usage: The attention request signal on line N-ATTN-REQ originates at some other bus unit (such as the bus adapter 154) to request PE85 to perform a 'sense' operation. PE85 honors the request as soon as the current operation in progress (e.g. instruction execution) is completed.

8. The command valid signal on line N-CMD-VALID is used by the PE85 to indicate that the bit pattern on PROCBUS lines 0–31 and Key Status Bus lines 0–4 (including all parity lines) is valid. The line can be turned active (down level) in the cycle that follows the one in which the Bus-Grant-PE85 turns active and N-Bus-Busy turns inactive.

9. The line ADDR-DECREMENT is used by PE85 for storage access operations which proceed from the start address downward to descending locations (such as required for decimal data processing data transfer). The signal can be activated in the same cycle in which N-CMD-Valid is activated.

10. The command cancel signal on line CMD-CANCEL is used by PE85 to cancel an already initiated fetch access to storage. This may occur in the cycle after N-CMD-Valid is turned active when PE85 detects conditions that inhibit the immediate use of the requested data.

In the preferred embodiment, there are five groups of PROCBUS commands of generally well known types: CPU-Storage; I/O-Storage; MMU Operation; Message Exchange; and Floating Point.

The bus unit (PE 85, adapter 154 or cache controller 153) requesting control of the bus 171 sets the command on the bus. For CPU-storage and I/O-storage commands, the bus unit also sets the access key and dynamic address translation bit on the Key Status Bus. After completion of the command status is returned on the same bus to the requesting bus unit.

The adapter 154 issues CPU-storage commands and I/O-storage commands while PE 85 can only issue CPU-storage commands. These command groups are as follows:

| Operation | CPU Memory Command | I/O-Memory Command |
|---|---|---|
| 1. S/370 Main Storage Reference | | |
| a) FETCH | | |
|    Cache Hit | Fetch from cache | Fetch from cache |
|    Cache Miss | Reload cache line from memory (incl. cast out) and fetch from cache | |
| b) STORE | | |
|    Cache Hit | Store in cache | Store in cache |
|    Cache Miss | Reload cache line from memory (incl. cast out) and store in cache | Store in memory |
| 2. Internal Object Area (IOA) Reference | Certain CPU-memory commands allow access to the IOA storage address checking. | |

I/O-storage commands are executed in cache controller 153 without checking of the S/370 main storage address. This checking is performed in STC1 155. CPU-storage commands are directed to controller 153 for execution and have a one byte command field and a three byte real or virtual address field. The command field bits are as follows:

| CMD Bit | Meaning |
|---|---|
| 0–1 = 10 | CPU-memory command |
| 2 = 1 | Fetch operation |
| 2 = 0 | Store operation |
| 3 = 1 | Cache bypass, no address checking |
| 3 = 0 | Cache access with address/checking:<br>- S/370 address compare<br>- ACB check |
| 4 = 1 | No DLAT access; i.e.<br>- no key-controlled protection check<br>- no reference and change bit handling<br>DLAT access; i.e.<br>- key-controlled protection check<br>- reference and change bit handling |
| 5–7 = nnn | Byte length count:<br>0 0 0 = 1 byte<br>0 0 1 = 2 bytes<br>0 1 0 = 3 bytes<br>0 1 1 = 4 bytes<br>1 0 0 = 8 bytes<br>1 0 1 = 64 bytes<br>1 1 0 = 64 bytes FETCH ! slow from BSM<br>1 1 1 = 64 bytes FETCH ! slow from adapter |

Examples of CPU-storage commands are:

1. Fetch (10111nnn)/store (10011nnn) Real N Byte, to fetch or store up to 64 byte from/into storage 162 with a real address.
2. Fetch (101010nn)/store (100010nn) Cache Real N Byte to read/write up to 4 bytes from/into cache with a real address.
3. Fetch (101011nn)/store (10001Inn) Cache Real N Byte to read/write up to 4 bytes from/into IOA with a real address (100000nn).
4. Fetch (101000nn)/store (100000nn) Cache Virtual N Byte to read/write up to 4 bytes from/into cache with a virtual address.

I/O-storage commands are initiated by the adapter 154 and directed to the cache controller 153. They transfer data strings from 1–64 bytes in length in ascending address order. The 32 bit command format includes a real byte address in the three low order bytes and the high order byte includes a highest order bit "0", next highest order bit defines a fetch or store operation and the remaining six bits define the length of the data transfer (1-64 bytes). Data strings are transferred on word boundaries except for the first and last transfer which may require position alignment on the bus.

MMU commands are used to control the cache controller 153 and its registers including DLAT, ACB, directory and the like.

Message commands are used to transfer messages between bus units connected to bus 151.

S/370 Storage Management Unit 81

1. Cache Controller 153 (FIG. 31)

The cache controller, FIG. 31, includes the cache storage 340 and addressing and compare logic 347, 348, a fetch aligner 343, as well as the directory look-aside table (DLAT) 341 for fast address translation. The controller 153 accepts virtual addresses and storage commands from the processor bus 170 and transfers fetch or store commands to the storage control interface 155 (FIG. 11) via multiplexer 349 and STC bus 157, when it cannot satisfy the request via cache storage 340.

DLAT 341 provides for fast translation of virtual page addresses into real page addresses. Its 2×32 entries hold 64 pretranslated page addresses. The DLAT 341 is accessed using a 2-way set associative addressing scheme. The virtual page size is preferably 4 KB. In case of a DLAT miss, the PE85 is interrupted and the virtual address translation is done by microprogram using segment and page tables (not shown) in S/370 main storage 162 in a well-known manner. The DLAT 341 is then updated to reflect the new virtual and real page address of the information fetched from storage and placed into the cache. A copy of the storage key is fetched from the S/370 Key Storage and included into the DLAT entry.

The 8 KB cache 340 with its associated cache directory 342 provides a high speed buffer to significantly improve the processor performance. Data and directory arrays are partitioned into 4 compartments. Each compartment in the cache is organized 256×8 B (bytes). For fetching data from cache 340, the byte offset in the virtual address is used to simultaneously address the DLAT 341, cache directory 342 and cache 340. Key-controlled protection checking is done by compare circuit 345 using the storage key in the selected DLAT entry. 4×8 B of data are latched up at the output 340a of the cache 340. If the requested data is in cache 340, a late select signal is used to gate the appropriate bytes into the fetch aligner 343.

For store operations partial store on a byte basis is performed.

In case of a cache miss the cache controller 153 automatically sets up a BSM command to fetch the required 64 B cache line in burst mode. If the cache line to be replaced by the new cache line was changed since it was loaded, a cache line cast-out operation to storage 162 is initiated before the new cache line is loaded. I/O data will never cause cache line cast-out and load operations. I/O data to be fetched from storage 162 will be looked for in both the main storage 162 and the cache storage 340 by accessing both facilities. If a cache-hit occurs, the memory operation is cancelled, and the cache storage supplies the data. If the I/O data is not in cache, it will be fetched directly from memory, but no cache line will be replaced. I/O data to be stored into storage will be stored into cache 340 if the addressed line is already in cache; otherwise, it will be stored directly into the storage 162.

The 4 KB key storage 344 holds the storage keys for 16 MB memory. The key storage is an array organized 4K×8. Each byte holds one storage key. Each DLAT entry holds a copy of the storage key associated with its 4 KB-block address. This reduces significantly the number of accesses to the key storage while repetitively accessing a page. Changes in storage key assignments affect both the key storage and any copies in cache storage.

Commands, data and addresses received by the cache controller 153 from the processor bus 170 via receiver circuit 355 are stored in the command, data and address registers 350, 351 and 352. Address register 347 stores the range of valid addresses for the related S/370 processing element PE85. The compare logic 348 verifies the validity of the received address. The S/370 address compare function provided by address register 347 and its related compare logic 348 handles addresses from both the PE85 and the I/O bus adapter 154.

The Address Compare Boundary (ACB) register 353 compare function ensures that S/370 main storage references intended for the customer area do not address the IOA area. The ACB register 353 stores the dividing line (boundary) between the reserved IOA area and the non-reserved area in S/370 storage 162. Each access to S/370 storage results in compare logic 354 comparing the received address with the ACB value.

2. STCI 155 (FIGS. 32A, B)

(a) Introduction

The storage control interface (STCI) 155 connects the S/370 chip set 150 to the S/88 duplexed fault-tolerant storage 16, 18 via bus logic 178 and the system bus 30 (FIG. 1). It supports all S/370 processor and I/O store/fetch commands which define data transfers from 1-64 bytes per command. All ECC, refresh, memory initialization and configuration, retries, etc. are handled by S/88 processor 62 and storage 16, 18. A detailed dataflow of the STCI 155 is shown in FIGS. 32A, B.

The STCI 155, its paired STCI 155a (not shown) in a storage management unit 83 and their corresponding STCI pair (not shown) in partner unit 23 (FIG. 8), together arbitrate for control of the system bus structure 30 via arbitration such as logic 408 (FIG. 32B) in each STCI. Not only does the STCI 155 arbitrate against I/O controllers and other CPUs 25, 27 and 29, 31 of module 9 as seen in FIG. 7, but STCI 155 must arbitrate against its associated S/88 processor 62 (and that processor's paired and partnered processors in CPUs 21, 23 of FIG. 8) which may be requesting control of the bus for S/370 I/O functions or conventional S/88 functions.

However, the arbitration logic is otherwise generally similar to that described in the Reid patent, based primarily upon module backpanel slot positions of the processor and I/O boards, which logic will now be described. During an arbitration phase, any unit of the processor module 9 which is capable of being a bus master and which is ready to initiate a bus cycle, arbitrates for use of the bus structure. The unit does this by asserting a Bus Cycle Request signal and by simultaneously checking, by way of an arbitration network, for units of higher priority which also are asserting a Bus Cycle Request. The unit, or pair of partnered units, which succeeds in gaining access to the bus structure during the arbitration phase is termed the bus master and starts a transfer cycle during the next clock phase.

Each memory unit 16, 18 is never a master and does not arbitrate.

During the definition phase of a cycle, the unit which is determined to be the bus master for the cycle defines the type of cycle by producing a set of cycle definition or function signals. The bus master also asserts the address signals and places on the address parity line even parity for the address and function signals. All units of the processor module, regardless of their internal operating state, always receive the signals on the bus conductors which carry the function and address signals, although peripheral control units can operate without receiving parity signals. The cycle being defined is aborted if a Bus Wait signal is asserted at this time.

During the response phase, any addressed unit of the system which is busy may assert the Bus Busy signal to abort the cycle. A memory unit, for example, can assert a Bus Busy signal if addressed when busy or during a refresh cycle. A Bus Error signal asserted during the response phase will abort the cycle, as the error may have been with the address given during the definition phase of the cycle. Data is transferred on both the A bus and the B bus during the data transfer phase for both read and write cycles. This enables the system to pipeline a mixture of read cycles and write cycles on the bus structure without recourse to re-arbitration for use of the data lines and without having to tag data as to the source unit or the destination unit.

Full-word transfers are accompanied by assertion of both UDS and LDS (upper and lower data strobe) signals. Half-word or byte transfers are defined as transfers accompanied by assertion of only one of these strobe signals. Write transfers can be aborted early in the cycle by the bus master by merely asserting neither strobe signal. Slave units, which are being read, must assert the strobe signals with the data. The strobe signals are included in computing bus data parity.

Errors detected during the data transfer phase will cause the unit which detects the error to assert one or both of the Bus Error signals in the next timing phase, which is the first post-data phase. The peripheral control units wait to see if an error occurs before using data. The central processing unit 21 and the main memory unit 16 of the system however, use data as soon as it is received and in the event of an error, in effect, back up and wait for correct data. The assertion of a Bus Error signal during a post-data phase causes the transfer phase to be repeated during the next, sixth, phase of the transfer cycle. This aborts the cycle, if any, that would otherwise have transmitted data on the bus structure during this second post-data, i.e. sixth, phase.

The normal backplane mode of operation of the illustrated system is when all units are in the Obey Both mode, in which both the A bus and the B bus appear to be free of error. In response to an error on the A bus, for example, all units synchronously switch to the Obey B mode. The module 9 returns to the Obey Both mode of operation by means of supervisor software running in a S/88 central processing unit.

In both the Obey B and the Obey A modes of operation, both the A bus and the B bus are driven by the system units and all units still perform full error checking. The only difference from operation in the Obey Both mode is that the units merely log further errors on the one bus that is not being obeyed, without requiring data to be repeated and without aborting any cycles. A Bus Error signal however on the obeyed bus is handled as above and causes all units to switch to obey the other bus.

(b) System Bus Phases

Figure 33:
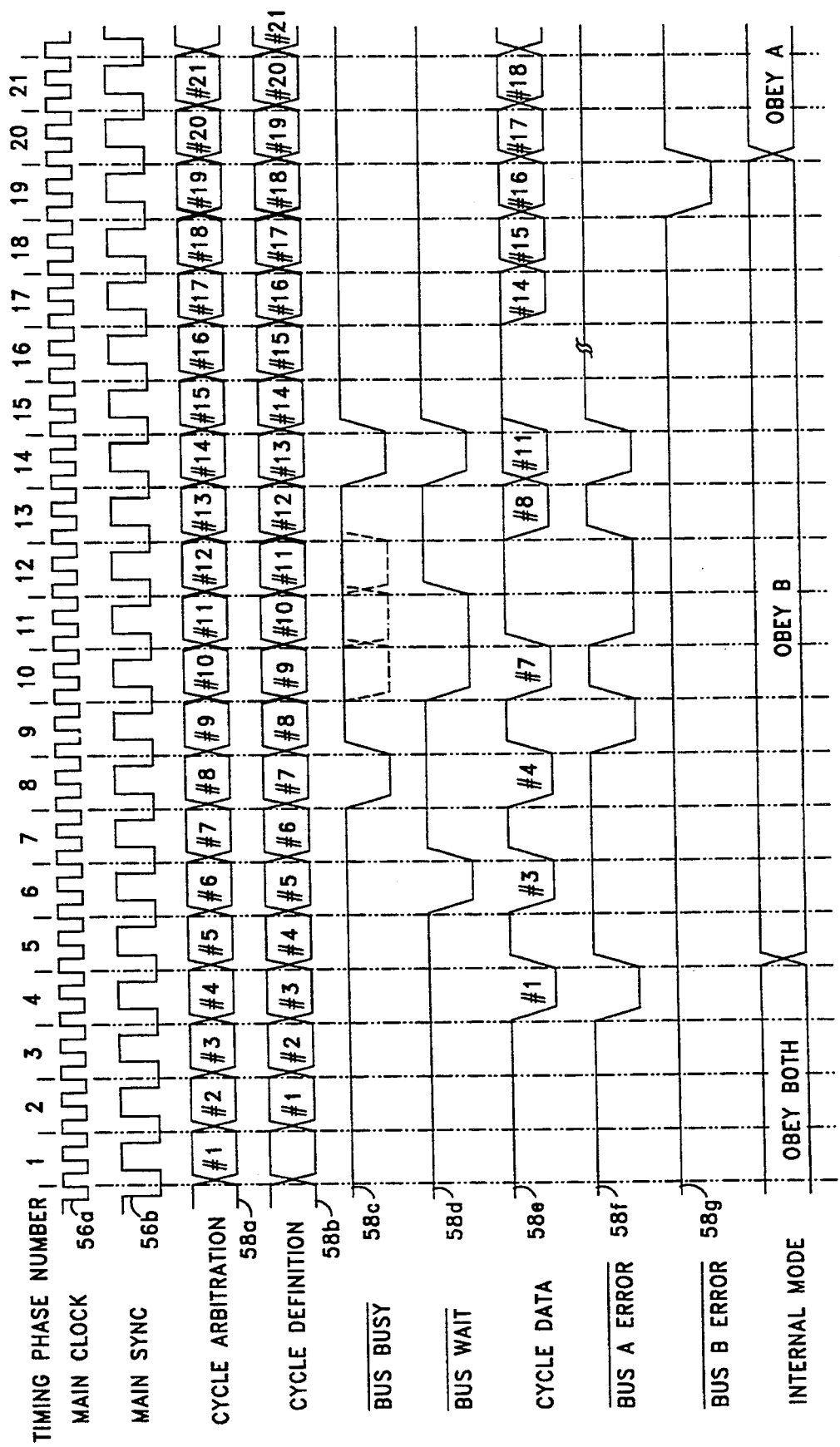
FIG. 33 is a timing diagram illustrating the S/88 system bus phases for data transfer between units on the bus.

FIG. 33 illustrates the foregoing operation with four pipelined multiple-phase transfer cycles on the bus structure 30 for the module 9. Waveforms 56a and 56b show the S/88 master clock and master synchronization signals which the clock 38 applies to the X bus 46, for twenty-one successive timing phases numbered (1) to (21) as labeled at the top of the drawing. The arbitration signals on the bus structure, represented with waveforms 58a change at the start of each timing phase to initiate, in each of the twenty-one illustrated phases, arbitration for a new cycle as noted with the cycle-numbering legend #1, #2, #3 . . . #21. FIG. 33 represents the cycle definition signals with waveform 58b. The cycle definition signals for each cycle occur one clock phase later than the arbitration signals for that cycle, as noted with the cycle numbers on the waveform 58b. The drawing further represents the Busy, Wait, Data, A Bus Error, and B Bus Error signals. The bottom row of the drawing indicates the backplane mode in which the system is operating and shows transitions between different modes.

With further reference to FIG. 33 during timing phase number (1), the module 9 produces the cycle arbitration signals for cycle #1. The system is operating in the Obey Both mode as designated. The Bus Master unit determined during the cycle arbitration of phase (1) defines the cycle to be performed during timing phase (2), as designated with the legend #1 on the cycle definition signal waveform 58b. Also in timing phase (2), the arbitration for a second cycle, cycle #2, is performed.

During timing phase (3) there is no response signal on the bus structure for cycle #1, which indicates that this cycle is ready to proceed with a data transfer as occurs during timing phase (4) and as designated with the #1 legend on the data wave form 58e. Also during timing phase (3), the cycle definition for cycle #2 is performed and arbitration for a further cycle #3 is performed.

In timing phase (4), the data for cycle #1 is transferred, and the definition for cycle #3 is performed. Also, a Bus A Error is asserted during this timing phase as designated with waveform 58f. The error signal aborts cycle #2 and switches all units in the module to the Obey B mode. The Bus A Error signal of timing phase (4) indicates that in the prior timing phase (3) at least one unit of the system detected an error regarding signals from the A bus 42. The error occurred when no data was on the bus structure, as indicated by the absence of data in waveform 58e during timing phase (3), and there hence is no need to repeat a data transfer.

During timing phase 5, with the system operating in the Obey B mode, a fifth cycle is arbitrated, the function for cycle #4 is defined and no response signal is present on the bus structure for cycle #3. Accordingly that cycle proceeds to transfer data during time phase (6). Also in time phase (6), a Bus Wait is asserted, as appears in waveform 58d; this is in connection with cycle #4. The effect is to extend that cycle for another timing phase and to abort cycle #5.

A new cycle #7 is arbitrated in timing phase (7) and the definition operation proceeds for cycle #6. In time phase (8), the data for cycle #4 is applied to the bus structure for transfer. Also in time phase (8), a Busy signal is asserted, This signal is part of the response for cycle #6 and aborts that cycle.

The arbitration and definition operations in time phase (9) follow the same pattern by another Bus A Error is asserted. The system already is operating in the Obey B mode and accordingly the response to this signal is simply to log the error.

The Bus Wait signal asserted in time phase (10) and continuing to time phase (11) extends cycle #8 for two further time phases, so that the data for that cycle is transferred during time phase (13), as designated. The Bus Wait signal asserted during these phases also aborts cycles #9 and #10, as shown. Any Busy signal asserted during phase (10), (11) or (12) in view of the extension of cycle #8 by the Wait signal, would abort cycle #8. Note that the data transfer for cycle #7 occurs in time phase (10) independent of the signals on the Wait and the Busy conductors during this time phase.

Further Bus A Error signals occurring during time phases (11), (12) and (14) again have no effect on the system other than to be logged, because the system is already operating in the Obey B mode. The Wait signal asserted during the time phase (14) aborts cycle #13. Also, it extends cycle #12, which however is aborted by the Busy signal asserted during time phase (14). Data for cycle #11 is transferred in the normal sequence during time phase (14). Further, the data transfer for cycle #14 occurs in time phase (17).

In time phase (19), immediately following the cycle #15 data transfer of time phase (18), a Bus B Error is asserted. This error signal aborts cycle #17, which is in the response phase, and initiates a repeat of the data transfer for cycle #15. The repeat transfer occurs during cycle #20. Further, this error signal switches the module to the Obey A mode.

Note that the Bus Wait signal is driven only by slave units which have been addressed by a bus master unit and are not ready to effect a data transfer. Since the STCI 155 is never a slave unit and only addresses memory, not I/O devices, this line is not utilized by the STCI 155.

The system bus logic 178 (FIG. 19C) provides the link from the STCI 155 to the S/88 memory boards 16, 18 and includes arbitration logic 408 (FIG. 32B). The same basic transfer cycles defined above for the bus 30 are used by logic 178:

1. Arbitration phase—This phase is ongoing every cycle as bus controllers vie for bus mastership. Typically arbitration priority is based on the back panel Slot ID of arbitrating devices. For the preferred form of the STCI design the arbitration priority is based on Slot ID for single CPUs, while utilizing the FIFO Almost Full/Almost Empty (AFE) flag and the Half-full (HF) flag lines 409 on each CPU (PE 85 and its paired unit) to assign priorities based on real task demand in multiple CPU implementations.
2. Cycle definition phase—This phase follows a bus grant in the previous cycle. It includes a 4-bit function code on Bus Fn Code A and B of the bus 30 to specify 16, 32 or 64-bit R/W transfers along with the 27-bit starting physical address to storage 16. Storage 16 is 256 MB for the preferred embodiment. All storage accesses are on 16, 32 or 64-bit boundaries so that address bit 0 is not used. Rather byte and word accessing is indicated by the UDS, LDS signals shown in FIG. 14 in conjunction with the Bus FN code definition.
3. Cycle Response phase—This phase may include a Bus error or Bus Busy condition on bus 30 from memory which will force the STCI 155 to rearbitrate and reissue previous cycle definition phase.
4. Data Phase—Once the storage request is accepted (past cycle response phase) the data phase will occur in the cycle following the cycle response phase (2 cycles after cycle definition phase). Sixteen, 32, or 64 bits of data may be transferred within a 125 ns phase on read or write.
5. Post Data Phase—Required to check for Bus errors which would force the data to be repeated (either from STCI 155 or memory 16) on the system bus 30 two cycles after data was initially sent. Since both A and B buses carry identical data, either A or B bus errors may occur during post-data phases.

An important difference between S/88 processor 62 arbitrating for the bus 30 and STCI 155 arbitrating for the bus 30 may now be described. Typically, a S/88 processor 62 will be operated in only one of the five phases at any moment in time. However, because of the fetch and store pipelining capability in the STCI 155 (described below), the STCI can operate in up to all five phases at the same time. For example, during a 64 byte read operation, STCI 155 can be operated in all five phases at the same time if there are no errors and STCI is granted arbitration control of the bus 30 in each of five succeeding cycles. This improves system performance, especially in a uniprocessor version of a module 9.

(c) STCI Features

Some of the STCI features are described below:

1. FIFO 400—Four (64×9 bit) First-In-First-Out fast RAMs form a buffer to allow up to four 64-byte store commands to be held before the unit 155 goes busy. It also carries incoming parity through to outputs for all data. The S/370 clock 152 clocks commands and data into FIFO 400; and S/88 clock 38 clocks commands and data out of the FIFO 400. A preferred embodiment of the FIFO 400 is the CY7C409 described more fully beginning at page 5-34 in the Product Information Manual published Jan. 15, 1988 by Cypress Semiconductor Corp.

In addition to the industry standard handshaking signals, Almost Full/Almost Empty (AFE) and Half Full (HF) flags are provided. AFE is high when the FIFO is almost full or almost empty. Otherwise AFE is low. HF is high when the FIFO is half full, otherwise HF is low.

The memory accepts 9-bit parallel words at its inputs under the control of the Shift-In (SI) input when the Input-Ready (IR) control signal is high. The data is output in the same order as it was stored under the control of the Shift-Out (SO) input when the Output-Ready (OR) control signal is high. If the FIFO is full (IR low) pulses at the SI input are ignored; if the FIFO is empty (OR low) pulses at the SO input are ignored.

Parallel expansion for wider words is implemented by logically ANDing the IR and OR outputs (respectively) of the individual FIFOs together. The AND operation insures that all of the FIFOs are either ready to accept more data (IR high) or are ready to output data (OR high) and thus compensate for variations in propagation delay times between devices.

Reading and writing operations are completely asynchronous, allowing the FIFO to be used as a buffer between two digital machines of widely differing operating clock frequencies or clock phases. The FIFO 400 includes a write pointer, a read pointer, and the control logic necessary to generate known handshaking (SI/IR, SO/OR) signals as well as the Almost Full/Almost Empty (AFE) and the Half Full (HF) flags. With the FIFO empty, the STCI logic will hold SO high, such that when a word is written, it will ripple through to the output directly. The OR signal will go high for one internal cycle and then go back low again. If more words are written into the FIFO, they will line up behind the first word and will not appear on outputs until SO has been brought low.

The data is not physically propagated through the memory. The read and write pointers are incremented instead of moving the data. The time required to increment the write pointer and propagate a signal from the SI input to the OR output of an empty FIFO (fallthrough time) or the time required to increment the read pointer and propagate a signal from the SO input to the IR output of a full FIFO (bubblethrough time) determine the rate at which data can be passed through FIFO 400.

Upon power up the FIFO is reset with a Master Reset signal. This causes the device to enter the empty condition, which is signified by the OR signal being low at the same time that the IR signal is high. In this condition, the data outputs (DO0–DO8) will be low. The AFE flag will be high and the HF flag will be low.

The availability of an empty location is indicated by the high state of the Input Ready (IR) signal. When IR is high a low to high transition on the Shift-In (SI) pin will load the data on the inputs into the FIFO 400. The IR output will then go low, indicating that the data has been sampled. The high to low transition of the SI signal initiates the low to high transition of the IR signal, as well as the AFE flag low to high transition if the FIFO 400 is almost full or almost empty.

The availability of data at the outputs of the FIFO 400 is indicated by the high state of the Output Ready (OR) signal. After the FIFO is reset all data outputs (DO0–DO8) will be in the low state. As long as the FIFO remains empty the OR signal will be low and all Shift Out (SO) pulses applied to it will be ignored. After data is shifted into the FIFO the OR signal will go high.

Two flags, Almost Full/Almost Empty (AFE) and Half Full (HF), describe how many words are stored in the FIFO. AFE is high when there are eight or less, or 56 or more, words stored in the FIFO. Otherwise the AFE flag is low. HF is high when there are 32 or more words stored in the FIFO, otherwise the HF Flag is low. Flag transitions occur relative to the falling edges of SI and SO.

2. SBI logic—System/88 Bus Interface (SBI) logic 178 which allows S/370 processor 85 to initiate read/writes to S/88 storage 16. It includes logic 408 to arbitrate every cycle for access to the bus 30 to initiate 16, 32, or 64-bit transfers. The logic 178 interface lines and the arbitration logic 408 are preferably of the type described in the Reid patent to the extent that they are not modified as described herein.

3. Fault tolerance—All STCI logic, including the FIFO buffer 400, is duplexed to provide self-checking on the S/370 processor board. The only simplexed logic includes comparator logic 402a–g, broken logic 403, and clock generation logic (not shown). Thus, STCI 155 has a substantially identical paired STCI 155a (not shown) which is a part of the storage management unit 83 of FIG. 8.

The comparator logic 402a–g forms the compare logic 15 of FIG. 8 and broken logic 403 forms a part of the common control logic 75 of FIG. 8. In the preferred embodiment, S/370 compare checking is performed only at the paired STCIs 155, 155a to protect against dispersion of erroneous data via bus structure 30. However, S/370 machine check and parity errors are supplied to logic 403 via bus 460. Some errors on BCU buses 247, 223 are picked up by S/88 compare circuits 12f (FIG. 8).

4. Address check—Two memory-mapped registers 404, 405 (MEM Base & MEM Size) are provided to ensure that the size of each S/370 processor storage space such as 162 is not violated while using a base offset (FIG. 10) to generate a valid physical S/370 user address in System/88 storage 16.

5. Synchronous operation—S/370 clocks 152 are derived from the S/88 clock 38 (FIG. 7) 16 Mhz input, via bus 30 and synchronizing logic 158 (FIG. 19C), to allow synchronization between the clocks within one S/370 oscillator input clock period from the start of the S/88 clock 38. This allows consecutive reads (e.g. a 64-byte read command) to be pipelined from memory 162 to the S/370 chip set 150 with no wait states in between (assuming consecutive cycles granted to STCI 155 on the system bus 30).

6. STC Bus interface—All standard S/370 fetch/store commands are executed along with command cancelling. Parity errors and/or ECC errors will not be reported to the S/370 operating system but rather handled as retries (ECC or bus parity errors) or going broken (internal board parity errors). 64-byte line boundary crossings will result in address wraparound.

As shown in FIG. 11, the STCI 155 interfaces to the S/370 processor 85 via the cache controller unit 153 which handles S/370 dynamic (virtual) address translation, utilizing an 8 KB instruction/data cache 340 as well as a 64-entry DLAT 341 (directory lookaside table). Thus all real/virtual I/O or processor transfers result in a 'real' address issued on the STC Bus 157 by unit 153. Typically when the bus adapter 154 or S/370 processor 85 conduct 'real' storage operations, unit 153 simply acts as a transition stage from the processor bus 170 to the STC Bus 157, except for cache hits which may result in a command being cancelled after having been issued on the STC Bus 157.

A brief description of the 41 STC Bus lines (FIGS. 32A and 30) is now presented. STC data/address/command bus 406 has 32 bidirectional data bus lines plus odd parity per byte. This bus is used to convey command and address in one cycle, and up to 32 bits of data on each subsequent cycle of the storage operation. STC Valid line is driven by unit 153 to STCI 155 to signal that a command/address is valid on the STC Bus in the same cycle. STC Cancel line is driven by unit 153 to STCI 155 to cancel a previously issued command. It may appear up to 2 cycles after STC Valid is issued. It is ORed with the PE 85 command cancel input. STC Busy line 440 is driven by STCI 155 to unit 153, one cycle after an 'STC Valid' is issued, to signify that the unit is busy and can't accept a new command. It is released 1 cycle before the unit 155 is able to receive a new command.

STC Data Invalid on line 433 may be issued by the STCI 155 to unit 153 in the same cycle as data is returned on a fetch to invalidate the data transfer. Unit 153 ignores the data cycle if the line is activated. This line will be sent coincident with data when a Fast ECC error has occurred on bus 30, data has miscompared between the logic of paired STCI units 155, 155a or incorrect parity was detected during a bus 30 read cycle.

STC Data Transfer line 441 is driven to unit 153 by the STCI 155 to signal a data transfer on the STC Bus 157 in the subsequent cycle. For stores, it dictates that unit 153 supply the next 32-bit word on the following cycle. For fetches, it alerts unit 153 that the next cycle will contain valid data, unless overridden by STC Data Invalid on next cycle. The STCI 155 design is fully pipelined to allow all the above states to be active at the same moment within one S/370 CPU. In this fashion, assuming continuous bus grants and no bus errors, the STCI 155 can maintain pipelined data on fetches with no wait states utilizing 64-bit reads (per 125 ns system bus 30 cycle) onto the 32 bit, 62.5 ns STC Bus 157.

The System/88 interface 410 is used in STCI 155 to support access to the MEM Size/MEM Base registers 405 and 404 within the BCU local virtual address space. Also 'Broken' 403 and 'Bus Interrupt Req' (IRQ) errors are merged with those on the S/88 processor board 102 to drive a low priority maintenance interrupt on the bus 30 as a single CPU.

Bus IRQ errors differ from broken in that these errors, usually due to unprotected signals from bus 30 which are detected different by same or partner board, do not disconnect a board from bus 30 as does broken. These errors are only active when the board is in Obey Both mode.

In addition, 'Obey A', 'Obey B', and 'Duplexed' signals on lines 411, 412, 413 are driven up from S/88 processor board logic 415 rather than reimplementing within the S/370 processors. Obey A/Obey B signals are used to control the input multiplexors 71, 73 (FIG. 8) for the check and drive side data input multiplexors respectively, as well for gating in Bus error conditions. The duplexed signal on line 413 is used for signalling when boards are partnered (i.e. used in bus arbitration logic 408 for ensuring both partners arbitrate together when in consecutive slots).

Figure 34:
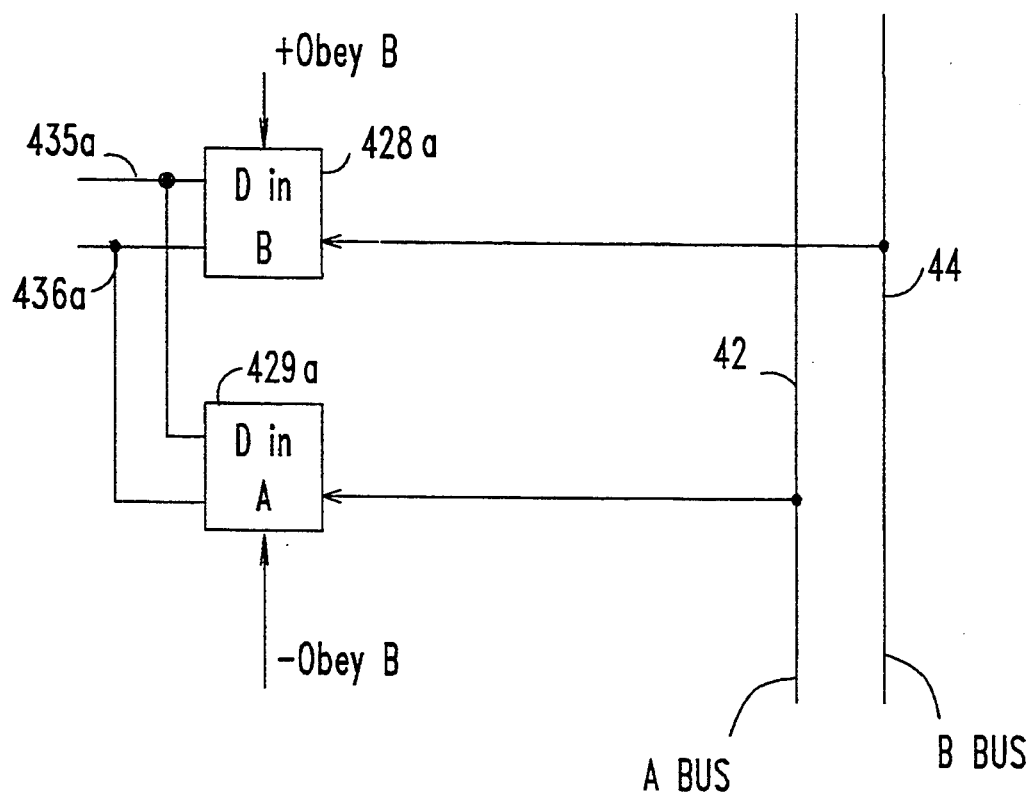
FIG. 34 is a fragmentary schematic diagram showing the "data in" registers of a paired storage control interface.

Obey A and B signals are inverted to provide both +Obey A, −Obey A, +Obey B and −Obey B. The +Obey A and −Obey A signals are applied to registers 428 and 429 respectively. Registers 428 and 429 are coupled respectively to the A and B buses of bus structure 30 respectively. S/88 clock signals (not shown) clock data from the A and B buses to registers 428 and 429 respectively for all three clock modes A, B, and Both. Data in register 428 is gated out on buses 435, 436 when the bus is operating in an Obey A or Obey Both modes and register 429 is gated out on buses 435, 436 only during the Obey B mode. Similarly, as seen in FIG. 34, the contents of register 428a of STCI 155a are similarly gated out during Obey B or Obey Both modes. The contents of register 429a are gated out during Obey A mode. Dot ORing of the outputs of registers 428, 429 and 428a, 429a performs the respective data input multiplexer functions 71, 73 (FIG. 3).

The MEM Size/MEM Base values in registers 405, 404 are memory-mapped in the S/88 processor 62 virtual address space, by way of the BCU local address space. They must be set during the S/88 boot process once the given S/370 CPU space 162 is defined. They can be altered by the S/88 as long as no STCI store/fetch operations are in process.

The registers 404, 405 are accessed by the address decode logic 216 of FIG. 19A via a local address (OO-7EO1FC) and include the following data: PA bits 20–23 and PA bits 20–27 which equal respectively the S/370 storage 162 size (MEM size) and storage base address (MEM Base) where:

MEM Size=megabytes (1 to 16) of main storage allotted from S/88 storage 16 to storage area 162.

MEM Base=megabytes of offset from address zero in physical address space of storage 16 assigned to storage area 162.

PA=S/88 translated virtual address (i.e. physical address).

When logic 216 decodes the address OO7EO1FC, the size and base address bits are set in registers 405, 404 by processor 62 via its bus 161D. During this operation, logic 216 uncouples the processor 62 from its associated hardware, whereby the loading of registers 404, 405 is transparent to the S/88 operating system. In addition, the S/370 operating system is unaware of their existence or their use in accessing the S/370 storage 162.

FIGS. 32A, B and 30 also illustrate signal I/O lines used by the storage control interface 155. This includes in addition to the STC Bus 157 all lines required to interface to the S/88 system bus 30, the S/88 processor 62 and the logic 415 on S/88 CPU board 102. For ease of description, the transceivers 13 of FIG. 8 are not shown in FIGS. 32A, B.

(d) Data Store Operations

On a store command from cache controller unit 153, the STCI 155 will clock the command in on address-/data bus 406 (which is part of STC bus 157) bits 0–7 and store it in the command buffer 416 along with the STC Valid bit and in buffer 417. STC Busy will be raised on line 440 during the next cycle by logic 401 to indicate that the unit 155 is busy. Meanwhile the 24-bit real address on bus 406 is also clocked into the A/D register 417.

As long as FIFO 400 is not full and can accept the entire data transfer length (up to 64 bytes) specified in the command (no FIFO overflow), STC Data Transfer will be raised by logic 401 and will remain active every cycle until all STC Bus data transfers for this command are complete. On stores, STC Data Transfer is not issued (and thus the command is not shifted into FIFO) until it is assured no cancel has been issued (up to 2 cycles after STC Valid). However, during this time logic 401 shifts the 24-bit address from register 417 to register 442 and the first four bytes of data are transferred from unit 153 to register 417. In addition, the FIFO HF and AFE flags 409 are compared to the byte transfer length decoded from command buffer 416. The FIFO flags indicate 1 of 4 ranges of buffer depth in use. If the byte transfer length plus the 4 bytes of command word data exceed the FIFO 64 word capacity when added to the worst case buffer depth, as indicated by the FIFO flags, then all STC Data Transfer activations are held up until this overflow condition disappears. This will occur as soon as enough words are shifted out of the FIFO to cause a change in the flag status.

If no cancel occurs and no FIFO overflow exists then command decodes from block 401, concatenated with the 24-bit address from register 442, via multiplexer 447, are stored in FIFO 400. Subsequent 32-bit data blocks from A/D register 417 are stored in FIFO 400 in consecutive cycles, via register 442, once the initial store command is shifted into the FIFO. Gate 423 is used to multiplex the lower 16 bits onto the upper 16 bits, for 16 bit transfers onto bus 30.

The S bit is used to distinguish stores from fetches and the C/A bit is used to differentiate between command words and data words in FIFO 400 as seen in FIG. 35. Parity is maintained through the FIFO.

The FIFO inputs and outputs are clocked differently. Data is shifted into the FIFO 400 with S/370 clocks, while being shifted out with S/88 clocks. The timings are set to allow for worst case fallthrough time of FIFOs (60 ns) when FIFO 400 is empty. The FIFO command and data words are shown in FIG. 35, wherein:

S=(1=Store, 0=Fetch)
C/A=(1=Cmd/Add, 0=Data)
P01=Bytes 0, 1 Even Parity
P23=Bytes 2, 3 Even Parity
LDW=Lower Data Word Select (lower data word multiplexed onto upper word; P01=P23 in this case)
64 B OVFL=16 word transfer exceeded due to odd address alignment; Requires additional 32-bit data transfer cycle.
32 B,16 B,8 B,4 B=Weighted byte transfer count
TRL1,0=Encode for valid bytes in 'Trailing' word (last 32 bit data transfer).

Individual sequencers in block 401 on the input/output sides of the FIFO 400 track transfers in/out of the FIFO. The output sequencer actually tracks the number of bus 30 data transfers pending for the current fetch or store command. Once the command word reaches the FIFO output, the C/A bit=1 is decoded in logic 401; and, as long as no previous command is still pending completion, the S/370 real address from FIFO 400 is merged with base register 404, via logic 422 and 423, which is then loaded as the starting 'physical' address into the address buffer 420 while the transfer count is loaded into the output sequencer in 401. Also the arbitration logic 408 is set to begin arbitration.

Cycle control logic in 408 will track all active STCI 155 bus 30 phases for both fetch and store operations. Together with bus 30 status lines (i.e., Bus Busy, Bus Error) this logic is used within STCI 155 to handle normal bus 30 phase operations as well as for handling error conditions resulting in cancelled cycle definition or data phases.

The physical address is formed by first comparing in logic 422 the upper four bits of the S/370 24-bit real address from the FIFO 400 with the S/370 storage size value in register 405. If the S/370 address bits do not exceed the size region allotted for the S/370 processor 85, the upper four bits are then added by logic 423 to the S/370 storage base value in register 404, and concatenated to lower bits 19-1 in buffer 420 to form a physical 27-bit word address which is used as the starting S/88 address into the S/370 area 162. Otherwise a soft program check is reported. Any 64-byte address boundary crossings will result in wraparound to the starting address.

The address U/D counter 421 is used to hold bits 5-2 of the outgoing physical address. It is clocked in synchronization with the output sequencer, and while normally incremented, may be decremented when responding to Bus Busy or Bus Error conditions of a cycle response phase. Once the output sequencer is loaded, associated logic initiates store cycles based on bus arbitration grants via logic 408 while responding to Bus Error and Bus Busy conditions. An appropriate S/88 function code is produced by logic 401 corresponding to the S/88 store command; and the function code is placed in register 443 for application to the A, B buses of bus structure 30 when an arbitration cycle request is granted.

The output sequencer is normally decremented on each grant, by one for 32-bit and by two for 64-bit transfers to bus 30, until it reaches zero, indicating no further bytes are to be transferred by the present command.

In the event of a Bus Busy or Bus Error during a cycle response phase overlapped with cycle definition phase (back-to-back grants), the output sequencer will be incremented by one for cancelled 32-bit transfers and by two for 64-bit transfers (fetch only). Simultaneously, the address U/D counter 421 is decremented by one for cancelled 32-bit transfers and by two for 64-bit transfers (fetch only).

The data out register 425 is used to buffer outgoing data. The data out hold register 426 is required in the event data must be redriven because of a subsequent Bus Error (A or B bus). In this case, subsequent data (to a higher address) may be accepted and stored in storage 16, 18 earlier than the previous cycle data which is associated with the Bus Error because that data transfer must be repeated 2 cycles after its initial transfer. (Unlike stores, fetched data cannot be received out of sequence.) Meanwhile the Bus Arbitration logic 408 arbitrates continuously for cycles until all transfers have been initiated and accepted on the bus 30. The arbitration and data transfer to system bus 30 and store 16, 18 are similar to those previously described in section (b).

Finally note that the FIFO design allows the storage of up to 64 words (almost 4 groups of 64-byte store transfers) before going busy. For stores, as long as the FIFO is not full and can accept the command and data words associated with the store, the FIFO is loaded continuously until done. Consequently, STC Busy is dropped after each store command is executed, releasing unit 153 and allowing the S/370 processor 85 to continue execution. Assuming a high cache hit ratio in unit 153, performance is improved significantly by buffering the equivalent of almost four 64-byte stores in the FIFO or thirty-two 1-4 byte stores.

It is assumed that STCI 155 is the "drive" side of the STCI pair 155, 155a and that STCI 155a is the error "check" side. Therefore, only STCI 155 drives signals (control, address, data) onto the bus structure 30 as shown in FIG. 32B. Where signals are intended for both buses A and B, the STCI 155 drive lines are shown coupled to both buses (through the transceivers 13 not shown in FIG. 32B). In STCI 155a, the corresponding lines are not coupled to the bus structure 30; merely to the compare logic 402a-g.

Compare logic 402g compares address bits 27-6 from buffer 420, address bits 5-2 from address U/D counter 421, modified address bit 1 and the parity bit from parity generator logic 445, and the function code from register 443 with corresponding bits from STCI 155a. In the event of a miscompare, logic 402g applies error signals to the broken logic 403 and to Bus Error A and B lines.

Logic 402e compares data out bits from data out register 425 with corresponding bits from STCI 155a and applies miscompare signals to logic 403 and to Bus Error A and B lines. Logic 402d compares bits from FIFO logic 401 with corresponding bits from STCI 155a. AND gate 446 provides an error signal to logic 403 if the STC Valid signal is raised while the STC Busy signal is active on line 440.

(e) Data Fetch Operations

A fetch command follows the same path as store commands through registers 416, 417, 442 and the FIFO 400 as described above. One difference is that the STC Data Transfer signal is not raised on the STC Bus logic 408 until data is known to be received in register 428 or 429 from storage 162 via the bus 30. A fetch command and an STC Valid signal are received and stored in register 416. The command and its initial storage address are stored in register 417. The STC Bus logic in 401 issues an STC Busy signal during the next STC Bus cycle to prevent the cache controller 153 from sending another command until STC Busy is removed.

Thus, when a fetch command is received, the STC Busy signal is maintained by logic 401 until the fetch command is fully executed because the cache controller 153 is waiting for the fetch data to be received. (During store cycles STC Busy was removed as soon as all store data was transferred from the controller 153 to the FIFO 400.) During a fetch command cycle, STC Busy must be maintained until any and all store commands in the FIFO 400 are executed, then the fetch command is executed. Only then can STC Busy be removed to permit transfer of the next command to the STCI 155.

In cycles following the storage of the command in registers 416, 417, the command and address are transferred into the register 442 and then into FIFO 400.

When the S/370 fetch command is received in the last stage of FIFO 400 (and output-ready is high as described above), the C/A and other command bits are decoded in logic 401. A S/88 function code corresponding to the decoded S/370 command bits, is placed in register 443 for application to the bus structure 30 when an arbitration cycle request is granted.

Following a grant and subsequent cycle definition phase and cycle response phase, the STCI 155 will enter the data phase assuming no bus busy or bus error was reported during the cycle response phase. The first 32 bits along with bits DP, UDS, and LDS are received on the A,B buses of structure 30 from the appropriate location in area 162 of storage 16 and partner, and latched into registers 428, 429 respectively, with the S/88 clock beginning the second half of the bus 30 cycle. Assuming Obey Both mode or Obey A mode active, data will be gated from register 428 onto buffer 430 in the next S/88 clock cycle (start of next bus 30 cycle). For 64-bit transfers, the second 32 bits are latched into registers 428 & 429 concurrently with the transfer of previous data to buffer 430. A parity generator 431 adds odd parity to the data word stored in 430. These data and parity bits, along with the UDS, LDS, and DP bits received, are applied to logic 402c via buses 435 and 436. Logic 402c compares these bits with the corresponding bits produced in the paired STCI 155a. Buffer 430 will now gate the first data word, plus parity, onto buffer 432 to be driven during the next STC bus cycle for transfer to cache controller 153 via bus 406 of STC bus 157. Buffer 432 is clocked with S/370 clocks which are synchronized with S/88 clocks such that the beginning of the STC bus cycle occurs after activation of the S/88 clock. Since identical 62.5 ns periods are defined for both S/88 and S/370 clocks, this allows for pipelining of consecutive reads from bus 30 to the STC bus. Thus in the preferred embodiment, two STCI 155 cycles are executed for each bus 30 cycle of 125 ns.

Assuming successive grants to the STCI 155, a second data phase will follow the first data phase described above (assuming no bus errors, etc.). Assuming 64-bit transfers, data will now be clocked into registers 428 & 429 concurrently with data clocked from buffer 428 (or 429 for Obey B mode) into buffer 430. Buffer 430 data will then apply the next 32 bits to buffer 432 for transfer to cache controller 153 as described above. It is therefore seen how consecutive 64-bit transfers can be utilized to maintain a pipelined data flow in the preferred embodiment.

If a Fast ECC error or Data miscompare or parity error occurs during the data phase, STC Data Invalid is issued on line 433 by logic 402c concurrently with the data on the STC address/data bus 406. Furthermore, if subsequent data arrives in the cycle after the cycle in which data is invalidated, a Bus error condition will be forced by the STCI SBI logic on both A and B buses following that data cycle. This ensures that data will be redriven 2 cycles later (i.e. one cycle after Bus error is reported), thus maintaining data integrity and functionality on the STC Bus by transferring fetched data in sequence. Driving bus errors on both A and B buses is equivalent to memory 16 reporting an ECC error condition versus a 'true' bus error, thus not causing a change in bus OBEY logic along all controllers on the system bus 30.

Similarly, the same logic 402c used to compare incoming data and check parity via buses 435, 436 is also used on store operations to verify the results of the data output comparison in 402e by performing a 'loopback' data comparison from the system bus 30 via register 428 or 429. This helps identify transceiver 13 problems on the board 101 faster and will set the board broken logic 403 on stores if there is a miscompare and a bus error is not reported in the next bus cycle. In addition, all comparator outputs 402a-g which produce a fault condition on valid miscompares for fetch and store operations, will generate a broken condition in logic 403. The initial setting of broken will generate bus error signals on both A and B buses, thus ensuring that a data transfer in the previous cycle is repeated, while any cycle definition phase in the previous cycle is aborted.

Unlike stores, for fetches all commands previously in the FIFO must be executed as well as the current fetch before the unit can drop the STC Busy line 440 and accept another command. The cache controller 153 must receive the data for a fetch command before another storage command can be issued.

The definition of the available read/write cycle types is shown in FIGS. 36 A-D wherein:
UU=Upper Byte of upper word
UM=Upper Byte of middle word
LM=Lower Byte of middle word
LL=Lower Byte of lower word
MEM 16=16-bit memory cycle
MEM 32=32-bit memory cycle
MEM 64=64-bit memory cycle
LW=Longword (32 bits)
UDS=Upper Data Strobe
LDS=Lower Data Strobe 64-bit writes are not available in the preferred embodiment of unit 155 due to the emphasis placed on minimizing hardware. A 64×36 FIFO is sufficient to support 32-bit store transfers from S/370. One performance limitation resulting from using only 32-bit writes is that since each S/88 memory board 'leaf' in interleaved storage 16 is 72 bits long (64 bits plus 8 ECC bits), each leaf, once accessed on writes, will stay busy for three (3) additional (125 ns) cycles. This means that the same leaf can be accessed only once every 5 cycles (625 ns) on consecutive writes. Since all S/370 32-bit writes are defined for successive addresses this means consecutive transfers within the same 64-bit boundary cannot be issued faster than every 5 cycles (625 ns) while consecutive transfers on different 64-bit boundaries can be issued in successive 125 ns cycles (assuming arbitration won).

Sixty-four bit read cycles are supported, and in this case as long as the consecutive reads do not access the same leaf, they can be executed in consecutive cycles. Otherwise they can be executed every 2 cycles (250 ns). Because each 32 bits is received from bus 30 on 64-bit reads every 62.5 ns, (e.g.,. twice every 125 ns bus 30 cycle) the STC Bus and bus 30 cycle times are matched such that data can be pipelined from the system bus 30 to the STC Bus 157 after being received. Two extra levels of buffering (buffers 430 and 432) are used with registers 428 and 429 to support proper synchronization of cycles and allow for parity generation of each data byte.

Each 27-bit address and each 4-bit function code are sent together with an accompanying parity bit during bus 30 cycle definition phases. The 32-bit data also carries a parity bit associated with it during bus 30 data phases. A basic 125 ns cycle on bus 30 allows for normal 16 and 32 bit transfers, as well as 64-bit read transfers within the 125 ns window. Optionally, additional hardware can be used to support consecutive 64-bit write transfers in STCI 155.

Figure 37:
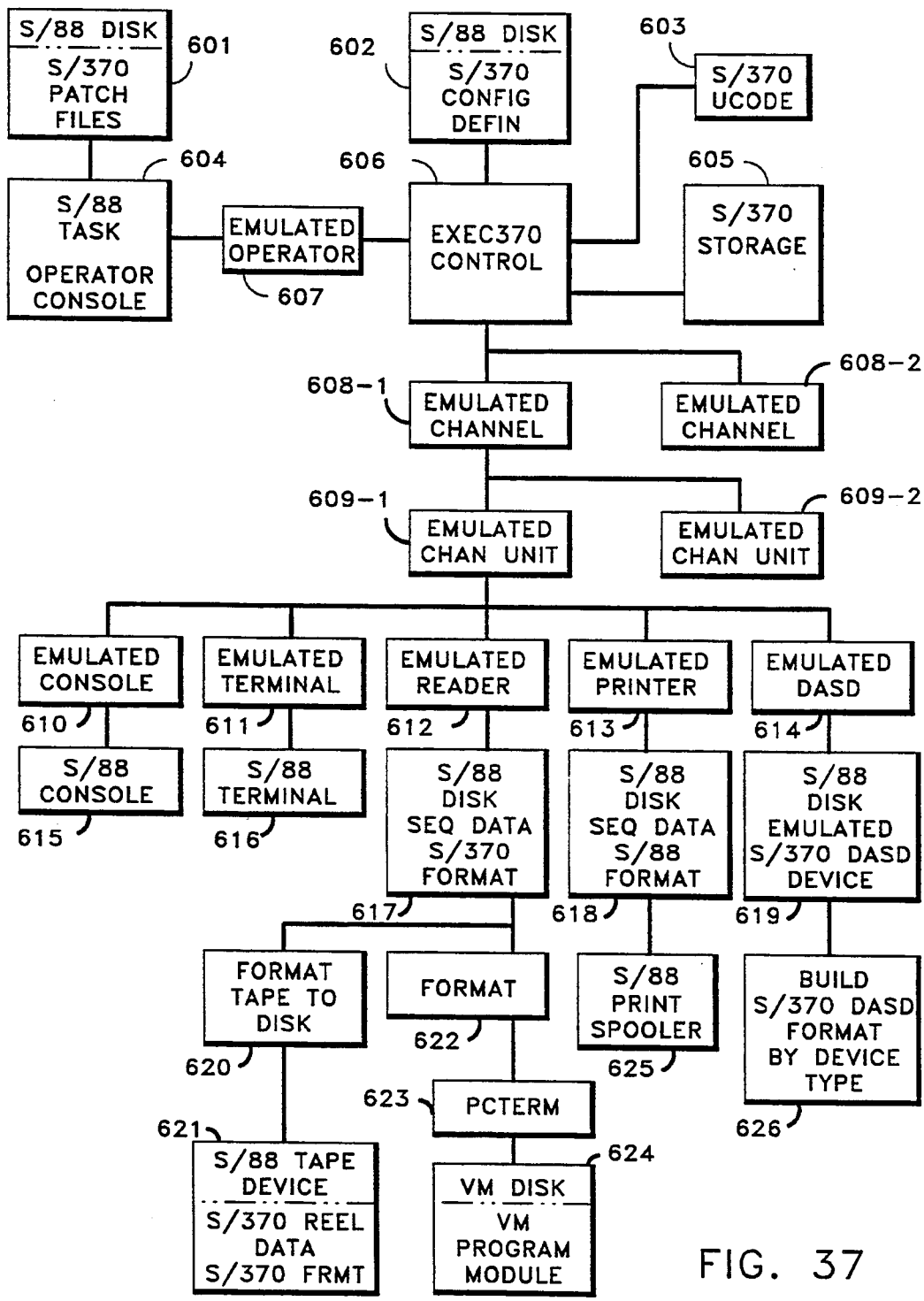
FIG. 37 illustrates conceptually the preferred embodiment of the overall system of the present application from a programmer's point of view.

S/370 I/O Support (FIG. 37)

FIG. 37 illustrates diagrammatically an overview of the S/88 hardware and application code which is utilized to support S/370 I/O functions. The hardware devices are 601, 602, 615–619, 621 and 623–625. The software (or firmware) routines are 603–614, 620, 622 and 626.

The functions of these several elements is now described. Block 606 is the main control for the S/88 application code which consists of Block 606 through Block 614. This set of blocks, known as EXEC370, performs all the S/88 application code functions pertaining to the emulation and support of S/370 external devices, services, configuration, operator's console, etc.

Block 603 is the microcode running in the S/370 microprocessor. It supports the S/370 CPU functions. A protocol between Block 603 and Block 606 enables them to communicate requests and responses with each other regarding the initiation of S/370 I/O operations, their completion, and S/370 I/O device and channel status information. It also enables Block 606 to request Block 603 to perform specific S/370 CPU functions. Block 605 is S/370 storage, and it is directly accessible to both Block 603 and Block 606. Block 606 provides the proper S/370 configuration via the data contained in Block 602 which is a S/88 data file.

Block 604 is a separate running task which provides the S/370 operator's panel through a S/88 terminal device. This task may be started or stopped at any time without disrupting the logical functioning of the S/370 process. Block 607 is a part of EXEC370 and provides interface emulation function between the S/370 process and Block 604.

Block 601 is a set of S/88 data "patch files" containing S/370 object code which has been written especially for the purpose of debugging the S/370 including its BCU 156. There is a debug panel provided by Block 604 which allows for the selection and loading into Block 605 of one of these "patch files."

Block 608-1 consists of the code responsible for emulating the S/370 channel. It performs the fetching of S/370 CCW's, the movement of data to and from Block 605, the reporting of S/370 I/O interrupt information to Block 603, and the selection of the proper Control Unit code emulator. There may be more than one S/370 channel (e.g., 608-2), however the same code is used.

Block 609-1 is the S/370 Control Unit emulator code. System 370 has many different types of control units, i.e., DASD controllers, tape controllers, communication controllers, etc. The S/370 controller function is partitioned between Block 609-1 and the particular device emulator, Block 610 through Block 614. The major purpose of Block 609-1 is address separation functions, however other Control Unit specific functions may reside in Block 609-1. There therefore is more than one block of this type (e.g., Block 609-2), i.e., DASD controller emulator, communications controller emulator, etc.; but there is not a one to one correspondence with those S/370 Control Units supported.

Block 610 represents the code necessary for emulating a S/370 console. Block 611 represents the code necessary for emulating a S/370 terminal. Block 612 represents the code necessary for emulating a S/370 reader. This is a virtual input device patterned after the standard VM reader. It provides for the input of sequential files which have been generated from another source, typically tape or diskette.

Block 613 represents the code necessary for emulating a S/370 printer. An actual S/88 printer may be driven or the S/370 data may written to a S/88 file for spool printing later. Block 614 represents the code necessary for emulating a S/370 disk. The two formats: Count, Key and Data; and Fixed Block are supported by two different sets of code.

Block 615 represents a S/88 terminal, typically the S/88 console output device. The System/88 console displays both S/88 operator messages and S/370 operator messages in addition to logging the messages to a log on disk which will appear to the S/370 as a 3278 or 3279 terminal.

Block 616 represents a S/88 terminal. Block 617 represents a S/88 sequential data file on a S/88 disk. Block 618 represents a S/88 printer or a sequential data file on a S/88 disk. Block 619 represents a S/88 data file on a S/88 disk. Block 620 is the code which will read a System/370 tape mounted on a S/88 tape device, and format it into Block 617 as it appears on the original S/370 tape. Block 621 represents a S/88 tape drive with a S/370 written tape mounted.

Block 622 is the code which will read a file entered into S/88 from a Personal Computer, and format it into Block 617 as it originally appeared when it was generated on a S/370 System.

Block 623 is a Personal Computer configured to send to and receive data from both a S/88 and a System/370. Block 624 is a S/370 System. Block 625 represents a S/88 spooled printer. Block 626 is the code which formats a S/88 file into an emulated System/370 DASD device. This is a S/88 separately run task which will format the file to any of the supported S/370 DASDs desired.

S/370 I/O OPERATIONS, FIRMWARE OVERVIEW

A simplified and generalized view of System/370 I/O is now presented. S/370 Architecture provides several types of I/O instructions, a program-testable condition-code (CC) scheme, and a program interrupt mechanism. Conceptually, an I/O instruction is directed toward an 'I/O Channel', which directs and controls the work of the I/O operation in parallel with other CPU processing, and reports status to the CPU when the I/O instruction is executed (via condition-code), and/or when the I/O operation is completed (via program interrupt).

S/370 instructions, condition-codes, interrupts, and I/O devices (DASD, tape, terminals, etc.) are closely architected. However, the I/O Channel is architected loosely to provide design latitude, and many differing implementations exist.

The broad view of the Fault Tolerant System/370 improvement is then a S/370 CPU (chipset with customized firmware) and a 'pseudo-I/O-Channel' consisting of time-slices of a S/88 CPU and Operating System (OS), with the addition of special firmware and application-level software (EXEC370) providing both S/370 I/O device emulation and overall control of the system complex. The S/88 portion of this complex provides fault-tolerant CPU, OS, I/O devices, power/packaging, busses, and memory; the S/370 CPU is made fault-tolerant through hardware redundancy and added comparison logic.

The required custom firmware (i.e., microcode) falls into two groups:

a. S/88 BCU-driver firmware (ETIO) running on the S/88 processor 62—service routines for initialization and control of the BCU/DMAC hardware, DMAC interrupt service, and status and error handling.

b. S/370 (processor 85) microcode—I/O instructions, I/O interrupt handling, and some special controls such as invocation of reset, IPL, halt, etc.

As an aid to understanding the context of the various firmware operations, consider the following simplified sequence of events that occur in a typical I/O operation: a S/370 write of an 80-byte message to an emulated S/370 3278 display terminal.

Figure 43:
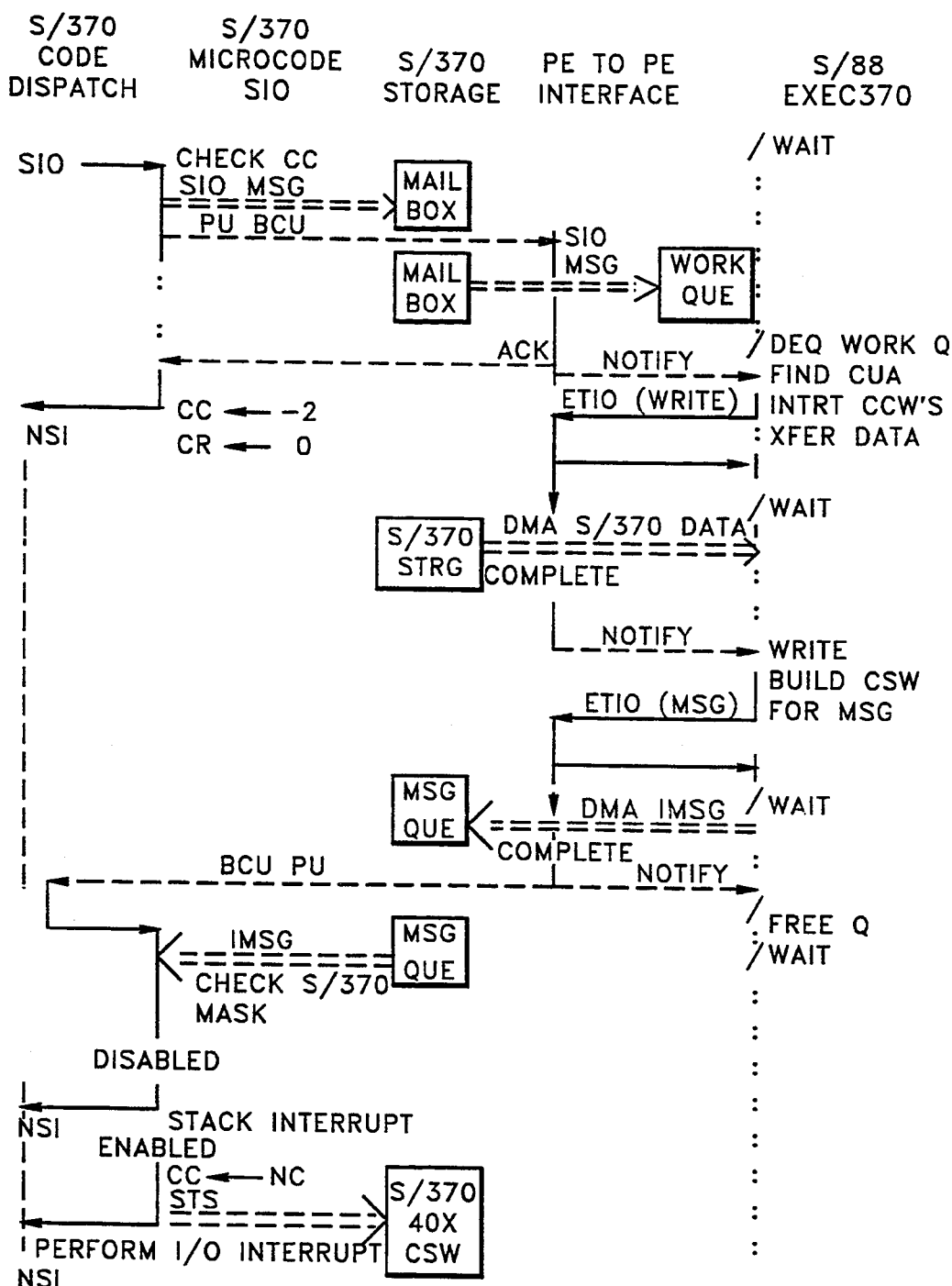
FIG. 43 illustrates conceptually the execution of a typical S/370 Start I/O instruction.
Figure 44A:
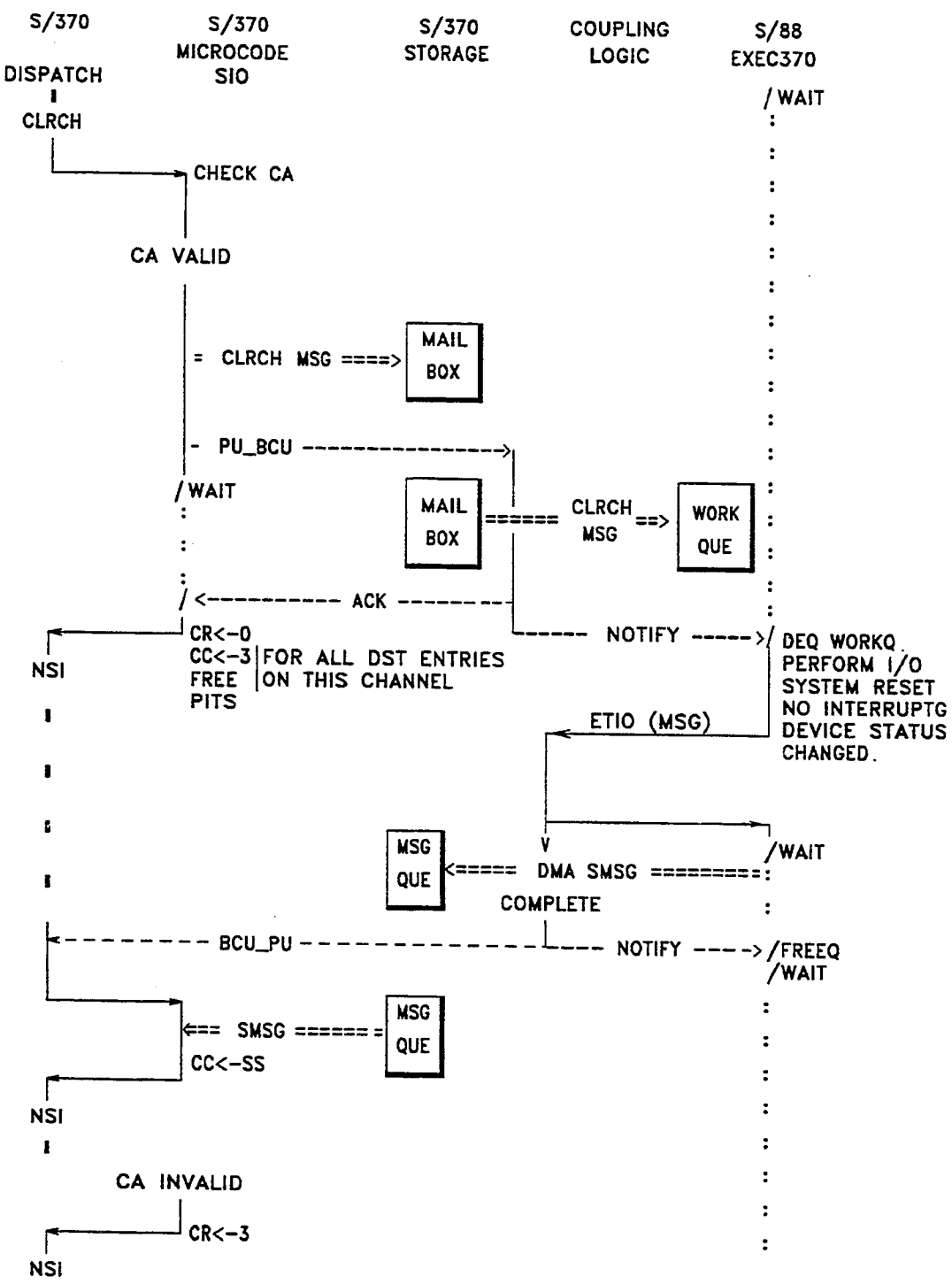
FIGS. 44A-L illustrate diagrammatically the control/data flows for S/370 microcode and EXEC 370 as they communicate with each other for executing each type of S/370 I/O instruction.
Figure 44B:
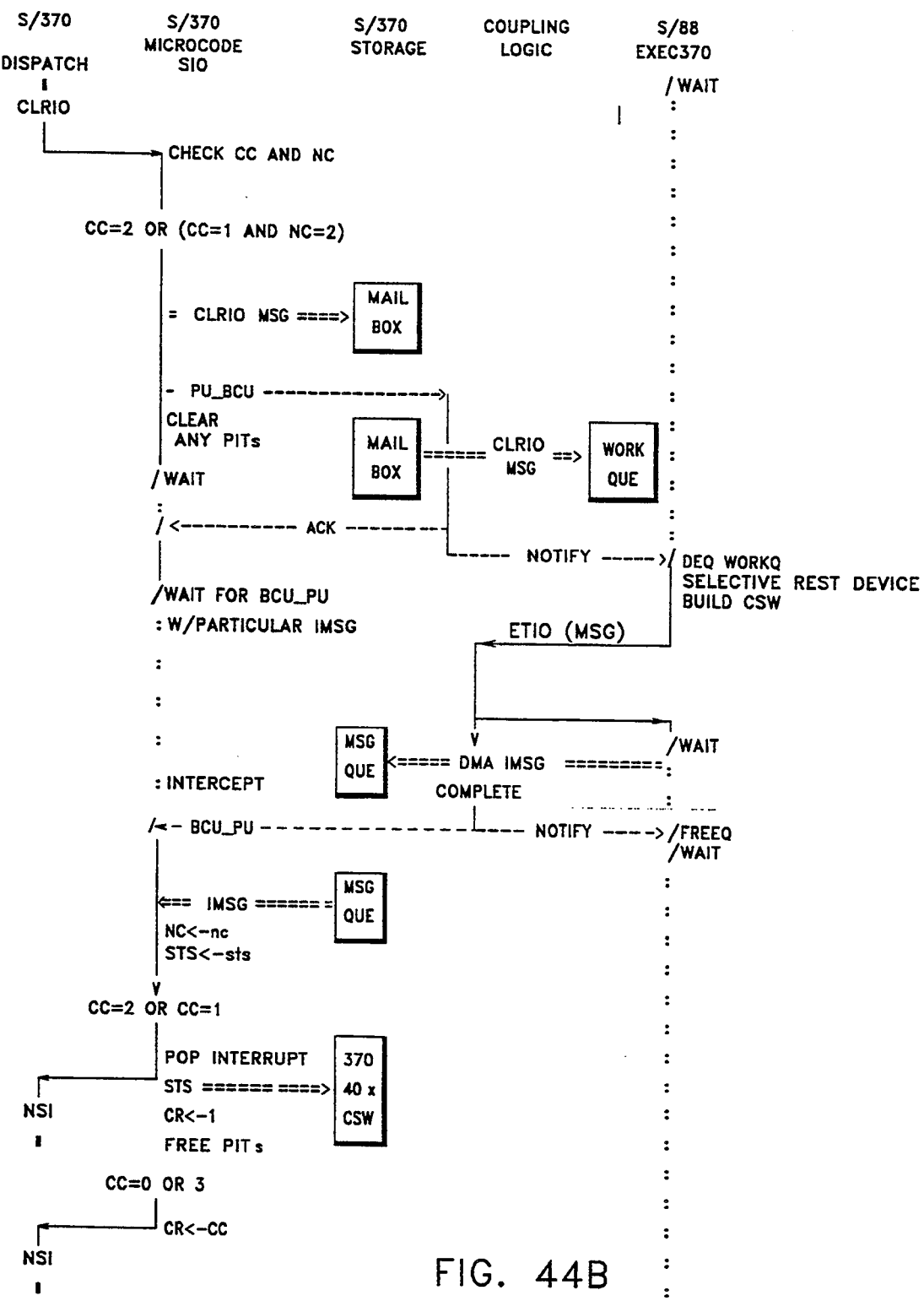
Figure 44C:
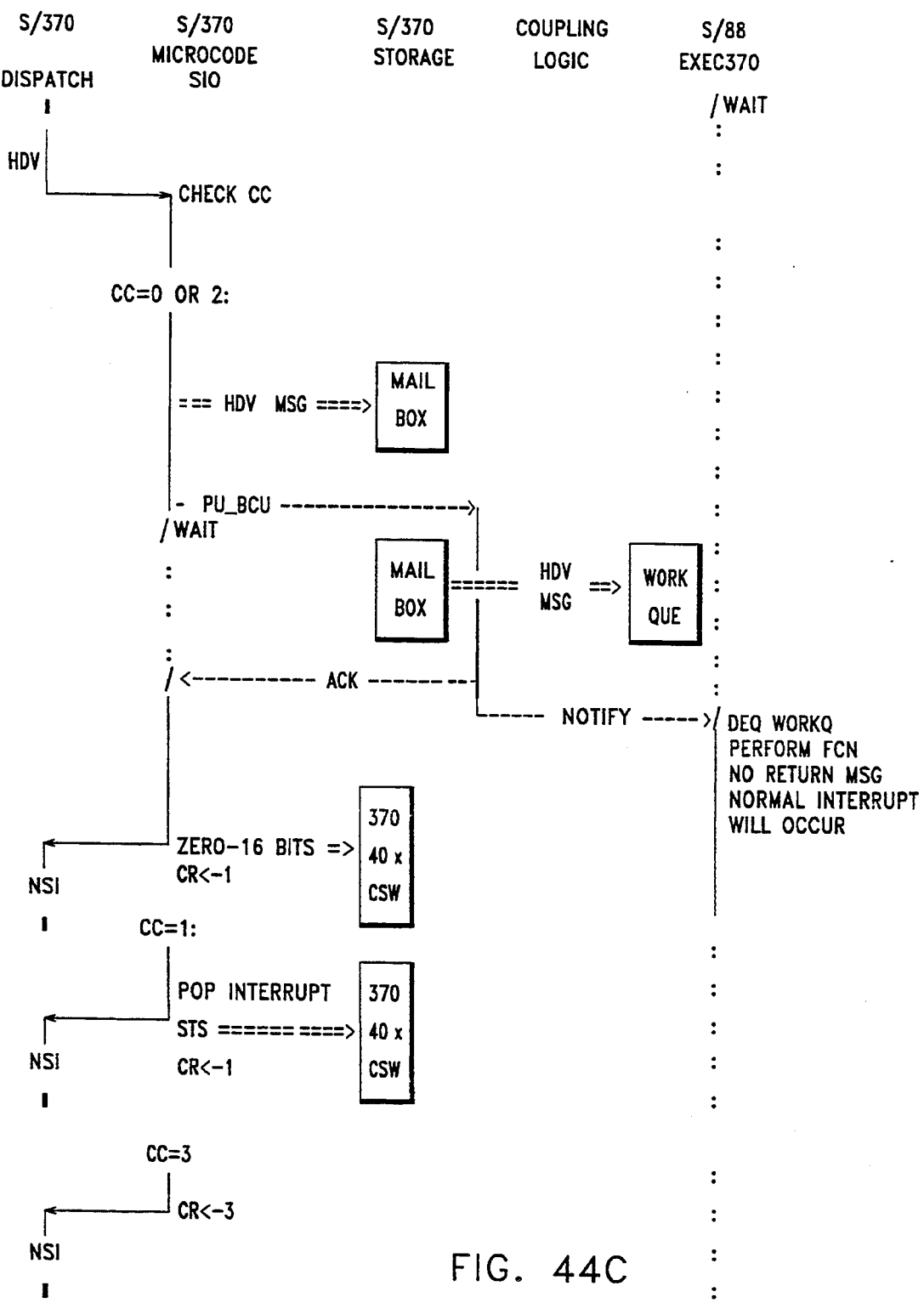
Figure 44D:
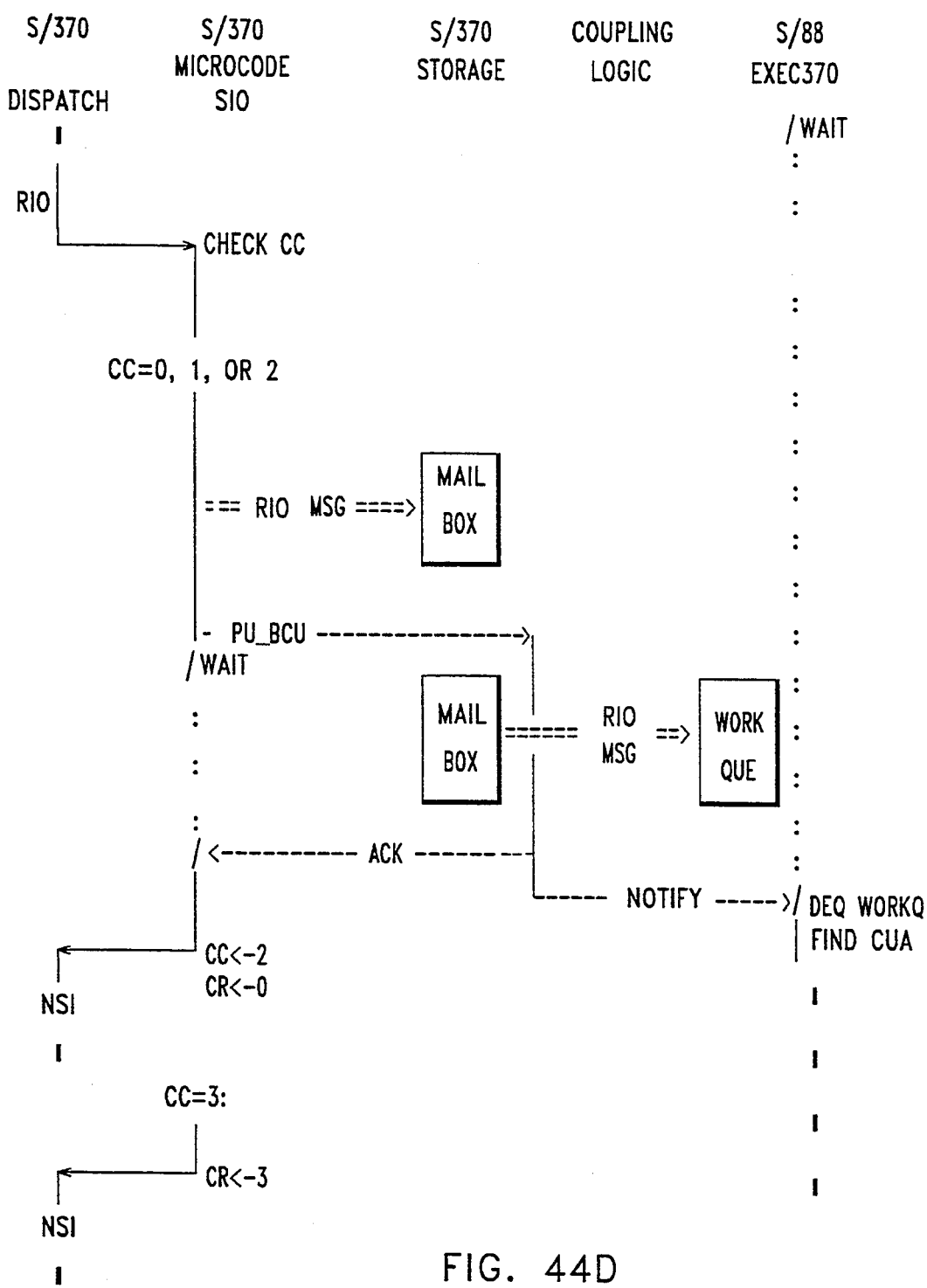
Figure 44E:
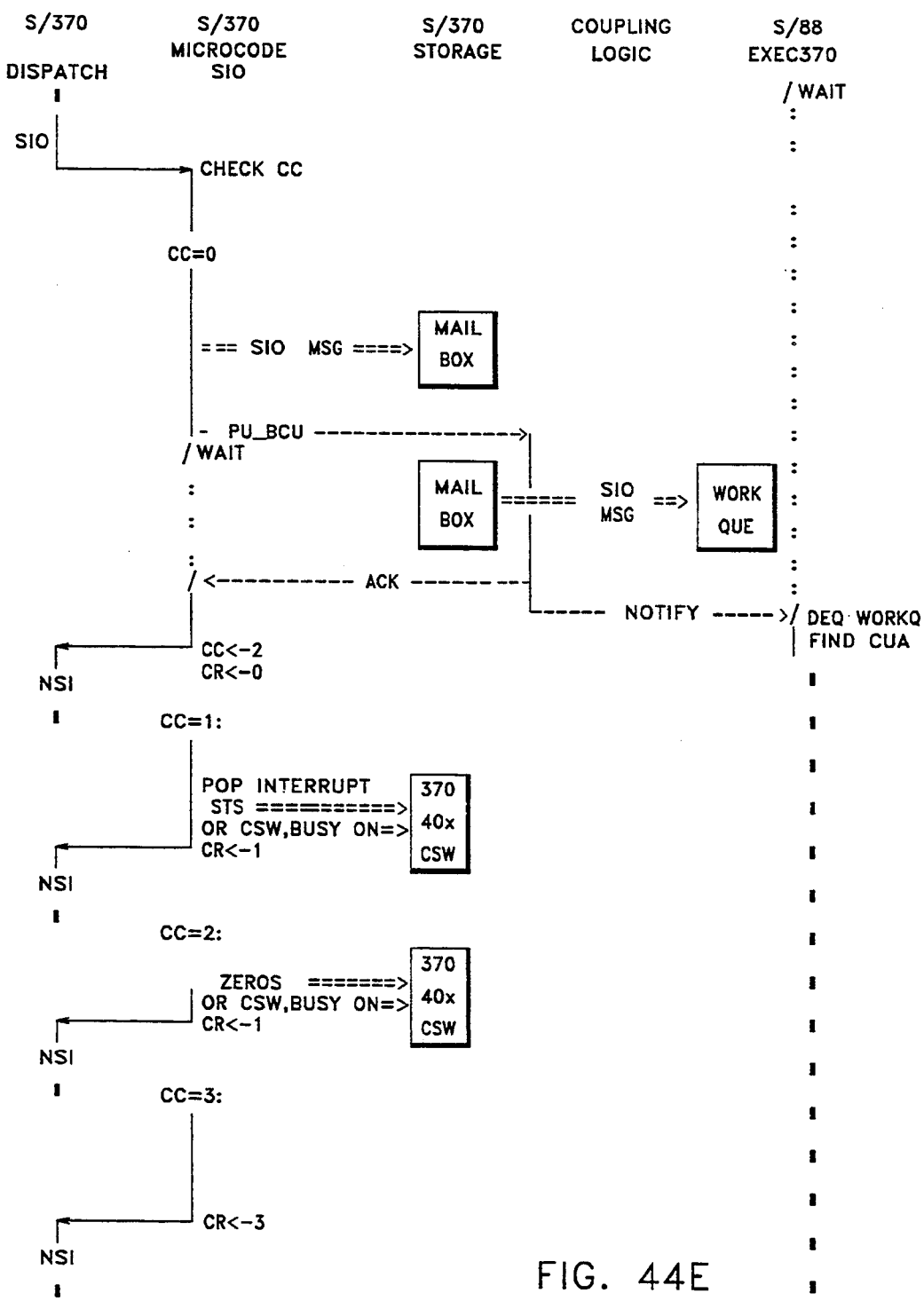
Figure 44F:
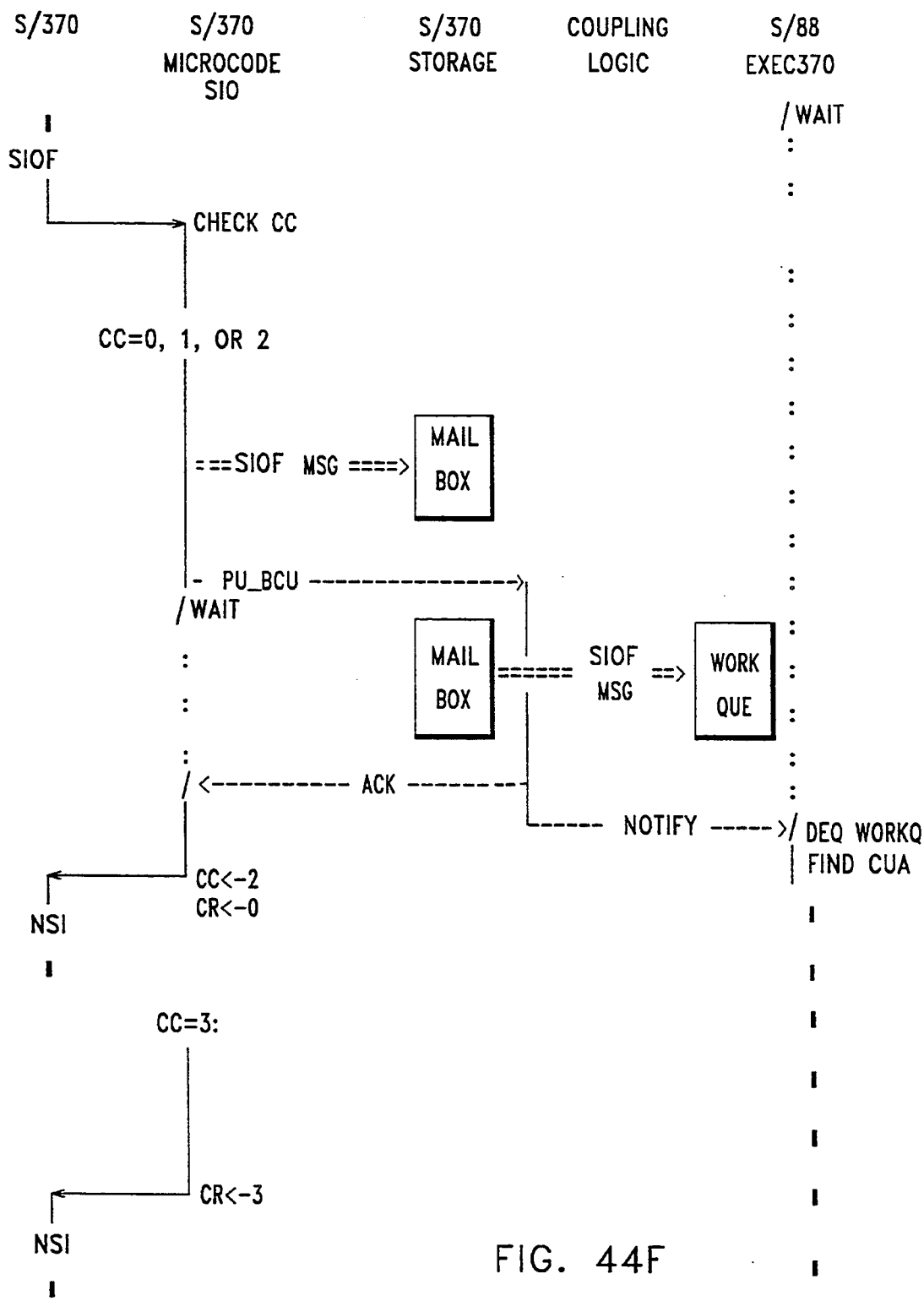
Figure 44G:
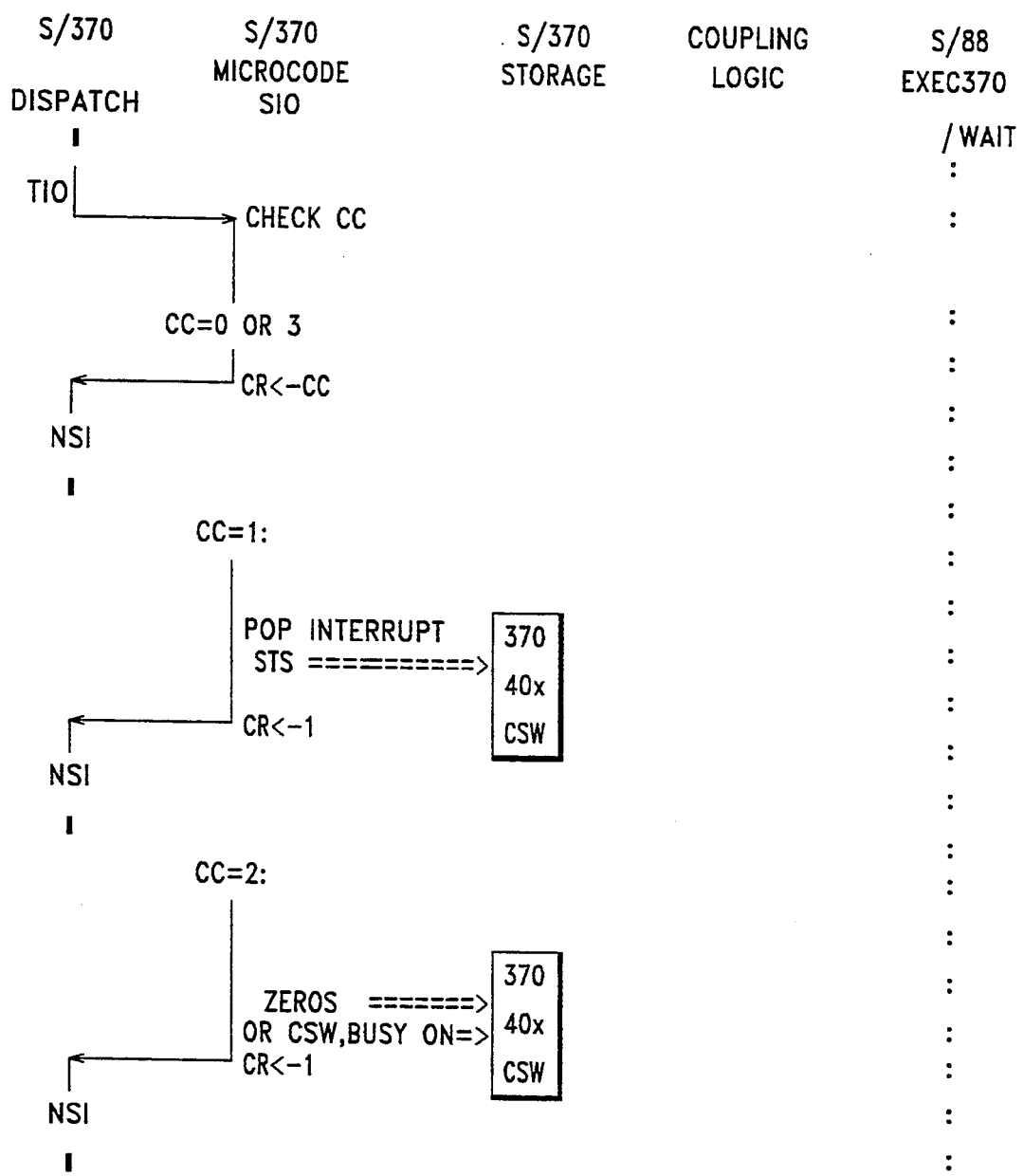
Figure 44H:
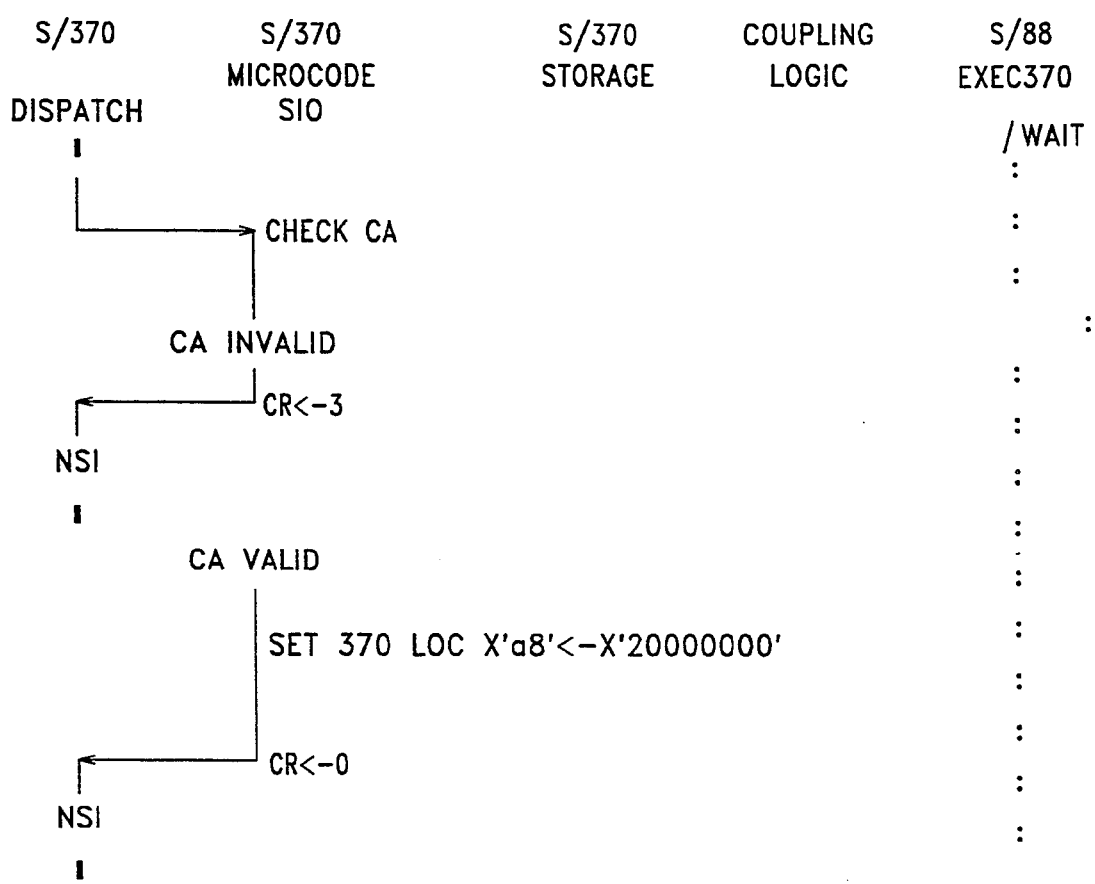
Figure 44I:
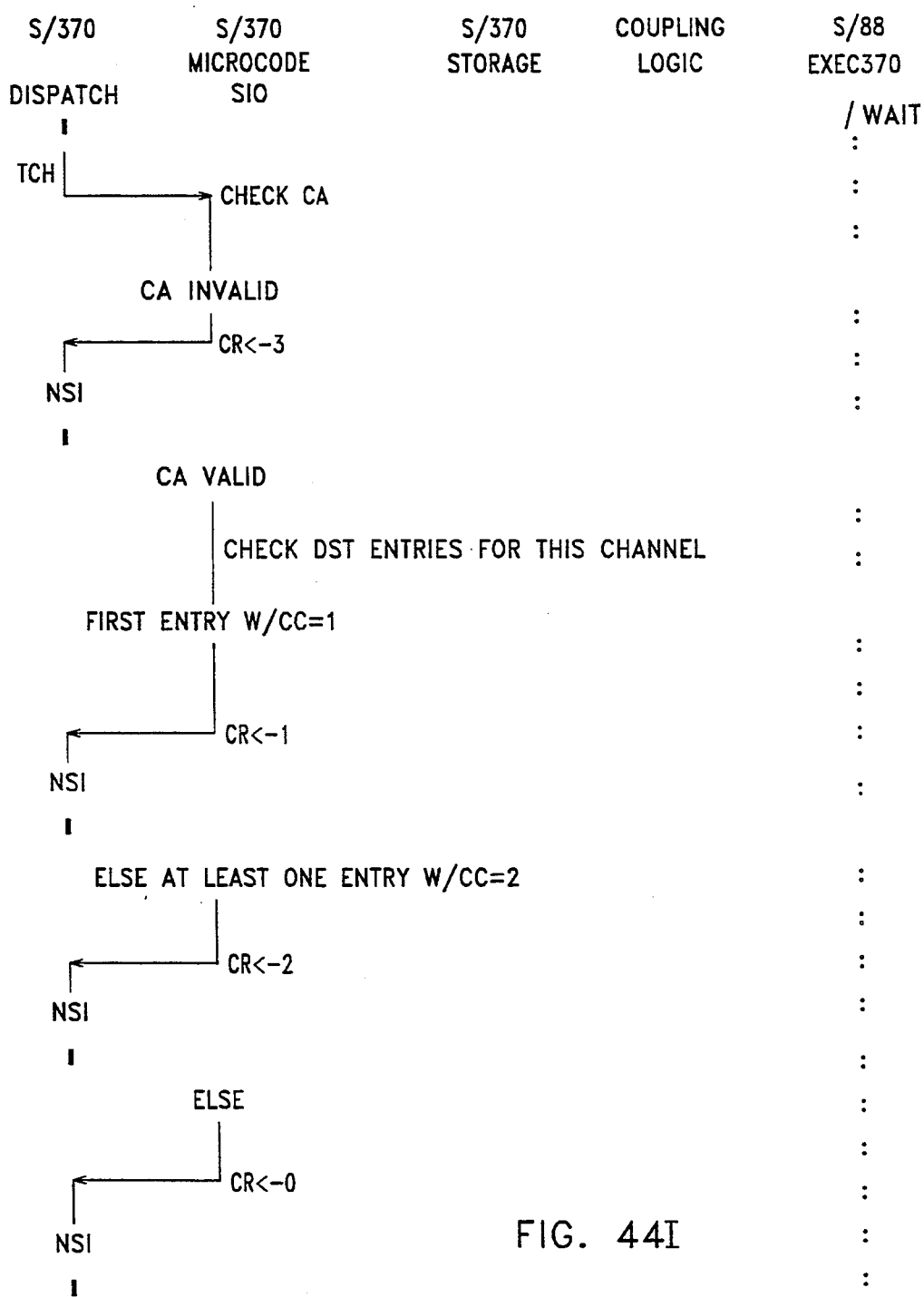
Figure 44J:
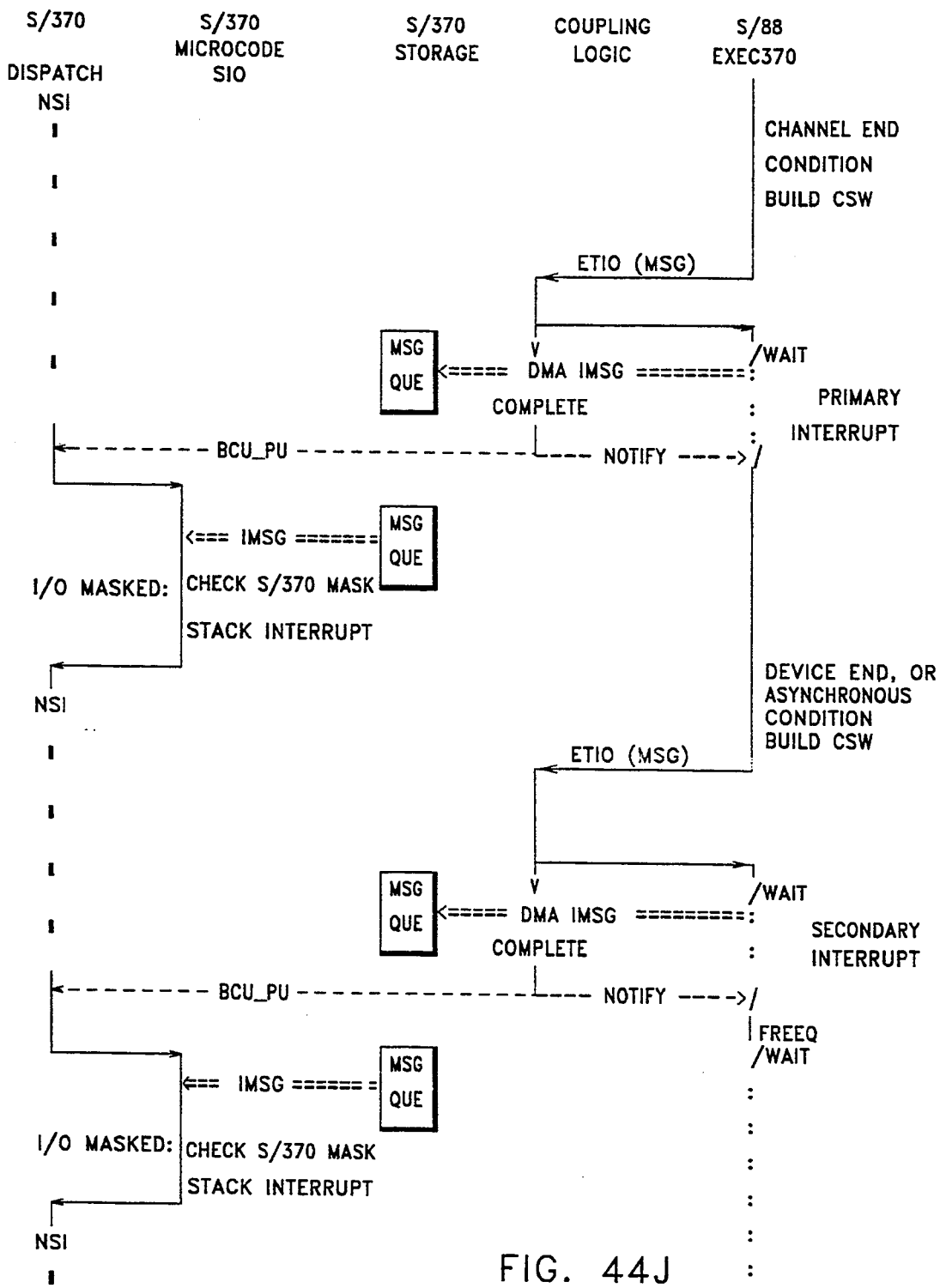
Figure 44K:
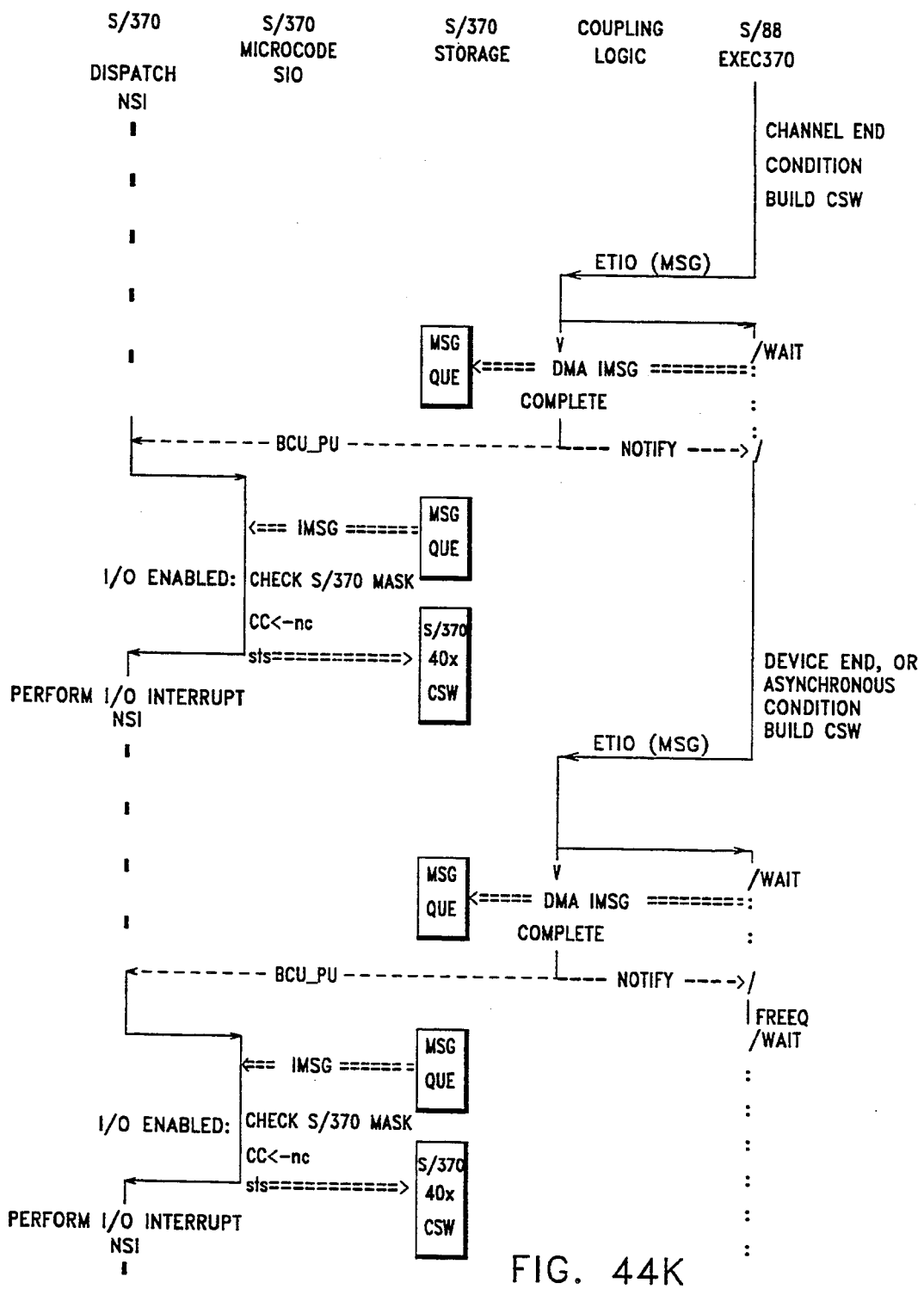
Figure 44L:
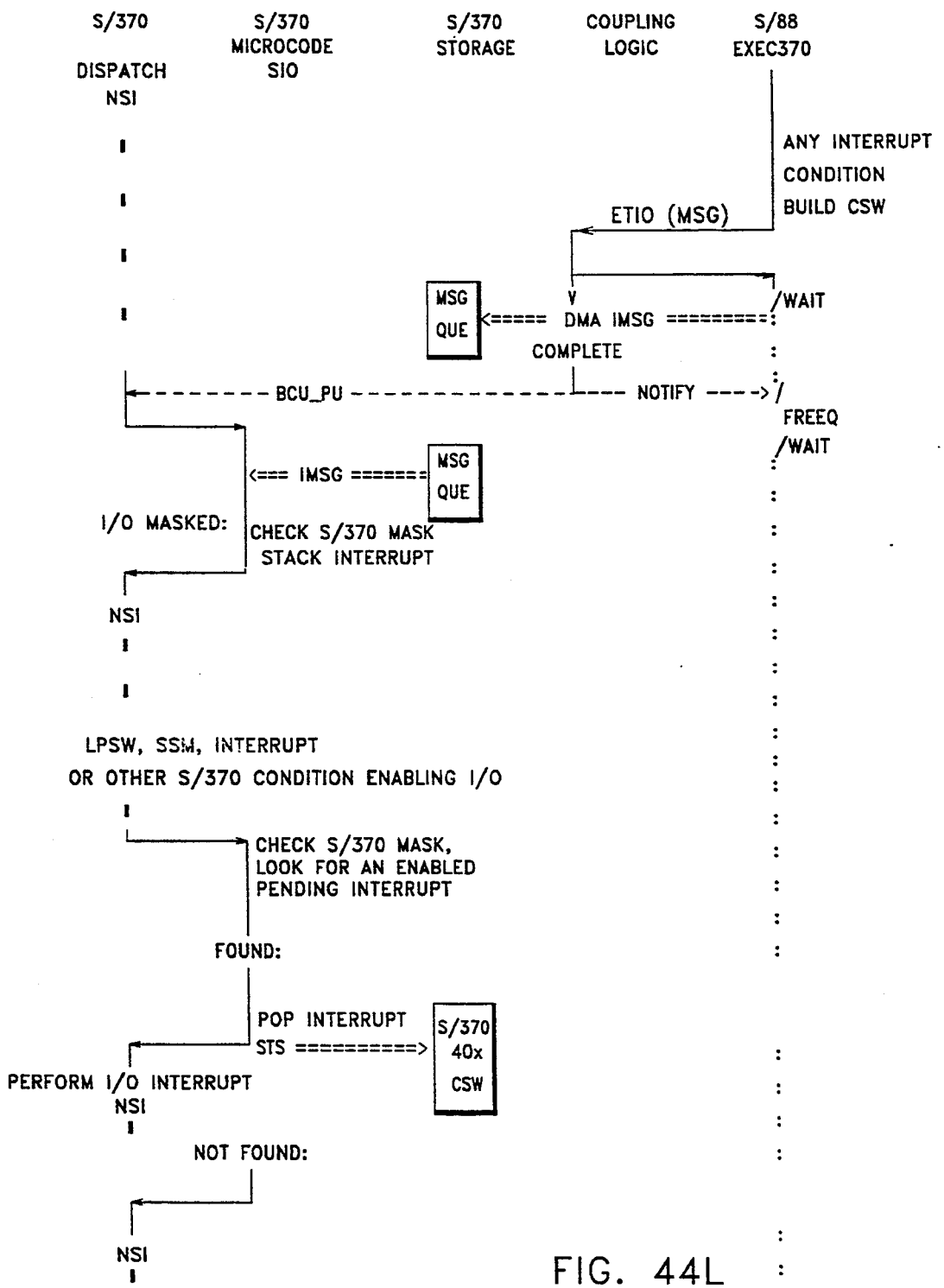

Assume for this example that initialization has already been done, the S/370 and S/88 are operating normally, and no other S/370 I/O operation is in progress, reference being directed to FIG. 43 and FIGS. 19A–C. Each of the data/command transfers between PE62 and elements of BCU 156 is performed using the "uncoupling" mechanism described above with respect to FIG. 20. The flow chart of FIG. 43 diagrammatically illustrates this typical start I/O operation.

a. S/370 processor 85 encounters a Start I/O (SIO) instruction. (All I/O instructions in chipset 150 are microcoded in the preferred embodiment).

b. Custom firmware for SIO is invoked; it moves several parameters into the fixed mailbox location 188 (in the IOA area of S/370 main memory), sends a service request to the BCU 156 (PU-BCU request), and waits for a response.

c. BCU hardware detects the request and generates a command to read the 16-byte mailbox from the S/370 IOA fixed location, then responds to the S/370 processor 85 by resetting the request via BCU-PU ACK (meaning 'request has been serviced').

d. In the S/370 processor 85, the SIO firmware is released to end the SIO instruction and continue processing at the next sequential instruction.

e. Concurrent with event 'd,' as a result of 'c,' S/370 hardware has been transferring the 16 bytes of mailbox data to the BCU interface buffer 259 in adapter 154 via bus 170.

f. As the data is buffered (in 4-byte blocks), the BCU hardware repeatedly signals the DMAC 209 (channel 0) to transfer the mailbox data (in 4-byte blocks) to a WORK QUEUE block in the local store 210.

g. When the 16-byte transfer is complete, the DMAC 209 presents an interrupt (NOTIFY, FIG. 43) to the S/88 processor 62 and then prepares itself for a future mailbox operation by loading the next linked-list item. This interrupt is one of the eight (8) DMAC interrupts to the processor 62, i.e., a "normal" DMAC channel 0 interrupt.

h. When the S/88 accepts the DMAC interrupt (subject to possible deferral due to masking), a custom firmware service routine (in ETIO) executes; it checks the DMAC 209 status, finds the WORK QUEUE block just received by reference to the linked-list, and enqueues that block for passing to the EXEC370 application program.

i. EXEC370 checks the WORK QUEUE, dequeues the WORK QUEUE block, constructs a data request in the WORK QUEUE block, and calls a firmware routine to get the 80 bytes of data to be sent to the 3278 terminal.

j. The firmware prepares and starts the DMAC 209 (channel 1), then sends a command to the BCU hardware to begin reading 80 bytes from a specific S/370 memory location via adapter 154, bus 170, and storage controller 155.

k. The BCU hardware 156, the adapter 154, and DMAC 209 transfer the 80 bytes to the WORK QUEUE block and the DMAC 209 presents an interrupt to the S/88; this is similar to the operations in f. and g. above. This interrupt, a "normal" DMAC channel 1 interrupt, is one of the eight DMAC interrupts described above.

l. A firmware interrupt service routine again checks DMAC status and enqueues a WORK QUEUE block pointer for EXEC370.

m. EXEC370 does any necessary data conversion, then writes the data to the emulated 3278 terminal using the services of the S/88 OS. After some time, it receives notification of the end (normal or error) of that operation. It then builds, in the WORK QUEUE block, an appropriate S/370 -interrupt message, including status, and again calls a firmware routine to write it to the S/370 message queue.

n. The firmware prepares and starts the DMAC (channel 3), then sends a command to the BCU hardware to write 16 bytes to the S/370 message queue. This is similar to a reversed-direction mailbox read, except that in this case, the adapter 154 generates a microcode-level exception interrupt in the S/370 processor 85 at the end of the operation (also subject to masking deferral). The DMAC 209 also interrupts (NOTIFY, FIG. 43) the S/88 processor 62, just as in g. and k. above. This interrupt, a "normal" DMAC channel 3 interrupt, is one of the eight DMAC interrupts.

In the S/370 processor 85, custom firmware handles the exception, and must test the channel masks for the deferral possibility; if masked, such that an interrupt cannot be presented to the running program, the essential data is moved from the message queue area 189 to a pending-interrupt queue; another custom firmware handler will service it when the channel is next enabled for interrupts. If not masked, this firmware switches the context of the S/370 to the program's interrupt routine immediately.

A broad view of the improved FT system leads to the conceptualization of the S/88 role as an attached slave I/O processor—it is an I/O handler or pseudo-channel for the S/370. In actuality, however, all of the basic communication between the processors must be initiated from the S/88 (because of the design). Also, the S/88 can access all of the S/370 memory and microcode space via EXEC370, while the reverse is not true—the S/370 processor 85 cannot access the S/88 storage at all, even accidentally. Thus, the truer picture is of the S/370 as slave to the S/88, but with the internal image of a normal stand-alone S/370 with S/370 I/O. The S/370 does not 'know' that the S/88 is there.

But since the S/370 programs run asynchronously to the S/88 and must not be impeded, S/370 I/O instructions must be able to INITIATE an action, and this facility is provided by the PU-BCU request line 256a, which has a singular meaning: S/370 has a high-priority message waiting for S/88 (usually an I/O instruction). The priority nature of this service demand is the reason for the automatic mailbox scheme and the linked-list programming of DMAC channel 0.

The DMAC 209 is an integral part of the BCU hardware design. It is initialized and basically controlled by S/88 firmware, and data transfers are paced by the BCU logic which drives the four request REQ input lines 263a–d, one for each channel. In addition, external BCU logic activates the Channel 0 PCL line 257a as each mailbox transfer completes, causing the DMAC 209 to present an interrupt request to the S/88 processor 62.

There are four basic data-transfer operations between S/370 and S/88:

|   |   | Size | Adapter 154 Channel | DMAC 209 Channel | DMAC Operation Type |
|---|---|---|---|---|---|
| 1. | Mailbox read | 16 bytes | 0 | 0 | continuous, linked-list |
| 2. | Data read | 1-4096 bytes | 0 | 1 | start-stop pre-emptable |
| 3. | Data write | 1-4096 bytes | 1 | 2 | start-stop pre-emptable |
| 4. | Message-Q write | 16 bytes | 1 | 3 | start-stop |

The initialization and programming of the DMAC 209 is entirely standard and preferably in conformance with the MC68450 Architecture. Briefly:

All 4 channels—word (16 bit) transfer size; REQ line controls transfer; memory address in store 210 counts up; device (BCU data buffer register) address does not count interrupts enabled; cycle-steal without hold; device with acknowledge/implicitly addressed/single addressing mode; 16-bit device port; PCL=status input In addition to the above CH0: Device to memory (store 210) transfer; linked array chaining; PCL=status input with interrupt CH1: device to memory (store 210) transfer; no chaining CH2 & 3: memory (store 210) to device transfer; no chaining The DMAC 'thinks' the device has 16-bit data, but external logic causes 32-bit transfers. The linked array chaining mode used in CH0 (Channel 0 of DMAC 209) implies that a linked-list exists, and it is set up by the ETIO initialization routine. Once CH0 is started, it stops only due to an error condition or by encountering the last valid entry in the linked-list. In normal operation, an interrupt to S/88 occurs each time the DMAC 209 completes a mailbox read, and the firmware monitors and replenishes the linked-list in real time; thus the last valid entry of the list is never reached, and CH0 runs (idles) continuously.

Each DMAC channel is provided with two interrupt vector registers NIV, EIV (FIG. 18), one for normal end-of-operation and one for end forced by a detected error. The present improvement uses all eight vectors, with eight separate ETIO interrupt routines in microcode store 174. Additionally, the channel 0 normal interrupt has two possible meanings: a PCL-caused 'mailbox received', and the less-common 'channel stopped due to the end of linked-list'. The interrupt handler differentiates these by testing a DMAC status bit.

The S/88 firmware also provides four service entries for the EXEC370 application program: initialization, and starting of the three basic data transfers discussed above—data read, data write, and message-Q write.

The ETIO-INITIALIZE entry is usually called soon after power-up, but can also be used to re-initialize for error recovery attempts. It resets the BCU hardware and the DMAC 209, then programs the DMAC registers in all four channels with configuration and control values. It also builds the necessary linked-list and starts Channel 0, causing the DMAC 209 to auto-load the first linked-list parameter set and then wait for a request transition from the BCU hardware on line 263a.

The other three service entries are called to start DMAC channels 1 (data read), 2 (data write), and 3 (message-Q write). The calling program (EXEC370) provides a pointer to a WORK QUEUE block which has been pre-set with data addresses, count, etc. These routines either start the DMAC209 and BCU hardware immediately, or enqueue the operation if the required DMAC channel is busy. (A separate 'work-pending' queue, shown in FIG. 41E, is maintained for each of these three channels). Once the requested service is either started or enqueued, control is returned to the calling program, and the interrupt handlers continue the operation to completion.

A third, small but crucially important, area of S/88 custom firmware is the modification of the S/88 OS (Operating System) to intercept and vector the eight DMAC interrupts to the custom handlers but transparent to the S/88 OS. This involves modifications to the standard architected MC68020 vector table in the OS for level 6 (which is normally autovectored for power failure) and placing the custom interrupt handlers into the OS. This is a preferred implementation; however, as will be seen below in the section relating to initialization routines for interrupts, logic could be provided in the BCU 156 to place a vector on the local bus 223 eliminating the need for vector modification.

All of the S/88 firmware for the preferred embodiment is written in MC68020 assembler language, and so cannot properly be termed microcode. It is considered firmware because of the nature of its functions.

There are four categories of customized firmware required for the S/370 processor 85:
1. Microcoded I/O instructions going to the S/88 pseudo-channel,
2. Handling of asynchronous messages coming from S/88, including I/O interrupts,
3. Maintenance of configuration data and status of all (emulated) S/370 I/O devices, and
4. Implementation of a subset of user manual operations.

All of this special firmware is written in S/370 microcode, and it uses pre-existing functional subroutines wherever possible.

There are ten I/O-type instructions in S/370 which are discussed in more detail with respect to the description for FIGS. 44A-I.

CLRCH—clear channel (channel-only op)
CLRIO—clear I/O
HDV—halt device
HIO—halt I/O
RIO—resume I/O
SIO—start I/O
SIOF—start I/O fast
STIDC—store channel ID (channel-only op)
TCH—test channel (channel-only op)
TIO—test I/O Each of these instructions is implemented in microcode so as to pass all essential information to EXEC370 in the S/88 via the mailbox mechanism, while maintaining conformance to S/370 Architecture. Several different hardware conditions in the adapter 154 result in activating the 'Adapter Attention' request, which is in turn one of several possible causes of a microcode-level 'Forced Exception' in the S/370 processor 85. The servicing of this exception by the microcode occurs between S/370 instructions (immediately if the PE 85 is in the wait state). The most frequent and common cause of 'Adapter Attention' is the receipt by the PE 85 of a message from the I/O pseudo-channel S/88 into the fixed Message-Q area 189 of the IOA section of S/370 main memory. The existing S/370 microcode exception handler is modified for the 'Adapter Attention' case. The code tests adapter 154 status to determine the cause of the request, and customizes only the 'Q-not-empty' (which means message received) handling; any other cause returns to existing unmodified code for handling.

The defined categories of received messages are:
0000 NOP: No Operation.
0001 RESET: Invoke existing S/370 Program Reset routine.
0002 CLEAR RESET: Invoke existing S/370 Clear Reset routine.
0003 HALT: Halt S/370 program execution, turn on ISTEP mode.
0004 STEP: Instruction step; execute one instruction, then HALT.
0005 RUN: Reset ISTEP mode; resume execution of program.
0006 LPSW: Execute S/370 'Load PSW' function, using a PSW provided within the message. Leave HALTED state.
0007 SMSG: Status Message—update the status bits, in the local (IOA) Device Status Table, for one or more configured I/O devices.
0008 IMSG: Interrupt Message—either enqueue or immediately present an S/370 I/O interrupt, depending upon Channel Mask state.

Message types 0001-0006 above are S/370 manual operations for state control, resulting from user input at the (emulated) S/370 System Console. They may also be forced directly by EXEC370 as needed for error recovery or synchronization. Message type 0007 is used to inform the S/370 of asynchronous changes of status of I/O devices, such as power-loss, ON/OFF-LINE changes, device-detected errors, etc. It may also be expanded for general-purpose communication from the S/88 to the S/370. Message type 0008 is the vehicle for reporting end-of-I/O operation status to the S/370—either normal or error end conditions. It will always result in an eventual Program Interrupt and Device Status Table modification in the S/370.

Certain of the details of the ETIO and EXEC370 functions, interface, protocols and instructions flows will now be discussed.

System Microcode Design

1. Introduction

Figure 38:
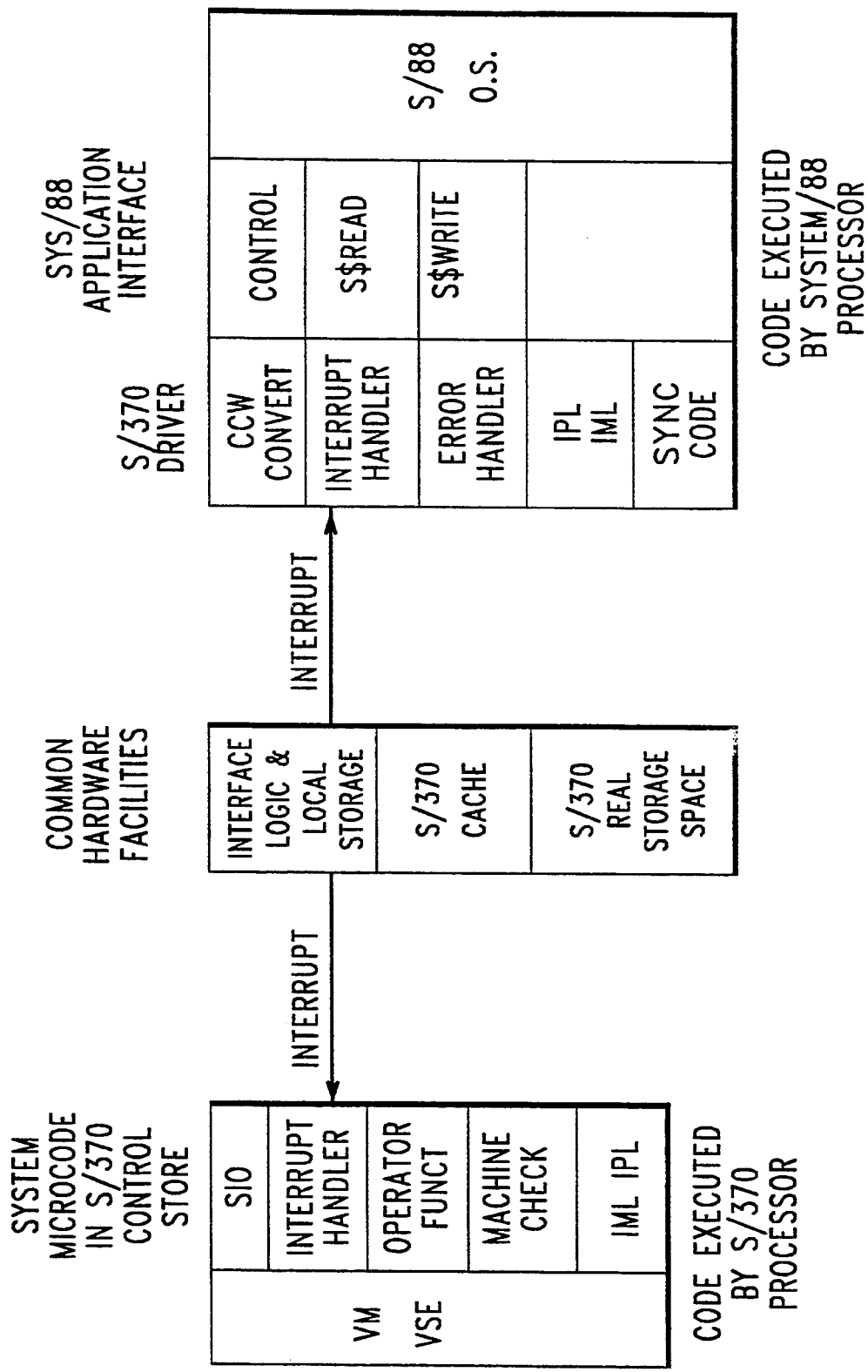
FIGS. 38, 39 and 40 illustrate diagrammatically preferred forms of the microcode design for the S/370 and S/88 interface, the S/370 I/O command execution and the partitioning of the interface between EXEC 370 software and the S/370 I/O driver (i.e. ETIO+BCU+S/370 microcode) respectively.

FIG. 38 illustrates the microcode design for a preferred embodiment of the present improvement. The code running in the S/370 processing unit (each processing element such as 85) is kept in control store 171 and interprets S/370 instructions when they are executed by PE 85. The microcoded instructions for Start I/O, interrupt handling, operator functions, machine check and initial microprogram load/program load (IML/IPL) are designed specifically to interface with the S/88 microcode as shown in the figure. The interface includes the common hardware facilities of the interface logic 81 including the local store 210, S/370 cache 340 and S/370 real storage space 162 with interrupt capability to the microcode of both processors 85 and 62. In the S/88 code, the S/370 microcode driver includes CCW convert, interrupt handler, error handler, IML/IPL and synchronizing code interacting with a S/88 application interface (EXEC/370) and the S/88 OS.

The fault tolerant processor 62 executes all I/O, diagnostics, fault isolation, IPL/IML, and synchronization for the system. This system is not viewed as a coprocessor system because S/370 programs are the only programs executing from the users point of view. The system administrator can control the systems attributes through the S/88 fault tolerant operating system. The primary function of the S/88 OS and the application EXEC/370 is I/O conversion with a multiple 370 channel appearance. All system error and recovery functions and dynamic resource allocation functions are handled by the S/88 OS. Machine check and operator functions previously handled by the S/370 OS are now passed to the S/88 OS so the functions can be handled in a fault tolerant fashion.

Figure 39:
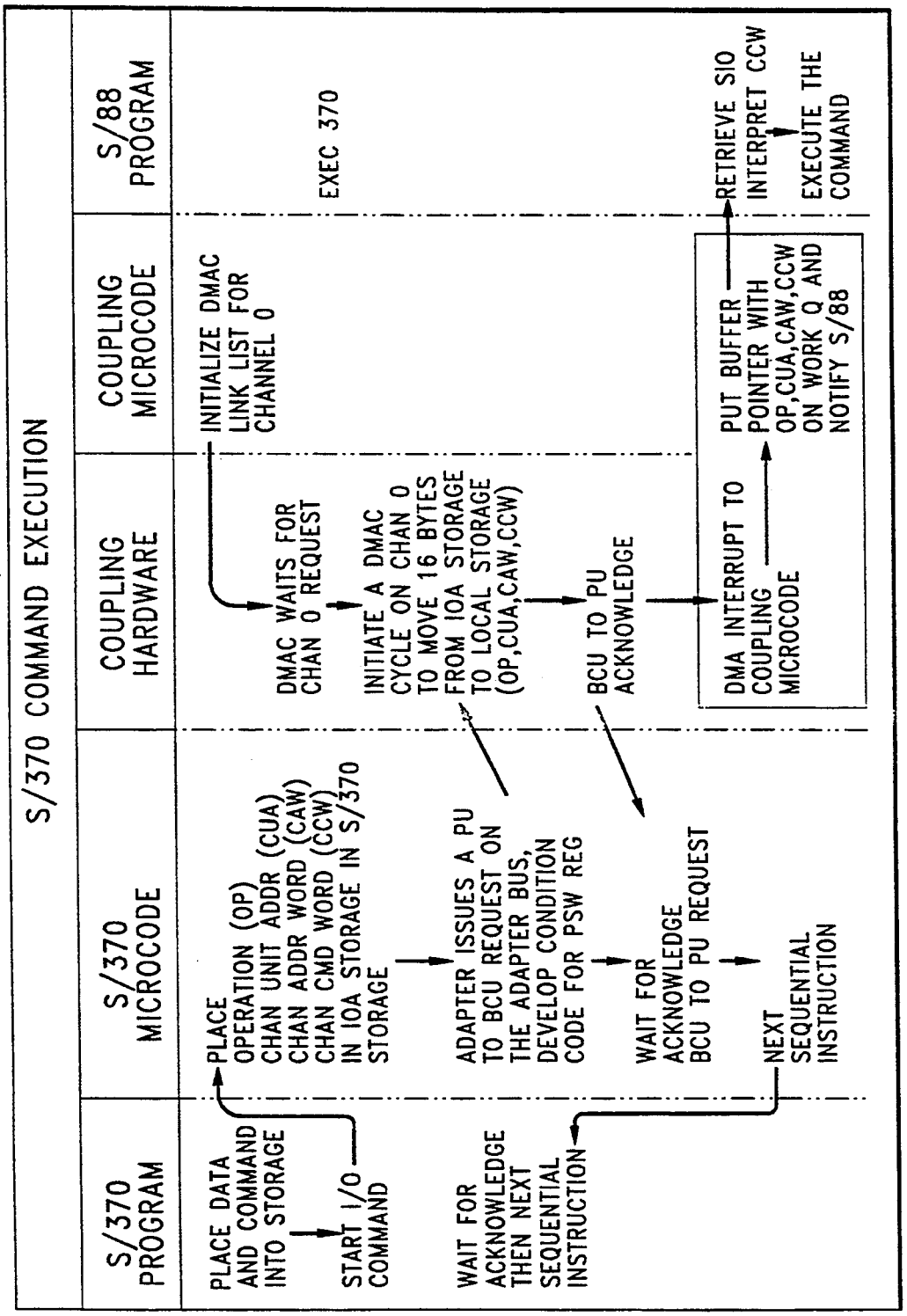

FIG. 39 illustrates the execution of a S/370 I/O command, in this example a start I/O command. The actions taken by the S/370 instruction, S/370 microcode, the coupling hardware (PE85 to PE62), the coupling microcode ETIO (executed on PE62) and the S/88 program EXEC 370 are shown briefly, the final step being the execution of the S/370 SIO on the S/88 processor PE62.

Figure 40:
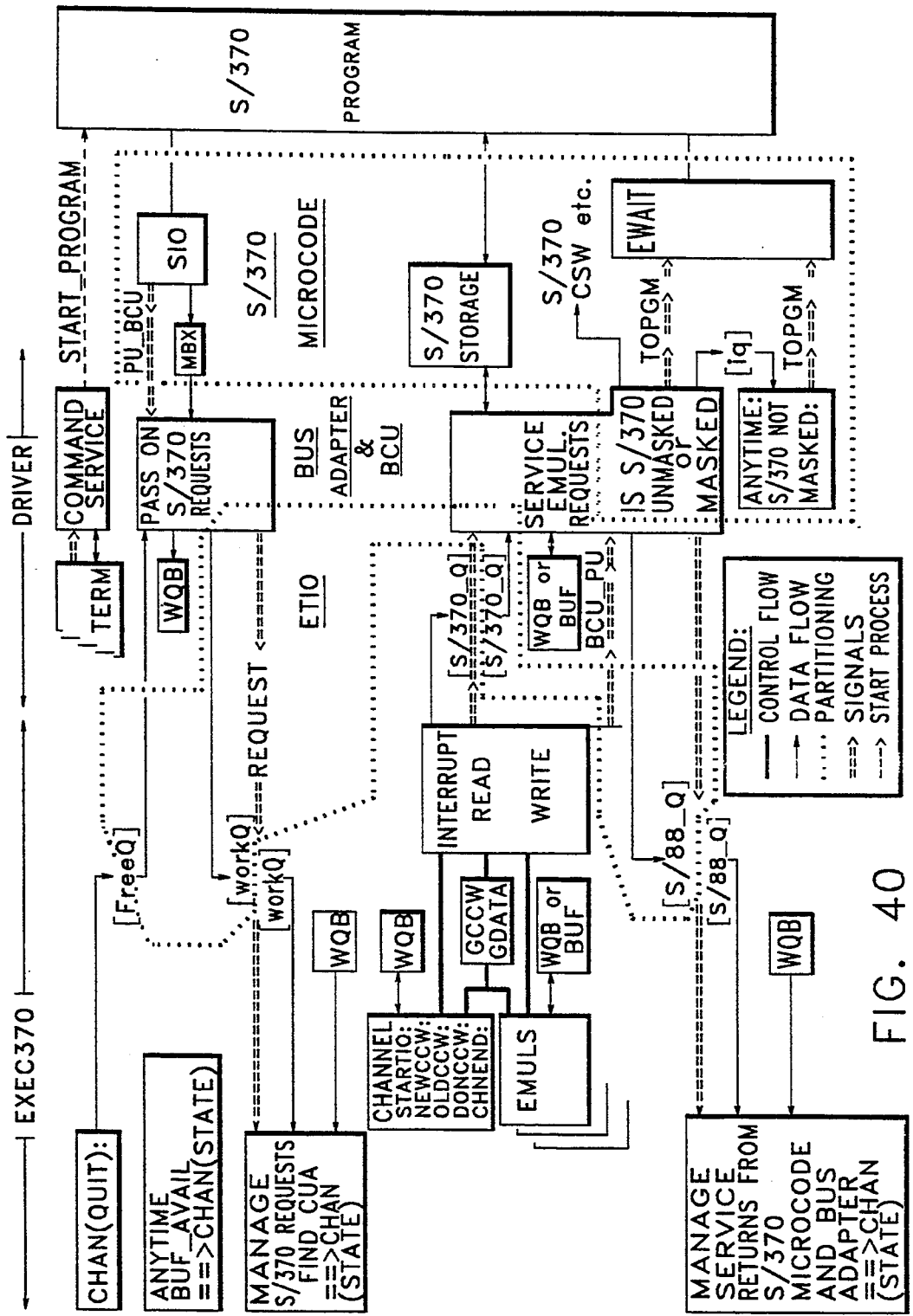

FIG. 40 is a simplified overview illustrating briefly certain of the components and functions of the improved system in relation to EXEC 370 and the microcode driver used during SIO execution, together with control flow, data flow, signals and hardware/code partitioning.

2. ETIO/EXEC 370 PROGRAM INTERFACE—FIGS. 41A–H, 42

The following terms are used in this section:

EXEC370—All S/88 software running on PE 62 pertaining to the emulation and support of S/370 external devices, services, configuration, operators console, etc. and stored in microcode store 174. Less frequently used EXEC370 code can be stored in cache 173.

S/370 MICROCODE—That microcode running in the S/370 processor 85 supporting S/370 processor operations and stored in store 171.

ETIO—The microcode interface between EXEC370 and the BCU 156 hardware and held in store 174.

S/370 PE85 microcode and EXEC370 communicate with each other via a "protocol", FIG. 41A. PE 85 microcode sends messages to EXEC370 requesting the execution of functions like I/O, and EXEC370 sends messages indicating the completion of I/O functions, messages regarding I/O device and channel status changes, and messages requesting PE85 microcode to perform specific S/370 CPU functions. These messages (described in detail later) are transmitted between PE85 microcode and EXEC370 via hardware which includes cache controller 153, adapter 154, BCU 156 and its DMAC 209, etc. This message transmission service is made available to EXEC370 by ETIO.

The interface between ETIO and EXEC370 and the protocol between PE85 microcode and EXEC370 is now described.

The interface FIG. 41B between EXEC 370, the S/370 External support software executed by S/88 and the BCU microcode driver (ETIO) running on PE 62 consists of a set of queues and buffers residing in the store 210, one event id, an EXBUSY variable, and a subroutine call sequence. The subroutine CALL interface initiates data transfer operations between S/88 and S/370 and initializes the DMAC 209 and BCU 156 at S/88 reboot time. The queue interface is used to keep track of work items until they can be processed, and the event ID interface (an interrupt to S/88) notifies EXEC370 when work has been added to the queues.

In store 210, there are sixteen 4 KB blocks 500, FIG. 41C. Fourteen (500-0 to 500-13) are used as 4KB block buffers. The remaining two are divided into thirty two 256 byte blocks 501-0 to 501-31. Four blocks 501-0 to 501-3 are used for hardware communication, one 501-4 for queues (Qs) and other variables common to EXEC370 and ETIO. The remaining twenty seven are used as Work Que Buffers (WQB) 501-5 to 501-31. In the address space equivalent to blocks 501-0 and 501-1, BCU 156 commands (executed by PE 62) are assigned 256 bytes and DMAC register addresses are assigned 256 bytes for accessing by PE 62 as described with respect to BCU 156 operations. Each of the twenty seven Work Que Buffers holds data pertaining to one specific task or service request. Twenty six WQBs are used to service PE85 microcode initiated requests. The remaining WQB (EXWQB) 501-31 is reserved for servicing requests originated by S/88 and sent to PE85 microcode; it will never appear on the freeQ FIG. 23E. Each WQB is addressed by a base address and an offset value stored in DMAC 209.

Each WQB, FIG. 41D contains a 16 byte mail block 505, a 16 byte parameter block 506, and a 224 byte device specific work area 507. The mail block 505 contains data passed between EXEC370 and PE85 microcode. Its content is transparent across the ETIO interface. The parameter block 506 contains parameters passed between ETIO and EXEC370, usually with respect to the transferring of data between local store 210 and main store 162. The work area 507 is owned by EXEC370. It contains information about the progress of the requested operation, current S/370 device status, possible user data, type of S/88 device, pointers to other EXEC370 control blocks, error occurrence information, etc.

The mail block 505 includes four fields containing S/370 I/O information passed between PE85 microcode and EXEC370:

OP—This field contains a request from either EXEC 370 or PE85 microcode.

CUA—16 bit Channel Unit Address.

CAW—32 bit S/370 channel address word of hex location 48 in S/370 storage 162 when the related I/O instruction was issued.

CCW—S/370 channel command word addressed by the above CAW. When EXEC370 returns an interrupt indication, this field contains the CSW, S/370 channel status word.

The parameter block 506 contains six parameters used when data transfer is requested between store 210 and main store 162 by EXEC370.

| | | |
|---|---|---|
| 1. | req - ETIO request field: | |
| | 0 | no operation |
| | 1 | Write the contents of the mail block in the PE85 message queue 189 in store 162 and then issue a BCU to PU request on line 256a. |
| | 2 | Read data from S/370 memory. |
| | 3 | Write data to S/370 memory. |
| 2. | ret - | results of the request made by the "req" field. This field is guaranteed by EXEC370 to initially be zero. If nonzero on return, ETIO is indicating an error of some type. |
| 3. | COUNT - | the number of bytes to be transferred. |
| 4. | S/370 ADDR - | the location in S/370 storage where the data area begins. This is not necessarily a CCW address field value. |
| 5. | key - | This 16 bit field will contain the following bit pattern: ppkkkk10 00000000 where pp (priority)=00 and kkkk=the proper S/370 storage protect key. |
| | Buff Addr - | the location in storage 210 where the data area begins. It may be inside a 4k buffer or a WQB. EXEC370 will insure the following relationship: (S/370 ADDR modulo 4)= (Buff Addr modulo 4) |

EXEC370 uses queues for maintaining the WQBs. The queue communication area 501-4 is 256 bytes long and resides at offset 400 (hex) in the store 210. FIG. 41E shows the queues defined between ETIO and EXEC370 for holding pointer entries to WQBs:

freeQ 510 holds pointers to those WQBs not currently in use.

workQ 511 holds pointers to WQBs waiting to be serviced by EXEC370.

S/3701Q 512 holds pointers to WQBs waiting message transfer from EXEC370 to PE85.

s/37002Q 513 holds pointers to WQBs waiting data transfer from cache controller 153 to S/88.

s/37003Q 154 holds pointers to WQBs waiting data transfer from S/88 to cache controller 153.

S88Q 515 holds pointers to WQBs after the ETIO service has been completed.

FIG. 41E shows the path of WQBs through the queues. All queues are initialized by EXEC370 during S/88 reboot. Empty WQBs are kept on the freeQ. ETIO removes them from the freeQ as needed to fill the link lists 516. The DMAC 209, via the link list 516, places S/370 mailbox entries from mailbox area 188 of storage 162 into the mail block areas of empty WQBs. WQBs on the link list which have been filled are moved to the workQ 511 by ETIO. When ETIO puts one (or more) WQBs on the workQ 511 and EXEC370 is not busy, ETIO notifies the EX370 event ID. EXEC370 removes the WQB from the workQ before it services the request.

During the processing of the request, data may have to be transferred between cache controller 153 and the buffer (WQB or block buffer), or a message may have to be sent to PE85 microcode. ETIO provides this service to EXEC370. EXEC370 calls ETIO which initiates the proper BCU156 operation or, if the hardware resource is busy, puts the WQB on the appropriate S/370 Q. Each of the three services (send messages to S/370, transfer data to S/370 and transfer data from S/370) has its own queues 512, 513, 514. WQBs are added to one of the S/370 queues by ETIO code while on the EXEC370 thread. When the I/O service has completed, the ETIO interrupt routine puts the WQB on the S88 Q 515; and, if EXEC370 is not busy, notifies the EX370 event ID.

Figure 42:
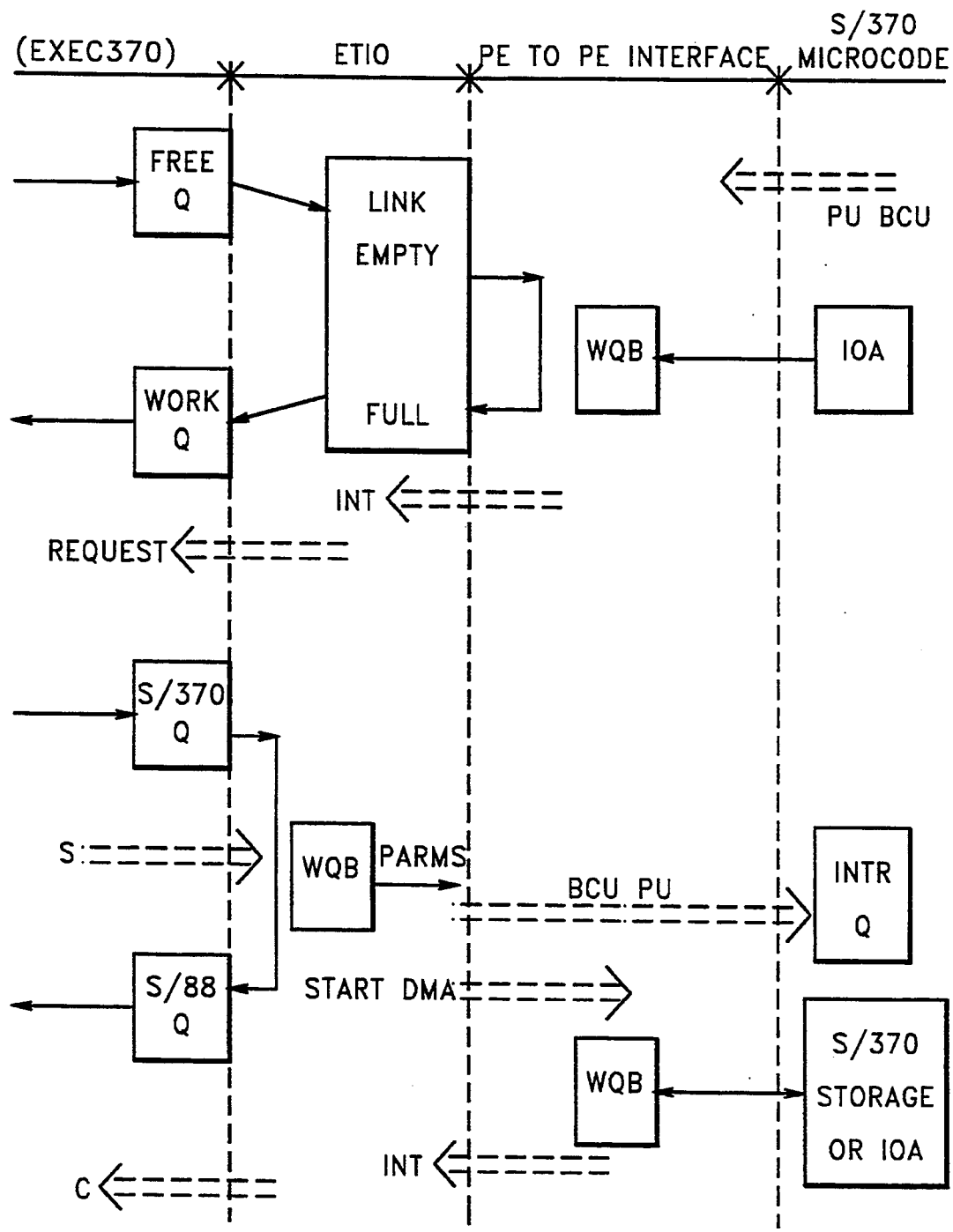
FIG. 42 illustrates conceptually the movement of work queue buffers through the link list and the queues in conjunction with the protocols between the EXEC 370, ETIO, S/370 microcode and the S/370-S/88 coupling hardware.

FIG. 42 illustrates the movement of WQBs through queues together with interfaces between EXEC 370, ETIO, interface hardware 89 and S/370 microcode. When the original work request has been entirely completed, i.e., data transfers complete, IO interrupt (if any) is sent to PE85; and EXEC370 returns the WQB to the freeQ. EXEC370 then gets its next task by checking first the S88 Q 515 and then the workQ 511. If both are empty, EXEC370 sets an EXBUSY variable to zero and waits for the EX370 event to be notified. EXEC370 sets EXBUSY to 1 when it is notified, before it begins processing.

Figures 41F, 41G, 41H:
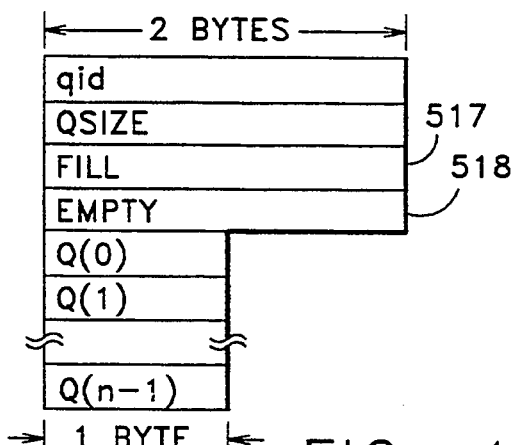

All queues, the EX370 event ID, and the EXBUSY variable reside in the queue comm area 501-4 of store 210 as shown in FIG. 41F. Each queue is circular in nature as shown in FIG. 41G, with two index type pointers: a fill index 517 and an empty index 518. The fill index 517 points to the next queue entry to fill, and the empty index 518 points to the next entry to empty. If the empty equals the fill index, the queue is empty. All six queues will never overflow since each has 32 entries and there are only 27 WQBs.

Each queue also includes:
qid identifies this queue.
QSIZE number of entries in this queue (n).
Q(i) address entries which point to WQBs in the queue.

The hardware communication area contains 1024 bytes. The BCU communication area uses 512 bytes of address space. The link lists 516 take up 480 bytes. 32 bytes are reserved for other hardware communication use. The link list 516 FIG. 41H, is used by the DMAC209 to bring in mail block items from the mailbox area 188 of store 162. WQBs from the freeQ 510 are used to fill entries in the link list 516. Each link list entry contains ten bytes, and identifies the address of the WQB in store 210 in which to put the data, the byte count of the data to be transferred (16), and the address of the next link entry in the list. The DMAC 209 (channel 0) interrupts S/88 when it comes to a link list entry with a zero next link address. The current position of the DMAC 209 (channel 0) in the list is available to the software at all times.

In addition to its interrupt entry points, ETIO has two external callable entry points:
etio init
etio(wbn)

EXEC370 calls etio init once per S/88 reboot, while EXEC370 is initializing. The queues have already been initialized and the event ID fields will be valid. PE85 microcode will not be operating yet, however it may be in the process of IML (initial microprogram load).

EXEC370 calls etio(wbn) whenever it wishes to have data or messages transferred from/to S/370.

The parameter wbn is a two-byte integer Work Queue Buffer Number identifying the WQB containing the service request. Wbn is an index value, ranging from 0 to 27. The service request is identified by the req field in the Parameter block. The req field values are: 1 = Write the contents of this mail block into the S/370 message queue 189 in store 162 and then issue a BCU to PU request; 2 = Read data from S/370 storage 162 into the store 210 area specified; and 3 = Write data to S/370 storage from the store 210 area specified.

The subroutine ETIO queues this WQB on the S/3701Q, S/3702Q or s/3703Q, if the requested I/O function cannot be initiated immediately. The ETIO interrupt routine will dequeue the next WQB from the appropriate S/370 Q when the previous operation finishes.

If the req field contains a 1, PE85 microcode should not be notified (e.g. by an interrupt) until the mail block entry is in the S/370 message queue area 189 of store 162.

If the S/370 message queue 189 is full, an error in the ret field of the Parm block will identify the problem to EXEC370. If necessary, EXEC370 can provide backup queue support.

3. EXEC370,S/370 Microcode Protocol

Communication between EXEC370 and S/370 microcode requires a Device Status Table (DST) with an entry for each I/O device in S/370 store 162. EXEC370 and S/370 microcode communicate with each other via 16-byte messages (see mail block 505 FIG. 41D) which are sent back and forth. There is a queue which holds the messages in FIFO order for the receiver on each end. There is also a notification mechanism (PU to BCU, and BCU to PU lines). In the mail block 505, the 16-bit S/370 opcode field "op" contains a request or response from either EXEC370 or S/370 microcode. The 16-bit Channel Unit Address (CUA) is the operand address of a S/370 I/O instruction. CAW is a 32-bit content of hex location 48 in S/370 storage 162 when the I/O instruction was issued and includes the storage key. The 8-byte CCW is addressed by the above CAW. When EXEC370 returns an interrupt indication, this field contains the CSW. PE85 stores the CSW in S/370 hex location 40 when it causes the I/O interrupt. The CUA field will be unchanged.

The OPERATION message is sent to EXEC370 by S/370 microcode whenever a S/370 instruction is encountered which is to be partially or completely handled by EXEC370. The OPERATION message contains the information described above with respect to the mail block 505 of FIG. 41D.

The EXEC370 messages sent to S/370 microcode include:

1. The RESET message (OP=1) requests that S/370 microcode process a S/370 Reset.
2. The CLEAR RESET message (OP=2) requests a S/370 Reset and Clear Storage.
3. The HALT message requests that S/370 microcode refrain from fetching S/370 instructions and wait for further instructions. The HALT message includes an OP field=3.
4. The STEP message (OP=4) requests that S/370 microcode fetch and execute one S/370 instruction and then enter HALT mode.
5. The RUN message (OP=5) requests that S/370 microcode enter its normal mode of fetching and executing S/370 instructions.
6. The LPSW message (OP=6) requests that S/370 microcode perform a S/370 LPSW (Load Program Status Word) instruction using the address specified in the ADDRESS field of the LPSW message. It may be used to take S/370 microcode out of the HALT condition.
7. The SMSG message (OP=7) indicates status changes for one or more configured S/370 I/O devices.
8. The IOINTR message (OP=8) indicates the completion of an I/O operation. If the channel is not masked OFF, S/370 microcode will initiate an I/O interrupt. If the channel is masked OFF, S/370 microcode will save the CSW in the Device Status Table and set the Device Status to 01 (CSW Stored). The IOINTR message also includes CUA and NC (put in DST CUA) next field.

Two messages, FETCH and STORE, from S/88 to cache controller 153 are logical function rather than message. It is necessary to allow an even or odd value for the CNT and the ADDRESS fields. Their fields are:

| BUF - 2 bytes | buffer address in store 210 |
| CNT - 2 bytes | byte count |
| ADDR - 4 bytes | S/370 storage address w/key |

S/370 microcode maintains a table containing information about the status of each addressable S/370 Device. The major pieces of information are:

Device Condition—allows the immediate setting of CR (S/370 condition register) after a TIO, SIO, etc.

Device next—the next condition to be used when taking an I/O interrupt.

Device CSW—maintained for masked 370 I/O interrupts.

Four different device conditions in the DST (CUA), are possible for a 370 device:

| 00 | Device Ready |
| 01 | Device not ready, CSW stored |
| 10 | Device Busy |
| 11 | Device not Operational |

At the completion of an I/O operation on a S/370 device, a CSW (Channel Status Word) is sent by the channel to the CPU. If the Channel is masked OFF the CPU does not accept the CSW.

In the present application, if the Channel is masked, S/370 Microcode saves the CSW and sets DST (CUA) condition to 01. A subsequent TIO or SI0 will result in the saved CSW being stored and the condition code 01 (CSW stored) being placed in the CR. When S/370 microcode is initialized, it will assume all Devices are not operational. S/88 will send an ONLINE message for each device to be supported. The device is identified by its CUA (Control Unit Address).

4. Instruction Flows Between S/370 Microcode and EXEC370

As PE85 executes S/370 program instruction strings, it will from time to time encounter an I/O instruction, which in the present application will be executed by the S/88 processor 62 and related hardware, firmware and software. FIGS. 44A–L (and above mentioned FIG. 43) illustrate microcode sequence flows utilized for the execution of these S/370 I/O instructions. The BCU 156 (and adapter 154) is the primary hardware coupling mechanism for effecting the ultimate S/370 I/O instruction execution by the S/88 hardware. Within the BCU 156, the DMAC 209 is the main "traffic cop" for directing the flow of operations and data. Channel 0 of DMAC 209 receives I/O commands from the S/370, channel 1 handles data flow from S/370, channel 2 handles data flow to S/370 and channel 3 sends interrupt (and other) messages to S/370. The local store 210 in BCU 156 forms the communication area between the S/370 and S/88.

The local bus 223/247 couples the S/88 processor 62 to the DMAC 209 and to local store 210. The local bus 223/247 couples the DMAC 209 and store 210 to S/370 via speed-up hardware in the BCU 156 and adapter 154.

S/370 I/O instructions are dispatched to S/370 microcode routines for handling within the S/370, and a S/88 application program EXEC 370 (together with its related S/88 ETIO microcode) effect the ultimate I/O execution. The adapter 154 and BCU 156 form the hardware connection between the S/370 and S/88 code. The start I/O microcode routine has a table DST which keeps track of the status of each device, e.g., is it currently available, did it already issue a SIO, is it busy, has it received an interrupt back. This information is contained in the condition code CC.

This section describes instruction flow for various S/370 I/O operations. Certain specific processes and terms used in this section are defined at the end of the section. The operations are as follows.

1. Clear Channel FIG. 44A—This instruction causes an I/O System Reset to be performed in the addressed channel, with a system reset signaled to all devices on the addressed channel. S/370 microcode does not know which devices are actually on the channel, so sets CC=3 for all DST entries on that channel. Subsequently, EXEC370 will send SMSG(s) to redefine the configuration on that channel.

The channel to be cleared is addressed by bits 16 through 23 of the instruction address. When S/370 microcode receives control from dispatch, it begins by checking the channel address. The channel address will be either valid or invalid. If the channel address is invalid, the condition register (CR) is set to 3 and S/370 returns to the next sequential instruction. A channel which is supported by S/370 microcode is considered to have a valid channel address. For channel address valid, S/370 microcode sends a clear channel message to EXEC370. It then goes through all the device status table (DST) entries for this channel. All the condition code fields are set to 3 meaning not available, and any pending interrupt table (PIT) entries found are released to a free pit list. S/370 microcode then sets the condition register to 0 and goes to the next sequential instruction. Meanwhile EXEC370 when it receives the clear channel message performs an I/O system reset for all devices on the addressed channel. It then ascertains which devices will be on line and sends a status message to S/370 microcode to redefine the configuration on that channel. When S/370 microcode receives the status message it modifies the condition code in the device status table for each device addressed to it in the status message.

2. Clear I/O FIG. 44B—This instruction suspends the execution of S/370 instruction processing in PE85 until the IMSG for the addressed CUA is returned by EXEC370.

When S/370 microcode receives control from dispatch, it gets the control unit address CUA from the upper end address of the instruction. Using the control unit address it finds the correct device status table DST entry for this device. It checks the value of the condition code CC. There are three options: (1) CC equals zero or 3, (2) CC equals 2 or CC equals 1 and next condition NC equals 2 and (3) CC equals 2 or CC equals 1.

For the first option, CC equals zero or 3, S/370 microcode merely sets the condition register to the value of CC and goes to the next sequential instruction.

If CC equals 1, there is a pending interrupt in the pending interrupt table (PIT). In this case, S/370 microcode goes to the pending interrupt table entry and checks the value of NC.

For the case CC equals 2 or CC equals 1 and NC equals 2, S/370 sends a clear I/O message to EXEC 370. It waits for the acknowledgment and clears any pending interrupt entries associated with the device. It then waits for the interrupt message to be returned by EXEC370. Meanwhile when EXEC370 receives the clear I/O message, it performs its selective reset of the addressed device, builds a control status word for the device and returns an interrupt message back to S/370 microcode. When S/370 microcode receives the interrupt message, it generates the PIT entry and fills in the NC and CSW from the message. The pit entry is then connected to the DST entry.

At this point we come to the third option CC equals 2 or CC equals 1. We get to this point by one of two paths. The first path is the device is busy or the device has sent a pending interrupt but remains busy. This is the case for the selective reset being issued. The second path is where the device has a pending interrupt but is no longer busy. For both of these paths, CC will be equal to either 2 or 1. This is the third option. S/370 microcode pops the interrupt, puts the CSW in S/370 storage, sets the condition register to 1 and returns to the next sequential instruction.

3. Halt Device (FIG. 44C)—When S/370 microcode receives control from dispatch for a Halt device instruction it checks the condition code for the addressed device status table entry. There are three options, a condition code equals 0 or 2, condition code equals 1, or condition code equals 3. For the first option, condition code equals 0 or 2, S/370 microcode sends a halt device message to EXEC370. It then zeros the 16 status bits in the S/370 CSW, sets the condition register to 1 and returns to the next sequential instruction. Meanwhile when EXEC370 receives the halt device message, it performs the appropriate function on the addressed device and returns a normal interrupt message. When CC=1, S/370 microcode pops the interrupt from the PIT table, puts a CSW in the proper location in S/370 storage, sets the condition register to equal 1 and goes to the next sequential instruction. For the third option, CC equals 3, S/370 microcode merely sets the condition register to equal 3 and goes to the next sequential instruction.

4. Halt I/O (FIG. 44C)—At this level of description, the function for halt I/O is identical to the function for halt device.

5. Resume I/O (FIG. 44D)—On a S/370 System, the RIO instruction merely checks to see if the channel is operational before accepting the instruction. S/370 microcode must check the CC for the specific CUA as with other I/O instructions. The CAW is not referenced, and a CCW is not fetched for this instruction.

When S/370 microcode receives control from dispatch for a resume I/O instruction, it checks the condition code for the addressed device status entry. There are two options. CC equals 0, 1 or 2 and CC equals 3. For CC equals 0, 1 or 2, S/370 microcode sends a Resume I/O message to EXEC370, sets the condition code to 2 and sets the condition register to 0 and goes to the next sequential instruction. Meanwhile when EXEC370 receives the resume I/O message, it will look up the control unit address and continue the previously suspended I/O operation. For the second option, CC equals 3—S/370 microcode merely sets the condition register to 3 and goes to the next sequential instruction.

6. Start I/O (FIG. 44E)—When S/370 microcode receives control from dispatch for a start I/O instruction, it uses the control unit address to find the device status table entry. It then checks the condition code and there are one of four options. CC equals 0, CC equals 1, CC equals 2 and CC equals 3. For CC equals 0, the device is ready and S/370 microcode sends a start I/O message to EXEC370, sets the CC equal to 2 meaning busy, sets the condition register to 0 meaning accepted, and returns to the next sequential instruction. Meanwhile when EXEC370 receives a start I/O message, it uses the control unit address to find the specific device and begins a normal I/O operation on that device. For the second option, CC equals 1, S/370 microcode pops the interrupt, puts the CSW into S/370 storage, sets the CSW busy bit "on", sets the condition register equal to 1, and returns to the next sequential instruction. For the third option, CC equals 2, S/370 microcode sets the CSW and S/370 storage location 40X to all zeros, turns the CSW busy bit on, sets the condition register equal to 1, and goes to the next sequential instruction. For the fourth option, CC equals 3, S/370 microcode merely sets the condition register equal to 3 (meaning device not operational) and goes to the next sequential instruction.

7. Start I/O Fast Release (FIG. 44F)—When S/370 microcode receives control from dispatch for a start I/O fast instruction, it checks the condition code for the addressed DST entry. There are two options, CC equals 0, 1, or 2 and CC equals 3. For the first option, CC equals 0, 1 or 2, S/370 microcode sends a start I/O fast message to EXEC370, sets the CC equal to 2, the condition register to 0 and goes to the next sequential instruction. Meanwhile when EXEC 370 receives a start I/O fast message, if it is able it starts the I/O operation; otherwise it returns an interrupt message with a CSW containing a deferred condition code which acts as a normal interrupt when it is received by S/370 microcode. For the second option, condition code equals 3, S/370 microcode merely sets the condition register to 3 and goes to the next sequential instruction.

8. Test I/O (FIG. 44G)—When S/370 microcode receives control from dispatch for a test I/O instruction, it checks the condition code. There are three options, CC equals 0 or 3, CC equals 1 or CC equals 2. For CC equals 0 or 3, the microcode sets the condition register equal to the CC value and goes to the next sequential instruction. For the second option, CC equals 1, the microcode pops the interrupt and puts the CSW in S/370 storage, sets the condition register to 1 meaning CSW stored, and goes to the next sequential instruction. For the third option, CC equals 2, the microcode zeros the CSW area (40X) in S/370 storage, sets the CSW busy bit "on", sets the condition register equal to 1 and goes to the next sequential instruction.

9. Store Channel ID (FIG. 44H)—When S/370 microcode receives control from dispatch for a store channel ID instruction, it checks the channel address. There are two options, channel address valid and channel address invalid. For the option channel invalid, the microcode sets the condition register equal to 3 and goes to the next sequential instruction. For the option channel address valid, the microcode sets S/370 storage location, A8 hexadecimal to hexadecimal 20000000. It then sets the condition register to 0 and goes to the next sequential instruction.

10. Test Channel (FIG. 44I)—When S/370 microcode receives control from dispatch for a test channel instruction it checks the channel address. Note for this flow there are two major options and three minor options. For the first major option, channel address invalid, the microcode sets the condition register to 3 and goes to the next sequential instruction. For the second option, channel address valid, the microcode further checks all DST entries for this channel. The first minor option occurs if the microcode discovers a DST entry for a specific device with CC equals 1 meaning this device has a pending interrupt. For this case, the microcode sets the condition register to equal 1 and goes to the next sequential instruction. If when the microcode gets to the bottom of the list of DST entries for this channel, it has not found an entry for CC equals 1 it then checks to see if there is at least one with CC equals 2. If it does, this is the second minor option; and for this case the microcode sets the condition register equal to 2 and goes to the next sequential instruction. Otherwise minor option three occurs and the microcode sets the condition register equal to 0 and goes to the next sequential instruction.

11. Primary and Secondary Interrupts (FIGS. 44J, 44K)—The terms primary and secondary interrupts are S/370 terms. A primary interrupt contains at least the Channel End (CE) status bit in the CSW resulting from an I/O operation. A secondary interrupt is either a second interrupt containing the Device End (DE) for the I/O operation; or it is an asynchronous interrupt initiated by the device requesting service.

At the level of this description, there is no difference between primary and secondary interrupts; therefore, only the primary interrupt is described. The difference between the I/O masked and the I/O enabled interrupts of FIGS. 44J and K is whether the I/O is masked. That is, whether the S/370 processor will accept an interrupt coming from the channel or not. If an interrupt is not accepted by the S/370 processor, the channel stacks the interrupt; and it is termed a pending interrupt until such time as the S/370 processor is enabled. When an interrupt condition occurs while the EXEC370 is emulating a specific device operation, it builds a CSW and stores it in a message which it then sends to the S/370 microcode. When the microcode receives this interrupt message it checks the S/370 mask to find out if the I/O is masked or enabled. If the I/O is masked (FIG. 44J) it stacks the interrupt. A description of the stacking interrupt process is set forth below. If S/370 microcode checks the mask and I/O is enabled, (FIG. 44K) the condition code field in the DST entry for the interrupting device is set equal to the next condition (NC) in the interrupt message, the CSW from the message is put into S/370 storage, and the microcode causes an I/O interrupt to be performed.

12. S/370 I/O Masking Events (FIG. 44L)—If the I/O is masked when the EXEC370 sends an interrupt message to S/370 microcode, the interrupt is stacked in a pending interrupt table (PIT) entry. At a subsequent point in time, some S/370 event will occur which results in the enabling of I/O interrupts. This could be due to a load PSW instruction, a set system mask instruction, or any interrupt for which the mask enables I/O. At any point when the PSW system mask is changed in such a way as to enable previously masked I/O, S/370 microcode must check for any interrupts pending for those channels. If none are found, the microcode merely exits to the next sequential instruction. If one is found however, the microcode pops the interrupt off the table, puts the CSW in S/370 storage and performs an I/O interrupt.

The following contains descriptions of those processes which have been referenced immediately above:

1. Stacked interrupt—The term stacked interrupt is used in conjunction with interrupt messages which are received by S/370 microcode when the S/370 I/O is masked off. Interrupts are stacked in the device status area in what is called a pending interrupt table or PIT. PIT entries are chained in FIFO order to the DST entry representing the S/370 device causing the interrupt. Stacking an interrupt involves getting a PIT entry from the free list, chaining it to the end of the PIT list for this DST entry, putting the CSW in the status field of the PIT entry and the NC value in the NC field of the PIT entry, and setting the CCW field of the DST to a "1". Setting the CC to a "1" indicates that there is a pending interrupt for this device.

2. Pop Interrupt—Popping an interrupt involves unchaining the PIT entry on the top of the DST/PIT list, setting the DST condition code to the value found in the NC field of the PIT entry, saving the status field of the PIT entry which contains a S/370 CSW, and returning the PIT entry to the free list.

3. Send Message to EXEC370—FIG. 43 may be referred to for this description by way of example. At the point where the option CC equals 0, S/370 microcode has decided that it needs to send a message to EXEC370. The message specifically is a start I/O message. For this message or any other type of message that S/370 microcode sends, the procedure is the same. S/370 microcode fills the data field in a mailbox entry in storage 162 with the contents of the message. It then issues a PU to BCU request which is received by the BCU logic 253. S/370 microcode then waits for an acknowledgment back. Meanwhile the BCU logic when it receives a PU to BCU indication starts a storage access and a DMA operation to transfer the data from the mailbox to the BCU store 210. When the DMA is complete, it returns an acknowledge signal to S/370 microcode which then proceeds with its next sequential program instruction. At the same time, the DMAC logic interrupts the System 88. The software routine receives control, checks the validity of the operation and then sends a notice to EXEC 370 which then dequeues the message from the work queue.

4. Send message to S/370 microcode—There are several different types of messages which EXEC370 sends to S/370 microcode. S/370 I/O Masking Events (FIG. 44L) is an example of such an interrupt message. EXEC370 calls the ETIO microcode which interfaces with the BCU logic. ETIO initiates a DMA operation which transfers the message from the BCU store 210 to S/370 storage. When the DMA is complete, a BCU to PU message is sent to S/370 microcode and an interrupt is sent to System 88 which causes the ETIO interface routine to send a notice to EXEC370.

Operation of the Bus Control Unit (BCU) 156

1. Introduction

Certain of the system components and their functions described above will be briefly summarized. The BCU 156 performs the I/O interface function between the S/370 chip set 150 and the I/O subsystem which is comprised of the S/88 PE62 and its associated system and I/O components in module 10. The S/370 chip set 150 and the I/O subsystem communicate via the bus adapter 154. The S/370 storage area 162 within the S/88 main storage 16 is sometimes referred to herein as the basic storage module (BSM) 162. There are 2 sets of adapter bus interface lines 249,250 (channel 0) and 251,252 (channel 1) coupling BCU 156 and the bus adapter 154.

The BCU 156 includes a 64 KB local store 210, a direct memory access controller (DMAC) 209, a 32 bit local address bus 247, a 32 bit local data bus 223 and interface logic 205.

As described above in greater detail the DMAC 209 includes four 4 data transfer channels:

Channel 0—Mailbox commands are transferred from the PE85 to the BCU 156. Messages are read from the S/370 storage area 162 to local storage 210.

Channel 1—S/370 PE85 write data. Data is read from the S/370 storage area 162 for transfer to local storage 210.

Channel 2—S/370 PE85 read data. Data is transferred to local storage 210 to S/370 storage area 162.

Channel 3—High priority message transfers from the BCU 156 to S/370 PE 85. Messages are transferred from local storage 210 to S/370 storage area 162.

The DMAC 209 transfers double words (32 bits) between the bus adapter 154 and the local storage 210. It also interrupts the I/O subsystem (S/88 PE62) when I/O data transfers are complete. The local store 210 includes I/O and message data buffers WQBs and link-list data for auto-mailbox loads via DMAC 209.

The BCU logic 205 includes a local bus arbitration unit 216 in which the S/88 PE62 and the DMAC 209 contend for access to the local bus, i.e., data bus 223 and address bus 247. The PE62 'Bus Request' line 190 is active whenever the following addresses (see FIG. 41C) are detected by the address decode and arbitration unit 216:

Any local storage address; any BCU directed command including Programmed BCU reset, BSM write select up, BSM read select ups and Read BCU status; Local bus interrupt acknowledge cycle; and any DMAC directed read or write register command.

The DMAC Bus Request line 269 is active when it wishes to gain control of the local bus 223,247 for a DMAC sequence (read or write the local storage 210) or a link-list load sequence (read from the local storage). The bus grant line 268 is raised when control of the local bus is given to the DMAC 209 by logic 216; line 191 is raised if control is given to PE62.

The BCU logic 205 controls the DMAC 209 transfer timing between the bus adapter 154 and the I/O subsystem and converts up to 4 KB I/O transfers into 64 byte block transfers for the bus adapter 154 on the channels 0 and 1.

BCU logic 205 detects a 64 byte boundary crossing for any block transfer. If this should occur, the block will be broken into two separate transfers. The BCU 156 will calculate the number of words up to the 64 byte boundary for the first transfer. This will be presented, along with the starting address to the bus adapter 154. The remaining words, along with a new address, will be presented to bus adapter 154 via a subsequent command (BSM read/BSM write). BCU logic 205 also provides a pre-empt of I/O data transfers (on a 64 byte boundary) as a high priority message or mailbox read request occurs. A high priority message request and a mailbox request can be handled concurrently in the BCU 156. A 'BSM Read' and "BSM Write" operation can be handled concurrently in the BCU 156.

The BCU 156 performs the following four I/O operations:

Mailbox Read operation: initiated by the S/370 I/O INSTRUCTION MICROCODE via the 'PU to BCU REQ' line 256a. The mailbox 188 is located in the S/370 BSM 162. It is used to store I/O commands that will be executed by the I/O subsystem (Start I/O, etc.). It can also contain status or other information that the I/O subsystem receives from PE85. A 'Mailbox Select Up' command is initiated by the BCU 156 when the 'PU to BCU Select line 210' is activated on adapter bus channel 0. S/370 I/O write operations (adapter bus Channel 0) will be pre-empted on a 64 byte boundary if the 'PU to BCU Request' is activated by the S/370 PE85.

S/370 I/O read and write operations: provide for data transfers (4 KB blocks max) between S/370 storage 162 and I/O devices on adapter bus channels 0 and 1. All data transfers are initiated by the I/O subsystem (S/88 PE62) via a 'BSM SELECT UP' adapter bus command.

High priority message transfers: interrupts, status, error, etc., messages of a high priority nature that are passed from the I/O subsystem to the S/370. All transfers are initiated from the BCU 156 via 'Q SELECT UP' command. S/370 I/O read operations (adapter bus Channel 1) will be pre-empted on a 64-byte boundary if a high priority message request occurs.

2. S/370 Start I/O Sequence Flow, General and Detailed Description

The 'Start I/O instruction SIO, the 'Channel Address Word' CAW and the first 'Channel Control Word' CCW are stored in predetermined 'mailbox' locations in S/370 storage 162. This information is passed to the local storage 210 via the BCU interface logic 205 and bus adapter 154.

The DMAC Channel 0 registers shown in FIG. 18 are used for mailbox read operations. They will be programmed by the S/88 PE62 to operate in a 'Linked Array Chaining Mode'. The PE62 initializes this mode by setting up a series of 'linked lists' (tables) in the local storage 210, FIG. 41H. It will then set the first 'top linked list address' into the DMAC Channel 0 Base Address Register (32 bits) BAR. This address points to the first location in store 210 of the linked list data.

The DMAC 'PCL' (Peripheral Control Line) 257a will be programmed by PE62 to cause the DMAC 209 to activate its IRQ interrupt output line 258 whenever the PCL line 257a is activated. The 'PCL' line 257a will be activated following the completion of a mailbox data transfer from main storage 162 to the local storage 210 via adapter buffer 259. The interrupt will inform the S/88 processor PE62 that a mailbox load has just completed.

The link list data (FIG. 41H) consists of the following: the starting storage address of a data block; the storage transfer count; and a link address to the next table entry. The last link address in the table will be zero.

The S/88 processor 162 sets the top linked list address in the DMAC Channel 0 base address reg.

The S/88 processor PE62 will activate the DMAC 209 by writing a "1" into bit 7 ('START' bit) of its channel 0 channel control register CCR. The DMAC 209 will then read the first linked list into its channel 0 registers as follows:
  Starting address of data block WQB of store 210 into memory address register MAR (32 bits);
  Transfer Count (bytes of mailbox data) into memory transfer count register MTC; and
  Link address into next data block address register BAR.

More specifically, during instruction execution, the S/370 PE85 decodes a 'START I/O' instruction, it places the 'START I/O' command, the Channel Address Word, and the first channel control word in successive 'mailbox' locations which are contained in S/370 memory 162. The starting address of the mailbox (base+queue length) is stored in the base register of the bus adapter 154 at initialization time.

The S/370 PE85 issues a 'LD OSCW' control op via the processor bus with bit 11 active. This sets the 'PU to BCU REQUEST' bit on in the control word of the bus adapter 154. OSCW bit 11 causes a 'PU to BCU Request' on the adapter bus (Channel 0). If a 'PU to BCU REQ' occurs during an I/O data transfer, then the BCU 156 will preempt the I/O transfer on a 64 byte boundary to allow for a mailbox load to take place.

Figure 45A:
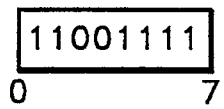
FIGS. 45A-AG illustrate data, command and status information on the local address and data buses in the BCU during data transfer operations within the BCU.
Figure 45B:
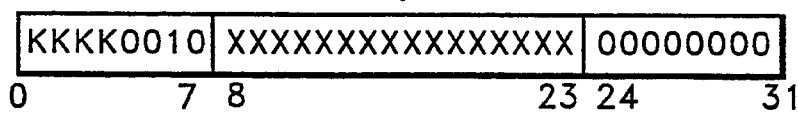

The BCU 156 then generates on bus 290 a 'Read Mailbox Select Up' command in the format shown in FIG. 45A where bits 0,1 are the command bits and bits 2-7 are the byte count and stores this in Channel 0 command register 214. The mailbox address bits are stored in register 219 via bus 290 in a format shown in FIG. 45B where bit 7 identifies the IOA area in storage 162; bits 24-26, the BCU Channel Number and bits 27-31, the mailbox offset.

After the BCU 156 activates the COMMAND/STATUS bus 249 and ADDR/DATA bus 250, by filling registers 214 and 219, it raises a 'TAG UP' command on line 262a and waits for data from bus adapter. It does this by sampling 'TAG DOWN' line 262b. 'TAG DOWN' is active as long as data is not ready. As soon as 'TAG DOWN' is de-activated by bus adapter 154 (data ready), the first four bytes of mailbox data is latched in the Channel 0 read buffer 226 via two channel 0 subcycles.

The BCU logic 253 then raises 'REQUEST' line 263a on channel 0 of the DMAC 209. The DMAC 209 then raises 'BUS REQUEST' (BR) to line 269 to the LOCAL BUS arbitration circuit 216. If the local bus is not being used by the S/88 processor 62, bus access is granted via bus grant line (BG) line 268 to the DMAC 209. The DMAC 209 then transfers the starting address of the WQB Local Mailbox (in store 210) from MAR to the Address Bus 247, and raises 'ACKO' (DMAC Channel 0 acknowledge) line 264a. The 'ACKO' signal initiates the transfer of the data from buffer 226, via the data bus 223, to the Local Mailbox portion of the WQB in store 210. The 'DTACK' line 265 is activated to inform the DMAC 209 that the operation is complete.

The BCU clock signals (FIG. 25) continue to transfer mailbox data from the buffer 259 to register 226. The BCU 156 performs two adapter bus ('TAG UP'/'TAG DOWN') sequences (16 bits each) for each local storage 210/DMAC 209 sequence (32 bits).

When the DMAC cycle is complete (DTACK active), the DMAC 209 raises 'Data Transfer Complete' (DTC) line 267 to the BCU logic 253 which then issues another 'REQUEST' to DMAC 209 on line 263a to read the second four bytes from register 226 to the WQB mailbox. The DMAC cycles repeat until the entire mailbox data (16 bytes) has been transferred (4 local bus cycles). The 'PCL' line 257a will then be activated by the BCU logic 253 to the DMAC 209. This causes the 'IRQ' line 258 to be activated from the DMAC 209 to the S/88 processor priority encoder/interrupt logic 212. PE62 will then handle the mailbox reddest.

When the DMAC 209 completes its channel 0 register loads from the linked list, it then waits for a signal on Channel 0 'REQ' line 263a from the BCU logic 253 to begin the next mailbox load. Once started, the DMAC Channel 0 remains active indefinitely, with the S/88 processor 62 controlling the circular linked list, and the BCU 156 suspending data transfers by keeping the 'REQ' line 263a inactive. If channel 0 stops due to an 'end-of-list' condition, the S/88 processor will receive a termination interrupt and restart Channel 0 when appropriate.

3. S/370 I/O DATA TRANSFER SEQUENCE FLOW, GENERAL DESCRIPTION

All I/O read and write transfers originate from the S/88 processor 62 via adapter bus architected 'BSM READ SELECT UP' and 'BSM WRITE SELECT UP' commands. The S/370 CCW command and starting address (in S/370 memory 162) is derived from the CCW for a 'START I/O'. Data is moved by the S/88 processor 62 between each I/O device and a local buffer in local storage 210.

The local store 210 includes a queue of storage blocks for I/O Write Operations which is managed by the S/88 processor 62. When the queue includes at least one entry, it is ready to kick off an I/O Write operation. The starting address for a selected one of these blocks is stored in the DMA channel 1 registers in the DMAC 209 by the S/88 processor 62 prior to the initiation of a write operation. The DMA Channel 1 registers are reserved for S/370 I/O write operations (S/370 storage 162 to I/O) via local store 210. The adapter data buffer 259 (64 bytes) is reserved for mailbox read and S/370 I/O write operations (data transfers from S/370 memory 162 to local storage 210). This buffer is associated with the Channel 0 adapter bus 249,250. The buffer 260 (64 bytes) is reserved for message write (to S/370 ) and S/370 I/O read operations (data transfers from local storage 210 to S/370 memory 162). This buffer is associated with the Channel 1 adapter bus 251,252. The S/88 processor 62 initializes the high order words of DMAC Channel 1 and 2 memory address registers to zero (0). This saves an extra bus cycle when these registers are loaded during operational sequences, since the local storage 210 does not require more than 16 bits of address.

(a) I/O Write Operations: (S/370 Storage 162 to Local Storage 210)

Figure 45C:
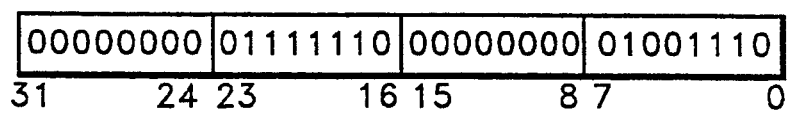

The S/88 processor 62 sets the local buffer starting address in the DMAC channel 1 memory address register MAR by placing information on the DMAC address and data bus 248 (VIA BUS 161a, DRIVER 217, BUS 247 AND LATCH 233) as shown in FIG. 45C, wherein bits 31-08=007E00='DMAC Register Select' command and bits 07-00 =DMAC Channel 1 memory address register (low) Select. Note that S/88 identifies most and least significant bits on the bus as and "0" respectively, the opposite of S/370 protocol.

Figure 45D:
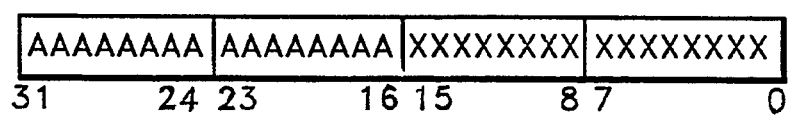

The contents shown in FIG. 45D (intended for MAR) are placed on the data bus 223, wherein bits 31-16=Starting address of local buffer in store 210 for the I/O write data. The high order data bus bits (31-16) will be loaded into the low order (15-00) part of the channel 1 memory address register. The high order bits (31-16) of the MAR were set to 0 during initialization.

Figure 45E:
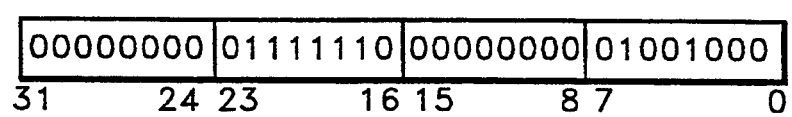

The DMAC 209 responds with a 16 bit port 'DSACK' signal lines 266a, b via the BCU logic 253 to the S/88 processor CPU. The S/88 processor 62 places the BCU data (byte count, storage key, adapter bus priority and customer/IOA space data) and the DMAC channel 1 memory transfer count data on the local address bus 247. FIG. 45E shows the command on address bus wherein bits

- 31-08=007E00='DMAC Register Select' command; and
- 07-00=BCU Select and DMAC Channel 1MTC Select.

Figure 45F:
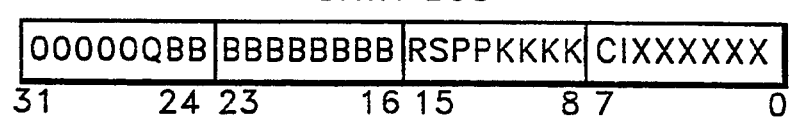

The byte count, storage key (derived from the CCW), adapter bus priority, and customer/IOA space bits will be placed on the data bus by the S/88 processor 62 in the format shown in FIG. 45F wherein the bit designation is as follows:

- 31-27=Reserved
- 26=High order byte count bit. This bit will =1 only when the maximum byte count (4K bytes) is being transferred.
- 26-16=Byte count loaded into DMAC Channel 1MTC register
- 26-14=Byte count loaded into the BCU register 220, (4096 max) and at least part of the count is loaded into register 221 as will be described in byte count operations below. The bus adapter 154 requires a count of 1111 1111 1111 in order to transfer 4096 bytes (byte count −1). Therefore, the BCU 156 will decrement the double word boundary bits 26–16 once before presenting it along with byteoffset bits 15–14 (in 64 byte blocks) to the bus adapter 154.
- 15-14 =Low order byte count bits BCU 156. These bits represent the byte offset minus 1 (for bus adapter requirements) from a double word boundary. These bits are not used by the DMAC 209 or the BCU 156 since they transfer double words only. They are passed to the bus adapter 154 for presentation to the S/370 BSM 162.
- 13-12=adapter bus channel priority
- 11-08=storage key
- 07=customer/IOA space bit
- 06=The S/88 processor will activate this bit (1) to indicate that one additional local storage access is required. This will occur when a starting S/370 storage address is not on a doubleword (32 bit) boundary. Since all BCU accesses must start at a doubleword boundary, the first access will contain the byte(s) at the designated starting address, as well as the preceding byte(s) contained at that doubleword address. The preceding byte(s) are discarded.
- 05-00=Reserved.

The DMAC 209 will load the high order word (i.e., byte count) of the data bus into the channel 1MTC register. The BCU 156 will capture the data bus contents as follows:

Bits 26-14—to BSM Read Select Up Byte Counter 220; and

Bits 13-06—to Adapter Bus Channel 0 A/D Register 219, but rearranged.

For a doubleword transfer to take place in one S/88 processor machine cycle, the address must be on a doubleword boundary. Since the DMAC Channel 1 MTC's address is not on a doubleword boundary, (bits 07-00=01001010), the following action takes place in order to load the BCU 156 and the DMAC 209 with one S/88 processor command. The BCU 156 will invert address bit 1 and present it to the DMAC 209 along with the other register select bits. This will allow the MTC register for Channel 1 to be selected properly (address bits 07–00=01001010). This arrangement also applies to the selection of the MTC register for Channel 2 I/O read operations. The DMAC 209 responds with a 'DTACK' signal on line 265 to the BCU logic 253. The BCU logic 253 converts the 'DTACK' signal to a 32 bit port 'DSACK' response on lines 266a, b to the S/88 Processor 62. The transfer byte count, along with the remaining data bus data will be presented to bus adapter 154 during the subsequent 'BSM READ SELECT UP' command. The BSM read boundary counter 221 or the BSM read select-up byte counter 220 will be loaded into the Channel 0 read command register 214.

Figure 45G:
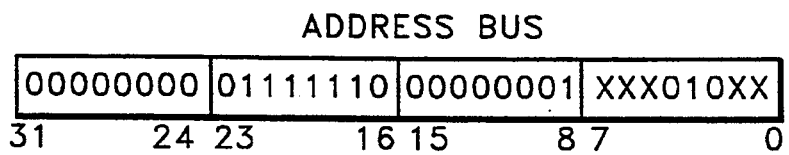

The S/88 processor 62 will then generate a 'BSM READ SELECT UP' command on the bus 247 in the format shown in FIG. 45G wherein bits 31–00=0-07E0108='BSM Read Select Up' command.

Figure 45H:
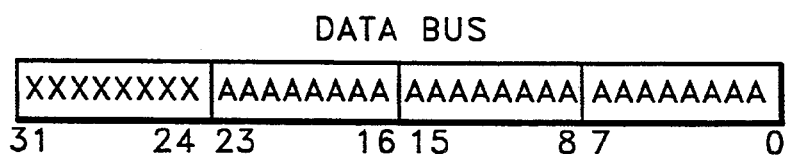

The S/88 processor 62 will also place the BSM starting address on the data bus 223 in the format shown in FIG. 45H wherein bits 23–0=the starting address in storage 162

The BSM starting address on bus 223 is stored in the A/D register 219 and the BSM Read Address register 231. It will be sent subsequently to bus adapter 154 for presentation to the S/370 storage 162. The BCU 156 then activates the 'DSACK' lines 266a, d to the S/88 processor 62. At this point, the S/88 processor is released, and is no longer involved with this operation.

Figure 45I:
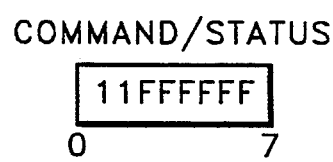

The BCU 156 places the 'BSM SELECT UP' (Read) command into register 214 via bus 290 and on the command/status bus 249 shown in FIG. 45I wherein bits
- 0–1=11, 'BSM Select Up' command (Read); and
- 2–7=Field length minus 1 (64 bytes max).

Figure 45J:
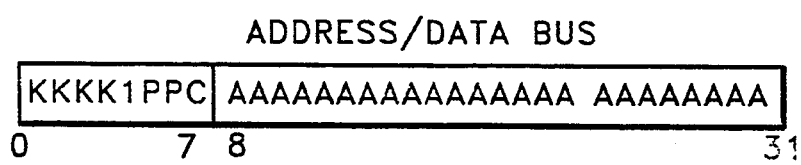

The field length was previously transferred from register 220 or 221 into register 214. The register 219 places address information on bus 250 in the format shown in FIG. 45J wherein bits
- 0–3=Storage key;
- 4=1;
- 5–6=Priority (bus adapter 154 to processor bus 170);
- 7=1=Customer Area Access; 0=Microcode Area Access;
- 8–31=Address of first byte in data field in storage 162.

Figure 45K:
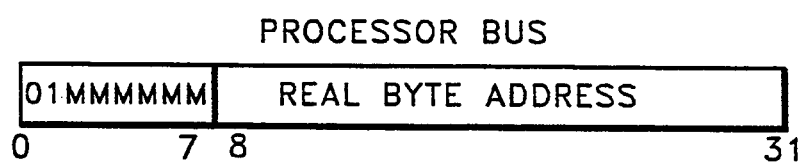
Figure 45L:
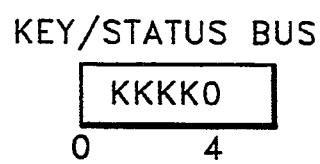

The BCU logic 253 then raises TAG UP line 262a to bus adapter 154 in order to latch the command, field length data into adapter command register 124 (FIG. 13) and key address data into register 122. Bus adapter 154 raises TAG DOWN to the BCU logic 253 if data is not valid. The BCU logic 253 waits until TAG DOWN drops. Bus adapter 154 converts the adapter bus BSM SELECT UP command to a processor bus I/O Memory command as shown in FIG. 45K and 45L in which bits on the processor address/data bus 170 represent:
- 0=0=I/O Memory Command
- 1=1=Fetch operation
- 2–7=Field length
- 8–31=Real byte address and in which the processor key/status bus bits represent:
- 0–3=Storage key
- 4=0=No Dynamic Translation When the addressed data is returned from S/370 memory 162, it is latched in the bus adapter data buffer 259 (Channel 0). The bus adapter 154 then de-activates TAG DOWN line 262b on the adapter bus channel 0. This condition alerts the BCU 156 to latch two bytes (16 bits) of data, immediately followed by another two bytes in the Channel 0 Read Buffer 226 (4 bytes) via the clock left and clock right signals. The BCU 156 then activates its 'REQI' line 263b (DMAC Channel 1 request) to the DMAC 209. The DMAC 209 issues a 'BUS REQ' on line 269 to the BCU local bus arbitration logic 216, in order to perform a local bus cycle.

When bus grant signal on line 268 is returned from the BCU arbitration logic 216, the DMAC 209 starts a Channel 0 Read Buffer 259 to the local storage 210 operation. It does this by returning ACK1 (DMA Channel 1 acknowledge) on line 264b to the BCU logic 253, and by gating the local storage address in DMAC channel 1 register MAR to the store 210 addressing circuits (not shown) via bus 248, latch 233, address bus 247 and multiplexor 232. The BCU logic 253 uses the ACK1 signal on line 264b and RAM select signal on line 210a to gate the first data (4 bytes) from buffer 226 to the data bus 223 for storage into store 210 at the address specified by the MAR register. When DTACK is returned on line 265 by the BCU logic 253, the DMAC 209 raises DTC (data transfer complete) on line 267.

The BCU 156 will decrement the byte count which has been retained in registers 220, MTC; increment channel 1 MAR; and decrement address register 231 for each double word (4 bytes) of data that is received from bus adapter 154, up to 64 bytes. The sequence described above is repeated for each four bytes (up to 64) of the BCU command. If the transfer byte count is greater than sixty-four, then the BCU 156 will present a new BSM starting address to bus adapter 154 via registers 231, 219 in order to fetch the next 64 bytes. The register 231 has been decremented for each four byte transfer as described above and therefore has the appropriate next starting address. The bus adapter 154 buffers 64 bytes of data for each starting address until the entire data transfer (up to 4 KB) requested by the command is complete.

The BCU 156 will leave the DMAC 209 idle (by not raising REQ) if the bus adapter buffer 259 is empty, and until the next valid data word is received; the state of tag down reflects the availability of valid data in buffer 259. The REQ/ACK cycles continue until the byte count goes to zero at which time the DMAC 209 raises IRQ on line 258 to the S/88 processor 62. This alerts the S/88 processor 62 to read the local storage buffer which contains the data read from S/370 storage 162 for appropriate processing.

(b) I/O Read Operation: (Local Storage 210 to S/370 Storage 162)

Figure 45M:
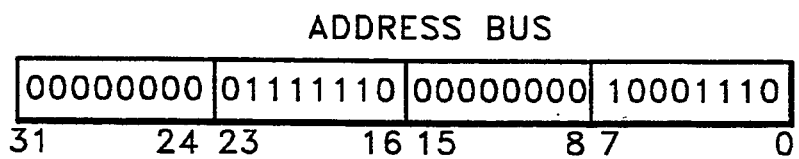
Figure 45N:
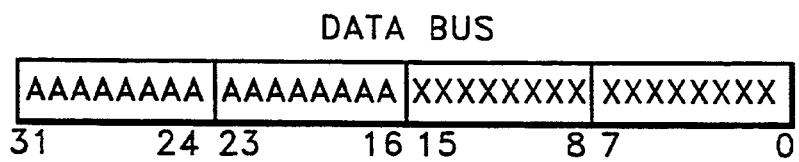
Figure 45O:
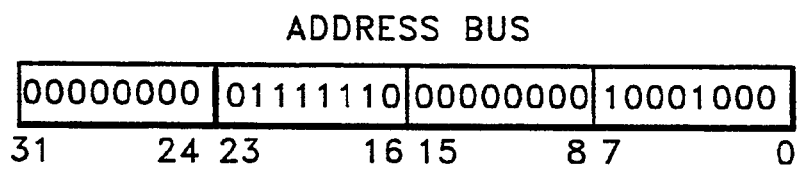

I/O Read Operations (under the control of EXEC370) are kicked off when at least one entry exists in the I/O Read queue in store 210. The S/88 processor 62 gains control of the local bus if it is not being used by DMAC 209. The S/88 processor 62 sets the local buffer I/O read starting address in the DMAC Channel 2 memory address register (MAR) by placing the information shown in FIG. 45M on the 247 bus wherein bits
- 31–08=007E00=DMAC Register Select command
- 07–00=DMAC Channel 2 Memory Address Reg (Low) Select;

and by placing the starting address (of the buffer in store 210) on data bus 223 as shown in FIG. 45N wherein bits
- 31–16=starting address of local buffer I/O read data
- 15–00=Reserved.

Figure 45P:
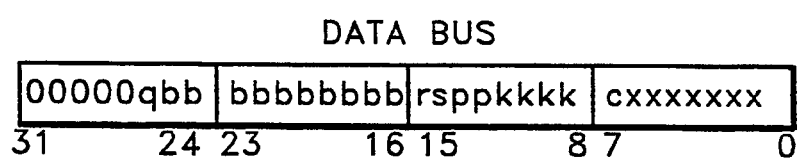

The high order data bus bits 31-16 will be loaded into the low order (15-00) bits of the Channel 2 memory address register. The high order bits (31-16) of the MAR were set to zero during initialization. The DMAC 209 responds with a DTACK signal on line 265 which is converted to DSACK signals on lines 266a, b to the S/88 processor 62. The S/88 processor 62 then moves data (up to 4 KB) from an I/O controller such as 20 or 24 to the local storage 210 via S/88 program control, using the starting address of the selected local storage I/O read buffer. When the data transfer is complete, the S/88 processor 62 places DMAC Channel 2 memory transfer count selection on address bus 247 in the format shown in FIG. 450 wherein bits:

31-08=007EOO=DMAC Register Select command
07-00=BCU and DMAC Channel 2 MTC Select The byte count, storage key (derived from the CCW), adapter bus priority, and customer/IOA space bits will be placed on the data bus by the S/88 processor 62 in the format shown in FIG. 45P wherein bits 31-27=Reserved
26=High order byte count bit. This bit will =1 only when the maximum byte count is being transferred.
26-16=Byte count of DMAC channel 2 MTC register
26-14=Byte count loaded into the BCU 156 (4096 max). The bus adapter 154 requires a count of 1111 1111 1111 in order to transfer 4096 bytes (byte count −1). Therefore, the BCU will decrement the double word boundary bits 26-16 once before presenting it along with byte-offset bits 15-14 (in 64 byte blocks) to bus adapter 154.
15-14=Low order byte count bits. These bits represent the byte offset minus 1 (for bus adapter requirements) from a double word (32 bits) boundary. These bits are not used by the DMAC 209 or the BCU 156, since they transfer double words only. The bits are passed to the bus adapter 154 for presentation to the S/370 BSM 162.
13-12=adapter bus channel priority
11-08=storage key
07=customer/IOA space bit
06-00=reserved The DMAC 209 will load the (byte count) of the data bus 223 into the channel 2 MTC register. The BCU 156 will capture the data bus contents when the above command appears on the address bus 247. Bits 26-16 are stored into BSM write select up byte counter 222. Bits 13-07 are stored into the high order byte of adapter bus channel 1A/D register 227. The DMAC responds with a DTACK signal on line 265 to the BCU logic 253. The logic 253 converts the DTACK signal to a 32 bit port DSACK response on lines 266a, b to the S/88 processor 62. The transfer byte count, along with the remaining data bus data will be presented to bus adapter 154 during the subsequent BSM write select up command. The count in the BSM write boundary counter 224 (all but last transfer) or the BSM write byte counter 222 (last transfer) is loaded into the adapter channel 1 write command register 225.

Figure 45Q:
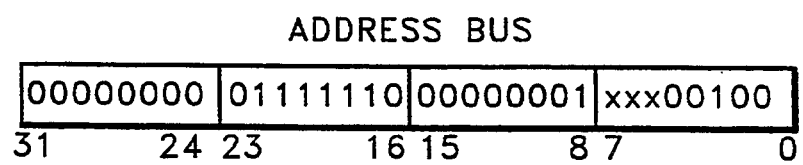
Figure 45R:
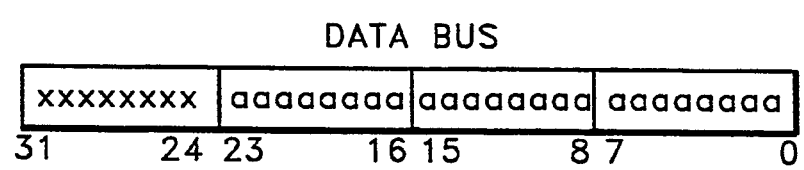

The S/88 processor 62 then generates a BSM write select up command on the local address bus 247 in the format shown in FIG. 45Q wherein bits 31-00=007E0104=BSM write select up command The S/88 processor will also place the BSM starting address on the data bus 223 in the format shown in FIG. 45R wherein bits 31-24=Reserved,
23-00=BSM starting address.

The BSM starting address on the data bus 223 will be captured by the low order bytes of the Channel 1 A/D register 227 and BSM write address register 228. It will subsequently be sent (as seen below) to bus adapter 154 for presentation to the S/370 storage 162. The BCU 156 then activates the DSACK lines 266a, b (32-bit port) to the S/88 processor 62. At this point, the S/88 processor 62 is released, and is no longer involved with this operation.

Figure 45S:

The BCU logic 253 issues a BSM select up command, gating bits "01" into the high order bits of command register 225 via bus 290 and places the command and field length of register 225 on bus 252 in the format shown in FIG. 45S wherein bits 0-1=BSM select up command (write),
2-7=Field length minus 1 (64 bytes max).

Figure 45T:

The contents of register 227 are placed on the address/data bus 251 (in two subcycles) in the format shown in FIG. 45T, wherein bits 0-3=storage key
4=1
5-6=priority (bus adapter to processor bus)
7=1=customer area access 0=microcode area access
8-31=S/370 address of first byte in data field The command, field length are stored in register 125 of adapter 154. The key/address data is stored in register 123 of adapter 154 via SYNC register 113. The BCU logic 253 activates the REQ2 signal on line 263c to the DMAC channel 2. The DMAC 209 sends the I/O buffer starting address from MAR to store 210 via bus 248, latch 233, bus 247, multiplexor 232 to transfer a double word of data from store 210 to A/D register 227. ACK2 (DMA Channel 2 acknowledge) is raised on line 264c. This causes a Tag Up on line 262a to adapter 154.

The adapter 154 then transfers a double word of data from the register 227 to bus adapter buffer 260 in two subcycles via register 113. A write sequence of REQ-/ACK signals followed by a Tag Up command is repeated to transfer each double word of data. The BCU 156 decrements the byte count in registers 222,224 and the address in register 228 and MTC of DMAC channel 2 for each double word (32 bits) that is presented to bus adapter 154 up to 64 bytes.

If the transfer byte count is greater than 64, then (as described above with respect to Write Operations) the BCU 156 will present a new starting address for the next 64 bytes. The bus adapter buffers 64 bytes of data for each starting address. This sequence will repeat until the byte count in register 222 (4 KB max) goes to zero.

When the bus adapter buffer 260 is full, the BCU 156 will suspend the write sequence until the bus adapter gives a buffer available indication via the Tag Down line 262c.

Figure 45U:
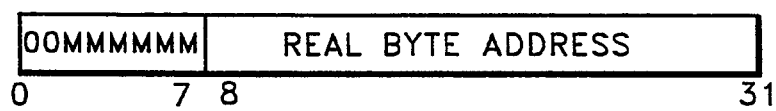
Figure 45V:

The bus adapter 154 converts the adapter bus BSM Select Up command to a S/370 Processor Bus I/O Memory command in a format shown in FIG. 45U and V on the processor bus 170 and the key/status bus wherein Processor Bus Bits
0=0=I/O Memory Command
1=0=Store operation
2-7=Field length
8-31=Real byte address;
Key/Status Bus Bits
0-3=Storage key
4=0=No Dynamic Translation;

When all of the data has been transferred, (byte count=0), the DMAC 209 will activate the interrupt line 258a to the S/88 processor priority encoder 212.

(c) S/370 High Priority Message Transfer Sequence Flow

All high priority message transfers originate from the I/O subsystem (S/88 processor 62). The DMAC channel 3 will be set up by the S/88 processor 62 to perform the data transfer (16 bytes). The BCU 156 will use the adapter bus channel 1 for data communication (Q Select UP command).

The BCU 156 detects a high priority message request when the S/88 processor PE62 performs a DMAC memory transfer count load to register MTC in channel 3. As a result of this, the BCU 156 generates a Q Select Up command to the S/370 PE85 on adapter bus 252 of channel 1. If a S/370 I/O read data transfer (adapter bus channel 1) is in progress when the request is detected, then the BCU 156 waits until the current 64-byte block transfer is complete before honoring the request.

If there is no I/O activity on the adapter bus channel 1, then the request will be processed immediately.

Figure 45W:
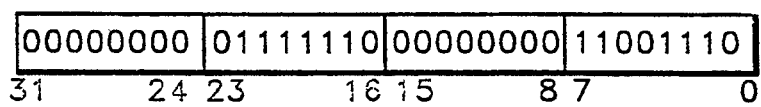

This high priority message transfer will now be described in greater detail. PE62 gains control of the local bus 223, 247 if it is not being used by the DMAC 209. PE62 then stores the message data in the local storage 210 via program control. PE62 sets the local buffer message starting address in the DMAC channel 3 memory address register MAR by placing information on the local address bus 247 in the format shown in FIG. 45W wherein bits 31–08=007E00=DMAC Register Select command,
07–00=DMAC Channel 3 Memory Address Reg (Low) Select.

Figure 45X:
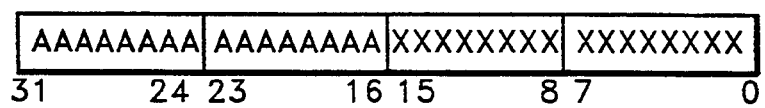

The starting address of local buffer message data intended for the memory address register is placed on the data bus 223 in the format shown in FIG. 45X wherein bits 31–16=Starting address of local buffer message data in store 210,
15–00=Reserved.

The high order data bus (Bits 31–16) will be loaded into the low order (bits 15–0) part of the DMAC channel 3 memory address register MAR. The high order bits (31–16) of MAR were set to zero during initialization. The DMAC 209 responds with a DTACK signal on line 265 which is converted to a 16-bit port DSACK signal on lines 266a, b via the BCU logic 253 to the S/88 processor 62.

Figure 45Y:
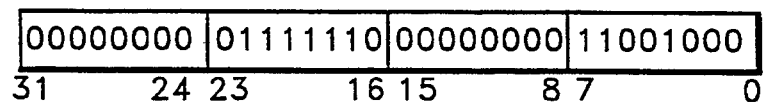
Figure 45Z:
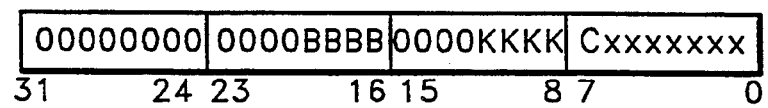
Figure 45A:
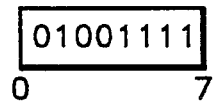
Figure 45A:
Figure 45A:
Figure 45A:
Figure 45A:
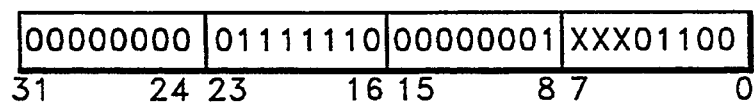
Figure 45A:
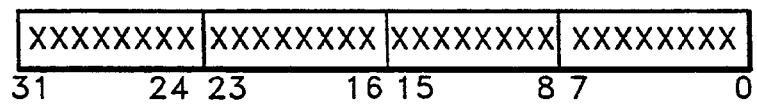
Figure 45A:
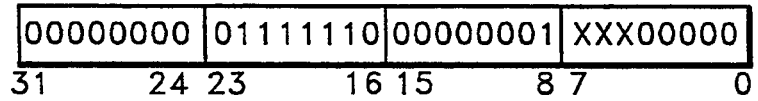

The S/88 processor 62 then places a command on the local address bus 247 in the format shown in FIG. 45Y wherein bits 31–08=007E00=DMAC Register Select command
07–00=BCU and DMAC channel 3 MTC Select The byte count, storage key and customer/IOA space bits will be placed on the data bus by the S/88 processor 62 in the format shown in FIG. 45Z wherein bits 31–20=Reserved
19–16=Transfer byte count bits. These bits are loaded in the DMAC 209 and the BCU 156. They represent a doubleword count to the DMAC 209 and the BCU 156 (64 bytes max).
15–12=Zero
11–08=Storage key
07=Customer/IOA space bit
06–00=Reserved The DMAC 209 will load the high order word (byte count) of the data bus 223 into the channel 3 memory transfer count register MTC. The BCU 156 will capture the data bus contents when this particular command appears on the address bus 247 by storing bits 19–16 into the Q Select Up counter 254 and bits 11–07 into channel 1 A/D register 227.

DMAC 209 responds with a DTACK signal to logic 253 which converts it to a 32 bit port DSACK response on lines 266a, b to PE 62. This action alerts the BCU 156 to initiate a high priority message transfer from local storage 210 to the S/370 BSM 162. The transfer byte count, along with the additional data shown in FIG. 45Z are presented to bus adapter 154 during a BCU generated Q Select Up command. The Q Select counter 254 is loaded into bits 4–7 of the channel 1 write command register 225. The BCU 156 places the Q Select Up command in register 225 via bus 290; and the data in register 225 is placed on the adapter bus 252 (channel 1) in the format shown in FIG. 45AA wherein bits 0–1=Q Select Up command (write),
2–7=Field length minus 1 (16 bytes).

Information placed on the address/data bus 251 via register 227 is shown in FIG. 45AB wherein bits 0–3=Storage key
4–6=Zero
7=1=Customer Area Access 0=Microcode Area Access
8–31=Don't care.

The data on buses 252 and 251 is transferred into adapter registers 125 and 123 respectively. The BCU logic 253 then activates the REQ line 263d (DMA Channel 3 request). The DMAC 209 places the I/O buffer starting address (from MAR) on the local bus 247, and raises ACK (DMAC Channel 3 acknowledge) line 264d. The BCU 156 then transfers the first four bytes of data from the addressed I/O buffer in local storage 210 to the adapter buffer 260 in two subcycles via the SYNC register 113. Succeeding four byte blocks are transferred by sequences directed by the Tag Up command to bus adapter 154, and the REQ/ACK lines 263d, 264d to the DMAC. The BCU 156 decrements the byte count for each double word (32 bits) that is presented to bus adapter 154.

The bus adapter 154 converts the Q Select Up command to a S/370 processor bus I/O memory command to send the message to area 189 of storage 162; the format of the command is shown in FIG. 45AC wherein PROC BUS 170 bits 0=0=I/O memory command
1=0=Store operation
2–7=Field length (64 byte max)
8–31=Real Byte Address (from adapter registers 110, 112).

The processor 85 KEY/STATUS bus has data in the format shown in FIG. 45AD wherein bits 0–3=Storage key,
4=No Dynamic Translation.

When all of the message data has been transferred to bus adapter 154 (byte count=0), the DMAC 209 will activate its interrupt line 258a to the S/88 processor priority encoder 212. The DMAC 209 presents interrupt vectors from the least significant byte of its data bus 248 to the S/88 processor data bus 161D, bits 23–16 via driver receiver 234 and bits 23–16 of the local data bus 223. The DMAC returns a 16-bit DSACK to PE 62.

(d) BCU Status Command

A Read BCU Status Command can be issued by the S/88 processor 62 in order to read the current status of the BCU 156. The command is placed on the address bus 247 by the S/88 processor 62 in the format shown in FIG. 45AE wherein bits 31-00=007E010C—Read BCU Status Command The BCU 156 will place the status shown in FIG. 45AF on the data bus, and return DSACK (32 bit port) on bus 266 PE 62. The bits in FIG. 45AF represent

- 31-29=adapter bus channel 0 status—keycheck, address check
- 28=1=Last data cycle 0=All other data cycles
- 27-26=adapter bus channel 1 status keycheck, address check
- 25=Buffer not available (Q Select Up command)
- 24=1=Last data cycle 0=All other data cycles
- 23=adapter bus channel 0 Tag Down
- 22=adapter bus channel 1 Tag Down
- 21=BSM Read Sync Check
- 20=BSM Read Select Up Request/Pending Latch
- 19=BSM Write Select Up Request/Pending Latch
- 18=Q Select Up Request/Pending Latch
- 17=Read Mailbox in progress
- 16=BSM Read in progress
- 15=BSM Write in progress
- 14=Q Select Up in progress.

BCU status bit 21 (BSM Read Sync Check) will be reset after it is read by the S/88 processor 62. This bit indicates that the bus adapter 154 and BCU 156 byte counts do not agree when a BSM Read operation terminates; hence an error is detected which requires re-sync.

For a BSM Write operation, bus adapter 154 will activate Tag Down 262b to indicate that all data has been received. Tag Down 262b will then be deactivated by bus adapter 154, at which time the status indicators will be presented to, and captured by the BCU 156. If Tag Down is not deactivated within 100 μs, the BCU 156 will activate a cancel line (not shown) to bus adapter 154. This will then cause bus adapter 154 to disconnect itself from the BCU 156. Tag Down 262b is also used by bus adapter 154 to indicate any error that cannot be reported to the BCU 156 via the Command/Status bus 252.

(e) Programmed BCU Reset

A programmed BCU Reset issued by PE 62 performs the same function as a Power on Reset to the BCU 156. It can be issued at any time in order to clear the BCU of any abnormal conditions. However, a local bus cycle (007EXXXX decode) must be recognized by the hardware for this command to execute.

The command is placed on the local address bus 247 by the S/88 processor in the format shown in FIG. 45AG wherein bits 31-00=007E0000—Reset BCU command The data bus contents will be ignored by the BCU 156. The BCU 156 will return DSACK (32 bit port) on lines 266a, b to the S/88 processor 62.

Count, Key, and Data Track Format Emulation (FIGS. 46A-K)

Emulation of S/370 DASD on S/88 will be described by way of example to illustrate a preferred manner in which S/370 I/O programs can be executed by S/88 processors and I/O devices. The S/370 is referred to as the Object system, and the S/88 as the Target system. DASD (Direct Access Storage Device) data for the object system is maintained by the target system in an Emulation Format. S/370 code running in the S/370 processor is referred to as object system software. The discussion is divided into four parts:

1) The object system—presents a brief description of the count, key, and data recording format used by existing S/370 direct access storage products.
2) The target system—describes the DASD program interface model.
3) The emulation format—describes the mapping of the object system fields into the emulation formats used.
4) The emulation function—describes the mapping of the object system functions into the emulation functions.

1. The Object System

DASD physical media is partitioned into cylinders and the cylinders into tracks. The number of each and their capacity varies for different DASD types and models. Each cylinder is program addressable by a two byte cylinder number (CC), and individual tracks within a cylinder are accessed by separate read/write heads each of which is addressable by a two byte head number (HH). The physical location of a track is given by its cylinder and head number and is therefore specified by the four byte track address (CCPIH). Each track contains a home address, a track descriptor (record 0), and one or more data records. The size of each record is programmable; and when the home address and record sizes are written on a track, that track is said to be formatted. All tracks are formatted from their track index to the following track index. FIG. 46A illustrates one such track.

The basic unit of information recorded on the physical media is a data byte consisting of eight bits. A group of data bytes makes up an area, and the device separates these areas by writing gaps between them. Each record consists of two (count, data) or three (count, key, data) areas, while the home address is made up of only one area. The three areas making up an object system record are: count, key (optional), and data. The count area contains the following fields:

| | | | |
|---|---|---|---|
| F | Flag | 1 byte | indicating the track condition, logical record track overflow |
| CCHH | Track address | 2 bytes | indicates the cylinder and head number where track is physically located |
| R | Record Number | 1 byte | indicating the sequential number of the record on the track |
| KL | Key Length | 1 byte | indicating the number of bytes in the key area |
| DL | Data Length | 2 bytes | indicating the number of bytes in the data area |
| ECC | Error Code | 2 bytes | used for error detection/correction code |

The key area contains the following fields:
(If KL=0, this area and its gap are omitted.)

| | | | |
|---|---|---|---|
| KEY | Key | KL bytes | user data |
| ECC | Error Code | 2 bytes | used for error detection/correction code |

The data area contains the following fields:

| | | | |
|---|---|---|---|
| DATA | Data | DL bytes | user data |
| ECC | Error Code | 2 bytes | used for error detection/ correction code |
| The first area on each track is the home address. It contains the following fields: | | | |
| F | Flag | 1 byte | indicating the track condition |
| CCHH | Track address | 2 bytes | indicates the cylinder and head number where track is physically located |
| ECC | Error Code | 2 bytes | used for error detection/ correction code |

Record 0 (track descriptor) is always the first record following the home address area. In the preferred programming system, the record 0 CCHH field defines the alternate track if the track has been flagged as defective. The Key Length is normally zero for record 0. Record 0 may be followed by one or more data records. The key area is optional, and if present may contain from 1 to 255 bytes. The number of a record is determined when a Format Write CCW command writes the count, key and data areas. After the record has been formatted, the user data areas may be read and/or rewritten (using other CCW commands) without destroying adjacent records on the track. If a record is reformatted, those following it on the same track are destroyed.

2. The Target System

DASD (FIG. 46B) is presented to S/88 microcode in the form of files which contain 4096 byte blocks of data sequentially numbered from one. The emulation mechanism maps object system format and function into a useable target system format and function combination.

3. The Emulation Format

The physical parameters of different DASD types and models in the object system vary. The DASD type and model number along with the various parameters are kept in the first data block, INFO, of the target system file, FIG. 46C. The balance of the file contains the emulated object track data FIG. 46C. The data for each track is maintained in an integral number of data blocks. The number of target system data blocks required for each track is a parameter kept in the first data block. Each track in the object system, beginning with CCHH=0000, is kept sequentially in the target system file. Its beginning block number may be calculated given the CCHH and the object disk dimensions kept in the INFO block.

Each emulated track (FIG. 46D) contains a directory of the records currently existing on that track, a directory header, and the user data (key, data) for each record. The directory is used to locate the data for a specific record, perform search on record or key operations, access the last record on the track, and handle track overflow.

Object system data is treated in the emulation environment in one of three ways: Maintained, Retained implicitly, or Not kept.

All gaps are unnecessary and are not kept. ECC data is neither created nor maintained because data integrity is insured by the target system. Since the program model provided by the target system eliminates all faulty physical surface area, alternate tracks in the object system are implemented in a faultless manner. This means that the part of the Flag byte (F) indicating track condition is not maintained, and Flag bytes written by object system software are checked for validity and discarded.

The CCHH (track address) passed by object system software is used to calculate the location of the emulated track in the target system DASD file. It is kept in the track header described below, but is not proliferated throughout the count and home address areas of the emulated track. The home address is not kept as an explicit area. The record number (R), also passed by object system software, is maintained implicitly and does not appear as explicit data.

User data, optional KEY and the DATA fields, for each record are maintained in a sequential manner in the emulated track immediately following the track directory, FIG. 46D.

The balance of the object system data [F (logical record track overflow), KL, and DL] is maintained in the track directory, FIG. 46E. A directory entry contains F, KL, and DL, as well as a pointer p to the user data (KEY and DATA) for each record. R is maintained implicitly as the directory entry number. FIG. 46E shows the header, directory and user data makeup as well as the mapping of an emulated track into the target system 4 KB blocks. Pointers p0–p2 point to the beginning addresses (within 4 KB blocks) of user data records 0–2.

4. Emulation Functions

This section addresses the use of the above described emulation formats in providing some of the object system's DASD CCW commands. The FIGS. 46F–K inclusive represent data transferred by the object system software during read and write operations. For CCW operations (ops) involving the home address, the F and CCHH values of FIG. 46F are calculated and/or checked but nothing is written to the emulated track.

For CCW ops involving record 0, FIG. 46G, the CCHH and R fields are checked but nothing is written. The KL and DL fields are transferred to/from the appropriate directory entry. Record zero is at offset zero into the user data area. Read/Write Record 0 always orients the head to the first record in the track.

CCW ops involving count always orient the head to the next record in track, FIG. 46H. For CCW ops involving key and data, the location and size of the user data is found in the directory, FIG. 46I. CCW ops involving count, key and data orient the read/write head to the next record in track, FIG. 46J. For CCW ops involving multiple count, key and data, processing begins with next directory entry and continues to the last valid directory entry, FIG. 46K.

Sharing of Real Storage 16 by S/88 and S/370

1. Introduction

"Stealing" one or more areas in real (physical) storage 16 for one or more S/370 processors and the management and mapping of storage 16 will now be described in more detail, reference being directed to:

FIG. 10 which conceptually illustrates S/88 virtual storage 106 and physical storage 16 and the allocation of S/370 physical storage areas 162–164 for S/370 processors 21, 23 and 25, 27 and 29, 31;

FIG. 47, which illustrates diagrammatically the method of capturing one S/370 storage area from the S/88 physical storage 16; and FIGS. 48A–K which illustrate known virtual/physical software mapping such as that used in S/88 storage management which mapping is controlled to permit capturing of the S/370 storage area.

Storage 16 is divided into 4 KB pages and a plurality of storage map entries (mme), one for each 4 KB page, are contained in mme arrays (FIG. 48A) which together map the entire storage 16. The entries corresponding to pages not assigned for use are tied together in a "freelist" (i.e., the storage allocation queue) by including in each entry (FIG. 48B) the physical page numbers (pointers) of the previous and next entries in the list. A software pointer in the S/88 operating system always points to the beginning of the freelist. Physical storage pages are assigned to various processes from the beginning of this freelist and pages returned to the freelist are preferably placed at the beginning of the freelist. The "previous and next" page numbers and the software pointer to the beginning of the freelist are updated appropriately.

When the System/88 is booted, these entries are placed in sequential address order in the freelist; only a few pages at this time are assigned for use. Hence, there are large contiguous areas of storage 16 available for assignment from the freelist. Hence, at boot time, the storage areas (e.g. 162, 163, 164) must be "stolen" for the S/370 processors. Subsequently, as pages are assigned from and returned to the freelist as required, the large contiguous blocks on the freelist become fractionalized and no longer available. If an attempt were made to create a contiguous S/370 area, it would be necessary to halt all processes and execute complex routines to reallocate storage blocks already allocated to various processes until sufficient contiguous storage became available.

Service routines, in the application program EXEC370, described below, provide the functions for stealing S/370 storage areas from the S/88 operating system.

2. Mapping S/88 Storage 16

Figures 48C, 48D:
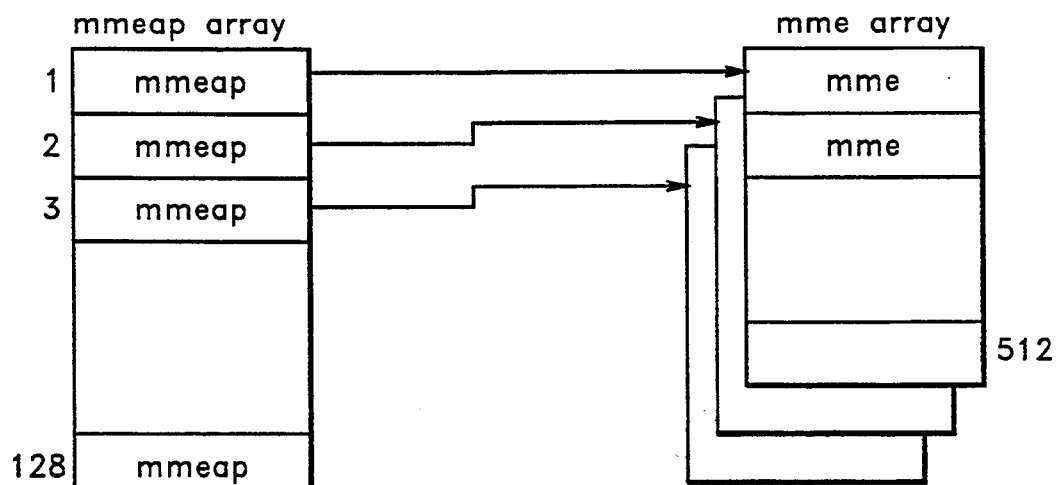

First, however, a preferred form of managing/mapping the S/88 main store 16 will be described, with reference to FIGS. 48A-K inclusive. FIG. 48A is a simple overview of the software structure set up by the S/88 operating system (S/88 OS) to maintain a process's virtual address space. The software structure includes the following elements:

pte—process table entry. (represents a process).
pmb—process map block(s). Chained together, they contain pointers (pme's) to the apte's for this process's virtual address space.
pmbp—a pointer in the pte to the first pmb in the chain.
pme—process map entries (pointers to the apte's) contained in the pmb's.
mme—physical storage map entries. Contained in the mme arrays, there is one mme for every 4 KB page of physical storage in the system, i.e., in storage 16.
apte—active page table entry. Contained in apt blocks, there is one apte for every unique virtual page in the system.
vpn—virtual page number within a process' virtual address space.
pmt—process management table. There is a pointer ptep in the pmt to each process (pte) in the system.
ptep—process table entry pointer to one process.

The storage map structure of FIG. 48A is used by the storage management unit 105, FIGS. 10 and 47. It consists of one or more mme arrays (FIG. 48C), each containing 512 ordered mme's in the preferred embodiment. Each mme represents one 4KB page of real storage 16, and therefore, an mme array represents 512×4 KB=2 MB of contiguous storage.

The box labelled Storage Map Array of FIG. 47 conceptually illustrates all of the mme arrays arranged in sequential address order.

Mme's are usually threaded onto one of three lists:
1.) used list, mme assigned to a process
2.) reclaim list, mme to be returned to free list
3.) free list, mme available for assignment to a process. As mme's are moved from one list to another their pointers are updated appropriately. If they are not on a list, they either represent a permanently wired page or are in a transient state. The mme data structure, used by the storage management unit 105, contains the three list pointers shown in FIG. 48B wherein:

| flags | wired | page is wired |
|---|---|---|
| | I/O in progress | disk I/O going on now |
| | write | indicates the last (or current) I/O for this frame was a write to disk |
| | connected | page has a PTW (physical table word) in the hardware registers |
| | modified | last look at modified bit |
| | unused (2) | |
| | evict cleanup | notifies post to clean up |
| | unused (1) | |
| | evict free | notifies post to clean and free this page |
| | page fault | some pf waiting on this page |
| | next mme | ppn (physical page number) to next mme |
| | prev mme | ppn to previous mme |
| | address | disk address, while in memory |
| | aptep | pointer to apte for this page |

The "next" and "previous" mme fields are used to create the chained lists (used, reclaim, freelist).

It is the physical page numbers to next mme and previous mme which will be altered as described below, when physical storage of S/88 is captured for a S/370 storage area. In the preferred embodiment, each mmep array (FIG. 48C) is a list of 128 pointers, each of which is a virtual address of an mme array. The first n pointers are an ordered list of all the mme arrays. The remaining 128-n pointers are NULL. This provides the capability to keep track of 128×2 MB=256 MB of real storage. Each of these pointers comprise the 16 most significant (high order) bits of a physical address, called a physical page number (ppn), and are used as a pointer to a specific mme. The seven high order bits of the ppn select the mme array, and the nine low order bits of the ppn select the mme within the array. The twelve low order bits of the physical address are an offset into the real (physical) page of storage 16.

A memory map information (mem map info) structure (FIG. 48D) is used to keep track of memory used for maps, wherein:

| mem map infop-1 | pointer to the first mem map information structure |
|---|---|
| next mem map infop | pointer to the next mem map information structure |
| n pages | number of 4K pages of real memory used by this map (maximum 16) |
| per page (16) | the balance of the structure is an array of per page information |

| | | |
|---|---|---|
| ppn | physical page number to mme for this page | |

The active page table entries (apte) are used to keep track of virtual storage. There is one apte for each 4 KB page of virtual storage in all virtual storage spaces in the system. The apte structure (FIG. 48E) indicates the owner(s) of the virtual space, the virtual address of the page, and the real memory address of the disk address if paged out.

If more than one process is sharing the same virtual address space, all the processes are identified via an apte trailer (FIG. 48G); and the apte for each virtual page points to the trailer.

The apte structure includes:

| | | |
|---|---|---|
| address | address of real 4K page | (flags mem assigned = 1) |
| | disk address address of next free apte if this apte is on the free list | (flags mem assigned = 0) |
| flags | per process | virtual page not shared with other processes |
| | forked page | per process page was forked |
| | mem assigned waiting | page has storage assigned waiting for this page |
| | I/O error | I/O error occurred on page |
| | release apte | free this APTE when I/O complete |
| | cpu type patch | page was patched at boot |
| | bad address, reassigned | errors forced new address |
| | count | number of processes sharing this page |
| vpage | virtual page number. The vpn consists of the 16 most significant bits of a 27 bit virtual address. | |
| process ptr | address of pte for per process or address of apt trailer | (if not shared virtual memory) (if shared virtual memory) |

Each apte is twelve bytes long, and 256 entries are contained in each active page table (apt) block (FIG. 48F). The relative position of apte's within a block has no significance. All unused apte's are threaded onto a free aptep list. If additional apte's are needed and the list is null, a new apt block is allocated in the wired heap; and the entire 256 apte's are threaded onto the free aptep list.

The apt trailer (FIG. 48G) is used for shared program regions, it is allocated in the wired system heap, and pointed to by an EITE (executable image table entry) or an apte. There will be four trailers per program (one per region). Trailers allow the system to find all PTWs which point to a page when removing it.

The apt trailer structure includes:

| | | |
|---|---|---|
| n procs | number of processes using this trailer | |
| v base | (region base vpn) first virtual page of this region | |
| n pages | number of pages in region | |
| users | bitmap of trailer users | |
| pp info(o:nnp) | the balance of the structure is an array of per process information | |
| npp | size of array | |
| n ptws | number of PTWs connected at this time | |
| aptep | pointer to APTE for this page | |

The process table entry (pte) (FIG. 48H) contains the information needed to manage a process; it contains information about the process's virtual address space. Each page table entry includes:

| | |
|---|---|
| first pmb ptr | pointer to the first pmb in a list of pmbs for this process |
| map root tbl phys addr | physical address of physical map |
| map root ptr phys | virtual address of physical map |
| map root ptr virt | virtual map image |
| pdr ptr | address of per process data region |

The process map block structure (FIG. 48I) is used to map a process's virtual space into real memory space and includes:

| | | |
|---|---|---|
| nextp | pointer to next pmb for this process | |
| base vpn | base virtual page number, the first virtual page number of this pmb (The six least significant bits will be zero.) | |
| map addr | physical address of map | |
| pme | process map entries 0–63, the balance of the structure is an array of per page information. The index into this array is the six least significant bits of the vpn. | |
| flags | used | copy of used bit |
| | in mem | page is in memory |
| | unused (1) | |
| | fence | this page is a fence page |
| | wired | wire this page when it comes in |
| | copy on write | copy page when written |
| | patched | page is patched code page |
| | ufence | user fence page |
| aptep | pointer to APTE for this page | |

The process management table (FIG. 48J) contains information used by the scheduler, including a list of pointers ptep to all the processes in the system, the number of pages available in the system and the number of pages committed.

The physical table word (ptw) of FIG. 48K includes:

| | |
|---|---|
| acl | ptw access code. |
| ppn | physical page number of page desired |
| ac2 | ptw access code. |
| u | this ptw is used |

3. Startup Procedure

The System/88 includes a startup procedure that powers on the system and boots program and data modules which are included in a startup file.

At automatic startup, the programmable read only store (prom) 181 (FIG. 12) runs diagnostics and self tests on both the System/88 and System/370 components. At the completion of those tasks, the PROM 181 reads a utility program that loads the S/88 operating system from a master disk (not shown).

The module start up code initializes all configured devices and disks and sets the internal clock from the system calendar clock. This file contains commands that the operating system executes as part of the procedure for starting up a module. This procedure includes functions of:

- reading table files that specify configurations of boards, disks and devices connected to the module;
- identifying the modules within the system; and
- starting various system service processes.

The module file supplies sufficient data to bring up a new system and can be modified by the customer to suit his requirements. In order to capture a S/370 area 162-164 from the S/88 main storage 16, certain statements are inserted into the module startup code command file. For example, if we assume the configuration of FIG. 10 with three S/370 processors 21, 23 and 25, 27 and 29, 31 and three S/370 storage areas 162, 163 and 164 for said processors, the following statements are inserted into the module startup code command file:

Start S/370 processor #1 VM 8 megabytes
Start S/370 processor #2 AIX 4 megabytes
Start S/370 processor #3 VSE 16 megabytes

4. S/370 Service Routine

Each Start S/370 command causes a software routine, to be executed to "steal" a block of real storage space from storage 16 for the particular S/370 processor #1, #2 or #3. Then the appropriate S/370 operating system will be IPLed into the "stolen" real storage space. The functions of the software routine are to capture storage areas from S/88 storage and to "replace" those areas when appropriate. Five subroutines are used to perform these functions:

a) The subroutine S/370 Displace Storage extracts a block of physical storage from the S/88 operating system tables. The block's base address will be on a megabyte boundary, and its size will be in integer quantities of megabytes.

```
Usage    declare  S/370 displace_stor entry (binary (15),
                                             binary (15),
                                             binary (15);
         call S/370 displace stor(n blks, ppn, error code);
```

Arguments—n blks (input) the number of contiguous megabytes desired.
ppn (output)
The physical page number of the first lowest or highest 4K page of real storage in the block. The eight least significant bits of ppn will be zero, and the base real address of the block will be 4096*ppn. error_code (output) insufficient_ free—There are not enough contiguous free blocks available to displace at least one MB. provided_less—The number of MB displaced is less than that requested.

b) The subroutine S/370 Replace Storage returns a block of physical storage to the S/88 operating system tables.

```
Usage
declare   S/370 replace_stor entry (binary (15),
                                    binary (15),
                                    binary (15);
```

```
          call S/370 replace_stor(n_blks,
                                  ppn,
                                  error_code);
```

Arguments
n_blks (input)
The number of contiguous megabytes being returned.
ppn (input)
The physical page number of the base of the block. The eight least significant bits of ppn must be zero.
error_code (output)
cannot_free_connected—Must use S/370 Close Storage before trying to return storage to VOS.

c) The subroutine S/370 Open Storage connects part, or all, of the previously displaced physical storage to the caller's virtual address space and returns the virtual page number. Each appropriate apte and pme is made and the virtual to physical mapping is established. The access code is "Read/Write", and the storage is wired.

```
Usage
declare      S/370 open_stor entry (binary (15),
                                    binary (15),
                                    binary (15),
                                    binary (15);
             call S/370 open_stor(n_blks,
                                  ppn,
                                  vpn,
                                  error_code);
```

Arguments
n_blks (input)
The number of contiguous megabytes requested.
ppn (output)
The physical page number of the first 4K page in the region. The eight least significant bits of ppn will be zero.
vpn (output)
The virtual page number of the first 4K page in the region. The eight least significant bits of vpn will be zero, and the virtual address is 4096*vpn.
error_code (output)
A returned error code.

d) S/370 Close Storage
The subroutine S/370 close storage disconnects the previously opened physical storage from the caller's virtual address space. The appropriate APTEs and PMEs are returned to the S/88 operating system, and the virtual to physical mapping is faulted. The physical storage is returned to the S/370 displace storage routine.

```
Usage
declare    S/370 close_stor entry  (binary (15)
                                    (binary (15)
                                    (binary (15)
           call S/370 close_stor   (n_blocks
                                    vpn,
                                    error_code);
```

Arguments
n_blks (input)
The number of contiguous megabytes being returned.

vpn (input)
 The virtual page number of the first 4K page in the region being returned.
error_code (output)
 A returned error code.

e) Gain Freedom is a subroutine that is called by the START_370 program. It puts the START_370 program in S/88 supervisor mode so that the above four subroutines can be performed. Once START_370 is in supervisor mode, the vector pointers can be modified to remove blocks of storage from the S/88 operating system and reassign the storage to each S/370 processor.

This subroutine is used to alter memory allocations and to change the manual vectors for interrupt level 6 of the S/88 processors. Customers are not given knowledge of, or access to, this call for system security reasons.

```
Usage
declare   S/370 gain_freedom entry (binary (15),
                                     binary (15);
          call S/370 gain_freedom (give_take,
                                    error_code);
```

Arguments
 give_take (input)
  A value of 0 returns the caller to application user state, and any other value sets the caller in supervisor state.
 error_code (output)
  A returned error code.

The function steps of the above subroutines are as follows:

S/370 Displace Storage
 1) Gain freedom, and lock mme arrays freelist
 2) Search free list for largest string of adjacent free mme's
 3) Round both ends to MB boundaries and calculate nblks, the number of 4 KB blocks in string
 4) If nblks>n_blks, set nblks to n_blks (the number of 4 KB requested) and modify base ppn boundary
 5) Unthread chosen string of mme's from free list
 6) Subtract npages from system available counts
 7) Unlock mme_arrays freelist, and relinquish freedom
 8) Set: ppn=base ppn
   rc=error if nblks<n_blks
   rc=error if nbls<=0
   rc=0 if no error S/370 Replace Storage
 1) Check that all entries are not connected, set flags to zero, and properly chain mme's together. Return error if a problem exists.
 2) Gain_freedom, and lock mme_arrays freelist
 3) Search free list for good location to thread mme's
  a. First candidate adjacent to base ppn.
  b. Second candidate at end of list.
 4) Thread entire block onto free list
 5) Add npages back into system available counts
 6) Unlock mme_arrays freelist, and relinquish freedom S/370 Open Storage
 1) Find this process's table entry and find a hole in its virtual storage on a pmb boundary large enough for n_blks of MB. Make sure there are enough displaced mme's to service the request. Return error if there is a problem.
 2) If necessary, allocate wired space for pmb's and apte's
 3) Setup the entire structure:
   mme's wired and connected
   mme.aptep->apte
   pme.aptep->apte
   all flags set properly
   apte.ptep->pte
 4) Tie newly constructed pmb chain onto task's pmb chain Close Storage
 1) Find this process's table entry and find the pmb's constructed by s$open_storage. Return if none found.
 2) Disconnect these pmb's from process's pmb chain.
 3) For each apte, call setup_ptw to fault the real mapping.
 4) Return wired space for pmb's and apte's to OS.
 5) Return the mme's to the Displace_Storage routine Gain Freedom
 1) Get address of give_take argument
 2) Go to step 7 if relinquishing freedom
 The following steps gain freedom
 3) Execute a trap 13 which causes OS to return to the caller while in supervisor state.
 4) Get user stack address and swap with system stack pointer
 5) Save system stack address in the user stack pointer
 6) Return to caller in supervisor state on user stack
 The following steps relinquish freedom
 7) Get saved system stack address back and swap to system stack pointer
 8) Replace user stack address in user stack pointer
 9) Modify stack so trap handler will return to step 11
 10) Return to trap handler
 11) Trap handler returns to user
 12) Return to caller in user state on user stack 5. Unthread Chosen String of mme's From Free List FIRST MME pertains to the first mme in the string which is to be unthreaded, and base ppn contains its ppn (physical page number). LAST MME pertains to the last mme in the string. If the FIRST MME is at the head of the free list (its previous mme field equals zero) the free list pointer is set equal to the next_mme field of the LAST MME; thus the mme following the LAST MME is now at the head of the free list. Otherwise the next mme field of the mme previous to the FIRST MME is set equal to the next_mme field of the LAST MME. If there are mme's following the LAST MME (its next mme field not zero), the previous mme field of the mme following the LAST MME is set equal to the prev mme field of the FIRST MME.

6. Writing Storage Base and Size to STCI

After storage has been "stolen" from S/88 OS, it is partitioned among the S/370 processors according to requirements stated in the configuration file. A configuration array is built in S/88 kernel storage which contains the base ppn and n blks for each S/370 processor. The term n blks means the number of contiguous megabytes of storage. It is equal to the number of stolen (unthreaded) mme's divided by 256. When the EXEC370 task for each S/370 processor is initiated in its respective S/88 processor, it uses the corresponding base ppn and n blks values to assemble an STCI word.

This word is then written to virtual address 007E01FC (in the local store 210 address space) causing the initialization of the STCI registers 404 and 405 (FIG. 32B) transparent to the S/88 operating system.

The uncoupling mechanism 216 and BCU interface logic 253, described earlier with respect to FIGS. 19A, 20, is used to initialize the registers 404, 405.

However, in the preferred embodiment, as shown in FIG. 32B the registers 404, 405 are coupled directly to the S/88 processor data bus 161D (rather than to the BCU local data bus 223). Decode logic 280 of logic 216 decodes the above virtual address to block AS from the S/88 hardware and to return DSACK to processor 62. Registers 404, 405 are enabled via the STCI select line 458 from logic 253. Bits 27-20 of the STCI word form the STCI "base" address and bits 23-20 form the S/370 storage "size" value. Bits 19-0 are zeros.

Initialization Functions for S/88 Interrupts Initiated by S/370

There are various scenarios for directing S/370 interrupts to the S/370 interrupt handler(s) microcode resident in S/88 without the knowledge of the S/88 operating system. Three will be described.

A first method involves modification of the S/88 operating system kernel by inserting the S/370 interrupt handler code into the S/88 operating system first level interrupt handler so that it is assembled as part of that object module. The table of interrupt vectors are contained in the interrupt handler assembly source, and the vectors used by S/370 are modified in the source to point to the S/370 interrupt handler code.

This method greatly differs from the S/88 architected method which is as follows:
1) Each interrupting device should be entered into the file identifying it, its path name, and board address, etc., to S/88 operating system.
2) When the first level interrupt handler receives the interrupt, it sets up the appropriate formatted stacks, saves all machine status and registers, verifies the validity of the interrupt, and passes the interrupt to a "second level" interrupt handler which calls the developer's specifically written device interrupt code.
3) When the interrupt code is finished, it returns control to the operating system interrupt handler which takes care of restoring environments.

The above first method circumvents all of this. By assembling S/370 interrupt vectors to point to the S/370 interrupt routine, we have avoided all of the normal interrupt processing performed by the S/88 operating system and do not have to identify S/370 via the device file. This is really a software uncoupling, since code has been modified instead of hardware. This first method is the quickest and least expensive method to achieve the desired interrupt function. However, this method is susceptible to additional maintenance for each subsequent release of the S/88 operating system. It requires at least a kernel bind; and, if the interrupt handler has been changed, the S/370 interrupt code must be reinserted and the interrupt handler reassembled.

A second method involves modification of operating system interrupt vectors after system boot; and it is this method which is implied for use with the description of the hardware interrupt mechanism of FIG. 20.

This second method requires the placing of the S/370 interrupt code into the S/88 operating system virtual address space (in the preferred embodiment, just below 007E0000) and the modification of the appropriate interrupt vectors in the operating system kernel interrupt handler. This work is done by the S/370 initialization routine after the operating system has initialized (at the same time that the S/370 initialization routine "steals" storage). Since the initializing routine is modifying the S/88 operating system kernel storage area, it has to "gain freedom" in the manner set forth to "steal" storage in the above description. This second method does not require the maintenance modification of each newly released S/88 operating system kernel. However, S/370 interrupts are nonfunctional until after S/88 operating system is up and running.

A third method involves hardware presentation of interrupt vector content; and this is a preferred alternative because no change in the S/88 operating system kernel is required, i.e., no change is made in the vector table.

This third method requires the placing of the S/370 interrupt routine into the S/88 operating system virtual address space and/or the BCU Local Storage as a known read-only store (ROS) address. The interrupt routine address(es) must be made available to the S/370 hardware, preferably in ROS. The following scenario is given to illustrate the method:
1) S/370 (e.g., DMAC 209 in BCU 156 ) activates interrupt request.
2) S/88 processing unit 62 activates interrupt acknowledge, data strobe, and address strobe.
3) The BCU places an interrupt vector number (could be all zero for easy recognition or offset into our ROS vector space) on the data bus 223 and activates data strobe acknowledge. This vector number is except for valid parity, of no consequence to processor 62.
4) Eventually processor 62 will perform a storage read cycle to obtain the 4-byte interrupt vector.
5) The BCU recognizes this specific storage access (by the virtual address), uncouples processor 62 from accessing storage and presents its own 4-byte interrupt vector (gated from S/370 ROS). The S/370 ROS contains as many vectors as required, several for DMAC, one for ROS board syncing, etc.

This third method enables uncoupling during board sync for the purpose of syncing S/370 hardware, etc. However, this method requires more hardware.

Gain Freedom Without Modifying the S/88 Operating System

A method is given above in "Start S/370 Service Routine" describing how the application program can gain freedom, i.e. obtain supervisor state. It involves writing a special OS service call "trap 13 instruction" routine to be added to the S/88 OS kernel.

This trap 13 interrupt routine does nothing more than "call" the program issuing the trap at the location immediately following the trap instruction. Since the trap interrupt routine is in supervisor state, the subject program will change to supervisor state. To regain application program state, the application program modifies the interrupt stack return address and returns from the trap 13 "call" to the trap 13 interrupt code which exits from the interrupt using the modified interrupt stack address. This method involves the addition of an interrupt routine to the S/88 OS.

A second method eliminates the modification of the subject OS. A special register (not shown) is defined in the BCU control storage address space which, when written to by the application program, causes a new BCU interrupt using the third method for implementing interrupts given above. The application interrupt routine is made resident in BCU read-only storage (not shown) and functions the same as the trap 13 code. The Gain Freedom routine previously described functions exactly the same except that it writes to the BCU special register instead of issuing a trap 13 instruction.

Stealing Storage Without Modifying S/88 OS

By utilizing this second Gain Freedom implementation, the "stealing of memory" does not require reassembly of any S/88 source code or binding of the S/88 OS kernel. The address of the head of the free list is available to the application program.

Power On and Synchronization of Simplexed and Partner Units 21, 23 (FIGS. 49, 50)
(S/88 Processing Unit as a Service Processor for S/370 Processing Unit)

1. Introduction

Figures 49, 50:
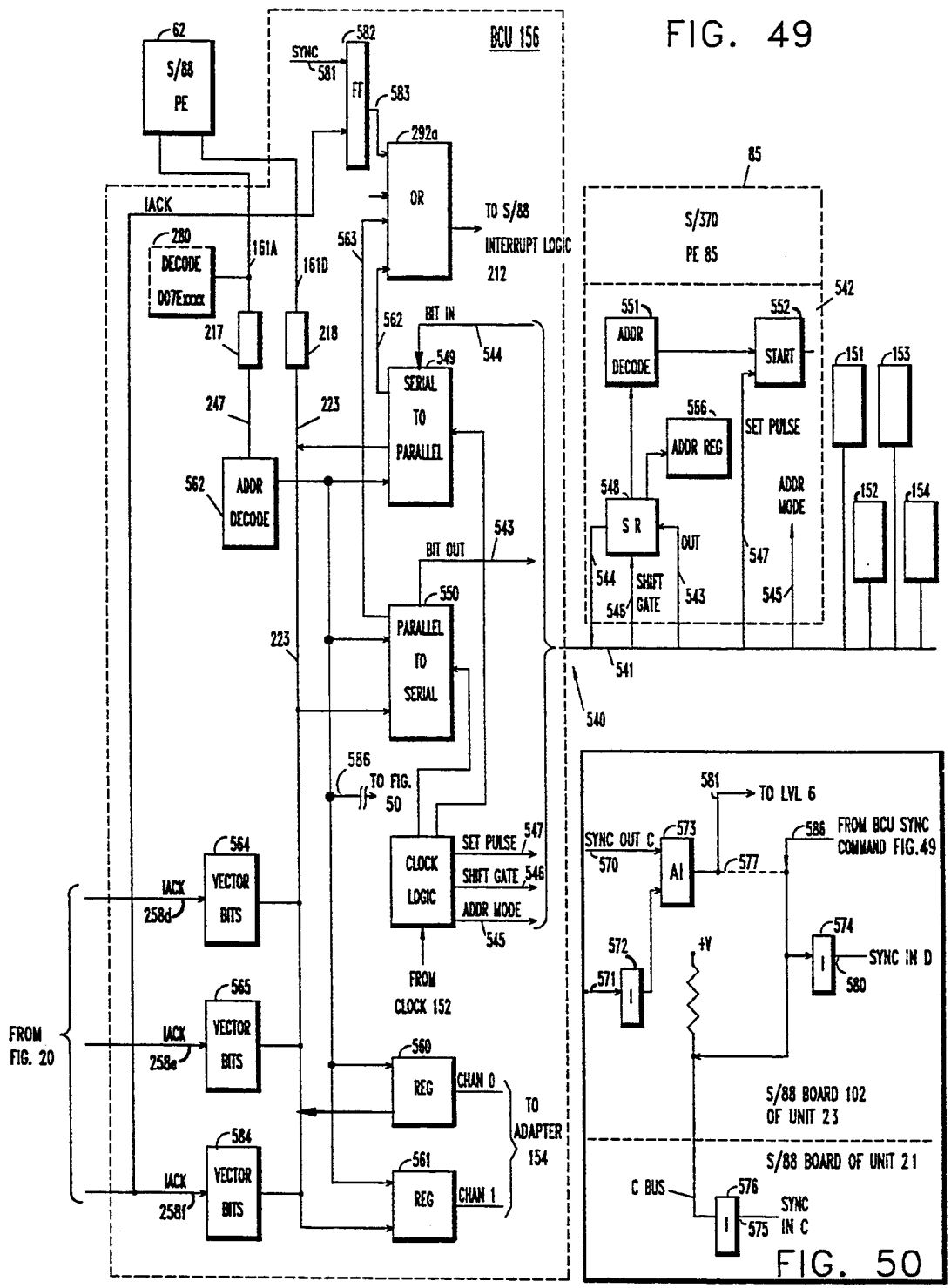
FIGS. 49 and 50 are fragmentary diagrams illustrating certain of the logic used to synchronize S/370-S/88 processor pairs and partner units.

This section will describe briefly with respect to FIGS. 49 and 50 certain of the hardware registers, latches and logic which determine the status of, and control and set the environment for, the synchronization of partner units such as 21, 23 of FIG. 7.

In addition certain of the microcode functions for accomplishing the initialization, synchronization and re-synchronization of simplexed and partner units will be described. Attention is directed first to the System/88 (the preferred embodiment) which functions essentially without change with respect to initialization and synchronization of S/88 processing units, both in simplexed and partnered unit environments. This method of operation will be described only briefly. In addition, certain of the pertinent description in the Reid patent will be repeated herein.

Error checking is being performed at the same time that each S/88 processing element 60, 62 (FIG. 8) of unit 21 drives the A bus 42 and the B bus 44. This concurrent operation is in contrast to I/O units in the processor module 9 which implement an error check prior to driving the bus structure. The processing unit 21 operates in this manner because timing therein is sufficiently important that any delay in operation is undesirable for system throughput. An error, noted by the checking logic during the time the processing unit is driving the bus structure, causes the unit to drive both an A Bus Error signal and a B Bus Error signal onto the X bus 46 during the next phase of the system clock.

During the same time phase, the failing central processing unit (e.g., 21) drives a level 1 maintenance interrupt, onto the X bus 46, which the partner central processing unit (e.g., 23) receives. At the end of that time phase, the failing unit goes off-line, becoming incapable of driving further signals onto the bus structure 30, except in response to interrogation from the partner central processing unit. This automatic off-line operation ensures that any read or write cycle is aborted, whether to the memory unit 16, 18 or to a peripheral device through a control unit during which an error was detected in either the address or the data on the A bus or B bus. Further, any data transfer during that same operating cycle is repeated using only the partner central processing unit.

More specifically, the comparator 12f compares the input data which the processing section 12a receives from the A bus 42 with the input data which the processing section 12b receives on the B bus 44. It also compares the function, address and data signals (including parity) which the processing section 12a applies to transceivers with corresponding signals which the processing section 12b produces. Timing and control signals of section 12a are compared with corresponding signals from section 12b. This comparison of internal control signals checks internal operations of the processing elements 60, 62 and facilitates prompt detection of faults and is useful in diagnosis and maintenance of the processor unit.

At any time that one or more corresponding input signals to the comparator 12f differ, the comparator produces a Compare Error signal which is applied to the control stage 86. The error can be the result of a data-in error, a data-out error, a function error or an address error. It can be, also, either a cycle error or a control error due to differing timing or control signals. The detection of an error by the parity-checking circuits produces a Parity Error signal which is applied to the control stage 86. The control stage 86 responds to the Compare Invalid signal and the Parity Invalid signal to produce, on the next clock phase (N+1), a Processor Error signal. One exception to this operation occurs if the Compare Invalid signal is due to an invalid comparison of input data signals during a read operation. In that event, control stage 86 produces the Processor Error signal only if no Bus Error signals are produced with the next timing phase. A Bus Error signal indicates a fault condition in the bus structure 30 and hence identifies that the invalid comparison of input data was the result of a fault in the A Bus or B Bus portion of the bus structure 30 and not in either processing section 12a or 12b.

One function of the Processor Error signal is to disable logic circuits and thereby essentially halt all operation in the processing section 12 of unit 21. In addition, the A Bus Error signal and the B Bus Error signal are applied to the X Bus 46 to signal all units in the module 9 to ignore information placed on the bus during the immediately preceding phase, e.g., to ignore the CPU Bus transfer. A Level One Interrupt signal is applied to the X Bus 46 to notify the partner processing unit 23 that some unit in the module has detected a fault-producing error.

At the start of the phase (N+2) the stage 86, still in response to the fault signal, terminates the assertive bus master status. This action is accompanied by the termination of the Bus Error signals. When the processing section 12 switches out of the Master state, it disables all the bus drivers in the transceivers 12e. The S/370 transceiver 13 drivers are also disabled via common control 75 whenever those of transceivers 12e are disabled. Similarly, in the event that a Processor Error signal is produced by the control stage 75 of unit 21, transceivers 12e, via control stage 86, and transceivers 13 are also disabled.

Thus, processing units 21, 23 can drive the bus structure only when in the Master state, as required to produce the Bus Enable signal that is applied to the drivers. The Processor Error signal promptly, i.e. at the end of the next timing phase, turns off the master status. In the event the processing section 12 of unit 21 produces a Processor Error signal, the S/88 processing section of partner unit 23 continues operating essentially without interruption. When the Processor Error signal occurs during a write operation, the partner processing unit 23 repeats the data transfer. When the Processor Error arises during a read operation, the partner unit reads in the repeated data which the memory applies to the bus structure in a subsequent timing phase.

Further, the partner processing unit 23 responds to the Level One interrupt which is a low priority interrupt, to initiate a diagnostic routine. In the event the cause of the Processor Error appears to be a transient phenomenon, i.e., the diagnostic routine does not identify or locate any faulty or erroneous condition, the processing unit 21 can be restored to operation without maintenance. In a preferred embodiment the occurrence of the transient failure is recorded, and if repeated an arbitrarily determined number of times the processing unit is electrically removed from service or operation without further diagnosis.

Each processing section 12 of the units 21, 23 includes logic circuits, typically in the processor status and control stage 86 to bring the two partner units into lock-step synchronization. The section 12 attain lock-step synchronization with the transition to Master status. Each section 12 must be in the Master state in order for it to drive signals onto the bus structure. The initializing sequence stored in each PROM 181 typically includes instructions for bringing the partnered sections into synchronization and to ensure that neither processing section is in the Master state initially, i.e., upon being turned on.

The processing sections 12 of the units 21, 23 are not in synchronization initially in the initializing sequence and one unit attains the Master state during a multi-phase cycle prior to the other. The one unit obtaining Master status controls the further initializing operation of the other unit to bring it into the Master state at a selected time.

When the processing section 12 of unit 21 is initialized, it negates an internal Error Check signal, and thereby prevents a Parity Invalid signal or a Compare Invalid signal from producing a Processor Hold Signal. Instead, the section 12 executes a test routine, typically stored in the PROM 181, which exercises all conditions that can produce a Processor Error signal. As each potentially faulty condition is created, the processing section tests to see whether the corresponding fault reporting signal is indeed produced. The absence of the Error Check signal thus inhibits the processing unit from attaining Master state, with the result that faults produced during this logic exercising routine do not stop the processing unit and are not reported to the bus structure 30. The test routine in the PROM 181 asserts the Error Check signal and enables the processor to assume the Master State only upon successful completion of this checking routine.

The S/370 processing units (the preferred embodiment) typically have hardware provided for initialization and service processor functions via a "back door" access to the various components and logic in each chip. Since these are well known, they will be described only briefly.

Similarly program routines for self-testing and initialization are well known and need not be described in detail. What is emphasized in this section is the mechanism whereby the typical S/370 self testing and initialization is achieved via the S/88 without either the S/370 or the S/88 operating systems being aware of the change. The self test and initialization routines (STIR) for the S/370 are placed in PROM 181 (FIG. 19C) in the preferred embodiment, together with routines for synchronizing the S/370 processing elements in partnered units. The S/88 functions therefore as the S/370 service processor. The storage-mapped I/O allocations of the S/88 code in PROM 181 are provided for the case where certain S/88 status or other register contents are required for the implementation of the S/370 code.

The manner in which this code goes about synchronization is to transfer a storage-mapped copy of the register set within a primary (or master) partner processing unit such as 21 (one that is operating properly) to the register set within a secondary (or slave) partner processing unit such as 23 (one that is not yet operating properly).

Before describing the details of the S/88 to S/370 coupling path for the synchronization mechanism, a brief review of the structure and environment of the module 9 of FIG. 7 will be given. The characteristics of the S/88 operating system such as fault tolerance and single system image are preserved for both the S/88 and S/370 structures. The module 9 is comprised of one or more simplexed S/370 processing units such as 21 or pairs of partner S/370 processing units such as 21, 23. S/88 simplexed or partner units such as 12 or 12, 14 may be included in the module for executing only S/88 programs.

Each S/370 processing unit includes a pair of S/370 processor elements such as 85, 87 and a pair of S/88 processor elements such as 62, 64 as shown in FIG. 7; and the pairs of processing elements are operated in lock step as a single logical processing unit. The partner units form a redundant design operated in lock step with each other to provide a fully fault tolerant, self checking logical processing unit.

Each of the S/370 processor elements 85, 87 of a pair is in part a S/370 chip set such as 150 (FIG. 11). The S/370 chip sets and their associated hardware are mounted on a S/88 style board such as 101 (FIG. 9A) for coupling with S/88 bus structure 30; and they are coupled to respective S/88 processing elements via interface logic circuits 89 and 91 (FIG. 8). In this section, the S/370 chip set pair and their associated hardware in one processing unit such as 21 will be referred to as a S/370 entity; and their corresponding S/88 processing elements such as 60, 62 and associated hardware will be referred to as a S/88 entity. The S/370 entities execute S/370 application programs and call upon the S/88 entities to perform the S/370 I/O operations as required utilizing the S/88 I/O devices and programs such that neither the S/88 nor the S/370 operating system is aware of the other.

2. Fault-Tolerant Hardware Synchronization one of the more unique and significant features of the S/88 -S/370 processing units is the self-determined synchronization of any processing unit such as 21 by a currently-processing partner 23. The S/88 entity of each unit has the capability and the responsibility for the synchronization of a new or error producing partner. When a S/88 entity of a unit assumes this responsibility, it is referred to as the "master." Its partner, which undergoes synchronization, is referred to as the "slave."

The S/88 hardware/firmware structure determines when synchronization is required and who synchronizes whom. The interconnected S/88 -S/370 hardware/firmware utilizes this same intelligence to follow the lead of the S/88 in synchronization decisions. That is, anytime the S/88 determines that a S/88 (slave) entity requires synchronization with its partner (master), that synchronization is permitted to progress to a suitable point after the S/88 slave entity has been "kicked-off"; then the execution is diverted to the corresponding S/370 entity. The S/370 entities are synchronized by the S/88 PEs executing code from PROM 181 to extract the S/370 Master state and restoring that state to both S/370 partners.

Either one of the partner pair can assume the master or the slave role in the synchronization of processing units, whether the requirement is invoked by an Initial Power On, the appearance of a new partner or a recovery from an error condition that caused two existing partners to lose synchronization (each case forcing a Maintenance Interrupt). In each case, the S/88 slave entity recognizes its status and depends on the S/88 master entity for synchronization.

The S/88 master and slave entities assume their respective roles as a result of their respective states at the time the maintenance interrupt occurs. The S/88 entities of all processing units detect and process the interrupt with each assuming it is a slave until a defaulted master is established. That master then kicks off any holding slave in lock-step, each resuming the pre-empted environment of the master (upon returning from the interrupt).

Likewise, the S/88 entities will uncouple the processors from the rest of the logic, use those processors to emulate the S/370 SP function to establish an identical pre-empted state within the S/370 partner-pair, then will re-establish the normal execution environment and permit the S/370 partner-pair to begin execution in lock-step.

The one situation not requiring sychronization:
A simplexed processing unit is powered on, i.e., single unit such as 21;
The situations that require synchronization are:
Duplexed processing units (e.g., 21, 23) are powered on;
A unit 21 is inserted while its partner 23 processes normally; and
A processing unit such as 21 detects a compare failure in its partner 23 and attempts recovery.

The S/88 entity has appropriate hardware facilities for establishing synchronization. The S/370 processing section has sufficient hardware and software assists to permit a slave entity to be initialized to the exact same state as the master entity. This includes such features as read/write status registers, readable mode registers, clearable caches, stoppable clocks and count rings, etc.

When a normally operating S/370 entity in unit 21 is to be brought into SYNC with its corresponding S/370 entity in a partnered unit 23, it is necessary to bring the partnered S/370 entity to the same state as the normally operating entity. This process is simplified in the preferred embodiment by sending a Queue Select Up Message from the S/88 processors 60, 62 (under control of the S/370 initialization and synchronization microcode in PROM 181) to the S/370 processors 85, 87. This Message stops the user applications from invoking further service requests via the Operating System, to the BCUs such as 156, during synchronization time. It also permits completion of the execution of all uncompleted I/O operations.

This brings the normally operating S/370 entity to a state which is copied into storage 162 for use by both S/370 entities upon "kickoff." At this time all registers, counters, pointers and buffers (context) in the S/370 processor, S/370 cache, DLAT, and the S/370 bus adapter are copied to storage (162) in an ordered stack. When the sync process is initiated, all four physical processors will have the S/370 context restored by loading that context into all four processors from the common stack. Both processors will be loaded with identical data for their registers, counters and buffers, then will begin program execution in lock-step or full sync.

The S/370 processing entity provides two methods for accessing the various registers and caches for synchronization. One is the normal, user-programmed read/write method using registers 560, 561 (FIG. 49) which couple the BCU local data bus 223 to channels 0, 1 of adapter 154. The other is a serial "back-door" Integrated Support Facility (ISF)/Universal Support Interface (USI) (540, 541) approach. By emulating the S/370 chipset service processor's serial interface/protocol (ISF/USI), the synchronization mechanism of the S/88 entities can access any and all facilities associated with the S/370 entity. When synchronization of one or more S/370 entities is required, both methods are employed. The normal path is used where it exists, and the USI path is used for the rest.

It is important to note that this part of the synchronization and initialization process (i.e., for the S/370 entities) must be transparent to the S/88 operating system which is not aware of the presence of, or the connection to, a S/370 entity. This transparency is achieved in a manner generally similar to that described above with respect to S/370 I/O operations. That is, the address decode logic 280 described with respect to FIG. 20, senses an address 007EXXXX each time data is to be transferred between the S/88 processor 62 and the logic of FIG. 49. When this address is decoded by logic 280, it couples the S/88 processor bus 161A, 161D to the local BCU address and data buses 247, 223 via circuits 217, 218 as described earlier. Register address decode logic 562 decodes the low order bits of the address on bus 247 to select one of the logic circuits 549, 550 or registers 560, 561 for data transfer with processor 62.

In addition, interrupts on lines 562, 563 are directed to the S/88 interrupt logic 212 of FIG. 20 via OR circuit 292a. The interrupt request signal is activated on line 562 when data has been received in logic 549 from one of the S/370 chips for transfer to processor 62. An interrupt request signal on line 563 notifies the processor 62 of the completion of a data transfer from logic 550 to a S/370 chip. An interrupt request on line 562 notifies the processor 62 that data has been received by logic 549 from a S/370 chip for transfer to processors 62. The interrupt requests are held on lines 562 and 563 until an IACK signal appears on lines 258d and 258c respectively. Vector numbers for these interrupts are derived from logic 564, 565 when energized by IACK signals 258d and 258e respectively from FIG. 20. The vector numbers are used by the processing element 62 to access the respective interrupt handler routines.

The S/370 integrated support facility (ISF) 540 FIG. 49 represents a "backdoor" entry to the logic on chipset 150. The ISF consists of a 5 line support bus 541 which connects to the Unit Support Interfaces (USIs) integrated on chips 85 and 151–154. A portion of the USI 542 on chip 85 is shown in FIG. 49.

The support bus 541 represents a serial interface with the following 5 lines:
BIT OUT (data to chip set) line 543
BIT IN (data from chip set) line 544
ADDRESS MODE (control) line 545

SHIFT GATE (control) line 546
SET PULSE (control) line 547

The ADDR_MODE line 545 signals the serial transfer (shift) of either address bits (up level) or data bits (down level) on the BIT OUT/BIT IN lines 543, 544. The BIT OUT and BIT IN lines 543, 544 are the interconnection between shift registers such as 548 inside a chip and external shift registers in logic 549, 550. The number of bits shifted between an internal register 548 and one of the two external registers 549, 550 is determined by the number of pulses applied to the shift gate line 546.

The SET PULSE is used to synchronize chip internal activities based on the address or data pattern just shifted into the chip. SET PULSE is activated after shifting is finished to signal the availability of the information on the chip side e.g., in register 548. This means that activities based on the information can be initiated as of this moment.

The following example illustrates the operation. A start function is assigned to a specific address pattern. This address is shifted into the registers such as 548 of each chip. When all address bits have been transferred, the address decode 551 in one of the chips detects its address. The SET PULSE follows the address transfer. The address decode and the SET PULSE form a chip internal start pulse at the output of gate 552.

The chip specific part of a USI contains controls and data chains as derived from the specific chip design. To retain the current status of storing elements not affected by a shift operation, the functional clocks must be stopped prior to the initiation of any USI activities. USI accesses requiring clock stop as prerequisite are defined as 'static'. Dynamic accesses or functions are those operations which can be executed while the chips are in operation.

The SET PULSE is used to synchronize functions to the chip internal timing. The functions are decoded from the address pattern or data pattern in the SERDES register, additionally gated by the ADDR MODE line (address or data mode):
 Set chip status into SERDES
 Set mode register into SERDES
 Load mode register from SERDES
 Set Support transfer Request latch (SPR)
 Reset Processor Controlled Request latch (PCR)
 Additional dynamic functions as required to support the individual chips.

The five-wire serial bus 541 of the ISF, that provides a 'back door' access to the various addressable entities within the S/370 chip set 150, is coupled to the Unit Support Interface (USI) of each chip e.g., USI 542 of chip 85. The USI 542 provides an 8-bit Address Register 566 and an 8-bit Serializer/Deserializer (SERDES) 548. The USI Address Register 566 receives the address of the chip and the address of the target entity within the chip while the SERDES 548 is the actual send-/receive mechanism. The USI also provides synchronization logic for the shift-in/shift out mechanism.

Each chip within the S/370 chip set 150 is assigned a 4 bit (high order) ISF/USI address, for example PE85, cache controller 153, clock 152, adapter 154, floating point coprocessor 151, and STCI 155 being assigned the hexadecimal values of 2, 4, 6, 8, and A and B respectively. The low order 4 bits of the ISF/USI Address define the internal chip entity (e.g., register, function or chain), addressed by the low order 4 bits.

The communications scheme is comprised of Shift Chains (also referred to as Function Chains) that, in turn, are comprised of fields that identify the command, the source chip, the destination chip, the data and the target entity within the chips. The shift chains are as follows:
 Bits 0–7—Function/Command
 8–11—Source (controlling) unit
 12–15—Target (sensed/controlled) unit
 16–23—Message/data
 24–27—Controlled (written) register
 28–31—Sensed (read) register These Function Chains are referred to as Shift Chains because of the serial nature of the ISF/USI and the fact that the chains must be 'shifted' in/out of logic 549, 550 and SERDES registers such as 548.

The Command Field of the Function Chain may contain a Write/Control Command (E61) or a Read/-Sense Command (F61). An example of a Function Chain is as follows:
 E602XX10=Write to the Mode Register of processor 85.
 where
 E6=command=Write
 0=Source address—PE62 for testing
 2=Destination—PE85
 XX=message (data)
 1=Controlled Register (Mode Register)
 0=Sense Register (none since command is "write")

The approaches to establish synchronization described herein use S/88 program code stored in the PROM 181. The code makes determinations associated with each of the above four situations and sets flags accordingly. The synchronization routines then use those flags to control the code pathing in order to perform the appropriate synchronization and/or initialization. A couple of examples are:
 Determining whether or not the memory on a particular S/88 board was compromised by a Power Fail and should be reinitialized from its partner.
 Determining whether or not a particular S/88 board should assume the Defaulted Master Processing Unit (DMPU) role.

The following subsections 3–6 set forth two different implementations of the synchronization mechanism. One is hardware-assisted and permits a faster 'time-to-ready' process. It, of course, requires additional control circuitry at least in the S/370 entity and can be enhanced beyond the defined capability by physically exposing certain S/88 control circuits to the S/370 'interface.' This 'interface' is, in reality, the 'parasitic attachment' of the S/370 circuitry to the S/88 circuitry.

The other implementation defined herein is microcode only, permitting the handling of the S/370 synchronization by the S/88 processor entities in emulation of a S/370 Service Processor. This technique may be used where performance and 'time-to-ready' is not critical.

3. A Simplexed Processing Unit 21 is Powered On (Hardware Implementation)

This situation can be caused by either of two conditions:
 1. This unit comes online as a result of a Power On/-Boot.
 2. This unit comes online as a result of a Power Fail Recovery.

For either condition, the code pathing is the same:

The S/88 entity of the unit 21 executes a portion of its Self Test and Initialization Routine (STIR) then attempts to determine whether or not the contents of its associated storage 16 have been compromised (Power Fail state). If so, it will fall back to the normal power on STIR path. If not, it will attempt to determine if it has a partner or co-resident processing unit that may be the DMPU. Finding none, it will assume DMPU responsibility and attempt to synchronize any other processing units.

The S/370 entity of the unit 21 merely follows the lead of the S/88 entity. This is accomplished by the S/88 processor 62, executing code resident in the S/88 PROM 181, completing normal Self Test then determining if this is an Initial Power On or a Power Fail Recovery. If it is a Power On, it continues with normal Initialization; then, assuming it is the DMPU, attempts to issue a SYNC signal. The signal is trapped by the S/370 logic which forces a Level 6 Interrupt to the S/88 processor 62. The Interrupt 6 will be vectored to the S/370 Synchronization microcode in the S/88 PROM 181 (FIG. 19A) (which is mapped into the S/88 address space).

Meanwhile, from Power On/Boot, the S/370 PE 85 has executed its own STIR then suspended execution at its Sync Point. During this time, the S/370 clock 152, also, has initialized itself. The S/88 Level 6 Interrupt Service Subroutine (ISS) (i.e., the S/370 Synchronization microcode) uses the ISF/USI interface of FIG. 44 to emulate the S/370 Service Processor. This SP Emulator will issue Function Strings to invoke the IML function of the S/370 control store 171, though no actual code transfer occurs (the microcode is in the S/88 PROM 181). The next step of the IML Emulation is to broadcast the SYNC to the S/370 entity (the processors 85 and 87) causing the processing unit 21 to step off into execution. The final step of the ISS is to Return-from-Interrupt, causing the processing unit to begin execution of the IPLed state.

As part of the S/88 processing unit 'module_start_up.cm' execution, an emulated service processor 'IPL Button Pushed' Function String will be sent to the S/370 processing unit to perform the IPL function, loading S/370 main storage from disk. The final step of IPL is, then, to pass control to the address specified by location 0.

B. Microcode-Only Implementation

The S/88 entity of the unit 21 executes its Self Test and Initialization Routine (STIR) then will determine if this is an Initial Power On (IPO) or a Power Fail Recovery (PFR). If this is an IPO, the code determines that the unit 21 is a simplexed entity and proceeds with loading the Operating System and executing its 'start-up' routine.

If this is a PFR the code determines whether or not the integrity of its associated storage has been comprised. If it has, the code proceeds as though this were an IPO. If the memory is found with its contents intact, the PFR code proceeds with the normal Restart tasks.

In either of the above cases, the synchronization function becomes a 'dummy' operation as there is no associated partner to be synchronized.

Duplexed Processing Units 21, 23 are Powered On—Hardware Implementation

This situation can be caused by either or two conditions:
1. These units come online as a result of a Power On/Boot.
2. These units come online as a result of a Power Fail Recovery.

The S/88 entity of each processing unit 21, 23 executes a portion of its Self Test and Initialization Routine (STIR) then attempts to determine whether or not the contents of its associated storage 16 have been compromised (Power Fail state). If so, it will fall back to the normal Power On STIR path. If not, it will attempt to determine if it has a partner or co-resident processing unit that may be the DMPU or whether or not it is the DMPU. If it is, it will assume the DMPU responsibility and attempt to synchronize any other processing units. If it is not the DMPU, it will proceed to the Sync Point and await SYNC.

Each S/370 entity merely follows the lead of the S/88 entity. The S/88 entity, executing code resident in its PROM 181, completes normal Self Test then determines if this is a Power On or a Power Fail Recovery. If it is a Power On, it continues with normal Initialization; then proceeds to the Sync Point. If this is a Power Fail Recovery, the cache is examined to determine whether or not it is valid. If it is, it may have to update its partner's memory, should that partner's cache be found invalid. If it's own cache is invalid, it must depend upon its partner to update it with valid cache contents. If neither partner can assure valid memory they must, as a pair, continue with normal Power On and Initialization. As the S/88 entities of the processing unit pair approach the Sync Point, each S/88 entity determines whether or not it must assume the DMPU responsibility. If it finds that it is the DMPU, it attempts to issue the SYNC.

The sync signal is trapped by the S/370 logic and forces a Level 6 Interrupt to the S/88 entity. The interrupt will be vectored to the S/370 Synchronization microcode in the PROM 181 (which is mapped into the S/88 address space). Meanwhile, from Power On/Boot, the S/370 entity (e.g., processing elements 85, 87) has executed its own STIR then suspended execution at its Sync Point. If this is a Power Fail Recovery, the S/370 entity goes through a process similar to the S/88 entity process of determining how far back into the Initialization routine it must go in order to assure memory integrity and synchronization. During this time the S/370 clock 152 has initialized itself.

A brief description of a preferred mechanism for trapping of the S/88 SYNC pulse by the S/370 processors will now be made reference being directed to FIGS. 20, 49, 50.

S/88 processors achieve synchronization by one of the S/88 pair of processors of the unit 23 issuing a SYNC OUT signal on line 570, FIG. 50. If the partner unit has been initialized and self-tested and is determined to be not BROKEN, it has a signal level on the BROKEN line 571 which is inverted by circuit 572 to gate the SYNC OUT signal through AND INVERT gate 573.

In the original System 88 (e.g., module 10), the SYNC signal was applied to the SYNC IN line 580 of the drive (d) S/88 processor of a unit 14 via line 577 and inverter 574. It is also applied to the SYNC IN line 575 of the checking S/88 processor of unit 12 via the C bus and inverter 576 to initiate the "kick-off" of all four S/88 processors of units 12, 14 in lock-step.

In the improved S/370 - S/88 units, such as 21, 23, the output 577 of circuit 573 is disconnected from the SYNC IN lines 580 and 575 to prevent kick-off of the S/88 processors. Instead it is connected via line 581 to set a flip-flop 582 in the BCU 156 of the partner unit 21 FIG. 49. It also sets a corresponding flip-flop in the paired BCU (not shown) in the unit 21. The following description will address only one S/370 and associated hardware in unit 21, but it will be appreciated that both S/370 entities are operating in a similar fashion.

The flip-flop 582 applies a level 6 interrupt signal to the S/88 processor 62 via line 583, OR circuits 292a and 292 (see FIG. 20), interrupt logic 293 and lines IP0-2. This action is referred to as "trapping" of the S/88 SYNC signal by the S/370.

It will be assumed that the S/370 entities of unit 21 have successfully executed their self-test and initialization routines (STIR) and are ready for kick-off.

As described above in FIG. 20 with respect to other DMAC and BCU level 6 interrupts, the S/88 processor 62 initiates an interrupt acknowledge cycle in response to a SYNC signal on line 583. The function code and priority level signals from processors 62 are decoded in logic 281, a local BCU bus request is made on line 190 via output 283 of decode logic 281, and gate 291, line 287 and OR circuit 284.

When a bus cycle is granted to processor 62 on line 191, it (together with signals on SYNC line 583, AS line 270 and decode line 283) enables AND gate 294-4 to apply a signal to IACK line 258f. This signal is applied to the vector bit logic 584 (FIG. 49) to apply an appropriate vector number to the S/88 processor 62 via BCU local bus 223, driver-receiver 218 and processor bus 161D. The signal on line 258f also resets the flip-flop 582.

If the S/370 STIR function were already completed as assumed, the S/88 processor 62 executes a read cycle to obtain the vector number which is then used by the processor 62 to access the first instruction of an interrupt routine for S/370 synchronization.

The last instruction of the synchronization routine generates a SYNC command which applies a SYNC signal to line 586 (FIG. 50). This signal is applied to the SYNC lines 580 and 575 to "kick-off" the S/88 (as well as the S/370) processors of partner units 21, 23 in lock-step.

As part of the S/88 'module start up.cm' execution, an emulated SP 'IML Button Pushed' Function String will be sent to the S/370 entities in units 21, 23. Rather than performing the entire IML function of DASD accesses, etc., this IML will bypass the I/O processes and load from S/88 Main Storage. The EXEC 370 code will already have fetched the IPL code from DASD and placed it in S/88 Main Storage, awaiting the IPL. The final step of IPL is, then, to pass control to the address specified by location 0.

B. Microcode-Only Implementation

Either the PU boards powered up as a result of an inital Power On (IPO) or as a result of a Power Fail Recovery (PFR).

Taking, first, the case of the IPO:

As a result of the S/88 Power Good signal being asserted by the IPO, a Maintenance Interrupt invokes the S/88 PROM 181 code. This code synchronizes the S/88 entity of the unit 21, then calls the S/370 STIR, also resident in PROM 181. The S/370 STIR determines that, this being an IPO, sufficient facilities have not been loaded to permit it to initialize and synchronize, as it requires the facilities of the S/88 and its Operating System. As a result, the S/370 STIR returns, without further action, to the S/88 PROM 181 code which proceeds to load the O/S. As a portion of the O/S initialization, a 'Start Up' module is called. This module, too, calls the S/370 STIR resident in PROM 181. This time, the STIR determines that the necessary facilities are available and utilizes them to synchronize then Initial Microcode Load (IML) itself.

Secondly, for the case of a PFR,

As a result of the S/88 Power Good signal being asserted by the IPO, a Maintenance Interrupt invokes the S/88 PROM 181 code. This code synchronizes the S/88 entity of the unit 21, then calls the S/370 STIR, also resident in PROM 181. The S/370 STIR determines that, this being a PFR, the necessary facilities are available and proceeds to synchronize and initialize the S/370 entity or unit 21.

5. A Partner 23 Is Inserted While The Other Unit 21 Processes Normally

A. Hardware Implementation

A level 6 Interrupt will be posted to the S/88 entity of the current unit 21 upon the insertion of the new board. While the new processing unit is running its STIR, the current processing unit will recognize the Level 6 Interrupt. The Level 6 will go about the process of archiving the pre-empted task environment, determining if the new processing unit is online; and, when it is, returning from the interrupt. As a function of the Return-from-Interrupt, the two units will step off into lockstepped synchronization, resuming the pre-empted task.

B. Microcode-Only Implementation

As a result of the new board being inserted, a Maintenance Interrupt invokes the S/88 PROM 181 code. This code resynchronizes the S/88 entity of the unit 21, then calls the S/370 STIR, also resident in PROM 181. The S/370 STIR determines that, this being similar to a PFR, the necessary facilities are available and proceeds to synchronize and initialize the S/370 entity of unit 21.

6. A Partner Detects A Compare Failure

A. Hardware Implementation

The failing processing unit will be forced into its STIR while the normally-performing processing unit will be interrupted by a forced Level 6 Interrupt. The Level 6 Interrupt Service Subroutine will go about the process of archiving the pre-empted task environment, determining if the new processing unit is online; and, when it is, returning from the interrupt. As a function of the Return-from-Interrupt, the two units will step off into lockstepped synchronization, resuming the pre-empted task. Should the failing processing unit fail to exit its STIR correctly (e.g., once or a selected number of tries), the normally-performing processing unit will, after an appropriate time, set BROKEN to the S/88 portion of the failing processing unit and its various status reporting facilities.

B. Microcode-Only Implementation

As a result of the compare-failure detection, and the board going off-line, a Maintenance Interrupt invokes the S/88 PROM 181 code. This code resynchronizes the S/88 entity of the unit 21, then calls the S/370

STIR, also resident in PROM 181. The S/370 STIR determines that, this being similar to a PFR, the necessary facilities are available and proceeds to synchronize and initialize the S/370 entity of unit 21. Another compare failure will result in the same action being repeated. After a pre-determined number of iterations, the board will be put off-line permanently and a failure reported.

Alternative Embodiments

1. Use in Other (non-S/88) Fault-Tolerant Systems

In the preferred embodiment, hardware fault-tolerance is shown to have at least three features. There is instantaneous, electrical isolation of a failing field replaceable unit without the propagation of data errors to another element of the system. Dynamic reconfiguration code is provided to remove or add components as required or when the components fail. The capability to remove power from and to apply power to a subsystem or field replaceable unit without the loss of the system is provided—i.e., hot plug capability. The user perceives no loss of function or performance.

It will be appreciated that the present improvements can be used in different fault-tolerant environments such as software fault-tolerant systems lacking certain of the above strict requirements.

An example of another system (lacking certain of the strict requirements) with which the present improvement may be used is shown in U.S. Pat. No. 4,356,550, entitled "Microprocessor System," issued Oct. 26, 1982 to James A. Katzman, et al. In FIG. 1 of this patent, three processing subsystems operate asynchronously with each other and are coupled to duplicated buses. If one subsystem fails, the remaining two can continue program execution. All errors are determined at check points in the program rather than instantaneously as in the preferred embodiment of the present application.

Processors, such as S/370 processors, alien to the subsystems of the patent, may be attached to said subsystems in a manner similar to that shown in the present application relative to the S/88. By using and controlling select lines in the subsystems of the patent in a manner similar to that described with respect to the address strobe (AS) line of the present application, the processors of the subsystems can be uncoupled to permit their use as I/O controllers for the parasitic, attached alien processors.

Figure 51:
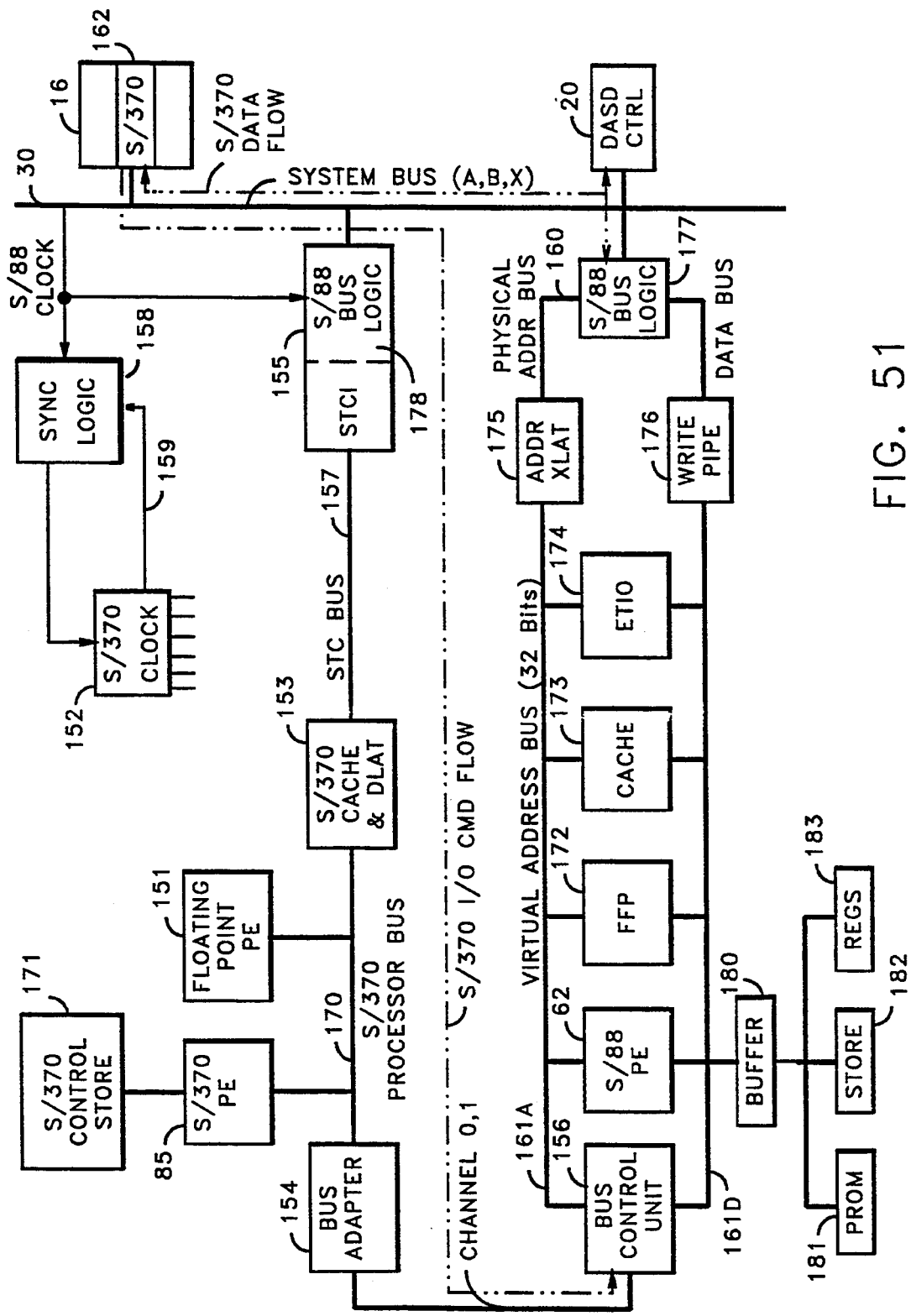
FIGS. 51 and 52 illustrate alternative embodiments of the present improvement.

2. Direct Data Transfers Between S/88 I/O Controllers and S/370 Main Storage In the preferred embodiment, it is assumed that the cache 340 may be the exclusive storage for some valid I/O data (rather than storage 162 storing all valid I/O data) as is true in typical S/370 cache systems today. In the embodiment of FIG. 51 in which the storage 162 is assumed to store all valid I/O data, I/O data transfers may take place directly between a S/88 I/O device such as disk controller 20 and the S/370 storage 162 for more efficient operation.

However, in this alternative embodiment, the BCU 156 must still be used for transferring S/370 I/O commands to the S/88. System 370 storage addresses associated with the commands must be changed to S/88 physical addresses by EXEC370 code while the commands are being converted to S/88 commands.

During data transfers from storage 162 to I/O devices, one method is to first flush the section of cache, related to the I/O operation, to storage 162 prior to performing the I/O operation.

During data transfers from I/O devices to storage 162, the section of cache related to the I/O operation is invalidated prior to performing the I/O operation.

If data conversion is required, the function may be performed in the I/O device controller(s) by routines similar to those used by EXEC370 within the S/88 processor 62.

Data conversion may also be performed by the EXEC370 application calling conversion routines in the S/88 OS such as ASCII to EBCDIC conversion.

3. Uncoupling Both Processors of a Directly Connected Pair

Figure 52:
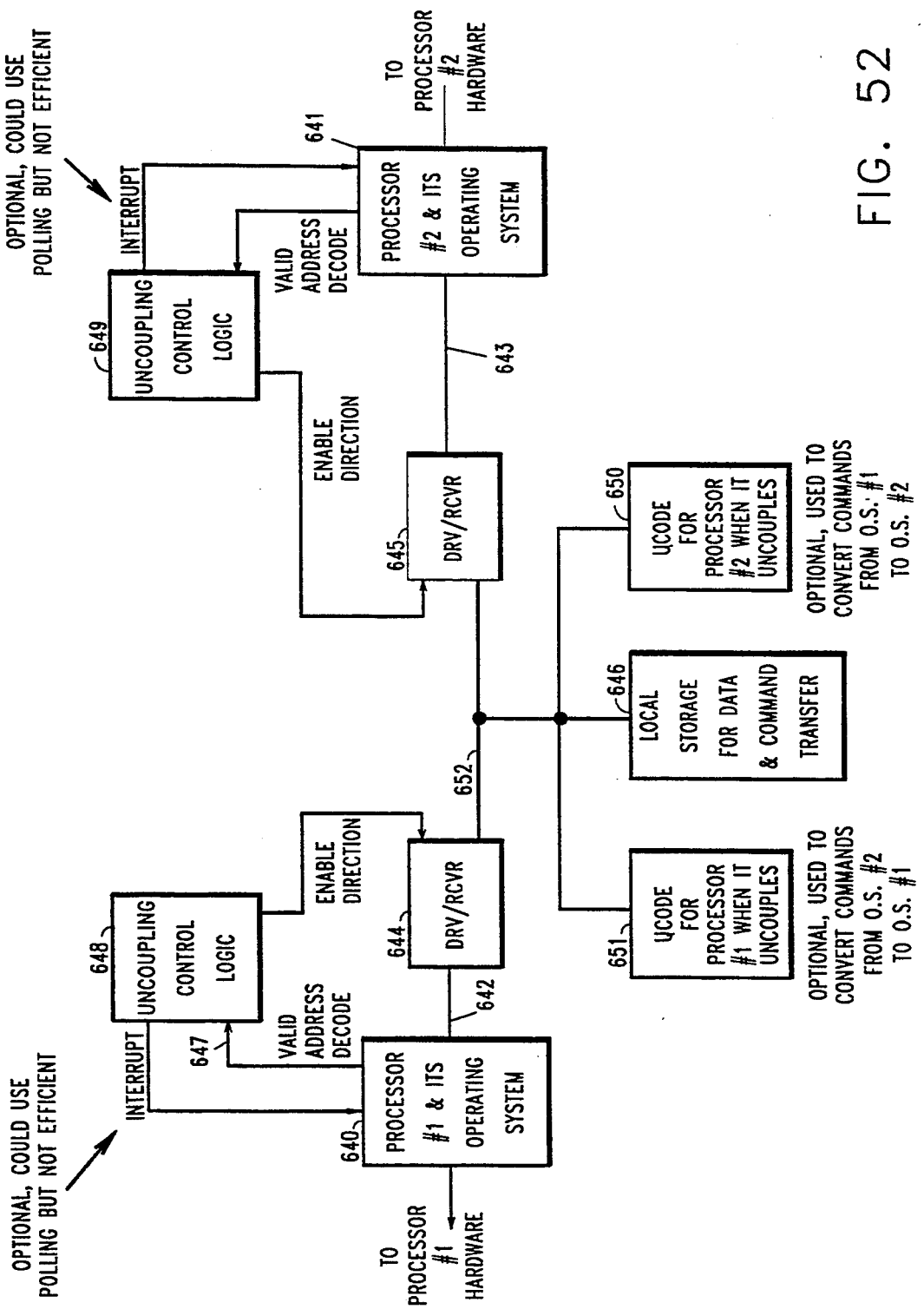

FIG. 52 illustrates the data flow for an alternative embodiment in which both of a pair of directly coupled processors are uncoupled from their associated hardware, preferably in a manner generally similar to that described with respect to the S/88 processor 62 of the preferred embodiment to transfer commands and/or data between the processors in a manner transparent to their operating systems.

Two processors 640, 641 are coupled to each other via the processor buses 642, 643, driver receiver circuits 644, 645 and a common local storage unit 646. The processors 640 and 641 may have the same or different architectures and the same or different operating systems. Each processor 640 and 641 may have its own hardware (not shown) including main storage and I/O devices for normal processing of programs under control of the respective operating systems. Neither operating system is aware of the existence of or coupling to the processor associated with the other operating system.

When processor 640 of this alternative embodiment is controlled, however, by an application program to send commands and/or data to the processor 641, it preferably puts a predetermined address on the processor address bus 647 which is decoded by logic 648 to cause circuits 644 to couple bus 642 to local store 646 via local bus 652 for command and data transfer from the processor 640 to the store 646. Decoding of the address also uncouples the processor 640 from its associated hardware to render the transfer transparent to the operating system of processor 640.

Uncoupling control logic 649 interrupts the processor 641 when I/O commands and/or data intended for processor 641 have been transferred into the local store 646. The processor 641 (via its application program interrupt handler) is uncoupled from its hardware and reads in the commands and/or data from store 646 into its main storage (not shown) in a manner transparent to its operating system. If the commands and/or data require conversion, the processor 641 utilizes the emulation microcode in the store 650 to perform the required conversion. The processor 641 then processes the converted commands under control of its operating system.

It will be appreciated that the "uncoupling" of the processors 640 and 641 may permit the continuous transfer of a substantial segment of commands and/or data to and from the local store 646 before "re-coupling" of each processor to its hardware is permitted. In this manner, fast and efficient data transfers will be achieved.

Commands and/or data may be transferred in the opposite direction from processor 641 to processor 640 in a similar manner. The commands and/or data may be converted where required by emulation microcode located in store 651; and the converted commands may be processed in processor 640 under control of its operating system.

This alternative embodiment differs in one significant respect from the preferred embodiment; i.e. the processor "initiating" the data transfer is uncoupled from its hardware to send data to the "receiving" processor. This requires the additional function of transferring control to an application program similar to EXEC370-/ETIO of the preferred embodiment when an I/O function (transfer commands and/or data to another processor) is to be performed.

The means for effecting the transfer of control for certain I/O operations from an operating system to an application program will depend upon the characteristics of the system.

For example, in the preferred embodiment, the S/370 executes a Start I/O instruction which is processed by the operating system in a normal fashion without "uncoupling" the S/370 processor from its associated hardware.

In the alternative embodiment of FIG. 52, for the instances when a S/370 processor 640 sends commands and/or data to the process 641, a selected invalid OP CODE may be used instead of a Start I/O instruction. Hardware or microcode decode of the selected invalid OP Code transfers control to a special application program which "uncouples" the S/370 from its hardware for information transfer with processor 641 via storage 646.

To prevent overwriting by one processor of data transferred by the other processor to store 646, processor 640 may be controlled to write into only one specific section of store 646; and processor 641 is controlled to only read from said one section. Processor 641 is permitted to write only into a second section of store 646 and processor 640 is permitted to only read from said second section. Processors 640 and 641 are inhibited from writing into the second and one sections respectively.

The uncoupling and interrupt mechanisms are operated transparent to the operating systems of both processors 640 and 641 as described with respect to the S/88 processor 62 of the preferred embodiment.

The emulation functions can be performed by application programs (rather than by microcode in local storage) in the manner described with respect to EXEC370 in the preferred embodiment.

Polling techniques could be used rather than the interrupt mechanism to transfer data between the processors 640, 641; however, such techniques would be inefficient.

It will be appreciated that since either processor 640 and 641 can perform I/O operations for the other processor, either processor can acquire certain of the I/O environment characteristics of the other.

It will also be appreciated that one application in one processor may communicate to a like or different application in a second processor without using the services of the operating system in either processing system.

In certain the claims, the term "application program or code" is used in its conventional sense as understood by those experienced in the data processing art; that is, it is typically distinguished from operating system code in the following manner:

1. Application programs sit on top of an operating system and typically must call the operating system for services such as Read, Write and Control of I/O, Time of Day, etc.
2. Application code is started or initiated by a user and is loaded via operating system services.
3. The operating system controls the paging of the application programs in and out of storage.
4. The operating system allocates main storage to the application programs. However, such "application" code is now given additional functions to perform.

"Alien" is used in certain of the claims to define apparatus which is not known to an operating system because it is not defined in the operating system configuration tables; and therefore the operating system has no device driver for the apparatus and cannot control the apparatus. However, a special application program running on the operating system is aware of the apparatus and can exercise certain control over the apparatus.

In the claims, "discern" is used in the sense that an operating system is not aware of alien apparatus connected to a processor on which the operating system is running, or that actions are taken by the processor and isolated from the operating system to prevent the operating system from rejecting such actions.

In the specification, the term "transparent" has been used frequently in this same sense.

While the invention has been particularly shown and described with reference to a preferred embodiment, it will be understood by those skilled in the art that the changes and alternative forms suggested above and various other changes in form and detail may be made therein without departing from the teachings of the present application. It is therefore intended that the above description and drawings be interpreted as illustrative rather than limiting; and it is intended to cover in the appended claims all such changes and modifications as full within the true spirit and scope of the invention.

What is claimed is:

1. A data processing apparatus comprising
a first system including a first processor and associated hardware including a main storage and I/O device operating under a first operating system containing routines for handling system interrupt requests from said hardware on plural priority levels, said first processor including means executing an interrupt acknowledge cycle to initiate the processing of each received interrupt request, and means effective during the interrupt acknowledge cycle for directing the first processor to a selected interrupt handler routine assigned to the priority level on which the interrupt signal occurs;
a second system including a second processor operating under a different operating system and including means for initiating an interrupt request to the first processor on a selected one of said levels, said first operating system having no interrupt routine to service the interrupt request from the second system;
means effective during an interrupt acknowledge cycle executed incident to the receipt of an interrupt request from the second system for uncoupling the first processor from its associated hardware to render said directing means ineffective;

an application program in said first system including an additional interrupt handler routine to service interrupt requests from the second system;

additional means effective while the first processor is uncoupled for directing the first processor to select the additional interrupt handler routine for use in servicing the interrupt request from the second system.

2. The apparatus of claim 1 wherein said first system is thereafter effective to execute said additional interrupt handler routine on said first processor without rejection by the first operating system.

3. The apparatus of claim 1 wherein the receipt of an interrupt request from the second system and the selection of the additional interrupt handler routine are indiscernible by the first operating system.

4. The apparatus of claim 1 wherein the first processor produces a predetermined output bit pattern during each interrupt acknowledge cycle and wherein said uncoupling means includes decode logic means responsive to said bit pattern produced upon receipt of an interrupt request from the second system for producing a control signal; and logic means responsive to said control signal uncoupling the first processor from its associated hardware to render the interrupt acknowledge cycle indiscernable to said hardware and first operating system.

5. The apparatus of claim 4 wherein said additional directing means includes means responsive to said control signal during the interrupt acknowledge cycle for transferring a predetermined vector value from the second system to the first processor, and means including said first processor operated to access the first instruction of the additional interrupt handler routine according to the received vector value.

6. In a data processing system having a processor and associated hardware operating under the control of an operating system containing routines for handling interrupt requests from said hardware on plural priority levels, a method for accepting and processing interrupt requests from data handling apparatus alien to said operating system comprising the steps of during system initialization, providing an additional interrupt handler for processing interrupt requests from the alien apparatus;

during system initialization, entering a vector address, pointing to said additional interrupt handler, into an operating system vector table in a manner, indiscernible to the operating system;

coupling an interrupt request from said alien apparatus, to the processor on a selected one of said priority levels;

uncoupling the processor from said hardware incident to receipt of said interrupt request from said alien apparatus;

while uncoupled, transferring address data from the alien apparatus to the processor in a manner indiscernible to the operating system for accessing of said vector address by the processor;

accessing said vector address; and branching to the additional interrupt handler pointed to by said vector address.

7. The method of claim 6 further comprising the step of inhibiting branching to said operating system routines incident to an interrupt request coupled from the hardware to said one priority level while an interrupt request from the alien apparatus is concurrently coupled to said one priority level.

8. A data processing system comprising a processor and associated hardware operating under an operating system containing routines for servicing interrupt requests from said hardware on plural priority levels, data handling apparatus alien to the operating system and including means for initiating interrupt requests to the processor on one of said priority levels, said routines being unable to service these interrupt requests from said alien apparatus, and a mechanism for processing said interrupt requests from said alien apparatus including an application program adapted to run on said processor and including an additional routine to service the interrupt requests from the alien apparatus, means effective upon the initiation of an interrupt request from the alien apparatus for operating the processor in isolation from its hardware and operating system, and means including the processor while operated in isolation for accessing the additional routine in a manner which is indiscernible by the operating system.

9. The system of claim 8 wherein the processor is thereafter effective to execute said additional interrupt handler routine.

10. The system of claim 9 further comprising means effective upon the initiation of an interrupt request from said alien apparatus for inhibiting access to said operating system routines by a concurrent interrupt request from said hardware on said one priority level.

11. In a data processing system, a first processing unit and associated hardware for executing programs under control of a first virtual operating system;

a second processing unit and associated hardware for executing programs under control of a second virtual operating system;

each operating system containing respective routines for handling interrupt requests from its respective associated hardware;

each processing unit and its associated hardware being alien to the operating system of the other processing unit and including means for initiating additional interrupt requests to the other processing unit, which cannot be serviced by the operating system routines of the other processing unit;

means directly coupling the processing units to each other for the transfer of information therebetween;

a respective application program adapted to run on each processing unit and including an additional interrupt handler routine to service the additional interrupt requests from the other processing unit; and means effective upon the initiation of an additional interrupt request from either processing unit to its respective additional interrupt handler routine for servicing of the latter request without using the services of the operating system routines of the other processing unit;

the system further comprising:

means associated with each processing unit and including a respective application program running on that processing unit effective upon servicing of a received additional interrupt request for asynchronously uncoupling that processing unit from its associated hardware and coupling that processing unit to the direct coupling means; and means controlled by each processing unit and its respective application program while that unit is uncoupled, for exchanging information between that unit and the direct coupling means, whereby information may be exchanged directly between the processing units.

12. In data processing apparatus having a first system including a first processor and associated hardware including a main storage and I/O device operating under a first operating system containing routines for handling system interrupt request from said hardware on plural priority levels, said first processor including means executing an interrupt acknowledge cycle to initiate the processing of each received interrupt request, and means effective during the interrupt acknowledge cycle for directing the first processor to a selected interrupt handler routine assigned to the priority level on which the interrupt signal occurs, the improvement comprising;

a second system including a second processor operating under a different operating system and including means for initiating an interrupt request to the first processor on a selected one of said levels, said first operating system having no interrupt routine to service the interrupt request from the second system and having no device table entry identifying said second system;

means effective during an interrupt acknowledge cycle executed incident to the receipt of an interrupt request from the second system for uncoupling the first processor from its associated hardware to render said directing means ineffective;

an additional interrupt handler routine in said first system to service interrupt requests from the second system; and additional means effective while the first processor is uncoupled for directing the first processor to select the additional interrupt handler routine for use in servicing the interrupt request from the second system.

* * * * *